United States Patent
Kawashima et al.

(10) Patent No.: US 11,599,025 B2
(45) Date of Patent: *Mar. 7, 2023

(54) RESIN MATERIAL FOR FORMING UNDERLAYER FILM, RESIST UNDERLAYER FILM, METHOD OF PRODUCING RESIST UNDERLAYER FILM, AND LAMINATE

(71) Applicant: MITSUI CHEMICALS, INC., Tokyo (JP)

(72) Inventors: Keisuke Kawashima, Ichihara (JP); Takashi Oda, Ichihara (JP); Koji Inoue, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 470 days.

This patent is subject to a terminal disclaimer.

(21) Appl. No.: 16/753,184

(22) PCT Filed: May 30, 2018

(86) PCT No.: PCT/JP2018/020785
§ 371 (c)(1),
(2) Date: Apr. 2, 2020

(87) PCT Pub. No.: WO2019/069502
PCT Pub. Date: Apr. 11, 2019

(65) Prior Publication Data
US 2020/0241419 A1    Jul. 30, 2020

(30) Foreign Application Priority Data
Oct. 6, 2017    (JP) .............................. JP2017-196452

(51) Int. Cl.
G03F 7/22     (2006.01)
C08F 232/08   (2006.01)
G03F 7/11     (2006.01)

(52) U.S. Cl.
CPC .............. *G03F 7/11* (2013.01); *C08F 232/08* (2013.01)

(58) Field of Classification Search
CPC ............ G03F 7/11; G03F 7/094; G03F 7/091; C08F 232/08; C08L 25/18; C08L 65/00;
(Continued)

(56) References Cited

U.S. PATENT DOCUMENTS

2020/0264511 A1 * 8/2020 Inoue ...................... G03F 7/168

FOREIGN PATENT DOCUMENTS

JP    2004177668 A    6/2004
JP    2008026600 A    2/2008
(Continued)

OTHER PUBLICATIONS

Hatakeyama, JP2008026600, English Machine Translation, 2008 (Year: 2008).*

(Continued)

*Primary Examiner* — Caleen O Sullivan
(74) *Attorney, Agent, or Firm* — Buchanan, Ingersoll & Rooney PC

(57) ABSTRACT

Provided is a resin material for forming an underlayer film which is used to form a resist underlayer film used in a multi-layer resist process, the resin material including a cyclic olefin polymer (I), in which a temperature at an intersection between a storage modulus (G') curve and a loss modulus (G") curve in a solid viscoelasticity of the resin material for forming an underlayer film which is as measured under conditions of a measurement temperature range of 30° C. to 300° C., a heating rate of 3° C./min, and a frequency of 1 Hz in a nitrogen atmosphere in a shear mode using a rheometer is higher than or equal to 40° C. and lower than or equal to 200°.

22 Claims, 4 Drawing Sheets

(a) CASE WHERE SUBSTRATE HAS UNEVEN STRUCTURE (b) CASE WHERE SUBSTRATE DOES NOT HAVE UNEVEN STRUCTURE

(58) Field of Classification Search
CPC ...... C08G 2261/122; C08G 2261/1414; C08G 2261/1424; C08G 2261/1426; C08G 2261/222; C08G 2261/3325; C08G 2261/3327; C08G 2261/418; C08G 2261/598; C08G 2261/60; C08G 2261/65; C08G 2261/724; C08G 61/08; C08G 61/06; C09D 165/00; H01L 21/0274
USPC ........................ 430/311, 270.1, 271.1, 272.1
See application file for complete search history.

(56) References Cited

FOREIGN PATENT DOCUMENTS

| | | |
|---|---|---|
| JP | 2014174428 A | 9/2014 |
| WO | 2009008446 A1 | 1/2009 |

OTHER PUBLICATIONS

Penaloza Jr, David. "Mechanical and Thermal Properties of Clay-poly(norbornene)Nanocomposites from Ruthenium Alkylidene-mediated Surface-initiated Polymerization," Kimika, 2016, vol. 27, No. 1, pp. 22-28.

International Search Report (PCT/ISA/210) dated Jul. 24, 2018, by the Japan Patent Office as the International Searching Authority for International Application No. PCT/JP2018/020785 and an English translation of the Report.

Written Opinion (PCT/ISA/237) dated Jul. 24, 2018, by the Japan Patent Office as the International Searching Authority for International Application No. PCT/JP2018/020785.

\* cited by examiner (a) CASE WHERE SUBSTRATE HAS UNEVEN STRUCTURE (b) CASE WHERE SUBSTRATE DOES NOT HAVE UNEVEN STRUCTURE (a) BEFORE REMOVAL OF POLYMER 1

(b) AFTER REMOVAL OF POLYMER 1

RESIN MATERIAL FOR FORMING UNDERLAYER FILM, RESIST UNDERLAYER FILM, METHOD OF PRODUCING RESIST UNDERLAYER FILM, AND LAMINATE

TECHNICAL FIELD

The present invention relates to a resin material for forming an underlayer film, a resist underlayer film, a method of producing a resist underlayer film, and a laminate.

BACKGROUND ART

In production of a semiconductor device, a multi-layer resist process has been used to achieve a high degree of integration. In this process, typically, a resist underlayer film is firstly formed on a substrate using a material for forming an underlayer film, a resist layer is formed on an upper surface side of the resist underlayer film, and the resist layer is baked and exposed to form a resist pattern. Next, a desired pattern can be obtained by transferring the resist pattern to the resist underlayer film through etching and transferring the resist underlayer film pattern to the substrate.

A shape of a circuit whose dimension size is large is further processed using not only a substrate having a flat shape but also a substrate having an uneven structure preliminarily formed in a large circuit shape in order to form a more complex circuit, and a multi-patterning method for forming a fine circuit is introduced to the most advanced circuit forming process.

Such a resist underlayer film used in the multi-layer resist process is required to have optical characteristics such as an embedding property for an uneven portion of a substrate having an uneven structure, the flatness of a surface on a side where a resist is applied, optical properties such as a moderate refractive index and an extinction coefficient, and characteristics such as excellent etching resistance.

In recent years, pattern refinement has been further promoted in order to increase the degree of integration. In order to deal with such refinement, various examinations have been conducted on structures, functional groups, and the like of compounds used in materials for forming underlayer films (for example, see Patent Document 1).

Meanwhile, in the refinement for pattern formation in order to obtain a high degree of integration, the influence of irregular reflection or standing waves from a semiconductor substrate in a lithography step carried out using an ArF excimer laser which is a current mainstream has been a major problem. In order to solve this problem, materials with an anti-reflection function as a function required for an underlayer film have been widely examined. As a form in which the anti-reflection function is imparted to an underlayer film, a form in which an uneven structure of a surface of a substrate is embedded with a certain kind of a material and a bottom anti-reflective coating (BARC) is provided on a layer having a flatness or a form in which an anti-reflection function is imparted to a material to be embedded with an uneven structure of a surface of a substrate has been examined.

Particularly in the former material for forming the bottom anti-reflective coating, because of ease of use, various examinations have been conducted on an organic bottom anti-reflective coating formed of a polymer and the like having a light absorbing site. For example, Patent Document 2 discloses a resist underlayer film (bottom anti-reflective coating) which is not intermixed with a resist film formed on an upper layer and in which desired optical constants (a refractive index and an extinction coefficient) are obtained and a selection ratio of a large dry etching rate with respect to a resist film is obtained in a case of being exposed to an ArF excimer laser.

RELATED DOCUMENT

Patent Document

[Patent Document 1] Japanese Unexamined Patent Publication No. 2004-177668
[Patent Document 2] International Publication No. WO2009/008446

SUMMARY OF THE INVENTION

Technical Problem

Recently, the number of cases of forming finer patterns with multi-patterning according to a multi-layer resist method, using a substrate that has multiple types of trenches and particularly trenches having aspect ratios different from one another, that is, a substrate that has a finer uneven structure, has been increasing. In such cases, a resist layer formed on the uppermost layer is required to have a high flatness in order to accurately transfer the pattern on a reticle. In the recent trend of the pattern refinement, the film thickness of the resist layer has been decreased in order to avoid pattern collapse in a resist development step, and thus the resist layer is more strongly affected by the flatness of the underlayer film. Therefore, a resist underlayer film to be formed on a substrate having a surface structure into which a resin is unlikely to infiltrate as described above is formed such that these trenches are sufficiently embedded and is required to have a high flatness. In addition, it is considered that a material that does not generate volatile components (outgas) in a baking step after application is preferable.

According to the examination conducted by the present inventors, it was found that a material which satisfies the requirement for the flatness and does not generate volatile components is unlikely to be realized in materials for forming a resist underlayer film of the related art.

In addition, recently, a case where a plurality of fine patterns are formed at once by performing an exposure-development step once according to a multilayer resist method using a substrate in a state (referred to as a sparse and dense pattern) in which a region where fine uneven patterns are "sparse" and a region where fine uneven patterns are "dense" are mixed on the same substrate has been increasing. In such a case, the resist underlayer film is required to be flat without a difference in film thickness on a projection pattern at a portion where the region where the patterns are "sparse" is switched to the region where the patterns are "dense". The film thickness of the resist layer as the outermost layer has been decreasing as described above, and the difference in film thickness in a sparse and dense pattern switching region tends to directly lead to a difference in film thickness of the resist layer. In a case where the flatness of the resist layer is not sufficient, an out-of-focus region is formed in the exposure step, and thus an accurate pattern is unlikely to be formed on the entire surface of the substrate. Therefore, a resist underlayer film formed on a typical substrate where sparse and dense patterns are mixed as described above is required to have a uniform film thickness on a projection pattern over the entire surface of the substrate.

According to the examination conducted by the present inventors, it was found that a material with a uniform film thickness on a projection pattern over the entire surface of a substrate is unlikely to be realized in a case of using a material for forming a resist underlayer film in the related art.

As the result of examination conducted by the present inventors, it was found that the uneven shape of a substrate is particularly complex, the interval between projections is large, and the depth of a recess pattern portion is large at the time of formation of an underlayer film of the related art on the above-described substrate according to a solution casting method such as spin coating, and subtle unevenness is likely to remain on the surface in a case where a region where the uneven shape is sparse and a region where the uneven shape is dense are mixed on the substrate. The present inventors assumed that this was because the content of a solvent before being dried increases as the interval between projections and the depth of a recess pattern portion increase, and thus complex unevenness is easily formed not in a flat surface where the shape of the surface of the underlayer film is simple but in such a surface resulting from an increase in volumetric shrinkage during drying of the solvent.

Since the flatness accuracy of the resist underlayer film is likely to reflect on the performance of the final product, fine pattern formation using a substrate with a complex uneven shape according to a multilayer resist method may become a particularly important issue.

In the lithography that employs EUV (abbreviation for extreme ultraviolet, a wavelength of 13.5 nm) exposure which is another fine processing technology, particularly, generation of volatile components (outgas) of a material that forms a resist underlayer film for exposure to high energy ray of EUV light may become a major problem in addition to the embedding property of the related art even though there is no reflection from a substrate.

Further, in the lithography using EUV exposure, the depth of focus becomes shallower because the exposure wavelength is shortened from 193 nm of ArF dry or 134 nm of ArF liquid immersion which is the current mainstream, and thus slight unevenness of the surface of an outermost layer resist adversely affects accurate pattern formation. Therefore, the importance of the flatness of the resist surface is considered to increase.

The present invention has been made in consideration of the above-described circumstances, and an object thereof is to provide a resin material for forming an underlayer film which enables realization of a resist underlayer film having sufficient optical characteristics, etching resistance, excellent flatness, and a suppressed amount of volatile components generated. In addition, the object thereof is to provide a resin material for forming an underlayer film with a small difference in film thickness in the sparse and dense pattern and excellent uniformity of the film thickness on a projection pattern in a silicon wafer surface.

Further, another object of the present invention is to provide a resin material for forming an underlayer film, which enables formation of a resist underlayer film having an excellent embedding property for an uneven structure, sufficient optical characteristics, etching resistance, excellent flatness, and a suppressed amount of volatile components generated on a substrate having a complex shape.

Solution to Problem

According to the present invention, provided are a resin material for forming an underlayer film, a resist underlayer film, a method of producing a resist underlayer film, and a laminate described below.

According to the configuration of the present invention, since the temperature at an intersection between G' and G" satisfies the requirement for a specific temperature range, the problem is considered to be solved based on the following assumed reason.

In a case where an underlayer film is formed by spin coating or the like, in a high-temperature drying step during a film forming step, the surface of the film has a fluidity, the unevenness of the surface of the underlayer film caused by volumetric shrinkage resulting from solvent volatilization is alleviated due to the influence of the surface tension of the film material, the gravity, and the like, and thus the shape of the surface tends to be close to a planar shape. Therefore, an underlayer film with high surface accuracy can be stably produced.

[1]

A resin material for forming an underlayer film which is used to form a resist underlayer film used in a multi-layer resist process, the resin material including: a cyclic olefin polymer (I), in which a temperature at an intersection between a storage modulus (G') curve and a loss modulus (G") curve in a solid viscoelasticity of the resin material for forming an underlayer film as measured under conditions of a measurement temperature range of 30° C. to 300° C., a heating rate of 3° C./min, and a frequency of 1 Hz in a nitrogen atmosphere in a shear mode using a rheometer is higher than or equal to 40° C. and lower than or equal to 200° C.

[2]

The resin material for forming an underlayer film according to [1], in which the temperature at the intersection between the storage modulus (G') curve and the loss modulus (G") curve in the solid viscoelasticity of the resin material for forming an underlayer film as measured under the conditions of a measurement temperature range of 30° C. to 300° C., a heating rate of 3° C./min, and a frequency of 1 Hz in a nitrogen atmosphere in a shear mode using a rheometer is higher than or equal to 60° C. and lower than or equal to 200° C.

[3]

The resin material for forming an underlayer film according to [1] or [2], in which the cyclic olefin polymer (I) has a repeating structural unit [A] represented by Formula (1).

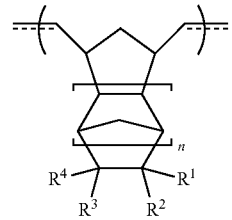

(1)

In Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2.

[4]

The resin material for forming an underlayer film according to [3], in which the cyclic olefin polymer (I) further has a repeating structural unit [B] represented by Formula (2).

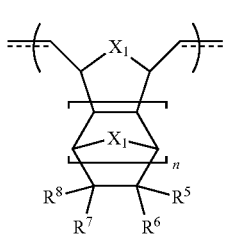

(2)

In Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—.

[5]

The resin material for forming an underlayer film according to [4], in which a molar ratio [A]/[B] of the structural unit [A] to the structural unit [B] in the cyclic olefin polymer (I) is greater than or equal to 5/95 and less than or equal to 95/5.

[6]

The resin material for forming an underlayer film according to any one of [1] to [5], further including: a thermoplastic resin (II) which is different from the cyclic olefin polymer (I).

[7]

The resin material for forming an underlayer film according to [6], in which the thermoplastic resin (II) contains at least one selected from an organic polymer having an aromatic ring structure and a (meth)acrylic polymer.

[8]

The resin material for forming an underlayer film according to [6] or [7], in which amass ratio (I/II) of the cyclic olefin polymer (I) to the thermoplastic resin (II) in the resin material for forming an underlayer film is greater than or equal to 5/95 and less than or equal to 85/15.

[9]

The resin material for forming an underlayer film according to any one of [6] to [8], in which a total amount of the cyclic olefin polymer (I) and the thermoplastic resin (II) in the resin material for forming an underlayer film is greater than or equal to 50% by mass and less than or equal to 100% by mass in a case where a total content of the resin material for forming an underlayer film is set to 100% by mass.

[10]

The resin material for forming an underlayer film according to any one of [1] to [9], in which an amount of a volatile component generated in the resin material for forming an underlayer film as measured using the following method 1 is greater than or equal to 0.0% by mass and less than or equal to 1.0% by mass in a case where a total amount of the resin material for forming an underlayer film is set to 100% by mass.

(method 1: the resin material for forming an underlayer film is dissolved in tetrahydrofuran to prepare a solution in which a concentration of the resin material for forming an underlayer film is 20% by mass, the obtained solution is weighed using an aluminum plate, heated at 200° C. for 3 minutes in a nitrogen flow such that the tetrahydrofuran is removed, and cooled to room temperature such that the resin material for forming an underlayer film is solidified, the resin material for forming an underlayer film is heated in a temperature range of 30° C. to 300° C. at a heating rate of 10° C./min in a nitrogen atmosphere, and the amount of the volatile component generated in the resin material for forming an underlayer film is calculated based on a weight reduction amount in a temperature range of 100° C. to 250° C.)

[11]

The resin material for forming an underlayer film according to any one of [1] to [10], in which a weight-average molecular weight (Mw) of the cyclic olefin polymer (I) in terms of polystyrene as measured using gel permeation chromatography is greater than or equal to 1000 and less than or equal to 20000.

[12]

The resin material for forming an underlayer film according to any one of [1] to [11], in which a refractive index (n value) of the resin material for forming an underlayer film at a wavelength of 193 nm as measured using the following method 2 is greater than or equal to 1.5 and less than or equal to 2.0.

(method 2: a coating film which is formed of the resin material for forming an underlayer film and has a thickness of 250 nm is formed on a silicon wafer, and the refractive index (n value) of the obtained coating film at a wavelength of 193 nm is set as the refractive index (n value) of the resin material for forming an underlayer film)

[13]

The resin material for forming an underlayer film according to any one of [1] to [12], in which an extinction coefficient (k value) of the resin material for forming an underlayer film as measured using the following method 3 is greater than or equal to 0.0001 and less than or equal to 0.5.

(method 3: a coating film which is formed of the resin material for forming an underlayer film and has a thickness of 250 nm is formed on a silicon wafer, and the extinction coefficient (k value) of the obtained coating film is set as the extinction coefficient (k value) of the resin material for forming an underlayer film)

[14]

The resin material for forming an underlayer film according to any one of [1] to [13], which is formed on an uneven structure of a substrate having the uneven structure and is used for an underlayer film for embedding a recess in the uneven structure.

[15]

The resin material for forming an underlayer film according to any one of [1] to [14], in which a content of a crosslinking agent in the resin material for forming an underlayer film is less than 5 parts by mass in a case where a total content of polymer components contained in the resin material for forming an underlayer film is set to 100 parts by mass.

[16]

A resist underlayer film including: the resin material for forming an underlayer film according to any one of [1] to [15].

[17]

A method of producing a resist underlayer film, including: a step of forming a coating film which contains the resin material for forming an underlayer film according to any one of [1] to [15] on a substrate.

[18]

The method of producing a resist underlayer film according to [17], further including: a step of heating the coating film.

[19]

A laminate including: a substrate; and a resist underlayer film containing the resin material for forming an underlayer film according to any one of [1] to [15], which is formed on one surface of the substrate.

[20]

The laminate according to [19], in which a flatness ($\Delta$FT) of a surface ($\alpha$) of the resist underlayer film on a side opposite to the substrate which is calculated using the following equation is greater than or equal to 0% and less than or equal to 5%.

$$\text{flatness}(\Delta FT)=[(H_{max}-H_{min})/H_{av}]\times 100(\%)$$

(where film thicknesses of the resist underlayer film are measured in ten optional sites of the surface ($\alpha$), an average value of these measured values is set as $H_{av}$, a maximum value in the film thicknesses of the resist underlayer film is set as $H_{max}$, and a minimum value in the film thicknesses of the resist underlayer film is set as $H_{min}$)

[21]

The laminate according to [19] or [20], in which an average value $H_{av}$ of the film thickness of the resist underlayer film is greater than or equal to 5 nm and less than or equal to 500 nm.

(where film thicknesses of the resist underlayer film are measured in ten optional sites of the surface ($\alpha$) of the resist underlayer film on the side opposite to the substrate, and the average value of these measured values is set as $H_{av}$)

[22]

The laminate according to any one of [19] to [21], in which the substrate has an uneven structure on at least one surface thereof, the resist underlayer film is formed on the uneven structure, the uneven structure has a height of greater than or equal to 5 nm and less than or equal to 500 nm, and an interval between projections is greater than or equal to 1 nm and less than or equal to 10 mm.

Advantageous Effects of Invention

According to the present invention, it is possible to provide a resin material for forming an underlayer film which enables realization of a resist underlayer film having sufficient optical characteristics, etching resistance, excellent flatness, and a suppressed amount of volatile components generated.

Further, the resin material for forming an underlayer film of the present invention enables formation of a resist underlayer film having an excellent embedding property for an uneven structure, sufficient optical characteristics, etching resistance, excellent flatness, and a suppressed amount of volatile components generated on a substrate having a complicated shape.

Further, the resin material for forming an underlayer film according to the present invention enables formation of a resist underlayer film with a small difference in film thickness in a sparse and dense pattern and excellent uniformity of the film thickness on a projection pattern in a silicon wafer surface on a substrate having a complex shape.

BRIEF DESCRIPTION OF THE DRAWINGS

The above-described objects, other objects, features, and advantages will become clearer based on preferred embodiments described below and the accompanying drawings.

DESCRIPTION OF EMBODIMENTS

Figure 1:
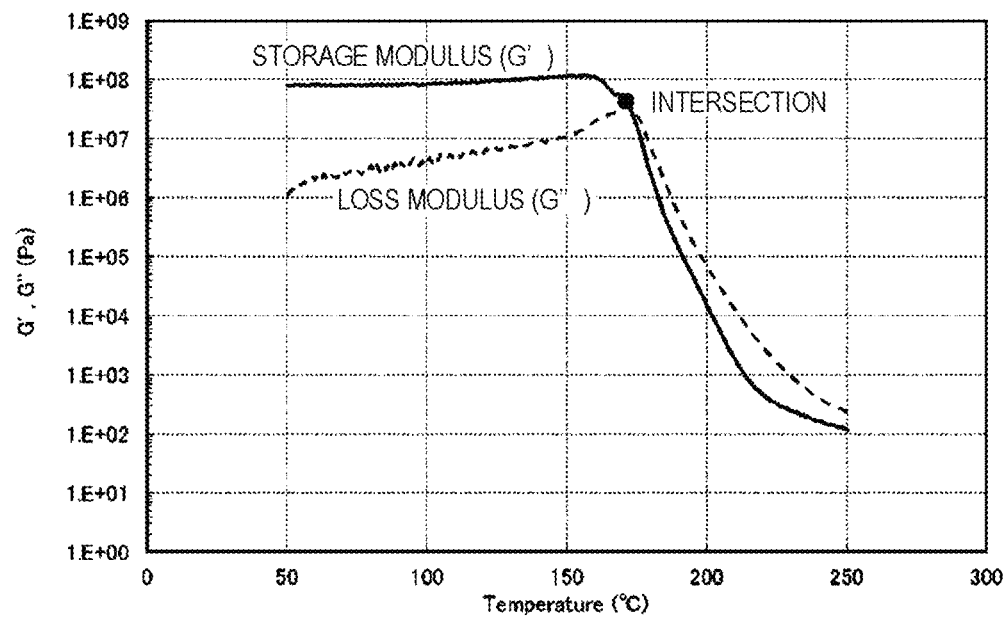
FIG. 1 shows a storage modulus (G') curve, a loss modulus (G") curve, and an intersection between these curves in measurement of the solid viscoelasticity of a polymer 1 described in Example 1.

Hereinafter, embodiments of the present invention will be described. Further, a numerical range of "A to B" indicates greater than or equal to A and less than or equal to B unless otherwise specified.

<Resin Material for Forming Underlayer Film>

A resin material for forming an underlayer film according to the present embodiment is a resin material for forming an underlayer film which is used to form a resist underlayer film used in a multi-layer resist process, the resin material including a cyclic olefin polymer (I), in which the temperature at an intersection between a storage modulus (G') curve and a loss modulus (G") curve in a solid viscoelasticity of the resin material for forming an underlayer film as measured under conditions of a measurement temperature range of 30° C. to 300° C. (alternatively, 50° C. to 250° C.), a heating rate of 3° C./min, and a frequency of 1 Hz in a nitrogen atmosphere in a shear mode using a rheometer is higher than or equal to 40° C. and lower than or equal to 200° C. (see FIGS. 1 and 2).

According to the present inventors, it is considered that in a case where the temperature at the intersection between the storage modulus (G') curve and the loss modulus (G") curve in the solid viscoelasticity of the resin material for forming an underlayer film is in the above-described range, the melt fluidity of the resin material for forming an underlayer film is in a suitable range, and thus occurrence of voids and the like at the time of embedding the uneven structure of the substrate can be suppressed and the embedding property in an excellent state while maintaining high flatness can be realized.

That is, the resin material for forming an underlayer film according to the present embodiment is formed on the uneven structure of the substrate having the uneven structure and can be particularly suitably used to form an underlayer film for embedding recesses in the uneven structure.

Here, the intersection between the storage modulus (G') curve and the loss modulus (G") curve can be used as a measure of showing a change of rheology of a substance (also referred to as a resin). Typically, the substance in a heating process up to the intersection exhibits characteristics as an elastic body, and the resin does not flow. Further, the substance exhibits characteristics as a viscous fluid by being further heated to a higher temperature through the intersection, and thus the resin flows. That is, the intersection between the storage modulus (G') curve and the loss modulus (G") curve has a technical significance in terms that the melt fluidity of the resin material for forming an underlayer film according to the present embodiment is exhibited.

The lower limit of the intersection between the storage modulus (G') curve and the loss modulus (G") curve is 40° C. or higher, preferably 60° C. or higher, more preferably 70° C. or higher, still more preferably 75° C. or higher, and particularly preferably 80° C. or higher.

Further, the upper limit of the intersection between the storage modulus (G') curve and the loss modulus (G") curve is 200° C. or lower, preferably 195° C. or lower, more preferably 190° C. or lower, still more preferably 180° C. or lower, even still more preferably 150° C. or lower, and particularly preferably 140° C. or lower.

In the case where the temperature at the intersection between the storage modulus (G') curve and the loss modulus (G") curve is in the above-described range, the resin material for forming an underlayer film according to the present embodiment can exhibit moderate fluidity required to uniformly embed the uneven structure of the surface of the substrate under a heating condition of 200° C. to 250° C. which has been typically used in a semiconductor device manufacturing step.

That is, in a case where the intersection between the storage modulus (G') curve and the loss modulus (G") curve is less than or equal to the above-described upper limit, the resin material for forming an underlayer film according to the present embodiment exhibits the characteristics as a viscous fluid, the resin flows, and the uneven surface of the substrate can be embedded in a more uniform state while defects such as voids are further suppressed.

Further, in a case where the intersection between the storage modulus (G') curve and the loss modulus (G") curve is greater than or equal to the above-described lower limit, the fluidity of the resin material for forming an underlayer film according to the present embodiment can be suppressed. As the result, shrinkage in the uneven surface of the substrate can be suppressed, and the uneven surface of the substrate can be embedded in a more uniform state while defects such as voids are further suppressed.

Figures 1, 3:
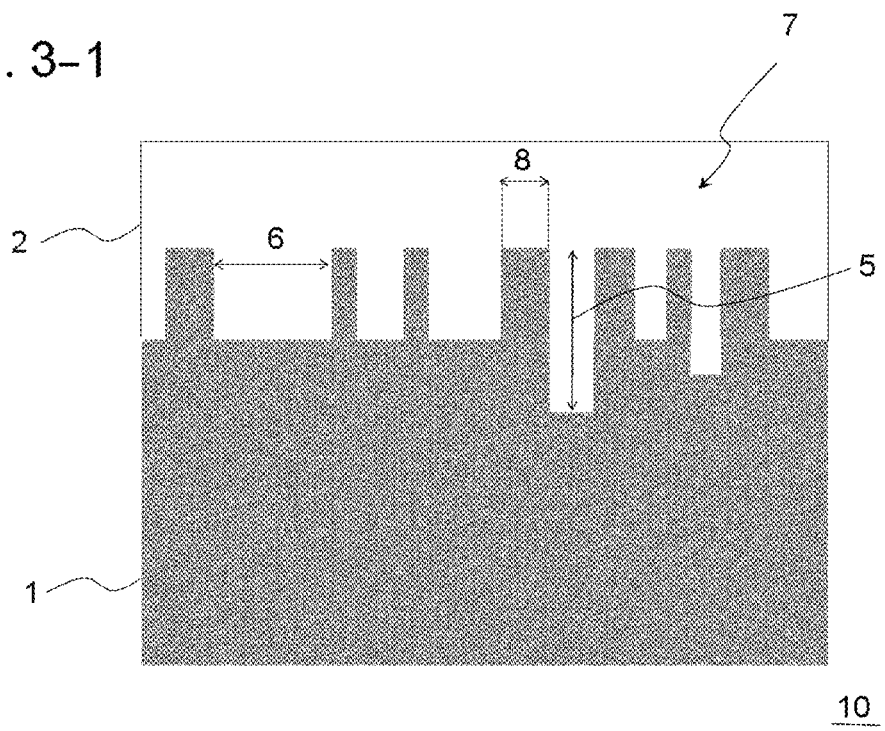
FIG. 3 shows schematic views for describing an uneven structure according to an embodiment of the present invention, in which the intervals between projections, the heights of projections, and the widths of projections are not uniform.
Figures 2, 3:
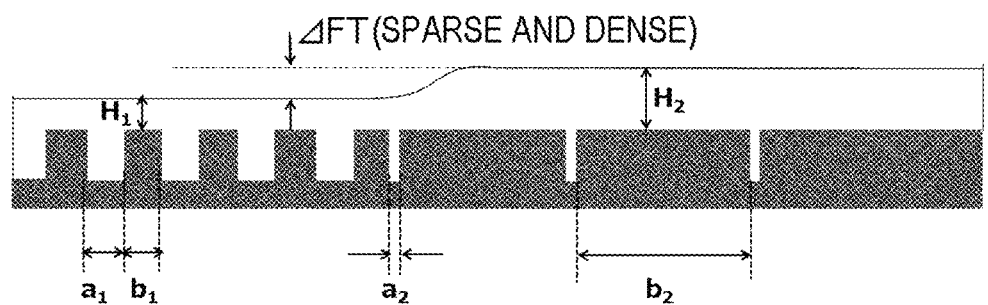

Here, in a case where a substrate 1 has an uneven structure 7 in which intervals 6 between projections, heights 5 of projections, and widths 8 of projections are not uniform as shown in FIG. 3, the film thickness of a resist underlayer film 2 tends to be non-uniform. However, according to the resin material for forming an underlayer film of the present embodiment, a resist underlayer film having sufficient optical characteristics, etching resistance, excellent flatness, and a suppressed amount of volatile components generated can be formed on the uneven structure 7 even in the case of the uneven structure 7 in which the intervals 6 between projections, the heights 5 of projections, and the widths 8 of projections are not uniform.

More specifically, in the case where the temperature at the intersection between the storage modulus (G') curve and the loss modulus (G") curve in the solid viscoelasticity of the resin material for forming an underlayer film is in the above-described range, the melt fluidity of the resin material for forming an underlayer film is in a suitable range, the resin flows such that the unevenness of the surface of the underlayer film caused by volumetric shrinkage resulting from solvent volatilization is alleviated, and thus the shape of the surface tends to be close to a planar shape in a high-temperature drying step during a film forming step in a case where an underlayer film is formed on a substrate as shown in FIG. 3-1 by spin coating or the like. Therefore, an underlayer film with high surface accuracy can be stably formed on the uneven structure 7.

The resin material for forming an underlayer film according to the present embodiment is a material for forming a layer to be disposed between a resist layer and a substrate (preferably a substrate having an uneven structure) in a step of manufacturing a semiconductor device. The layer to be disposed between the resist layer and the substrate is referred to as a resist underlayer film based on a resist layer formed of a resist material that typically transfers a mask pattern in a photolithography process. The surface of the substrate which comes into contact with the resist underlayer film may be in a state in which a coating film is formed of a low dielectric material, such as a silica ($SiO_2$) film, a SiCN film, a SiOC film obtained by doping silica ($SiO_2$) with carbon (C), a methylsiloxane-based organic film (SOG), or a silica insulating film in which minute holes having a size of several nanometers or less are uniformly distributed.

(Cyclic Olefin Polymer (I))

The cyclic olefin polymer (I) used in the present embodiment is not particularly limited as long as the polymer is dissolved in an organic solvent in a temperature range of room temperature to 50° C. and preferably at room temperature. As the organic solvent, a solvent selected from the group consisting of an alcohol-based solvent, an ether-based solvent, a ketone-based solvent, an amide-based solvent, an ester-based solvent, and a cyclic hydrocarbon-based solvent is preferable. Among these, an alcohol-based solvent, an ether-based solvent, a ketone-based solvent, an amide-based solvent, or an ester-based solvent is more preferable, and an ether-based solvent, a ketone-based solvent, an amide-based solvent, or an ester-based solvent is still more preferable. A solvent having a polyether monoester structure is particularly preferable.

More specific preferred examples of the cyclic olefin polymer (I) according to the present embodiment include a cyclic olefin polymer having a norbornane skeleton or a tetracyclododecane skeleton. Further, it is preferable that the cyclic olefin polymer has a substituent having heteroatoms contained in the above-described organic solvent. Preferred examples of the substituent having heteroatoms include an alkoxy group, an aryloxy group, an alkoxyalkyl group, an aryloxyalkyl group, an alkoxycarbonyl group, a dialkylaminocarbonyl group, an aryloxycarbonyl group, an alkylaryl-laminocarbonyl group, an alkoxycarbonylalkyl group, an alkoxycarbonylaryl group, an aryloxycarbonylalkyl group, an alkoxyalkyloxycarbonyl group, and an alkoxycarbonylalkyloxycarbonyl group. As the substituent, the above-described ester groups are particularly preferable.

As other examples of the cyclic olefin polymer (I) according to the present embodiment, those having a repeating structural unit [A] represented by Formula (1) are preferable, and those having the repeating structural unit [A] represented by Formula (1) and a repeating structural unit [B] represented by Formula (2) are more preferable.

As the cyclic olefin polymer (I) according to the present embodiment, those having a wide range of glass transition temperatures are present. The glass transition temperature thereof is preferably in a range of 40° C. to 220° C., more preferably in a range of 50° C. to 220° C., still more preferably in a range of 60° C. to 200° C., and even still more preferably in a range of 70° C. to 180° C.

In a case where the resin material for forming an underlayer film according to the present embodiment contains the cyclic olefin polymer (I) having the repeating structural unit [A] represented by Formula (1) and the repeating structural unit [B] represented by Formula (2), it is possible to form a resist underlayer film having sufficient optical characteristics, etching resistance, excellent flatness, and a suppressed amount of volatile components generated by being heated.

The cyclic olefin polymer (I) having the repeating structural unit [A] and the repeating structural unit [B] is considered to have excellent compatibility with a thermoplastic resin (II) described below, it is advantageous to obtain an underlayer film forming material with an excellent planarization effect and the like in some cases. Even in a case where the cyclic olefin polymer (I) has a particularly high glass transition temperature, an excellent planarization effect is exhibited in some cases. The glass transition temperature of the cyclic olefin polymer (I) in a case of being used in combination with the thermoplastic resin (II) is preferably higher than or equal to 120° C. and lower than or equal to 200° C. The lower limit thereof is preferably 125° C. or higher and more preferably 128° C. or higher. The upper limit thereof is preferably 190° C. or lower and more preferably 180° C. or lower.

It is particularly preferable that the resin material for forming an underlayer film according to the present embodiment is obtained by using the cyclic olefin polymer (I) having the repeating structural unit [B].

In a case where the cyclic olefin polymer (I) according to the present embodiment has the repeating structural unit [A] represented by Formula (1) and the repeating structural unit [B] represented by Formula (2), the molar ratio [A]/[B] of the structural unit [A] to the structural unit [B] in the cyclic olefin polymer (I) is preferably greater than or equal to 5/95 and less than or equal to 95/5, more preferably greater than or equal to 7/93 and less than or equal to 93/7, and still more preferably greater than or equal to 10/90 and less than or equal to 90/10.

According to the present inventors, it is considered that in a case where the composition of the cyclic olefin polymer (I) is in the above-described range, the density of elements such as oxygen and sulfur in the main chain of the polymer is in a suitable range, appropriate adhesiveness to the interface of the substrate can be exhibited at the time of embedding the uneven structure of the substrate, occurrence of voids and the like can be further suppressed, and the embedding property in an excellent state while maintaining higher flatness can be realized. Further, the interaction with the substrate due to the presence of elements such as oxygen and sulfur in the main chain of the cyclic olefin polymer (I) is assumed to become a driving force for the cyclic olefin polymer (I) to enter the fine uneven structure.

In the present embodiment, the repeating structural unit [A] represented by Formula (1) and the repeating structural unit [B] represented by Formula (2) are represented by the following formulae. Here, the dotted lines in the main chain portions in Formulae (1) and (2) each indicate one covalent bond constituting a double bond or a state in which a double bond is hydrogenated and one covalent bond constituting the double bond is lost.

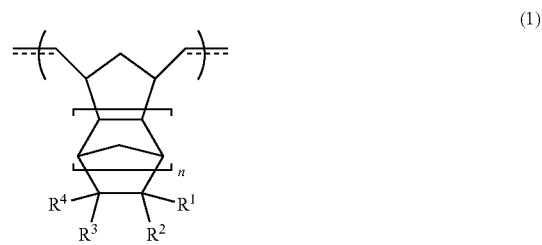

(1)

In Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms (preferably 2 to 10 carbon atoms), a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms (preferably 3 to 20 carbon atoms), an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms (preferably 4 to 20 carbon atoms), $R^1$ to $R^4$ may be bonded to one another to form a ring structure, and n represents an integer of 0 to 2.

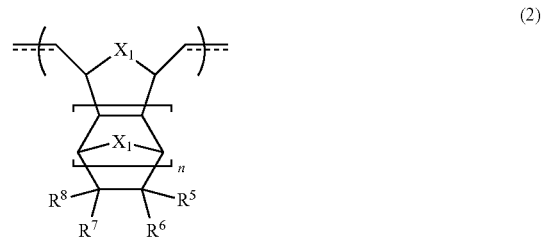

(2)

In Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms (preferably 2 to 10 carbon atoms), a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms (preferably 3 to 20 carbon atoms), an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms (preferably 4 to 20 carbon atoms), $R^5$ to $R^8$ may be bonded to one another to form a ring structure, n represents an integer of 0 to 2, and $X_1$ represents —O— or —S—.

Examples of the alkyl group having 1 to 10 carbon atoms as $R^1$ to $R^4$ in Formula (1) include a methyl group, an ethyl group, an n-propyl group, an i-propyl group, an n-butyl group, a tert-butyl group, an n-pentyl group, a cyclopentyl group, a cyclohexyl group, and a cyclooctyl group. Examples of the aryl group having 6 to 20 carbon atoms include a phenyl group, a naphthyl group, an anthracenyl group, an o-tolyl group, an m-tolyl group, a p-tolyl group, a biphenyl group, and a phenol group. Examples of the alkoxy group having 1 to 10 carbon atoms include a methoxy group, an ethoxy group, an n-propoxy group, an i-propoxy group, an n-butoxy group, a tert-butoxy group, an n-pentoxy group, a cyclopentoxy group, a cyclohexyloxy group, and a cyclooctyloxy group. Examples of the aryloxy group having 6 to 20 carbon atoms include a phenyloxy group, a naphthyloxy group, an anthracenyloxy group, an o-tolyloxy group, an m-tolyloxy group, a p-tolyloxy group, a 4-oxy-1,1'-biphenyl group, and a 4-hydroxyphenyloxy group. Examples of the alkoxyalkyl group having 2 to 10 carbon atoms include a methoxymethyl group, a methoxyethyl group, an ethoxymethyl group, an ethoxyethyl group, an n-propoxymethyl group, an isopropoxymethyl group, an n-butoxymethyl group, an isobutoxymethyl group, a tert-butoxymethyl group, a cyclopentyloxymethyl group, a cyclohexyloxymethyl group, and a cyclooctyloxymethyl group. Examples of the aryloxyalkyl group having 7 to 20 carbon atoms include a phenyloxymethyl group, a naphthyloxymethyl group, an anthracenyloxymethyl group, an o-tolyloxymethyl group, an m-tolyloxymethyl group, a p-tolyloxymethyl group, a 4-oxy-1,1'-biphenylmethyl group, and a 4-hydroxyphenyloxymethyl group. Examples of the alkoxycarbonyl group having 2 to 20 carbon atoms include a methoxycarbonyl group, an ethoxycarbonyl group, an n-propoxycarbonyl group, an n-butoxycarbonyl group, an isobutoxycarbonyl group, a tert-butoxycarbonyl group, an n-pentyloxycarbonyl group, a cyclopentyloxycarbonyl group, an n-hexyloxycarbonyl group, a cyclohexyloxycarbonyl group, a 3-methylbutoxycarbonyl group, a 2-methylpentoxycarbonyl group, a 3-methylpentoxycarbonyl group, a 4-methylpentoxycarbonyl group, a 1-ethylcyclopentyloxycarbonyl group, a 1-methylcyclohexyloxycarbonyl group, a norbornyloxycarbonyl group, and an adamantyloxycarbonyl group. Examples of the dialkylaminocarbonyl group having 3 to 10 carbon atoms include a dimethylaminocarbonyl group, a diethylaminocarbonyl group, an ethylmethylaminocarbonyl group, a methylbutylaminocarbonyl group, a butylethylaminocarbonyl group, and a cyclohexylmethylaminocarbonyl group. Examples of the aryloxycarbonyl group having 7 to 20 carbon atoms include a phenoxycarbonyl group, a benzyloxycarbonyl group, a 4-methylphenoxycarbonyl group, a 3,4-dimethylphenoxycarbonyl group, a 1-naphthoxycarbonyl group, a 2-naphthoxycarbonyl group, and a 1-anthracenoxycarbonyl group. Examples of the alkylarylaminocarbonyl group having 8 to 20 carbon atoms include a methylphenylaminocarbonyl group, an ethylphenylaminocarbonyl group, a butylphenylaminocarbonyl group, and a cyclohexylphenylaminocarbonyl group. Examples of the alkoxycarbonylalkyl group having 3 to 30 carbon atoms include a methoxycarbonylmethyl group, a methoxycarbonylethyl group, an ethoxycarbonylmethyl group, an ethoxycarbonylethyl group, an n-propoxycarbonylmethyl group, an i-propoxycarbonylmethyl group, an n-butoxycarbonylmethyl group, a tert-butoxycarbonylmethyl group, an n-pentyloxycarbonylmethyl group, a cyclopentyloxycarbonylmethyl group, an n-hexyloxycarbonylmethyl group, a cyclohexyloxycarbonylmethyl group, an n-octyloxycarbonylmethyl group, a cyclooctyloxycarbonylmethyl group, a 1-ethylcyclopentyloxycarbonylmethyl group, and a 1-methylcyclohexyloxycarbonylmethyl group. Examples of the alkoxycarbonylaryl group having 8 to 30 carbon atoms include a methoxycarbonylphenyl group, a methoxycarbonyl-o-tolyl group, a methoxycarbonyl-m-tolyl group, a methoxycarbonyl-p-tolyl group, a methoxycarbonylsilyl group, a methoxycarbonyl-a-naphthyl group, a methoxycarbonyl-β-naphthyl group, an ethoxycarbonylphenyl group, a propoxycarbonylphenyl group, a butoxycarbonylphenyl group, an ethoxycarbonylphenyl group, an n-propoxycarbonylphenyl group, an i-propoxycarbonylphenyl group, an n-butoxycarbonylphenyl group, a tert-butoxycarbonylphenyl group, an n-pentyloxycarbonylphenyl group, a cyclopentyloxycarbonylphenyl group, an n-hexyloxycarbonylphenyl group, a cyclohexyloxycarbonylphenyl group, an n-octyloxycarbonylphenyl group, a cyclooctyloxycarbonylphenyl group, a 1-ethylcyclopentyloxycarbonylphenyl group, a 1-methylcyclohexyloxycarbonylphenyl group, a methoxycarbonylnaphthyl group, a methoxycarbonylethyl group, an ethoxycarbonylnaphthyl group, an n-propoxycarbonylnaphthyl group, an i-propoxycarbonylnaphthyl group, an n-butoxycarbonylnaphthyl group, a tert-butoxycarbonylnaphthyl group, an n-pentyloxycarbonylnaphthyl group, a cyclopentyloxycarbonylnaphthyl group, an n-hexyloxycarbonylnaphthyl group, a cyclohexyloxycarbonylnaphthyl group, an n-octyloxycarbonylnaphthyl group, a cyclooctyloxycarbonylnaphthyl group, a 1-ethylcyclopentyloxycarbonylnaphthyl group, and a 1-methylcyclohexyloxycarbonylnaphthyl group. Examples of the aryloxycarbonylalkyl group having 8 to 20 carbon atoms include a phenoxycarbonylmethyl group, a benzyloxycarbonylmethyl group, a 4-methylphenoxycarbonylmethyl group, a 3,4-dimethylphenoxycarbonylmethyl group, a 1-naphthoxycarbonylmethyl group, a 2-naphthoxycarbonylmethyl group, and a 1-anthracenoxycarbonylmethyl group. Examples of the alkoxyalkyloxycarbonyl group having 3 to 20 carbon atoms include a methoxymethyloxycarbonyl group, an ethoxymethyloxycarbonyl group, an n-propoxymethyloxycarbonyl group, an isopropoxymethyloxycarbonyl group, an n-butoxymethyloxycarbonyl group, a tert-butoxymethyloxycarbonyl group, a cyclopentyloxymethyloxycarbonyl group, a cyclohexyloxymethyloxycarbonyl group, a cyclooctyloxymethyloxycarbonyl group, a norbornyloxymethyloxycarbonyl group, a 1-methylcyclopentyloxymethyloxycarbonyl group, a 1-ethylcyclopentyloxymethyloxycarbonyl group, a 1-methylcyclohexyloxymethyloxycarbonyl group, a 1-methylnorbornyloxymethyloxycarbonyl group, a 1-ethylnorbornyloxymethyloxycarbonyl group, a 1-ethoxypropyloxymethyloxycarbonyl group, a 1-ethoxy-1-methylethyloxymethyloxycarbonyl group, a tetrahydrofuran-2-yloxymethyloxycarbonyl group, a tetrahydropyran-2-yloxymethyloxycarbonyl group, a 1-adamantyloxymethyloxycarbonyl group, and a 2-adamantyloxymethyloxycarbonyl group. Examples of the alkoxycarbonylalkyloxycarbonyl group having 4 to 30 carbon atoms include a methoxycarbonylmethyloxycarbonyl group, an ethoxycarbonylmethyloxycarbonyl group, an n-propoxycarbonylmethyloxycarbonyl group, an isopropoxycarbonylmethyloxycarbonyl group, an n-butoxycarbonylmethyloxycarbonyl group, a tert-butoxycarbonylmethyloxycarbonyl group, a cyclopentyloxycarbonylmethyloxycarbonyl group, a cyclohexyloxycarbonylmethyloxycarbonyl group, a cyclooctyloxycarbonylmethyloxycarbonyl group, a norbornyloxycarbonylmethyloxycarbonyl group, a 1-methylcyclopentyloxycarbonylmethyloxycarbonyl group, a 1-ethylcyclopentyloxycarbonylmethyloxycarbonyl group, a 1-methylcyclohexyloxycarbonylmethyloxycarbonyl group, a 1-methylnorbornyloxycarbonylmethyloxycarbonyl group, a 1-ethylnorbornyloxycarbonylmethyloxycarbonyl group, a 1-ethoxypropyloxycarbonylmethyloxycarbonyl group, a 1-ethoxy-1-methylethyloxycarbonylmethyloxycarbonyl group, a tetrahydrofuran-2-yloxycarbonylmethyloxycarbonyl group, a tetrahydropyran-2-yloxycarbonylmethyloxycarbonyl group, a 1-adamantyloxycarbonylmethyloxycarbonyl group, and a 2-adamantyloxycarbonylmethyloxycarbonyl group.

Further, $R^1$ to $R^4$ may form a ring structure. Specifically, $R^1$ to $R^4$ are each independently bonded to one another or at least two of these are bonded to each other to form a ring structure optionally through a —C— bond, a —O— bond, or a —$NR^9$— bond. Examples thereof include a cyclic alkyl structure, a cyclic ester structure, a cyclic acid anhydride structure, a cyclic amide structure, and a cyclic imide structure.

In a case where at least two of $R^1$ to $R^4$ form a cyclic alkyl structure through a —C— bond, examples of the structure include cyclopentyl, cyclohexyl, and cyclopentyl. In a case where a cyclic ester structure is formed through a —O— bond, examples of the structure include γ-butyrolactone and δ-valerolactone. In a case of a cyclic acid anhydride structure, a maleic anhydride structure is exemplified. In a case where a lactam ring is formed through a —$NR^9$— bond, γ-lactam and δ-lactam are exemplified. In a case where a maleimide ring which is a lactam ring or a cyclic imide structure is formed, $R^9$ on a nitrogen atom may represent an alkyl group having 1 to 10 carbon atoms or an aryl group having 6 to 20 carbon atoms. Examples of the alkyl group having 1 to 10 carbon atoms include a methyl group, an ethyl group, an n-propyl group, an i-propyl group, an n-butyl group, a tert-butyl group, a 1-methylbutyl group, a 2-methylbutyl group, a n-pentyl group, a 1-methylpentyl group, a 1-ethylbutyl group, a 2-methylhexyl group, a 2-ethylhexyl group, a 4-methylheptyl group, a cyclopentyl group, a cyclohexyl group, and a cyclooctyl group. Examples of the aryl group having 6 to 20 carbon atoms include phenyl, naphthyl, anthracenyl, o-tolyl, m-tolyl, p-tolyl, biphenyl, and phenol. Among these, it is preferable that R1 to R4 in Formula (1) represent an alkoxycarbonyl group, an aryloxycarbonyl group, an alkoxycarbonylalkyl group, an alkoxycarbonylaryl group, an alkoxyalkyloxycarbonyl group, an alkoxycarbonylalkyloxycarbonyl group, a γ-butyrolactone ring, maleic anhydride, or a maleimide ring.

Further, $X_1$ indicates a structure derived from an element selected from oxygen and sulfur. A structure derived from oxygen is preferable. As described above, it is considered that the resin material for forming an underlayer film according to the present embodiment, which contains the cyclic olefin polymer (I) having the repeating structural unit [B] represented by Formula (2) in which $X_1$ satisfies the above-described definition, is capable of exhibiting appropriate adhesiveness to the interface of the substrate at the time of embedding the uneven structure of the substrate, suppressing occurrence of voids and the like, and realizing the embedding property in an excellent state while maintaining high flatness. Further, the interaction with the substrate due to the presence of elements such as oxygen and sulfur in the main chain of the cyclic olefin polymer (I) is assumed to become a driving force for the cyclic olefin polymer (I) to enter the fine uneven structure.

The cyclic olefin polymer (I) according to the present embodiment may have two or more structural units in which at least one of $R^1$ to $R^4$ in the repeating structural unit [A] represented by Formula (1) is different from the rest.

In the repeating structural unit [A] represented by Formula (1) according to the present embodiment, examples of the cyclic olefin polymer in which n represents 0 include poly(bicycle[2.2.1]hept-2-ene) in a case where all of $R^1$ to $R^4$ represent hydrogen; poly(5-methyl-bicyclo[2.2.1]hept-2-ene), poly(5-ethyl-bicyclo[2.2.1]hept-2-ene), poly(5-(n-propyl)-bicyclo[2.2.1]hept-2-ene), poly(5-(i-propyl)-bicyclo[2.2.1]hept-2-ene), poly(5-(n-butyl)-bicyclo[2.2.1]hept-2-ene), poly(5-(tert-butyl)-bicyclo[2.2.1]hept-2-ene), poly(5-(n-pentyl)-bicyclo[2.2.1]hept-2-ene), poly(5-cyclopentyl-bicyclo[2.2.1]hept-2-ene), poly(5-cyclohexyl-bicyclo[2.2.1]hept-2-ene), and poly(5-cyclooctyl-bicyclo[2.2.1]hept-2-ene) in a case where at least one of $R^1$ to $R^4$ represents an alkyl group; poly(5-phenyl-bicyclo[2.2.1]hept-2-ene), poly(5-naphthyl-bicyclo[2.2.1]hept-2-ene), poly(5-anthracenyl-bicyclo[2.2.1]hept-2-ene), poly(5-(o-tolyl)-bicyclo[2.2.1]hept-2-ene), poly(5-(m-tolyl)-bicyclo[2.2.1]hept-2-ene), poly(5-p-tolyl)-bicyclo[2.2.1]hept-2-ene), poly(5-biphenyl-bicyclo[2.2.1]hept-2-ene), and poly(5-(4-hydroxyphenyl)-bicyclo[2.2.1]hept-2-ene) in a case where at least one of $R^1$ to $R^4$ represents an aryl group; poly(5-methoxy-bicyclo[2.2.1]hept-2-ene), poly(5-ethoxy-bicyclo[2.2.1]hept-2-ene), poly(5-(n-propoxy)-bicyclo[2.2.1]hept-2-ene), poly(5-(i-propoxy)-bicyclo[2.2.1]hept-2-ene), poly(5-(n-butoxy)-bicyclo[2.2.1]hept-2-ene), poly(5-(tert-butoxy)-bicyclo[2.2.1]hept-2-ene), poly(5-(n-pentoxy)-bicyclo[2.2.1]hept-2-ene), poly(5-cyclopentyloxy-bicyclo[2.2.1]hept-2-ene), poly(5-cyclohexyloxy-bicyclo[2.2.1]hept-2-ene), and poly(5-cyclooctyloxy-bicyclo[2.2.1]hept-2-ene) in a case where at least one of $R^1$ to $R^4$ represents an alkoxy group; poly(5-phenyloxy-bicyclo[2.2.1]hept-2-ene), poly(5-naphthyloxy-bicyclo[2.2.1]hept-2-ene), poly(5-anthracenyloxy-bicyclo[2.2.1]hept-2-ene), poly(5-(o-tolyloxy)-bicyclo[2.2.1]hept-2-ene), poly(5-(m-tolyloxy)-bicyclo[2.2.1]hept-2-ene), poly(5-(p-tolyloxy)-bicyclo[2.2.1]hept-2-ene), poly(5-(4-oxy-1,1'-biphenyl)-bicyclo[2.2.1]hept-2-ene), and (5-(4-hydroxyphenyloxy)-bicyclo[2.2.1]hept-2-ene) in a case where at least one of $R^1$ to $R^4$ represents an aryloxy group; poly(5-methoxymethyl-bicyclo[2.2.1]hept-2-ene), poly(5-methoxyethyl-bicyclo[2.2.1]hept-2-ene), poly(5-ethoxymethyl-bicyclo[2.2.1]hept-2-ene), poly(5-ethoxyethyl-bicyclo[2.2.1]hept-2-ene), poly(5-(n-propoxymethyl)-bicyclo[2.2.1]hept-2-ene), poly(5-isopropoxymethyl-bicyclo[2.2.1]hept-2-ene), poly(5-(n-butoxymethyl)-bicyclo[2.2.1]hept-2-ene), poly(5-isobutoxymethyl-bicyclo[2.2.1]hept-2-ene), poly(5-(tert-butoxymethyl)-bicyclo[2.2.1]hept-2-ene), poly(5-cyclopentyloxymethyl-bicyclo[2.2.1]hept-2-ene), poly(5-cyclohexyloxymethyl-bicyclo[2.2.1]hept-2-ene), poly(5-cyclooctyloxymethyl-bicyclo[2.2.1]hept-2-ene) in a case where at least one of $R^1$ to $R^4$ represents an alkoxyalkyl group; poly(5-phenyloxymethyl-bicyclo[2.2.1]hept-2-ene), poly(5-naphthyloxymethyl-bicyclo[2.2.1]hept-2-ene), poly(5-anthracenyloxymethyl-bicyclo[2.2.1]hept-2-ene), poly(5-(o-tolyloxymethyl)-bicyclo[2.2.1]hept-2-ene), poly(5-(m-tolyloxymethyl)-bicyclo[2.2.1]hept-2-ene), poly(5-p-tolyloxymethyl)-bicyclo[2.2.1]hept-2-ene), poly(5-(4-oxy-1,1'-biphenylmethyl)-bicyclo[2.2.1]hept-2-ene), and poly(5-(4-hydroxyphenyloxymethyl)-bicyclo[2.2.1]hept-2-ene) in a case where at least one of $R^1$ to $R^4$ represents an aryloxyalkyl group; poly(5-methoxycarbonyl-bicyclo[2.2.1]hept-2-ene), poly(5-ethoxycarbonyl-bicyclo[2.2.1]hept-2-ene), poly(5-(n-propoxycarbonyl)-bicyclo[2.2.1]hept-2-ene), poly(5-(n-butoxycarbonyl)-bicyclo[2.2.1]hept-2-ene), poly(5-isobutoxycarbonyl-bicyclo[2.2.1]hept-2-ene), poly(5-(tert-butoxycarbonyl)-bicyclo[2.2.1]hept-2-ene), poly(5-(n-pentyloxycarbonyl)-bicyclo[2.2.1]hept-2-ene), poly(5-(2-methyl-2-pentyloxycarbonyl)-bicyclo[2.2.1]hept-2-ene), poly(5-(3-methyl-3-pentyloxycarbonyl)-bicyclo[2.2.1]hept-2-ene), poly(5-(2-ethyl-3-methyl-3-pentyloxycarbonyl)-bicyclo[2.2.1]hept-2-ene), poly(5-cyclopentyloxycarbonyl-bicyclo[2.2.1]hept-2-ene), poly(5-(n-hexyloxycarbonyl)-bicyclo[2.2.1]hept-2-ene), poly(5-cyclohexyloxycarbonyl-bicyclo[2.2.1]hept-2-ene), poly(5-(2-methyl-2-butoxycarbonyl)-bicyclo[2.2.1]hept-2-ene), poly(5-(2,3-dimethyl-2-butoxycarbonyl)-bicyclo[2.2.1]hept-2-ene), poly(5-(2,3,3-trimethyl-2-butoxycarbonyl)-bicyclo[2.2.1]hept-2-ene), poly(5-(2-methyl-2-hexyloxycarbonyl)-bicyclo[2.2.1]hept-2-ene), poly(5-(3,4-dimethyl-3-hexyloxycarbonyl)-bicyclo[2.2.1]hept-2-ene), poly(5-(3-methylbutoxycarbonyl)-bicyclo[2.2.1]hept-2-ene), poly(5-(2-methylpentoxycarbonyl)-bicyclo[2.2.1]hept-2-ene), poly(5-(3-methylpentoxycarbonyl)-bicyclo[2.2.1]hept-2-ene), poly(5-(4-methylpentoxycarbonyl)-bicyclo[2.2.1]hept-2-ene), poly(5-(3-methyl-3-heptyloxycarbonyl)-bicyclo[2.2.1]hept-2-ene), poly(5-(2-cyclopentyl-2-propoxycarbonyl)-bicyclo[2.2.1]hept-2-ene), poly(5-(2-cyclohexyl-2-propoxycarbonyl)-bicyclo[2.2.1]hept-2-ene), poly(5-(2-norbornyl-2-propoxycarbonyl)-bicyclo[2.2.1]hept-2-ene), poly(5-(1,1-dicyclopentylethoxycarbonyl)-bicyclo[2.2.1]hept-2-ene), poly(5-(1,1-dicyclohexylethoxycarbonyl)-bicyclo[2.2.1]hept-2-ene), poly(5-(1-methylcyclopentyloxycarbonyl)-bicyclo[2.2.1]hept-2-ene), poly(5-(1-ethylcyclopentyloxycarbonyl)-bicyclo[2.2.1]hept-2-ene), poly(5-(1-methylcyclohexyloxycarbonyl)-bicyclo[2.2.1]hept-2-ene), poly(5-(1-ethylcyclohexyloxycarbonyl)-bicyclo[2.2.1]hept-2-ene), poly(5-(1-methylcyclooctyloxycarbonyl)-bicyclo[2.2.1]hept-2-ene), poly(5-(1-ethylcyclooctyloxycarbonyl)-bicyclo[2.2.1]hept-2-ene), poly(5-(1-adamantyloxycarbonyl)-bicyclo[2.2.1]hept-2-ene), poly(5-(2-methyl-2-adamantyloxycarbonyl)-bicyclo[2.2.1]hept-2-ene), poly(5-(2-ethyl-2-adamantyloxycarbonyl)-bicyclo[2.2.1]hept-2-ene), poly(5-(1-methyldecahydronaphthalene-1-yloxycarbonyl)-bicyclo[2.2.1]hept-2-ene), poly(5-(1-ethyldecahydronaphthalene-1-yloxycarbonyl)-bicyclo[2.2.1]hept-2-ene), poly(5-(2-methyldecahydronaphthalene-2-yloxycarbonyl)-bicyclo[2.2.1]hept-2-ene), poly(5-(2-ethyldecahydronaphthalene-2-yloxycarbonyl)-bicyclo[2.2.1]hept-2-ene), poly(5-(2-methyl-2-norbornyloxycarbonyl)-bicyclo[2.2.1]hept-2-ene), poly(5-(2-ethyl-2-norbornyloxycarbonyl)-bicyclo[2.2.1]hept-2-ene), poly(5-(2,7,7-trimethyl-2-norbornyloxycarbonyl)-bicyclo[2.2.1]hept-2-ene), poly(5-(2-ethyl-7,7-dimethyl-2-norbornyloxycarbonyl)-bicyclo[2.2.1]hept-2-ene), poly(5-(5-methyl-octahydro-4,7-methano-indene-5-yloxycarbonyl)-bicyclo[2.2.1]hept-2-ene), poly(5-(5-ethyl-octahydro-4,7-methano-indene-5-yloxycarbonyl)-bicyclo[2.2.1]hept-2-ene), poly(5-(4-methyl-tetracyclo[6.2.1.1$^{3,6}$.0$^{2,7}$]-dodecane-4-yloxycarbonyl)-bicyclo[2.2.1]hept-2-ene), and poly(5-(4-ethyl-tetracyclo[6.2.1.1$^{3,6}$.0$^{2,7}$]-dodecane-4-yloxycarbonyl)-bicyclo[2.2.1]hept-2-ene) in a case where at least one of $R^1$ to $R^4$ represents an alkoxycarbonyl group; poly(5-dimethylaminocarbonyl-bicyclo[2.2.1]hept-2-ene), poly(5-diethylaminocarbonyl-bicyclo[2.2.1]hept-2-ene), poly(5-ethylmethylaminocarbonyl-bicyclo[2.2.1]hept-2-ene), poly(5-methylbutylaminocarbonyl-bicyclo[2.2.1]hept-2-ene), poly(5-butylethylaminocarbonyl-bicyclo[2.2.1]hept-2-ene), and poly(5-cyclohexylmethylaminocarbonyl-bicyclo[2.2.1]hept-2-ene) in a case where at least one of $R^1$ to $R^4$ represents a dialkylaminocarbonyl group; poly(5-phenoxycarbonyl-bicyclo[2.2.1]hept-2-ene), poly(5-benzyloxycarbonyl-bicyclo[2.2.1]hept-2-ene), poly(5-(4-methylphenoxycarbonyl)-bicyclo[2.2.1]hept-2-ene), poly(5-(3,4-dimethylphenoxycarbonyl)-bicyclo[2.2.1]hept-2-ene), poly(5-(1-naphthoxycarbonyl)-bicyclo[2.2.1]hept-2-ene), poly(5-(2-naphthoxycarbonyl)-bicyclo[2.2.1]hept-2-ene), and poly(5-(1-anthracenoxycarbonyl)-bicyclo[2.2.1]hept-2-ene) in a case where at least one of $R^1$ to $R^4$ represents an aryloxycarbonyl group; poly(5-methylphenylaminocarbonyl-bicyclo[2.2.1]hept-2-ene), poly(5-ethylphenylaminocarbonyl-bicyclo[2.2.1]hept-2-ene), poly(5-butylphenylaminocarbonyl-bicyclo[2.2.1]hept-2-ene), and poly(5-cyclohexylphenylaminocarbonyl-bicyclo[2.2.1]hept-2-ene) in a case where at least one of $R^1$ to $R^4$ represents an alkylarylaminocarbonyl group; poly(5-methoxycarbonylmethyl-bicyclo[2.2.1]hept-2-ene), poly(5-methoxycarbonylethyl-bicyclo[2.2.1]hept-2-ene), poly(5-ethoxycarbonylmethyl-bicyclo[2.2.1]hept-2-ene), poly(5-ethoxycarbonylethyl-bicyclo[2.2.1]hept-2-ene), poly(5-(n-propoxycarbonylmethyl)-bicyclo[2.2.1]hept-2-ene), poly(5-(i-propoxycarbonylmethyl)-bicyclo[2.2.1]hept-2-ene), poly(5-(n-butoxycarbonylmethyl)-bicyclo[2.2.1]hept-2-ene), poly(5-(tert-butoxycarbonylmethyl)-bicyclo[2.2.1]hept-2-ene), poly(5-(n-pentyloxycarbonylmethyl)-bicyclo[2.2.1]hept-2-ene), poly(5-(2-methyl-2-butoxycarbonyl)methyl)-bicyclo[2.2.1]hept-2-ene), poly(5-(2,3-dimethyl-2-butoxycarbonyl)methyl)-bicyclo[2.2.1]-2-ene), poly(5-cyclopentyloxycarbonylmethyl-bicyclo[2.2.1]hept-2-ene), poly(5-(n-hexyloxycarbonylmethyl)-bicyclo[2.2.1]hept-2-ene), poly(5-cyclohexyloxycarbonylmethyl-bicyclo[2.2.1]hept-2-ene), poly(5-(n-octyloxycarbonylmethyl)-bicyclo[2.2.1]hept-2-ene), poly(5-cyclooctyloxycarbonylmethyl-bicyclo[2.2.1]hept-2-ene), poly(5-(2-cyclopentyl-2-propoxycarbonyl)methyl)-bicyclo[2.2.1]hept-2-ene), poly(5-(2-cyclopentyl-2-propoxycarbonyl)methyl)-bicyclo[2.2.1]hept-2-ene), poly(5-(1-methylcyclopentyloxycarbonyl)methyl)-bicyclo[2.2.1]hept-2-ene), poly(5-(1-ethylcyclopentyloxycarbonyl)methyl)-bicyclo[2.2.1]hept-2-ene), poly(5-(1-methylcyclohexyloxycarbonyl)methyl)-bicyclo[2.2.1]-2-ene), and poly(5-(1-ethylcyclohexyloxycarbonyl)methyl)-bicyclo[2.2.1]hept-2-ene) in a case where at least one of $R^1$ to $R^4$ represents an alkoxycarbonylalkyl group; poly(5-methoxycarbonylphenyl-bicyclo[2.2.1]hept-2-ene), poly(5-ethoxycarbonylphenyl-bicyclo[2.2.1]hept-2-ene), poly(5-(n-propoxycarbonylphenyl)-bicyclo[2.2.1]hept-2-ene), poly(5-(i-propoxycarbonylphenyl)-bicyclo[2.2.1]hept-2-ene), poly(5-(n-butoxycarbonylphenyl)-bicyclo[2.2.1]hept-2-ene), poly(5-(tert-butoxycarbonylphenyl)-bicyclo[2.2.1]hept-2-ene), poly(5-(n-pentyloxycarbonylphenyl)-bicyclo[2.2.1]hept-2-ene), poly(5-(3-(2-methyl-2-butoxycarbonyl)phenyl)-bicyclo[2.2.1]hept-2-ene), poly(5-(3-2,3-dimethyl-2-butoxycarbonyl)phenyl)-bicyclo[2.2.1]hept-2-ene), poly(5-(3-(2-cyclopentyl-2-propoxycarbonyl)phenyl)-bicyclo[2.2.1]hept-2-ene), poly(5-(3-(2-cyclohexyl-2-propoxycarbonyl)phenyl)-bicyclo[2.2.1]hept-2-ene), poly(5-(3-(1-methylcyclopentyloxycarbonyl)phenyl)-bicyclo[2.2.1]hept-2-ene), poly(5-(3-(1-ethylcyclopentyloxycarbonyl)phenyl)-bicyclo[2.2.1]hept-2-ene), poly(5-(3-(1-methylcyclohexyloxycarbonyl)phenyl)-bicyclo[2.2.1]hept-2-ene), poly(5-(3-(1-ethylcyclohexyloxycarbonyl)phenyl)-bicyclo[2.2.1]hept-2-ene), poly(5-(4-(2-methyl-2-butoxycarbonyl)phenyl)-bicyclo[2.2.1]hept-2-ene), poly(5-(4-(2,3-dimethyl-2-butoxycarbonyl)phenyl)-bicyclo[2.2.1]hept-2-ene), poly(5-

(4-(2-cyclopentyl-2-propoxycarbonyl)phenyl)-bicyclo[2.2.1]hept-2-ene), poly(5-(4-(2-cyclohexyl-2-propoxycarbonyl)phenyl)-bicyclo[2.2.1]hept-2-ene), poly(5-(4-(1-methylcyclopentyloxycarbonyl)phenyl)-bicyclo[2.2.1]hept-2-ene), poly(5-(4-(1-ethylcyclopentyloxycarbonyl)phenyl)-bicyclo[2.2.1]hept-2-ene), poly(5-(4-(1-methylcyclohexyloxycarbonyl)phenyl)-bicyclo[2.2.1]hept-2-ene), poly(5-(4-(1-ethylcyclohexyloxycarbonyl)phenyl)-bicyclo[2.2.1]hept-2-ene), poly(5-methoxycarbonylnaphthyl-bicyclo[2.2.1]hept-2-ene), poly(5-ethoxycarbonylnaphthyl-bicyclo[2.2.1]hept-2-ene), poly(5-(n-propoxycarbonylnaphthyl)-bicyclo[2.2.1]hept-2-ene), poly(5-(i-propoxycarbonylnaphthyl)-bicyclo[2.2.1]hept-2-ene), poly(5-(n-butoxycarbonylnaphthyl)-bicyclo[2.2.1]hept-2-ene), poly(5-(tert-butoxycarbonylphenyl)-bicyclo[2.2.1]hept-2-ene), poly(5-(n-pentyloxycarbonylnaphthyl)-bicyclo[2.2.1]hept-2-ene), poly(5-(5-(2-methyl-2-butoxycarbonyl)naphthyl)-bicyclo[2.2.1]hept-2-ene), poly(5-(5-(2,3-dimethyl-2-butoxycarbonyl)naphthyl)-bicyclo[2.2.1]hept-2-ene), poly(5-(5-(2-cyclopentyl-2-propoxycarbonyl)naphthyl)-bicyclo[2.2.1]hept-2-ene), poly(5-(5-(2-cyclohexyl-2-propoxycarbonyl)naphthyl)-bicyclo[2.2.1]hept-2-ene), poly(5-(5-(1-methylcyclopentyloxycarbonyl)naphthyl)-bicyclo[2.2.1]hept-2-ene), poly(5-(5-(1-ethylcyclopentyloxycarbonyl)naphthyl)-bicyclo[2.2.1]hept-2-ene), poly(5-(5-(1-methylcyclohexyloxycarbonyl)naphthyl)-bicyclo[2.2.1]hept-2-ene), and poly(5-(5-(1-ethylcyclohexyloxycarbonyl)naphthyl)-bicyclo[2.2.1]hept-2-ene) in a case where at least one of $R^1$ to $R^4$ represents an alkoxycarbonylaryl group; poly(5-phenoxycarbonylmethyl-bicyclo[2.2.1]hept-2-ene), poly(5-benzyloxycarbonylmethyl-bicyclo[2.2.1]hept-2-ene), poly(5-(4-methylphenoxycarbonylmethyl)-bicyclo[2.2.1]hept-2-ene), poly(5-(3,4-dimethylphenoxycarbonylmethyl)-bicyclo[2.2.1]hept-2-ene), poly(5-(1-naphthoxycarbonylmethyl)-bicyclo[2.2.1]hept-2-ene), poly(5-(2-naphthoxycarbonylmethyl)-bicyclo[2.2.1]hept-2-ene), and poly(5-(1-anthracenoxycarbonylmethyl)-bicyclo[2.2.1]hept-2-ene) in a case where at least one of $R^1$ to $R^4$ represents an aryloxycarbonylalkyl group; poly(5-methoxymethyloxycarbonyl-bicyclo[2.2.1]hept-2-ene), poly(5-ethoxymethyloxycarbonyl-bicyclo[2.2.1]hept-2-ene), poly(5-(n-propoxymethyloxycarbonyl)-bicyclo[2.2.1]hept-2-ene), poly(5-isopropoxymethyloxycarbonyl-bicyclo[2.2.1]hept-2-ene), poly(5-(n-butoxymethyloxycarbonyl)-bicyclo[2.2.1]hept-2-ene), poly(5-(tert-butoxymethyloxycarbonyl)-bicyclo[2.2.1]hept-2-ene), poly(5-cyclopentyloxymethyloxycarbonyl)-bicyclo[2.2.1]hept-2-ene poly(5-cyclohexyloxymethyloxycarbonyl-bicyclo[2.2.1]hept-2-ene), poly(5-cyclooctyloxymethyloxycarbonyl-bicyclo[2.2.1]hept-2-ene), poly(5-norbornyloxymethyloxycarbonyl-bicyclo[2.2.1]hept-2-ene), poly(5-(1-methylcyclopentyloxymethyloxycarbonyl)-bicyclo[2.2.1]hept-2-ene), poly(5-(1-ethylcyclopentyloxymethyloxycarbonyl)-bicyclo[2.2.1]hept-2-ene), poly(5-(1-methylcyclohexyloxymethyloxycarbonyl)-bicyclo[2.2.1]hept-2-ene), poly(5-(1-ethylcyclohexyloxymethyloxycarbonyl)-bicyclo[2.2.1]hept-2-ene), poly(5-(1-methylnorbornyloxymethyloxycarbonyl)-bicyclo[2.2.1]hept-2-ene), poly(5-(1-ethylnorbornyloxymethyloxycarbonyl)-bicyclo[2.2.1]hept-2-ene), poly(5-(1-ethoxypropyloxymethyloxycarbonyl)-bicyclo[2.2.1]hept-2-ene), poly(5-(1-ethoxy-1-methylethyloxymethyloxycarbonyl)-bicyclo[2.2.1]hept-2-ene), poly(5-tetrahydrofuran-2-yloxymethyloxycarbonyl-bicyclo[2.2.1]hept-2-ene), poly(5-tetrahydropyran-2-yloxymethyloxycarbonyl-bicyclo[2.2.1]hept-2-ene), poly(5-(1-adamantyloxymethyloxycarbonyl)-bicyclo[2.2.1]hept-2-ene), poly(5-(2-adamantyloxymethyloxycarbonyl)-bicyclo[2.2.1]hept-2-ene), poly(5-(1-(1-methoxy)ethoxycarbonyl)-bicyclo[2.2.1]hept-2-ene), poly(5-(1-(1-ethoxy)ethoxycarbonyl)-bicyclo[2.2.1]hept-2-ene), poly(5-(1-(1-n-propoxy)ethoxycarbonyl)-bicyclo[2.2.1]hept-2-ene), poly(5-(1-(1-isopropoxy)ethoxycarbonyl)-bicyclo[2.2.1]hept-2-ene), poly(5-(1-(1-n-butoxy)ethoxycarbonyl)-bicyclo[2.2.1]hept-2-ene), poly(5-(1-(1-tert-butoxy)ethoxycarbonyl)-bicyclo[2.2.1]hept-2-ene), poly(5-(1-(1-cyclopentyloxy)ethoxycarbonyl)-bicyclo[2.2.1]hept-2-ene), poly(5-(1-(1-cyclohexyloxy)ethoxycarbonyl)-bicyclo[2.2.1]hept-2-ene), poly(5-(1-(1-cyclooctyloxy)ethoxycarbonyl)-bicyclo[2.2.1]hept-2-ene), poly(5-(1-(1-norbornyloxy)ethoxycarbonyl)-bicyclo[2.2.1]-2-ene), poly(5-(1-(1-methylcyclopentyloxy)ethoxycarbonyl)-bicyclo[2.2.1]hept-2-ene), poly(5-(1-(1-ethylcyclopentyloxy)ethoxycarbonyl)-bicyclo[2.2.1]hept-2-ene), poly(5-(1-(1-methylcyclohexyloxy)ethoxycarbonyl)-bicyclo[2.2.1]hept-2-ene), poly(5-(1-(1-ethylcyclohexyloxy)ethoxycarbonyl)-bicyclo[2.2.1]hept-2-ene), poly(5-(1-(1-methylnorbornyloxy)ethoxycarbonyl)-bicyclo[2.2.1]hept-2-ene), poly(5-(1-(1-ethylnorbornyloxy)ethoxycarbonyl)-bicyclo[2.2.1]hept-2-ene), poly(5-(1-(1-ethoxypropyloxy)ethoxycarbonyl)-bicyclo[2.2.1]hept-2-ene), poly(5-(1-(1-ethoxy-1-methylethyloxy)ethoxycarbonyl)-bicyclo[2.2.1]hept-2-ene), poly(5-(1-(tetrahydrofuran-2-yloxy)ethoxycarbonyl)-bicyclo[2.2.1]hept-2-ene), poly(5-(1-tetrahydropyran-2-yloxy)ethoxycarbonyl)-bicyclo[2.2.1]hept-2-ene), poly(5-(1-(1-adamantyloxy)ethoxycarbonyl)-bicyclo[2.2.1]-2-ene), and poly(5-(1-(2-adamantyloxy)ethoxycarbonyl)-bicyclo[2.2.1]hept-2-ene) in a case where at least one of $R^1$ to $R^4$ represents an alkoxyalkyloxycarbonyl group; and poly(5-methoxycarbonylmethyloxycarbonyl-bicyclo[2.2.1]hept-2-ene), poly(5-ethoxycarbonylmethyloxycarbonyl-bicyclo[2.2.1] hept-2-ene) poly(5-(n-propoxycarbonylmethyloxycarbonyl)-bicyclo[2.2.1]hept-2-ene), poly(5-(isopropoxycarbonylmethyloxycarbonyl-bicyclo[2.2.1]hept-2-ene), poly(5-(n-butoxycarbonylmethyloxycarbonyl)-bicyclo[2.2.1]hept-2-ene), poly(5-(tert-butoxycarbonylmethyloxycarbonyl)-bicyclo[2.2.1]hept-2-ene), poly(5-(2-cyclopentyl-2-propoxycarbonylmethyloxycarbonyl)-bicyclo[2.2.1]hept-2-ene), poly(5-(2-cyclopentyl-2-butoxycarbonylmethyloxycarbonyl)-bicyclo [2.2.1]hept-2-ene), poly(5-(2-cyclohexyl-2-propoxycarbonylmethyloxycarbonyl)-bicyclo[2.2.1]hept-2-ene), poly(5-(3-(2-cyclohexyl-2-propoxycarbonyl)propoxycarbonyl)-bicyclo[2.2.1]hept-2-ene), poly(5-(2-cyclohexyl-2-butoxycarbonylmethyloxycarbonyl)-bicyclo[2.2.1]hept-2-ene), poly(5-(3-cyclohexyl-3-pentyloxycarbonylmethyloxycarbonyl)-bicyclo[2.2.1]hept-2-ene), poly(5-(2-ethyl-2-norbornyloxycarbonylmethyloxycarbonyl)-bicyclo[2.2.1]hept-2-ene), poly(5-(2-norbornyl-2-propoxycarbonylmethyloxycarbonyl)-bicyclo[2.2.1]hept-2-ene), poly(5-(4-ethyl-tetracyclo[6.2.1.1$^{3,6}$.0$^{2,7}$]-dodecane-4-yloxycarbonylmethyloxycarbonyl)-bicyclo[2.2.1]hept-2-ene), poly(5-(2-tetracyclo[6.2.1.1$^{3,6}$.0$^{2,7}$]-dodecane-4-yl)-2-propoxycarbonylmethyloxycarbonyl)-bicyclo[2.2.1]hept-2-ene), poly(5-(1,1-dicyclohexylethoxycarbonylmethyloxycarbonyl)-bicyclo[2.2.1]hept-2-ene), poly(5-(1,1-dicyclohexylpropoxycarbonylmethyloxycarbonyl)-bicyclo[2.2.1]hept-2-ene), poly(5- cyclopentyloxycarbonylmethyloxycarbonyl-bicyclo[2.2.1]hept-2-ene), poly(5-cyclohexyloxycarbonylmethyloxycarbonyl-bicyclo[2.2.1] hept-2-ene), poly(5-cyclooctyloxycarbonylmethyloxycarbonyl-bicyclo[2.2.1] hept-2-ene), poly(5-norbornyloxycarbonylmethyloxycarbonyl-bicyclo[2.2.1]hept-2-ene), poly(5-(1-methyicyciopentyioxycarbonyimethyioxycarbonyi-bicyclo[2.2.1]hept-2-ene), poly(5-(1-ethylcyclopentyloxycarbonylmethyloxycarbonyl)-bicyclo[2.2.1]hept-2-ene), poly(5-(1-methylcyclohexyloxycarbonylmethyloxycarbonyl)-bicyclo[2.2.1]hept-2-ene), poly(5-(1-ethylcyclohexyloxycarbonylmethyloxycarbonyl)-bicyclo[2.2.1]hept-2-ene), poly(5-(1-methylnorbornyloxycarbonylmethyloxycarbonyl)-bicyclo[2.2.1]hept-2-ene), poly(5-(1-ethylnorbornyloxycarbonylmethyloxycarbonyl)-bicyclo[2.2.1]hept-2-ene), poly(5-(1-ethoxypropyloxycarbonylmethyloxycarbonyl)-bicyclo[2.2.1]hept-2-ene), poly(5-(1-ethoxy-1-methylethyloxycarbonylmethyloxycarbonyl)-bicyclo[2.2.1]hept-2-ene), poly(5-tetrahydrofuran-2-yloxycarbonylmethyloxycarbonyl-bicyclo[2.2.1]hept-2-ene), poly(5-tetrahydropyran-2-yloxycarbonylmethyloxycarbonyl-bicyclo[2.2.1]hept-2-ene), poly(5-(1-adamantyloxycarbonylmethyloxycarbonyl)-bicyclo[2.2.1]hept-2-ene), poly(5-(2-adamantyloxycarbonylmethyloxycarbonyl)-bicyclo[2.2.1]hept-2-ene), poly(5-(1-(2-(1-adamantyl)-2-propoxycarbonyl)ethoxycarbonyl)-bicyclo[2.2.1]hept-2-ene), poly(5-(3-(2-(1-adamantyl)-2-propoxycarbonyl)propoxycarbonyl)-bicyclo[2.2.1]hept-2-ene), poly(5-(2-(2-(1-adamantyl)-2-propoxycarbonyl)-2-propoxycarbonyl)-bicyclo[2.2.1]hept-2-ene), poly(5-(2-methyl-2-adamantyloxycarbonylmethyloxycarbonyl)-bicyclo[2.2.1]hept-2-ene), poly(5-(3-(2-methyl-2-adamantyloxycarbonyl)propoxycarbonyl)-bicyclo[2.2.1]hept-2-ene), poly(5-(2-(2-methyl-2-adamantyloxycarbonyl)-2-propoxycarbonyl)-bicyclo[2.2.1]hept-2-ene), poly(5-(1-(2-methyl-2-adamantyloxycarbonyl)ethoxycarbonyl)-bicyclo[2.2.1]hept-2-ene), poly(5-(2-ethyl-2-adamantyloxycarbonylmethyloxycarbonyl)-bicyclo[2.2.1]hept-2-ene), poly(5-(2-isopropyl-2-adamantyloxycarbonylmethyloxycarbonyl)-bicyclo[2.2.1]hept-2-ene), poly(5-(2-(1-adamantyl)-2-propoxycarbonylmethyloxycarbonyl)-bicyclo[2.2.1]hept-2-ene), poly(5-(2-(1-adamantyl)-2-butoxycarbonylmethyloxycarbonyl)-bicyclo[2.2.1]hept-2-ene), poly(5-(3-(1-adamantyl)-3-pentyloxycarbonylmethyloxycarbonyl)-bicyclo[2.2.1]hept-2-ene), poly(5-(3-tert-butoxycarbonyl-1-cyclopentyloxycarbonyl)-bicyclo[2.2.1]hept-2-ene), poly(5-(3-(1-methylcyclohexyloxycarbonyl)-1-cyclopentyloxycarbonyl)-bicyclo[2.2.1]hept-2-ene), poly(5-(5-tert-butoxycarbonyl-2-norbornyloxycarbonyl)-bicyclo[2.2.1]hept-2-ene), poly(5-(5-1-methylcyclohexyloxycarbonyl)-2-norbornyloxycarbonyl)-bicyclo[2.2.1]hept-2-ene), poly(5-(5,5-di(tert-butoxycarbonyl)-2-norbornyloxycarbonyl)-bicyclo[2.2.1]hept-2-ene), poly(5-(5,6-di(tert-butoxycarbonyl)-2-norbornyloxycarbonyl)-bicyclo[2.2.1]hept-2-ene), poly(5-(1-(1-methylcyclohexyloxycarbonyl)-octahydro-4,7-methanoindene-5-yloxycarbonyl)-bicyclo[2.2.1]hept-2-ene), poly(5-(6-tert-butoxycarbonyi-decahydronaphthaiene-2-yloxycarbonyl)-bicyclo[2.2.1]hept-2-ene), poly(5-(9-tert-butoxycarbonyl-tetracyclo[6.2.1.1$^{3,6}$.0$^{2,7}$]-dodecane-4-yloxycarbonyl)-bicyclo[2.2.1]hept-2-ene), and poly(5-(9-1-methylcyclohexyloxycarbonyl-tetracyclo[6.2.1.1$^{3,6}$.0$^{2,7}$]-dodecane-4-yloxycarbonyl)-bicyclo[2.2.1]hept-2-ene) in a case where at least one of $R^1$ to $R^4$ represents an alkoxycarbonylalkyloxycarbonyl group.

In a case where $R^1$ to $R^4$ are bonded to one another to form a ring structure, examples of the cyclic alkyl structure include poly(1,4,4a,5,6,7,8,8a-octahydro-1,4-methanonaphthalene). Examples of the cyclic ester structure which can form a lactone ring include poly(4-oxy-tricyclo[5.2.1.0$^{2,6}$]-8-decene-3-one) as a γ-butyrolactone structure; poly(4-oxy-tricyclo[6.2.1.0$^{2,7}$]-9-undecene-3-one) as a γ-valerolactone structure; and poly(4-oxy-tricyclo[5.2.1.0$^{2,6}$]-8-decene-3,5-dione) as a cyclic acid anhydride structure. Examples of the cyclic amide structure which can form a lactam ring include poly(4-methyl-4-aza-tricyclo[5.2.1.0$^{2,6}$]-8-decene-3-one), poly(4-ethyl-4-aza-tricyclo[5.2.1.0$^{2,6}$]-8-decene-3-one), poly(4-(n-propyl)-4-aza-tricyclo[5.2.1.0$^{2,6}$]-8-decene-3-one), poly(4-(n-butyl)-4-aza-tricyclo[5.2.1.0$^{2,6}$]-8-decene-3-one), poly(4-(1-methylbutyl)-4-aza-tricyclo[5.2.1.0$^{2,6}$]-8-decene-3-one), poly(4-cyclopentyl-4-aza-tricyclo[5.2.1.0$^{2,6}$]-8-decene-3-one), poly(4-cyclohexyl-4-aza-tricyclo[5.2.1.0$^{2,6}$]-8-decene-3-one), poly(4-phenyl-4-aza-tricyclo[5.2.1.0$^{2,6}$]-8-decene-3-one), and poly(4-(4-hydroxyphenyl)-4-aza-tricyclo[5.2.1.0$^{2,6}$]-8-decene-3-on e) as γ-lactam; and poly(4-methyl-4-aza-tricyclo[6.2.1.0$^{2,7}$]-9-undecene-3-one), poly(4-ethyl-4-aza-tricyclo[6.2.1.0$^{2,7}$]-9-undecene-3-one), poly(4-(n-propyl)-4-aza-tricyclo[6.2.1.0$^{2,7}$]-9-undecene-3-one), poly(4-(n-butyl)-4-aza-tricyclo[6.2.1.0$^{2,7}$]-9-undecene-3-one), poly(4-(1-methylbutyl)-4-aza-tricyclo[6.2.1.0$^{2,7}$]-9-undecene-3-one), poly(4-cyclopentyl-4-aza-tricyclo[6.2.1.0$^{2,7}$]-9-undecene-3-one), poly(4-cyclohexyl-4-aza-tricyclo[6.2.1.0$^{2,7}$]-9-undecene-3-one), poly(4-phenyl-4-aza-tricyclo[6.2.1.0$^{2,7}$]-9-undecene-3-one), and poly(4-(4-hydroxyphenyl)-4-aza-tricyclo[6.2.1.0$^{2,7}$]-9-undecene-3-one) as δ-lactam. Examples of the cyclic imide structure which can form a maleimide ring include poly(4-methyl-4-aza-tricyclo[5.2.1.0$^{2,6}$]-8-decene-3,5-dione), poly(4-(ethyl-4-aza-tricyclo[5.2.1.0$^{2,6}$]-8-decene-3,5-dione), poly(4-(n-propyl)-4-aza-tricyclo[5.2.1.0$^{2,6}$]-8-decene-3,5-dione), poly(4-(n-butyl)-4-aza-tricyclo[5.2.1.0$^{2,6}$]-8-decene-3,5-dione), poly(4-(1-methylbutyl)-4-aza-tricyclo[5.2.1.0$^{2,6}$]-8-decene-3,5-dione), poly(4-cyclopentyl-4-aza-tricyclo[5.2.1.0$^{2,6}$]-8-decene-3,5-dione), poly(4-cyclohexyl-4-aza-tricyclo[5.2.1.0$^{2,6}$]-8-decene-3,5-dione), poly(4-phenyl-4-aza-tricyclo[5.2.1.0$^{2,6}$]-8-decene-decene-3,5-dione) and poly(4-(4-hydroxyphenyl)-4-aza-tricyclo[5.2.1.0$^{2,6}$]-8-decene-3,5-dione).

Among these, in the repeating structural unit [A] represented by Formula (1) according to the present embodiment, as the cyclic olefin polymer in which n represents 0, poly(5-methoxycarbonyl-bicyclo[2.2.1]hept-2-ene), poly(5-ethoxycarbonyl-bicyclo[2.2.1]hept-2-ene), poly(5-(n-propoxycarbonyl)-bicyclo[2.2.1]hept-2-ene), poly(5-(n-butoxycarbonyl)-bicyclo[2.2.1]hept-2-ene), poly(5-isobutoxycarbonyl-bicyclo[2.2.1]hept-2-ene), poly(5-(tert-butoxycarbonyl)-bicyclo[2.2.1]hept-2-ene), poly(5-(n-pentyloxycarbonyl)-bicyclo[2.2.1]hept-2-ene), poly(5-(2-methyl-2-pentyloxycarbonyl)-bicyclo[2.2.1]hept-2-ene), poly(5-(3-methyl-3-pentyloxycarbonyl)-bicyclo[2.2.1]hept-2-ene), poly(5-(2-ethyl-3-methyl-3-pentyloxycarbonyl)-bicyclo[2.2.1]hept-2-ene), poly(5-cyclopentyloxycarbonyl-bicyclo[2.2.1]hept-2-ene), poly(5-(n-hexyloxycarbonyl)-bicyclo[2.2.1]hept-2-ene), poly(5-cyclohexyloxycarbonyl-bicyclo[2.2.1]hept-2-ene), poly(5-(2-methyl-2-butoxycarbonyl)-bicyclo[2.2.1]hept-2-ene), poly(5-(2,3-dimethyl-2-butoxycarbonyl)-bicyclo[2.2.1]hept-2-ene), poly(5-(2,3,3-trimethyl-2-butoxycarbonyl)-bicyclo[2.2.1]hept-2-ene), poly(5-2-methyl-2-hexyloxycarbonyl)-bicyclo[2.2.1]hept-2-ene), poly(5-(3,4-dimethyl-3-hexyloxycarbonyl)-bicyclo[2.2.1]hept-2-ene), poly(5-(3-methylbutoxycarbonyl)-bicyclo[2.2.1]hept-2-ene), poly(5-(2-methylpentoxycarbonyl)-bicyclo[2.2.1]hept-2-ene), poly(5-(3-methylpentoxycarbonyl)-bicyclo[2.2.1]hept-2-ene), poly(5-(4-methylpentoxycarbonyl)-bicyclo[2.2.1]hept-2-ene), poly(5-(3-methyl-3-heptyloxycarbonyl)-bicyclo[2.2.1]hept-2-ene), poly(5-(2-cyclopentyl-2-propoxycarbonyl)-bicyclo[2.2.1]hept-2-ene), poly(5-(2-cyclohexyl-2-propoxycarbonyl)-bicyclo[2.2.1]hept-2-ene), poly(5-(2-norbornyl-2-propoxycarbonyl)-bicyclo[2.2.1]hept-2-ene), poly(5-(1,1-dicyclopentylethoxycarbonyl)-bicyclo[2.2.1]hept-2-ene), poly(5-(1,1-dicyclohexylethoxycarbonyl)-bicyclo[2.2.1]hept-2-ene), poly(5-(1-methylcyclopentyloxycarbonyl)-bicyclo[2.2.1]hept-2-ene), poly(5-(1-ethylcyclopentyloxycarbonyl)-bicyclo[2.2.1]hept-2-ene), poly(5-(1-methylcyclohexyloxycarbonyl)-bicyclo[2.2.1]hept-2-ene), poly(5-(1-ethylcyclohexyloxycarbonyl)-bicyclo[2.2.1]hept-2-ene), poly(5-(1-methylcyclooctyloxycarbonyl)-bicyclo[2.2.1]hept-2-ene), poly(5-(1-ethylcyclooctyloxycarbonyl)-bicyclo[2.2.1]hept-2-ene), poly(5-(1-adamantyloxycarbonyl)-bicyclo[2.2.1]hept-2-ene), poly(5-(2-methyl-2-adamantyloxycarbonyl)-bicyclo[2.2.1]hept-2-ene), poly(5-(2-ethyl-2-adamantyloxycarbonyl)-bicyclo[2.2.1]hept-2-ene), poly(5-(1-methyldecahydronaphthalene-1-yloxycarbonyl)-bicyclo[2.2.1]hept-2-ene), poly(5-(1-ethyldecahydronaphthalene-1-yloxycarbonyl)-bicyclo[2.2.1]hept-2-ene), poly(5-(2-methyldecahydronaphthalene-2-yloxycarbonyl)-bicyclo[2.2.1]hept-2-ene), poly(5-(2-ethyldecahydronaphthalene-2-yloxycarbonyl)-bicyclo[2.2.1]hept-2-ene), poly(5-(2-methyl-2-norbornyloxycarbonyl)-bicyclo[2.2.1]hept-2-ene), poly(5-(2-ethyl-2-norbornyloxycarbonyl)-bicyclo[2.2.1]hept-2-ene), poly(5-(2,7,7-trimethyl-2-norbornyloxycarbonyl)-bicyclo[2.2.1]hept-2-ene), poly(5-(2-ethyl-7,7-dimethyl-2-norbornyloxycarbonyl)-bicyclo[2.2.1]hept-2-ene), poly(5-(5-methyl-octahydro-4,7-methano-indene-5-yloxycarbonyl)-bicyclo[2.2.1]hept-2-ene), poly(5-(5-ethyl-octahydro-4,7-methano-indene-5-yloxycarbonyl)-bicyclo[2.2.1]hept-2-ene), poly(5-(4-methyl-tetracyclo[6.2.1.1$^{3,6}$.0$^{2,7}$]-dodecane-4-yloxycarbonyl)-bicyclo[2.2.1]hept-2-ene), poly(5-(4-ethyl-tetracyclo[6.2.1.1$^{3,6}$.0$^{2,7}$]-dodecane-4-yloxycarbonyl)-bicyclo[2.2.1]hept-2-ene), poly(5-methoxycarbonylphenyl-bicyclo[2.2.1]hept-2-ene), poly(5-ethoxycarbonylphenyl-bicyclo[2.2.1]hept-2-ene), poly(5-(n-propoxycarbonylphenyl)-bicyclo[2.2.1]hept-2-ene), poly(5-(i-propoxycarbonylphenyl)-bicyclo[2.2.1]hept-2-ene), poly(5-(n-butoxycarbonylphenyl)-bicyclo[2.2.1]hept-2-ene), poly(5-(tert-butoxycarbonylphenyl)-bicyclo[2.2.1]hept-2-ene), poly(5-n-pentyloxycarbonylphenyl)-bicyclo[2.2.1]hept-2-ene), poly(5-(3-(2-methyl-2-butoxycarbonyl)phenyl)-bicyclo[2.2.1]hept-2-ene), poly(5-(3-2,3-dimethyl-2-butoxycarbonyl)phenyl)-bicyclo[2.2.1]-2-ene), poly(5-(3-(2-cyclopentyl-2-propoxycarbonyl)phenyl)-bicyclo[2.2.1]hept-2-ene), poly(5-(3-(2-cyclohexyl-2-propoxycarbonyl)phenyl)-bicyclo[2.2.1]hept-2-ene), poly(5-(3-(1-methylcyclopentyloxycarbonyl)phenyl)-bicyclo[2.2.1]hept-2-ene), poly(5-(3-(1-ethylcyclopentyloxycarbonyl)phenyl)-bicyclo[2.2.1]hept-2-ene), poly(5-(3-(1-methylcyclohexyloxycarbonyl)phenyl)-bicyclo[2.2.1]hept-2-ene), poly(5-(3-(1-ethylcyclohexyloxycarbonyl)phenyl)-bicyclo[2.2.1]hept-2-ene), poly(5-(4-(2-methyl-2-butoxycarbonyl)phenyl)-bicyclo[2.2.1]hept-2-ene), poly(5-(4-(2,3-dimethyl-2-butoxycarbonyl)phenyl)-bicyclo[2.2.1]hept-2-ene), poly(5-(4-(2-cyclopentyl-2-propoxycarbonyl)phenyl)-bicyclo[2.2.1]hept-2-ene), poly(5-(4-(2-cyclohexyl-2-propoxycarbonyl)phenyl)-bicyclo[2.2.1]hept-2-ene), poly(5-(4-(1-methylcyclopentyloxycarbonyl)phenyl)-bicyclo[2.2.1]hept-2-ene), poly(5-(4-(1-ethylcyclopentyloxycarbonyl)phenyl)-bicyclo[2.2.1]hept-2-ene), poly(5-(4-(1-methylcyclohexyloxycarbonyl)phenyl)-bicyclo[2.2.1]hept-2-ene), poly(5-(4-(1-ethylcyclohexyloxycarbonyl)phenyl)-bicyclo[2.2.1]hept-2-ene), poly(5-methoxycarbonylnaphthyl-bicyclo[2.2.1]hept-2-ene), poly(5-ethoxycarbonylnaphthyl-bicyclo[2.2.1]hept-2-ene), poly(5-(n-propoxycarbonylnaphthyl)-bicyclo[2.2.1]hept-2-ene), poly(5-(i-propoxycarbonylnaphthyl)-bicyclo[2.2.1]hept-2-ene), poly(5-(n-butoxycarbonylnaphthyl)-bicyclo[2.2.1]hept-2-ene), poly(5-(tert-butoxycarbonylphenyl)-bicyclo[2.2.1]hept-2-ene), poly(5-(n-pentyloxycarbonylnaphthyl)-bicyclo[2.2.1]hept-2-ene), poly(5-(5-(2-methyl-2-butoxycarbonyl)naphthyl)-bicyclo[2.2.1]hept-2-ene), poly(5-(5-(2,3-dimethyl-2-butoxycarbonyl)naphthyl)-bicyclo[2.2.1]hept-2-ene), poly(5-(5-(2-cyclopentyl-2-propoxycarbonyl)naphthyl)-bicyclo[2.2.1]hept-2-ene), poly(5-(5-(2-cyclohexyl-2-propoxycarbonyl)naphthyl)-bicyclo[2.2.1]hept-2-ene), poly(5-(5-(1-methylcyclopentyloxycarbonyl)naphthyl)-bicyclo[2.2.1]hept-2-ene), poly(5-(5-(1-ethylcyclopentyloxycarbonyl)naphthyl)-bicyclo[2.2.1]hept-2-ene), poly(5-(5-(1-methylcyclohexyloxycarbonyl)naphthyl)-bicyclo[2.2.1]hept-2-ene), poly(5-(5-(1-ethylcyclohexyloxycarbonyl)naphthyl)-bicyclo[2.2.1]hept-2-ene), poly(5-phenoxycarbonyl-bicyclo[2.2.1]hept-2-ene), poly(5-benzyloxycarbonyl-bicyclo[2.2.1]hept-2-ene), poly(5-(4-methylphenoxycarbonyl)-bicyclo[2.2.1]hept-2-ene), poly(5-(3,4-dimethylphenoxycarbonyl)-bicyclo[2.2.1]hept-2-ene), poly(5-(1-naphthoxycarbonyl)-bicyclo[2.2.1]hept-2-ene), poly(5-(2-naphthoxycarbonyl)-bicyclo[2.2.1]hept-2-ene), poly(5-(1-anthracenoxycarbonyl)-bicyclo[2.2.1]hept-2-ene), poly(5-methoxymethyloxycarbonyl-bicyclo[2.2.1]hept-2-ene), poly(5-ethoxymethyloxycarbonyl-bicyclo[2.2.1]hept-2-ene), poly(5-(n-propoxymethyloxycarbonyl)-bicyclo[2.2.1]hept-2-ene), poly(5-isopropoxymethyloxycarbonyl-bicyclo[2.2.1]hept-2-ene), poly(5-(n-butoxymethyloxycarbonyl)-bicyclo[2.2.1]hept-2-ene), poly(5-(tert-butoxymethyloxycarbonyl)-bicyclo[2.2.1]hept-2-ene), poly(5-cyclopentyloxymethyloxycarbonyl)-bicyclo[2.2.1]hept-2-ene), poly(5-cyclohexyloxymethyloxycarbonyl-bicyclo[2.2.1]hept-2-ene), poly(5-cyclooctyloxymethyloxycarbonyl-bicyclo[2.2.1]hept-2-ene), poly(5-norbornyloxymethyloxycarbonyl-bicyclo[2.2.1]hept-2-ene), poly(5-(1-methylcyclopentyloxymethyloxycarbonyl)-bicyclo[2.2.1]hept-2-ene), poly(5-(1-ethylcyclopentyloxymethyloxycarbonyl)-bicyclo[2.2.1]-2-ene), poly(5-(1-methylcyclohexyloxymethyloxycarbonyl)-bicyclo[2.2.1]-2-ene), poly(5-(1-ethylcyclohexyloxymethyloxycarbonyl)-bicyclo[2.2.1]hept-2-ene), poly(5-(1-methylnorbornyloxymethyloxycarbonyl)-bicyclo[2.2.1]hept-2-ene), poly(5-(1-ethylnorbornyloxymethyloxycarbonyl)-bicyclo[2.2.1]hept-2-ene), poly(5-(1-ethoxypropyloxymethyloxycarbonyl)-bicyclo[2.2.1]hept-2-ene), poly(5-(1-ethoxy-1-methylethyloxymethyloxycarbonyl)-bicyclo[2.2.1]hept-2-ene), poly(5-tetrahydrofuran-2-yloxymethyloxycarbonyl-bicyclo[2.2.1]hept-2-ene), poly(5-tetrahydropyran-2-yloxymethyloxycarbonyl-bicyclo[2.2.1]hept-2-ene), poly(5-(1-adamantyloxymethyloxycarbonyl)-bicyclo[2.2.1]hept-2-ene), poly(5-(2-adamantyloxymethyloxycarbonyl)-bicyclo[2.2.1]hept-2-ene), poly(5-(1-(1-methoxy)ethoxycarbonyl)- bicyclo[2.2.1]hept-2-ene), poly(5-(1-(1-ethoxy)ethoxycarbonyl)-bicyclo[2.2.1]hept-2-ene), poly(5-(1-(1-n-propoxy)ethoxycarbonyl)-bicyclo[2.2.1]hept-2-ene), poly(5-(1-(1-isopropoxy)ethoxycarbonyl)-bicyclo[2.2.1]hept-2-ene), poly(5-(1-(1-n-butoxy)ethoxycarbonyl)-bicyclo[2.2.1]hept-2-ene), poly(5-(1-(1-tert-butoxy)ethoxycarbonyl)-bicyclo[2.2.1]hept-2-ene), poly(5-(1-(1-cyclopentyloxy)ethoxycarbonyl)-bicyclo[2.2.1]hept-2-ene), poly(5-(1-(1-cyclohexyloxy)ethoxycarbonyl)-bicyclo[2.2.1]hept-2-ene), poly(5-(1-(1-cyclooctyloxy)ethoxycarbonyl)-bicyclo[2.2.1]hept-2-ene), poly(5-(1-(1-norbornyloxy)ethoxycarbonyl)-bicyclo[2.2.1]-2-ene), poly(5-(1-(1-methylcyclopentyloxy)ethoxycarbonyl)-bicyclo[2.2.1]hept-2-ene), poly(5-(1-(1-ethylcyclopentyloxy)ethoxycarbonyl)-bicyclo[2.2.1]hept-2-ene), poly(5-(1-(1-methylcyclohexyloxy)ethoxycarbonyl)-bicyclo[2.2.1]hept-2-ene), poly(5-(1-(1-ethylcyclohexyloxy)ethoxycarbonyl)-bicyclo[2.2.1]hept-2-ene), poly(5-(1-(1-methylnorbornyloxy)ethoxycarbonyl)-bicyclo[2.2.1]hept-2-ene), poly(5-(1-(1-ethylnorbornyloxy)ethoxycarbonyl)-bicyclo[2.2.1]hept-2-ene), poly(5-(1-(1-ethoxypropyloxy)ethoxycarbonyl)-bicyclo[2.2.1]hept-2-ene), poly(5-(1-(1-ethoxy-1-methylethyloxy)ethoxycarbonyl)-bicyclo[2.2.1]hept-2-ene), poly(5-(1-(tetrahydrofuran-2-yloxy)ethoxycarbonyl)-bicyclo[2.2.1]hept-2-ene), poly(5-(1-tetrahydropyran-2-yloxy)ethoxycarbonyl)-bicyclo[2.2.1]hept-2-ene), poly(5-(1-(1-adamantyloxy)ethoxycarbonyl)-bicyclo[2.2.1]-2-ene), poly(5-(1-(2-adamantyloxy)ethoxycarbonyl)-bicyclo[2.2.1]hept-2-ene), poly(5-(n-butoxycarbonylmethyloxycarbonyl)-bicyclo[2.2.1]hept-2-ene), poly(5-(tert-butoxycarbonylmethyloxycarbonyl)-bicyclo[2.2.1]hept-2-ene), poly(5-(2-cyclopentyl-2-propoxycarbonylmethyloxycarbonyl)-bicyclo[2.2.1]hept-2-ene), poly(5-(2-cyclopentyl-2-butoxycarbonylmethyloxycarbonyl)-bicyclo[2.2.1]hept-2-ene), poly(5-(2-cyclohexyl-2-propoxycarbonylmethyloxycarbonyl)-bicyclo[2.2.1]hept-2-ene), poly(5-(3-(2-cyclohexyl-2-propoxycarbonyl)propoxycarbonyl)-bicyclo[2.2.1]hept-2-ene), poly(5-(2-cyclohexyl-2-butoxycarbonylmethyloxycarbonyl)-bicyclo[2.2.1]hept-2-ene), poly(5-(3-cyclohexyl-3-pentyloxycarbonylmethyloxycarbonyl)-bicyclo[2.2.1]hept-2-ene), poly(5-(2-ethyl-2-norbornyloxycarbonylmethyloxycarbonyl)-bicyclo[2.2.1]hept-2-ene), poly(5-(2-norbornyl-2-propoxycarbonylmethyloxycarbonyl)-bicyclo[2.2.1]hept-2-ene), poly(5-(4-ethyl-tetracyclo[6.2.1.1$^{3,6}$.0$^{2,7}$]-dodecane-4-yloxycarbonylmethyloxycarbonyl)-bicyclo[2.2.1]hept-2-ene), poly(5-(2-tetracyclo[6.2.1.1$^{3,6}$.0$^{2,7}$]-dodecane-4-yl)-2-propoxycarbonylmethyloxycarbonyl)-bicyclo[2.2.1]hept-2-ene), poly(5-(1,1-dicyclohexylethoxycarbonylmethyloxycarbonyl)-bicyclo[2.2.1]hept-2-ene), poly(5-(1,1-dicyclohexylpropoxycarbonylmethyloxycarbonyl)-bicyclo[2.2.1]hept-2-ene), poly(5-cyclopentyloxycarbonylmethyloxycarbonyl-bicyclo[2.2.1]hept-2-ene), poly(5-cyclohexyloxycarbonylmethyloxycarbonyl-bicyclo[2.2.1]hept-2-ene), poly(5-cyclooctyloxycarbonylmethyloxycarbonyl-bicyclo[2.2.1]hept-2-ene), poly(5-norbornyloxycarbonylmethyloxycarbonyl-bicyclo[2.2.1]hept-2-ene), poly(5-(1-methylcyclopentyloxycarbonylmethyloxycarbonyl)-bicyclo[2.2.1]hept-2-ene), poly(5-(1-ethylcyclopentyloxycarbonylmethyloxycarbonyl)-bicyclo[2.2.1]hept-2-ene), poly(5-(1-methylcyclohexyloxycarbonylmethyloxycarbonyl)-bicyclo[2.2.1]hept-2-ene), poly(5-(1-ethylcyclohexyloxycarbonylmethyloxycarbonyl)-bicyclo[2.2.1]hept-2-ene), poly(5-(1-methylnorbornyloxycarbonylmethyloxycarbonyl)-bicyclo[2.2.1]hept-2-ene), poly(5-(1-ethylnorbornyloxycarbonylmethyloxycarbonyl)-bicyclo[2.2.1]hept-2-ene), poly(5-(1-ethoxypropyloxycarbonyimethyloxycarbonyl)-bicyclo[2.2.1]hept-2-ene), poly(5-(1-ethoxy-1-methylethyloxycarbonylmethyloxycarbonyl)-bicyclo[2.2.1]hept-2-ene), poly(5-tetrahydrofuran-2-yloxycarbonylmethyloxycarbonyl-bicyclo[2.2.1]hept-2-ene), poly(5-tetrahydropyran-2-yloxycarbonylmethyloxycarbonyl-bicyclo[2.2.1]hept-2-ene), poly(5-(1-adamantyloxycarbonylmethyloxycarbonyl)-bicyclo[2.2.1]hept-2-ene), poly(5-(2-adamantyloxycarbonylmethyloxycarbonyl)-bicyclo[2.2.1]hept-2-ene), poly(5-(1-(2-(1-adamantyl)-2-propoxycarbonyl)ethoxycarbonyl)-bicyclo[2.2.1]hept-2-ene), poly(5-(3-(2-(1-adamantyl)-2-propoxycarbonyl)propoxycarbonyl)-bicyclo[2.2.1]hept-2-ene), poly(5-(2-(1-adamantyl)-2-propoxycarbonyl)-2-propoxycarbonyl)-bicyclo[2.2.1]hept-2-ene), poly(5-(2-methyl-2-adamantyloxycarbonylmethyloxycarbonyl)-bicyclo[2.2.1]hept-2-ene), poly(5-(3-(2-methyl-2-adamantyloxycarbonyl)propoxycarbonyl)-bicyclo[2.2.1]hept-2-ene), poly(5-(2-(2-methyl-2-adamantyloxycarbonyl)-2-propoxycarbonyl)-bicyclo[2.2.1]hept-2-ene), poly(5-(1-(2-methyl-2-adamantyloxycarbonyl)ethoxycarbonyl)-bicyclo[2.2.1]hept-2-ene), poly(5-(2-ethyl-2-adamantyloxycarbonylmethyloxycarbonyl)-bicyclo[2.2.1]hept-2-ene), poly(5-(2-isopropyl-2-adamantyloxycarbonylmethyloxycarbonyl)-bicyclo[2.2.1]hept-2-ene), poly(5-(2-(1-adamantyl)-2-propoxycarbonylmethyloxycarbonyl)-bicyclo[2.2.1]hept-2-ene), poly(5-(2-(1-adamantyl)-2-butoxycarbonylmethyloxycarbonyl)-bicyclo[2.2.1]hept-2-ene), poly(5-(3-(1-adamantyl)-3-pentyloxycarbonylmethyloxycarbonyl)-bicyclo[2.2.1]hept-2-ene), poly(5-(3-tert-butoxycarbonyl-1-cyclopentyloxycarbonyl)-bicyclo[2.2.1]hept-2-ene), poly(5-(3-(1-methylcyclohexyloxycarbonyl)-1-cyclopentyloxycarbonyl)-bicyclo[2.2.1]hept-2-ene), poly(5-(5-tert-butoxycarbonyl-2-norbornyloxycarbonyl)-bicyclo[2.2.1]hept-2-ene), poly(5-(5-1-methylcyclohexyloxycarbonyl)-2-norbornyloxycarbonyl)-bicyclo[2.2.1]hept-2-ene), poly(5-(5,5-di(tert-butoxycarbonyl)-2-norbornyloxycarbonyl)-bicyclo[2.2.1]hept-2-ene), poly(5-(5,6-di(tert-butoxycarbonyl)-2-norbornyloxycarbonyl)-bicyclo[2.2.1]hept-2-ene), poly(5-(1-(1-methylcyclohexyloxycarbonyl)-octahydro-4,7-methanoindene-5-yloxycarbonyl)-bicyclo[2.2.1]hept-2-ene), poly(5-(6-tert-butoxycarbonyl-tetrahydronaphthalene-2-yloxycarbonyl)-bicyclo-[2.2.1]hept-2-ene), poly(5-(9-tert-butoxycarbonyl-tetracyclo[6.2.1.1$^{3,6}$.0$^{2,7}$]-dodecane-4-yloxycarbonyl)-bicyclo[2.2.1]hept-2-ene), or poly(5-(9-1-methylcyclohexyloxycarbonyl-tetracyclo[6.2.1.1$^{3,6}$.0$^{2,7}$]-dodecane-4-yloxycarbonyl)-bicyclo[2.2.1]hept-2-ene) is preferable.

In the repeating structural unit [A] represented by Formula (1) according to the present embodiment, in a case where $R^1$ to $R^4$ are bonded to one another to form a ring structure, as the cyclic olefin polymer in which n represents 0, poly(4-oxy-tricyclo[5.2.1.0$^{2,6}$]-8-decene-3-one), poly(4-oxy-tricyclo[5.2.1.0$^{2,6}$]-8-decene-3,5-dione), poly(4-methyl-4-aza-tricyclo[5.2.1.0$^{2,6}$]-8-decene-3,5-dione), poly(4-(ethyl-4-aza-tricyclo[5.2.1.0$^{2,6}$]-8-decene-3,5-dione), poly(4-(n-propyl)-4-aza-tricyclo[5.2.1.0$^{2,6}$]-8-decene-3,5- dione), poly(4-(n-butyl)-4-aza-tricyclo[5.2.1.0$^{2,6}$]-8-decene-3,5-dione), poly(4-(1-methylbutyl)-4-aza-tricyclo[5.2.1.0$^{2,6}$]-8-decene-3,5-dione), poly(4-cyclopentyl-4-aza-tricyclo[5.2.1.0$^{2,6}$]-8-decene-3,5-dione), poly(4-cyclohexyl-4-aza-tricyclo[5.2.1.0$^{2,6}$]-8-decene-3,5-dione), poly(4-phenyl-4-aza-tricyclo[5.2.1.0$^{2,6}$]-8-decene-3,5-dione), or poly(4-(4-hydroxyphenyl-4-aza-tricyclo[5.2.1.0$^{2,6}$]-8-decene-3,5-d ione) is preferable.

In the repeating structural unit [A] represented by Formula (1) according to the present embodiment, examples of the cyclic olefin polymer in which n represents 1 include poly(tetracyclo[4.4.0.1$^{2,5}$.1$^{7,10}$]-3-dodecene) in a case where all of R$^1$ to R$^4$ represent hydrogen; poly(8-methyl-tetracyclo[4.4.0.1$^{2,5}$.1$^{7,10}$]-3-dodecene), poly(8-ethyl-tetracyclo[4.4.0.1$^{2,5}$.1$^{7,10}$]-3-dodecene), poly(8-(n-propyl)-tetracyclo[4.4.0.1$^{2,5}$.1$^{7,10}$]-3-dodecene), poly(8-i-propyl)-tetracyclo[4.4.0.1$^{2,5}$.1$^{7,10}$]-3-dodecene), poly(8-n-butyl)-tetracyclo[4.4.0.1$^{2,5}$.1$^{7,10}$]-3-dodecene), poly(8-tert-butyl)-tetracyclo[4.4.0.1$^{2,5}$.1$^{7,10}$]-3-dodecene), poly(8-(n-pentyl)-tetracyclo[4.4.0.1$^{2,5}$.1$^{7,10}$]-3-dodecene), poly(8-cyclopentyl-tetracyclo[4.4.0.1$^{2,5}$.1$^{7,10}$]-3-dodecene), poly(8-cyclohexyl-tetracyclo[4.4.0.1$^{2,5}$.1$^{7,10}$]-3-dodecene), and poly(8-cyclooctyl-tetracyclo[4.4.0.1$^{2,5}$.7,10]-3-dodecene) in a case where at least one of R$^1$ to R$^4$ represents an alkyl group; poly(8-phenyl-tetracyclo[4.4.0.1$^{2,5}$.1$^{7,10}$]-3-dodecene), poly(8-naphthyl-tetracyclo[4.4.0.1$^{2,5}$.1$^{7,10}$]-3-dodecene), poly(8-anthracenyl-tetracyclo[4.4.0.1$^{2,5}$.1$^{7,10}$]-3-dodecene), poly(8-(o-tolyl)-tetracyclo[4.4.0.1$^{2,5}$.1$^{7,10}$]-3-dodecene), poly(8-(m-tolyl)-tetracyclo[4.4.0.1$^{2,5}$.1$^{7,10}$]-3-dodecene), poly(8-(p-tolyl)-tetracyclo[4.4.0.1$^{2,5}$.1$^{7,10}$]-3-dodecene), poly(8-biphenyl-tetracyclo[4.4.0.1$^{2,5}$.1$^{7,10}$]-3-dodecene), and poly(8-(4-hydroxyphenyl)-tetracyclo[4.4.0.1$^{2,5}$.1$^{7,10}$]-3-dodecene) in a case where at least one of R$^1$ to R$^4$ represents an aryl group; poly(8-methoxy-tetracyclo[4.4.0.1$^{2,5}$.1$^{7,10}$]-3-dodecene), poly(8-ethoxy-tetracyclo[4.4.0.1$^{2,5}$.1$^{7,10}$]-3-dodecene), poly(8-(n-propoxy)-tetracyclo[4.4.0.1$^{2,5}$.1$^{7,10}$]-3-dodecene), poly(8-(i-propoxy)-tetracyclo[4.4.0.1$^{2,5}$.1$^{7,10}$]-3-dodecene), poly(8-(n-butoxy)-tetracyclo[4.4.0.1$^{2,5}$.1$^{7,10}$]-3-dodecene), poly(8-(tert-butoxy)-tetracyclo[4.4.0.1$^{2,5}$.1$^{7,10}$]-3-dodecene), poly(8-(n-pentoxy)-tetracyclo[4.4.0.1$^{2,5}$.1$^{7,10}$]-3-dodecene), poly(8-cyclopentyloxy-tetracyclo[4.4.0.1$^{2,5}$.1$^{7,10}$]-3-dodecene), poly(8-cyclohexyloxy-tetracyclo[4.4.0.1$^{2,5}$.1$^{7,10}$]-3-dodecene), and poly(8-cyclooctyloxy-tetracyclo[4.4.0.1$^{2,5}$.1$^{7,10}$]-3-dodecene) in a case where at least one of R$^1$ to R$^4$ represents an alkoxy group; poly(8-phenyloxy-tetracyclo[4.4.0.1$^{2,5}$.1$^{7,10}$]-3-dodecene), poly(8-naphthyloxy-tetracyclo[4.4.0.1$^{2,5}$.1$^{7,10}$]-3-dodecene), poly(8-anthracenyloxy-tetracyclo[4.4.0.1$^{2,5}$.1$^{7,10}$]-3-dodecene), poly(8-(o-tolyloxy)-tetracyclo[4.4.0.1$^{2,5}$.1$^{7,10}$]-3-dodecene), poly(8-(m-tolyloxy)-tetracyclo[4.4.0.1$^{2,5}$.1$^{7,10}$]-3-dodecene), poly(8-(p-tolyloxy)-tetracyclo[4.4.0.1$^{2,5}$.1$^{7,10}$]-3-dodecene), poly(8-(4-oxy-1,1'-biphenyl)-tetracyclo[4.4.0.1$^{2,5}$.1$^{7,10}$]-3-dodecene), and (8-(4-hydroxyphenyloxy)-tetracyclo[4.4.0.1$^{2,5}$.1$^{7,10}$]-3-dodecene) in a case where at least one of R$^1$ to R$^4$ represents an aryloxy group; poly(8-methoxymethyl-tetracyclo[4.4.0.1$^{2,5}$.1$^{7,10}$]-3-dodecene), poly(8-methoxyethyl-tetracyclo[4.4.0.1$^{2,5}$.1$^{7,10}$]-3-dodecene), poly(8-ethoxymethyl-tetracyclo[4.4.0.1$^{2,5}$.1$^{7,10}$]-3-dodecene), poly(8-ethoxyethyl-tetracyclo[4.4.0.1$^{2,5}$.1$^{7,10}$]-3-dodecene), poly(8-(n-propoxymethyl)-tetracyclo[4.4.0.1$^{2,5}$.1$^{7,10}$]-3-dodecene), poly(8-isopropoxymethyl-tetracyclo[4.4.0.1$^{2,5}$.1$^{7,10}$]-3-dodecene), poly(8-(n-butoxymethyl)-tetracyclo[4.4.0.1$^{2,5}$.1$^{7,10}$]-3-dodecene), poly(8-isobutoxymethyl-tetracyclo[4.4.0.1$^{2,5}$.1$^{7,10}$]-3-dodecene), poly(8-tert-butoxymethyl)-tetracyclo[4.4.0.1$^{2,5}$.1$^{7,10}$]-3-dodecene), poly(8-cyclopentyloxymethyl-tetracyclo[4.4.0.1$^{2,5}$.1$^{7,10}$]-3-dodecene poly(8-cyclohexyloxymethyl-tetracyclo[4.4.0.1$^{2,5}$.1$^{7,10}$]-3-dodecene), and poly(8-cyclooctyloxymethyl-tetracyclo[4.4.0.1$^{2,5}$.1$^{7,10}$]-3-dodecene) in a case where at least one of R$^1$ to R$^4$ represents an alkoxyalkyl group;

poly(8-phenyloxymethyl-tetracyclo[4.4.0.1$^{2,5}$.1$^{7,10}$]-3-dodecene), poly(8-naphthyloxymethyl-tetracyclo[4.4.0.1$^{2,5}$.1$^{7,10}$]-3-dodecene), poly(8-anthracenyloxymethyl-tetracyclo[4.4.0.1$^{2,5}$.1$^{7,10}$]-3-dodecene), poly(8-(o-tolyloxymethyl)-tetracyclo[4.4.0.1$^{2,5}$.1$^{7,10}$]-3-dodecene), poly(8-(m-tolyloxymethyl)-tetracyclo[4.4.0.1$^{2,5}$.1$^{7,10}$]-3-dodecene), poly(8-(p-tolyloxymethyl)-tetracyclo[4.4.0.1$^{2,5}$.1$^{7,10}$]-3-dodecene), poly(8-(4-oxy-1,1'-biphenylmethyl)-tetracyclo[4.4.0.1$^{2,5}$.1$^{7,10}$]-3-dodecene), and poly(8-(4-hydroxyphenyloxymethyl)-tetracyclo[4.4.0.1$^{2,5}$.1$^{7,10}$]-3-dodecene) in a case where at least one of R$^1$ to R$^4$ represents an aryloxyalkyl group; poly(8-methoxycarbonyl-tetracyclo[4.4.0.1$^{2,5}$.1$^{7,10}$]-3-dodecene), poly(8-ethoxycarbonyl-tetracyclo[4.4.0.1$^{2,5}$.1$^{7,10}$]-3-dodecene), poly(8-(n-propoxycarbonyl)-tetracyclo[4.4.0.1$^{2,5}$.1$^{7,10}$]-3-dodecene), poly(8-(n-butoxycarbonyl)-tetracyclo[4.4.0.1$^{2,5}$.1$^{7,10}$]-3-dodecene), poly(8-isobutoxycarbonyl-tetracyclo[4.4.0.1$^{2,5}$.1$^{7,10}$]-3-dodecene), poly(8-(tert-butoxycarbonyl)-tetracyclo[4.4.0.1$^{2,5}$.1$^{7,10}$]-3-dodecene), poly(8-(n-pentyloxycarbonyl)-tetracyclo[4.4.0.1$^{2,5}$.1$^{7,10}$]-3-dodecene), poly(8-(2-methyl-2-pentyloxycarbonyl)-tetracyclo[4.4.0.1$^{2,5}$.1$^{7,10}$]-3-dodecene), poly(8-(3-methyl-3-pentyloxycarbonyl)-tetracyclo[4.4.0.1$^{2,5}$.1$^{7,10}$]-3-dodecene), poly(8-(2-ethyl-3-methyl-3-pentyloxycarbonyl)-tetracyclo[4.4.0.1$^{2,5}$.1$^{7,10}$]-3-dodecene), poly(8-cyclopentyloxycarbonyl-tetracyclo[4.4.0.1$^{2,5}$.1$^{7,10}$]-3-dodecene), poly(8-(n-hexyloxycarbonyl)-tetracyclo[4.4.0.1$^{2,5}$.1$^{7,10}$]-3-dodecene), poly(8-cyclohexyloxycarbonyl-tetracyclo[4.4.0.1$^{2,5}$.1$^{7,10}$]-3-dodecene), poly(8-(2-methyl-2-butoxycarbonyl)-tetracyclo[4.4.0.1$^{2,5}$.1$^{7,10}$]-3-dodecene), poly(8-(2,3-dimethyl-2-butoxycarbonyl)-tetracyclo[4.4.0.1$^{2,5}$.1$^{7,10}$]-3-dodecene), poly(8-(2,3,3-trimethyl-2-butoxycarbonyl)-tetracyclo[4.4.0.1$^{2,5}$.1$^{7,10}$]-3-dodecene), poly(8-(2-methyl-2-hexyloxycarbonyl)-tetracyclo[4.4.0.1$^{2,5}$.1$^{7,10}$]-3-dodecene), poly(8-(3,4-dimethyl-3-hexyloxycarbonyl)-tetracyclo[4.4.0.1$^{2,5}$.1$^{7,10}$]-3-dodecene), poly(8-(3-methylbutoxycarbonyl)-tetracyclo[4.4.0.1$^{2,5}$.1$^{7,10}$]-3-dodecene), poly(8-(2-methylpentoxycarbonyl)-tetracyclo[4.4.0.1$^{2,5}$.1$^{7,10}$]-3-dodecene), poly(8-(3-methylpentoxycarbonyl)-tetracyclo[4.4.0.1$^{2,5}$.1$^{7,10}$]-3-dodecene), poly(8-(4-methylpentoxycarbonyl)-tetracyclo[4.4.0.1$^{2,5}$.1$^{7,10}$]-3-dodecene), poly(8-(3-methyl-3-heptyloxycarbonyl)-tetracyclo[4.4.0.1$^{2,5}$.1$^{7,10}$]-3-dodecene), poly(8-(2-cyclopentyl-2-propoxycarbonyl)-tetracyclo[4.4.0.1$^{2,5}$.1$^{7,10}$]-3-dodecene), poly(8-(2-cyclohexyl-2-propoxycarbonyl)-tetracyclo[4.4.0.1$^{2,5}$.1$^{7,10}$]-3-dodecene), poly(8-(2-norbornyl-2-propoxycarbonyl)-tetracyclo[4.4.0.1$^{2,5}$.1$^{7,10}$]-3-dodecene), poly(8-(1,1-dicyclopentylethoxycarbonyl)-tetracyclo[4.4.0.1$^{2,5}$.1$^{7,10}$]-3-dodecene), poly(8-(1,1-dicyclohexylethoxycarbonyl)-tetracyclo[4.4.0.1$^{2,5}$.1$^{7,10}$]-3-dodecene), poly(8-(1-methylcyclopentyloxycarbonyl)-tetracyclo[4.4.0.1$^{2,5}$.1$^{7,10}$-]-3-dodecene), poly(8-(1-ethylcyclopentyloxycarbonyl)-tetracyclo[4.4.0.1$^{2,5}$.1$^{7,10}$]-3-dodecene), poly(8-(1-methylcyclohexyloxycarbonyl)-tetracyclo[4.4.0.1$^{2,5}$.1$^{7,01}$]-3-dodecene), poly(8-(1-ethylcyclohexyloxycarbonyl)-tetracyclo[4.4.0.1$^{2,5}$.1$^{7,10}$]-3-dodecene), poly(8-(1-methylcyclooctyloxycarbonyl)-tetracyclo[4.4.0.1$^{2,5}$.1$^{7,10}$]-3-dodecene), poly(8-(1-ethylcyclooctyloxycarbonyl)-tetracyclo[4.4.0.1$^{2,5}$.1$^{7,10}$]-3-dodecene), poly(8-(1-adamantyloxycarbonyl)-tetracyclo[4.4.0.1$^{2,5}$.17,10]-3-dodecene), poly(8-(2-methyl-2-adamantyloxycarbonyl)-tetracyclo[4.4.0.1$^{2,5}$.1$^{7,10}$]-3-dodecene), poly(8-(2-ethyl-2-adamantyloxycarbonyl)- tetracyclo[4.4.0.1$^{2,5}$.1$^{7,10}$]-3-dodecene), poly(8-(1-methyl-decahydronaphthalene-1-yloxycarbonyl)-tetracyclo[4.4.0.1$^{2,5}$.1$^{7,10}$]-3-dodecene), poly(8-(1-ethyldecahydronaphthalene-1-yloxycarbonyl)-tetracyclo[4.4.0.1$^{2,5}$.1$^{7,10}$]-3-dodecene), poly(8-(2-methyldecahydronaphthalene-2-yloxycarbonyl)-tetracyclo[4.4.0.1$^{2,5}$.1$^{7,10}$]-3-dodecene), poly(8-(2-ethyldecahydronaphthalene-2-yloxycarbonyl)-tetracyclo[4.4.0.1$^{2,5}$.1$^{7,10}$]-3-dodecene), poly(8-(2-methyl-2-norbornyloxycarbonyl)-tetracyclo[4.4.0.1$^{2,5}$.1$^{7,10}$]-3-dodecene), poly(8-(2-ethyl-2-norbornyloxycarbonyl)-tetracyclo[4.4.0.1$^{2,5}$.1$^{7,10}$]-3-dodecene), poly(8-(2,7,7-trimethyl-2-norbornyloxycarbonyl)-tetracyclo[4.4.0.1$^{2,5}$.1$^{7,10}$]-3-dodecene), poly(8-(2-ethyl-7,7-dimethyl-2-norbornyloxycarbonyl)-tetracyclo[4.4.0.1$^{2,5}$.1$^{7,10}$]-3-dodecene), poly(8-(5-methyl-octahydro-4,7-methano-indene-5-yloxycarbonyl)-tetracyclo[4.4.0.1$^{2,5}$.1$^{7,10}$]-3-dodecene), poly(8-(5-ethyl-octahydro-4,7-methano-indene-5-yloxycarbonyl)-tetracyclo[4.4.0.1$^{2,5}$.1$^{7,10}$]-3-dodecene), poly(8-(4-methyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), and poly(8-(4-ethyl-tetracyclo[6.2.1.1.$^{3,6}$.0$^{2,7}$]-dodecane-4-yloxycarbonyl)-tetracyclo[4.4.0.1$^{2,5}$.1$^{7,10}$]-3-dodecene) in a case where at least one of R$^1$ to R$^4$ represents an alkoxycarbonyl group; poly(8-dimethylaminocarbonyl-tetracyclo[4.4.0.1$^{2,5}$.1$^{7,10}$]-3-dodecene), poly(8-diethylaminocarbonyl-tetracyclo[4.4.0.1$^{2,5}$.1$^{7,10}$]-3-dodecene), poly(8-ethylmethylaminocarbonyl-tetracyclo[4.4.0.1$^{2,5}$.1$^{7,10}$]-3-dodecene), poly(8-methylbutylaminocarbonyl-tetracyclo[4.4.0.1$^{2,5}$.1$^{7,10}$]-3-dodecene), poly(8-butylethylaminocarbonyl-tetracyclo[4.4.0.1$^{2,5}$.1$^{7,10}$]-3-dodecene), and poly(8-cyclohexylmethylaminocarbonyl-tetracyclo[4.4.0.1$^{2,5}$.1$^{7,10}$]-3-dodecene) in a case where at least one of R$^1$ to R$^4$ represents a dialkylaminocarbonyl group; poly(8-phenoxycarbonyl-tetracyclo[4.4.0.1$^{2,5}$.1$^{7,10}$]-3-dodecene), poly(8-benzyloxycarbonyl-tetracyclo[4.4.0.1$^{2,5}$.1$^{7,10}$]-3-dodecene), poly(8-(4-methylphenoxycarbonyl)-tetracyclo[4.4.0.1$^{2,5}$.1$^{7,10}$]-3-dodecene), poly(8-(3,4-dimethylphenoxycarbonyl)-tetracyclo[4.4.0.1$^{2,5}$.1$^{7,10}$]-3-dodecene), poly(8-(1-naphthoxycarbonyl)-tetracyclo[4.4.0.1$^{2,5}$.1$^{7,10}$]-3-dodecene), poly(8-(2-naphthoxycarbonyl)-tetracyclo[4.4.0.1$^{2,5}$.1$^{7,10}$]-3-dodecene), and poly(8-(1-anthracenoxycarbonyl)-tetracyclo[4.4.0.1$^{2,5}$.1$^{7,10}$]-3-dodecene) in a case where at least one of R$^1$ to R$^4$ represents an aryloxycarbonyl group; poly(8-methylphenylaminocarbonyl)-tetracyclo[4.4.0.1$^{2,5}$.7,10]-3-dodecene), poly(8-ethylphenylaminocarbonyl-tetracyclo[4.4.0.1$^{2,5}$.1$^{7,10}$]-3-dodecene), poly(8-butylphenylaminocarbonyl-tetracyclo[4.4.0.1$^{2,5}$.1$^{7,10}$]-3-dodecene), and poly(8-cyclohexylphenylaminocarbonyl-tetracyclo[4.4.0.1$^{2,5}$.1$^{7,10}$]-3-dodecene) in a case where at least one of R$^1$ to R$^4$ represents an alkylarylaminocarbonyl group; poly(8-methoxycarbonylmethyl-tetracyclo[4.4.0.1$^{2,5}$.1$^{7,10}$]-3-dodecene), poly(8-methoxycarbonylethyl-tetracyclo[4.4.0.1$^{2,5}$.1$^{7,10}$]-3-dodecene), poly(8-ethoxycarbonylmethyl-tetracyclo[4.4.0.1$^{2,5}$.1$^{7,10}$]-3-dodecene), poly(8-ethoxycarbonylethyl-tetracyclo[4.4.0.1$^{2,5}$.1$^{7,10}$]-3-dodecene), poly(8-(n-propoxycarbonylmethyl)-tetracyclo[4.4.0.1$^{2,5}$.1$^{7,10}$]-3-dodecene), poly(8-(i-propoxycarbonylmethyl)-tetracyclo[4.4.0.1$^{2,5}$.1$^{7,10}$]-3-dodecene), poly(8-(n-butoxycarbonylmethyl)-tetracyclo[4.4.0.1$^{2,5}$.1$^{7,10}$]-3-dodecene), poly(8-(tert-butoxycarbonylmethyl)-tetracyclo[4.4.0.1$^{2,5}$.1$^{7,10}$]-3-dodecene), poly(8-(n-pentyloxycarbonylmethyl)-tetracyclo[4.4.0.1$^{2,5}$.1$^{7,10}$]-3-dodecene), poly(8-(2-methyl-2-butoxycarbonyl)methyl)-tetracyclo[4.4.0.1$^{2,5}$.1$^{7,10}$]-3-dodecene), poly(8-(2,3-dimethyl-2-butoxycarbonyl)methyl)-tetracyclo[4.4.0.1$^{2,5}$.1$^{7,10}$]-3-dodecene), poly(8-cyclopentyloxycarbonylmethyl-tetracyclo[4.4.0.1$^{2,5}$.1$^{7,10}$]-3-dodecene), poly(8-(n-hexyloxycarbonylmethyl)-tetracyclo[4.4.0.1$^{2,5}$.1$^{7,10}$]-3-dodecene), poly(8-cyclohexyloxycarbonylmethyl-tetracyclo[4.4.0.1$^{2,5}$.1$^{7,10}$]-3-dodecene), poly(8-(n-octyloxycarbonylmethyl)-tetracyclo[4.4.0.1$^{2,5}$.1$^{7,10}$]-3-dodecene), poly(8-cyclooctyloxycarbonylmethyl-tetracyclo[4.4.0.1$^{2,5}$.1$^{7,10}$]-3-dodecene), poly(8-(2-cyclopentyl-2-propoxycarbonyl)methyl)-tetracyclo[4.4.0.1$^{2,5}$.1$^{7,10}$]-3-dodecene), poly(8-(2-cyclohexyl-2-propoxycarbonyl)methyl)-tetracyclo[4.4.0.1$^{2,5}$.1$^{7,10}$]-3-dodecene), poly(8-(1-methylcyclopentyloxycarbonyl)methyl)-tetracyclo[4.4.0.1$^{2,5}$.1$^{7,10}$]-3-dodecene), poly(8-(1-ethylcyclopentyloxycarbonyl)methyl)-tetracyclo[4.4.0.1$^{2,5}$.1$^{7,10}$]-3-dodecene), poly(8-(1-methylcyclohexyloxycarbonyl)methyl)-tetracyclo[4.4.0.1$^{2,5}$.1$^{7,10}$]-3-dodecene), and poly(8-(1-ethylcyclohexyloxycarbonyl)methyl)-tetracyclo[4.4.0.1$^{2,5}$.1$^{7,10}$]-3-dodecene) in a case where at least one of R$^1$ to R$^4$ represents an alkoxycarbonylalkyl group; poly(8-methoxycarbonylphenyl)-tetracyclo[4.4.0.1$^{2,5}$.1$^{7,10}$]-3-dodecene), poly(8-ethoxycarbonylphenyl-tetracyclo[4.4.0.1$^{2,5}$.1$^{7,10}$]-3-dodecene), poly(8-(n-propoxycarbonylphenyl)-tetracyclo[4.4.0.1$^{2,5}$.1$^{7,10}$]-3-dodecene), poly(8-(i-propoxycarbonylphenyl)-tetracyclo[4.4.0.1$^{2,5}$.1$^{7,10}$]-3-dodecene), poly(8-(n-butoxycarbonylphenyl)-tetracyclo[4.4.0.1$^{2,5}$.1$^{7,10}$]-3-dodecene), poly(8-(tert-butoxycarbonylphenyl)-tetracyclo[4.4.0.1$^{2,5}$.1$^{7,10}$]-3-dodecene), poly(8-(n-pentyloxycarbonylphenyl)-tetracyclo[4.4.0.1$^{2,5}$.1$^{7,10}$]-3-dodecene), poly(8-(3-(2-methyl-2-butoxycarbonyl)phenyl)-tetracyclo[4.4.0.1$^{2,5}$.1$^{7,10}$]-3-dodecene), poly(8-(3-(2,3-dimethyl-2-butoxycarbonyl)phenyl)-tetracyclo[4.4.0.1$^{2,5}$.1$^{7,10}$]-3-dodecene), poly(8-(3-(2-cyclopentyl-2-propoxycarbonyl)phenyl)-tetracyclo[4.4.0.1$^{2,5}$.1$^{7,10}$]-3-dodecene), poly(8-(3-(2-cyclohexyl-2-propoxycarbonyl)phenyl)-tetracyclo[4.4.0.1$^{2,5}$.1$^{7,10}$]-3-dodecene), poly(8-(3-(1-methylcyclopentyloxycarbonyl)phenyl)-tetracyclo[4.4.0.1$^{2,5}$.1$^{7,10}$]-3-dodecene), poly(8-(3-(1-ethylcyclopentyloxycarbonyl)phenyl)-tetracyclo[4.4.0.1$^{2,5}$.1$^{7,10}$]-3-dodecene), poly(8-(3-(1-methylcyclohexyloxycarbonyl)phenyl)-tetracyclo[4.4.0.1$^{2,5}$.1$^{7,10}$]-3-dodecene), poly(8-(3-(1-ethylcyclohexyloxycarbonyl)phenyl)-tetracyclo[4.4.0.1$^{2,5}$.1$^{7,10}$]-3-dodecene), poly(8-(4-(2-methyl-2-butoxycarbonyl)phenyl)-tetracyclo[4.4.0.1$^{2,5}$.1$^{7,10}$]-3-dodecene), poly(8-(4-(2,3-dimethyl-2-butoxycarbonyl)phenyl)-tetracyclo[4.4.0.1$^{2,5}$.1$^{7,10}$]-3-dodecene), poly(8-(4-(2-cyclopentyl-2-propoxycarbonyl)phenyl)-tetracyclo[4.4.0.1$^{2,5}$.1$^{7,10}$]-3-dodecene), poly(8-(4-(2-cyclohexyl-2-propoxycarbonyl)phenyl)-tetracyclo[4.4.0.1$^{2,5}$.1$^{7,10}$]-3-dodecene), poly(8-(4-(1-methylcyclopentyloxycarbonyl)phenyl)-tetracyclo[4.4.0.1$^{2,5}$.1$^{7,10}$]-3-dodecene), poly(8-(4-(1-ethylcyclopentyloxycarbonyl)phenyl)-tetracyclo[4.4.0.1$^{2,5}$.1$^{7,10}$]-3-dodecene), poly(8-(4-(1-methylcyclohexyloxycarbonyl)phenyl)-tetracyclo[4.4.0.1$^{2,5}$.1$^{7,10}$]-3-dodecene), poly(8-(4-(1-ethylcyclohexyloxycarbonyl)phenyl)-tetracyclo[4.4.0.1$^{2,5}$.1$^{7,10}$]-3-dodecene), poly(8-methoxycarbonylnaphthyl-tetracyclo[4.4.0.1$^{2,5}$.1$^{7,10}$]-3-dodecene), poly(8-ethoxycarbonylnaphthyl-tetracyclo[4.4.0.1$^{2,5}$.1$^{7,10}$]-3-dodecene), poly(8-(n-propoxycarbonylnaphthyl)-tetracyclo[4.4.0.1$^{2,5}$.1$^{7,10}$]-3-dodecene), poly(8-(i-propoxycarbonylnaphthyl)-tetracyclo[4.4.0.1$^{2,5}$.1$^{7,10}$]-3-dodecene), poly(8-(n-butoxycarbonylnaphthyl)-tetracyclo[4.4.0.1$^{2,5}$.1$^{7,10}$]-3-dodecene), poly(8-(tert-butoxycarbonylphenyl)-tetracyclo[4.4.0.1$^{2,5}$.1$^{7,10}$]-3-dodecene), poly(8-(n-pentyloxycarbonylnaphthyl)-tetracyclo[4.4.0.1$^{2,5}$.1$^{7,10}$]-3-dodecene), poly(8-(5-(2- methyl-2-butoxycarbonyl)naphthyl)-tetracyclo[4.4.0.1$^{2,5}$.1$^{7,10}$]-3-dodecene), poly(8-(5-(2,3-dimethyl-2-butoxycarbonyl)naphthyl)-tetracyclo[4.4.0.1$^{2,5}$.1$^{7,10}$]-3-dodecene), poly(8-(5-(2-cyclopentyl-2-propoxycarbonyl)naphthyl)-tetracyclo[4.4.0.1$^{2,5}$.1$^{7,10}$]-3-dodecene), poly(8-(5-(2-cyclohexyl-2-propoxycarbonyl)naphthyl)-tetracyclo[4.4.0.1$^{2,5}$.1$^{7,10}$]-3-dodecene), poly(8-(5-(1-methylcyclopentyloxycarbonyl) naphthyl)-tetracyclo[4.4.0.1$^{2,5}$.1$^{7,10}$]-3-dodecene), poly(8-(5-(1-ethylcyclopentyloxycarbonyl) naphthyl)-tetracyclo[4.4.0.1$^{2,5}$.1$^{7,10}$]-3-dodecene), poly(8-(5-(1-methylcyclohexyloxycarbonyl)naphthyl)-tetracyclo[4.4.0.1$^{2,5}$.1$^{7,10}$]-3-dodecene), and poly(8-(5-(1-ethylcyclohexyloxycarbonyl)naphthyl)-tetracyclo[4.4.0.1$^{2,5}$.1$^{7,10}$]-3-dodecene) in a case where at least one of $R^1$ to $R^4$ represents an alkoxycarbonylaryl group; poly(8-phenoxycarbonylmethyl-tetracyclo[4.4.0.1$^{2,5}$.1$^{7,10}$]-3-dodecene), poly(8-benzyloxycarbonylmethyl-tetracyclo[4.4.01$^{2,5}$.1$^{7,10}$]-3-dodecene), poly(8-(4-methylphenoxycarbonylmethyl)-tetracyclo[4.4.0.1$^{2,5}$.1$^{7,10}$]-3-dodecene), poly(8-(3,4-dimethylphenoxycarbonylmethyl)-tetracyclo[4.4.0.1$^{2,5}$.1$^{7,10}$]-3-dodecene), poly(8-(1-naphthoxycarbonylmethyl)-tetracyclo[4.4.0.1$^{2,5}$.1$^{7,10}$]-3-dodecene), poly(8-(2-naphthoxycarbonylmethyl)-tetracyclo[4.4.0.1$^{2,5}$.1$^{7,10}$]-3-dodecene), and poly(8-(1-anthracenoxycarbonylmethyl)-tetracyclo[4.4.0.1$^{2,5}$.1$^{7,10}$]-3-dodecene) in a case where at least one of $R^1$ to $R^4$ represents an aryloxycarbonylalkyl group; poly(8-methoxymethyloxycarbonyl-tetracyclo[4.4.0.1$^{2,5}$.1$^{7,10}$]-3-dodecene), poly(8-ethoxymethyloxycarbonyl-tetracyclo[4.4.0.1$^{2,5}$.1$^{7,10}$]-3-dodecene), poly(8-(n-propoxymethyloxycarbonyl)-tetracyclo[4.4.0.1$^{2,5}$.1$^{7,10}$]-3-dodecene), poly(8-isopropoxymethyloxycarbonyl-tetracyclo[4.4.0.1$^{2,5}$.1$^{7,10}$]-3-dodecene), poly(8-(n-butoxymethyloxycarbony)-tetracyclo[4.4.0.1$^{2,5}$.1$^{7,10}$]-3-dodecene), poly(8-(tert-butoxymethyloxycarbony)-tetracyclo[4.4.0.1$^{2,5}$.1$^{7,10}$]-3-dodecene), poly(8-cyclopentyloxymethyloxycarbonyl-tetracyclo[4.4.0.1$^{2,5}$.1$^{7,10}$]-3-dodecene), poly(8-cyclohexyloxymethyloxycarbonyl-tetracyclo[4.4.0.1$^{2,5}$.1$^{7,10}$]-3-dodecene), poly(8-cyclooctyloxymethyloxycarbonyl-tetracyclo[4.4.0.1$^{2,5}$.1$^{7,10}$]-3-dodecene), poly(8-norbornyloxymethyloxycarbonyl-tetracyclo[4.4.0.1$^{2,5}$.1$^{7,10}$]-3-dodecene), poly(8-(1-methylcyclopentyloxymethyloxycarbonyl)-tetracyclo[4.4.0.1$^{2,5}$.1$^{7,10}$]-3-dodecene), poly(8-(1-ethylcyclopentyloxymethyloxycarbonyl)-tetracyclo[4.4.0.1$^{2,5}$.1$^{7,10}$]-3-dodecene), poly(8-(1-methylcyclohexyloxymethyloxycarbonyl)-tetracyclo[4.4.0.1$^{2,5}$.1$^{7,10}$]-3-dodecene), poly(8-(1-ethylcyclohexyloxymethyloxycarbonyl)-tetracyclo[4.4.0.1$^{2,5}$.1$^{7,10}$]-3-dodecene), poly(8-(1-methylnorbornyloxymethyloxycarbonyl)-tetracyclo[4.4.0.1$^{2,5}$.1$^{7,10}$]-3-dodecene), poly(8-(1-ethylnorbornyloxymethyloxycarbonyl)-tetracyclo[4.4.0.1$^{2,5}$.1$^{7,10}$]-3-dodecene), poly(8-(1-ethoxypropyloxymethyloxycarbonyl)-tetracyclo[4.4.0.1$^{2,5}$.1$^{7,10}$]-3-dodecene), poly(8-(1-ethoxy-1-methylethyloxymethyloxycarbonyl)-tetracyclo[4.4.0.1$^{2,5}$.1$^{7,10}$]-3-dodecene), poly(8-tetrahydrofuran-2-yloxymethyloxycarbonyl-tetracyclo[4.4.0.1$^{2,5}$.1$^{7,10}$]-3-dodecene), poly(8-tetrahydropyran-2-yloxymethyloxycarbonyl-tetracyclo[4.4.0.1$^{2,5}$.1$^{7,10}$]-3-dodecene), poly(8-(1-adamantyloxymethyloxycarbonyl)-tetracyclo[4.4.0.1$^{2,5}$.1$^{7,10}$]-3-dodecene), poly(8-(2-adamantyloxymethyloxycarbonyl)-tetracyclo[4.4.0.1$^{2,5}$.1$^{7,10}$]-3-dodecene), poly(8-(1-(1-methoxy)ethoxycarbonyl)-tetracyclo[4.4.0.1$^{2,5}$.1$^{7,10}$]-3-dodecene), poly(8-(1-(1-ethoxy)ethoxycarbonyl)-tetracyclo[4.4.0.1$^{2,5}$.1$^{7,10}$]-3-dodecene), poly(8-(1-(1-n-propoxy)ethoxycarbonyl)-tetracyclo[4.4.0.1$^{2,5}$.1$^{7,10}$]-3-dodecene), poly(8-(1-(1-isopropoxy)ethoxycarbonyl)-tetracyclo[4.4.0.1$^{2,5}$.1$^{7,10}$]-3-dodecene), poly(8-(1-(1-n-butoxy)ethoxycarbonyl)-tetracyclo[4.4.0.1$^{2,5}$.1$^{7,10}$]-3-dodecene), poly(8-(1-(1-tert-butoxy)ethoxycarbonyl)-tetracyclo[4.4.0.1$^{2,5}$.1$^{7,10}$]-3-dodecene), poly(8-(1-(1-cyclopentyloxy)ethoxycarbonyl)-tetracyclo[4.4.0.1$^{2,5}$.1$^{7,10}$]-3-dodecene), poly(8-(1-(1-cyclohexyloxy)ethoxycarbonyl)-tetracyclo[4.4.0.1$^{2,5}$.1$^{7,10}$]-3-dodecene), poly(8-(1-(1-cyclooctyloxy)ethoxycarbonyl)-tetracyclo[4.4.0.1$^{2,5}$.1$^{7,10}$]-3-dodecene), poly(8-(1-(1-norbornyloxy)ethoxycarbonyl)-tetracyclo[4.4.0.1$^{2,5}$.1$^{7,10}$]-3-dodecene), poly(8-(1-(1-methylcyclopentyloxy)ethoxycarbonyl)-tetracyclo[4.4.0.1$^{2,5}$.1$^{7,10}$]-3-dodecene), poly(8-(1-(1-ethylcyclopentyloxy)ethoxycarbonyl)-tetracyclo[4.4.0.1$^{2,5}$.1$^{7,10}$]-3-dodecene), poly(8-(1-(1-methylcyclohexyloxy)ethoxycarbonyl)-tetracyclo[4.4.0.1$^{2,5}$.1$^{7,10}$]-3-dodecene), poly(8-(1-(1-ethylcyclohexyloxy)ethoxycarbonyl)-tetracyclo[4.4.0.1$^{2,5}$.1$^{7,10}$]-3-dodecene), poly(8-(1-(1-methylnorbornyloxy)ethoxycarbonyl)-tetracyclo[4.4.0.1$^{2,5}$.1$^{7,10}$]-3-dodecene), poly(8-(1-(1-ethylnorbornyloxy)ethoxycarbonyl)-tetracyclo[4.4.0.1$^{2,5}$.1$^{7,10}$]-3-dodecene), poly(8-(1-(1-ethoxypropyloxy)ethoxycarbonyl)-tetracyclo[4.4.0.1$^{2,5}$.1$^{7,10}$]-3-dodecene), poly(8-(1-(1-ethoxy-1-methylethyloxy)ethoxycarbonyl)-tetracyclo[4.4.0.1$^{2,5}$.1$^{7,10}$]-3-dodecene), poly(8-(1-(tetrahydrofuran-2-yloxy)ethoxycarbonyl)-tetracyclo[4.4.0.1$^{2,5}$.1$^{7,10}$]-3-dodecene), poly(8-(1-(tetrahydropyran-2-yloxy)ethoxycarbonyl)-tetracyclo[4.4.0.1$^{2,5}$.1$^{7,10}$]-3-dodecene), poly(8-(1-(1-adamantyloxy)ethoxycarbonyl)-tetracyclo[4.4.0.1$^{2,5}$.1$^{7,10}$]-3-dodecene), and poly(8-(1-(2-adamantyloxy)ethoxycarbonyl)-tetracyclo[4.4.0.1$^{2,5}$.1$^{7,10}$]-3-dodecene) in a case where at least one of $R^1$ to $R^4$ represents an alkoxyalkyloxycarbonyl group; and poly(8-methoxycarbonylmethyloxycarbonyl-tetracyclo[4.4.0.1$^{2,5}$.1$^{7,10}$]-3-dodecene), poly(8-ethoxycarbonylmethyloxycarbonyl-tetracyclo[4.4.0.1$^{2,5}$.1$^{7,10}$]-3-dodecene), poly(8-(n-propoxycarbonylmethyloxycarbonyl)-tetracyclo[4.4.0.1$^{2,5}$.1$^{7,10}$]-3-dodecene), poly(8-isopropoxycarbonylmethyloxycarbonyl-tetracyclo[4.4.0.1$^{2,5}$.1$^{7,10}$]-3-dodecene), poly(8-(n-butoxycarbonylmethyloxycarbonyl)-tetracyclo[4.4.0.1$^{2,5}$.1$^{7,10}$]-3-dodecene), poly(8-(tert-butoxycarbonyimethyloxycarbonyl-tetracyclo[4.4.0.1$^{2,5}$.1$^{7,10}$]-3-dodecene), poly(8-(2-cyclopentyl-2-propoxycarbonylmethyloxycarbonyl)-tetracyclo[4.4.0.1$^{2,5}$.1$^{7,10}$]-3-dodecene), poly(8-(2-cyclopentyl-2-butoxycarbonylmethyloxycarbonyl)-tetracyclo[4.4.0.1$^{2,5}$.1$^{7,10}$]-3-dodecene), poly(8-(2-cyclohexyl-2-propoxycarbonylmethyloxycarbonyl)-tetracyclo[4.4.0.1$^{2,5}$.1$^{7,10}$]-3-dodecene), poly(8-(3-(2-cyclohexyl-2-propoxycarbonyl)propoxycarbonyl)-tetracyclo[4.4.0.1$^{2,5}$.1$^{7,10}$]-3-dodecene), poly(8-(2-cyclohexyl-2-butoxycarbonylmethyloxycarbonyl)-tetracyclo[4.4.0.1$^{2,5}$.1$^{7,10}$]-3-dodecene), poly(8-(3-cyclohexyl-3-pentyloxycarbonylmethyloxycarbonyl)-tetracyclo[4.4.0.1$^{2,5}$.1$^{7,10}$]-3-dodecene), poly(8-(2-ethyl-2-norbornyloxycarbonylmethyloxycarbonyl)-tetracyclo[4.4.0.1$^{2,5}$.1$^{7,10}$]-3-dodecene), poly(8-(2-norbornyl-2-propoxycarbonylmethyloxycarbonyl)-tetracyclo[4.4.0.1$^{2,5}$.1$^{7,10}$]-3-dodecene), poly(8-(4-ethyl-tetracyclo[6.2.1.1$^{3,6}$.0$^{2,7}$]-dodecane-4-yloxycarbonylmethyloxycarbonyl)-tetracyclo[4.4.0.1$^{2,5}$.1$^{7,10}$]-3-dodecene), poly(8-(2-tetracyclo[6.2.1.1$^{3,6}$.0$^{2,7}$]-dodecane-4-yl)-2-propoxycarbonylmethyloxycarbonyl)-tetracyclo[4.4.0.1$^{2,5}$.1$^{7,10}$]-3-dodecene), poly(8-(1,1-dicyclohexylethoxycarbonylmethyloxycarbonyl)-tetracyclo[4.4.0.1$^{2,5}$.1$^{7,10}$]-3-dodecene), poly(8-(1,1-dicyclohexylpropoxycarbonylmethyloxycarbonyl)-tetracyclo[4.4.0.1$^{2,5}$.1$^{7,10}$]-3-dodecene), poly(8-cyclopentyloxycarbonylmethyloxycarbonyl-tetracyclo[4.4.0.1$^{2,5}$.1$^{7,10}$]-3-dodecene), poly(8- cyclohexyloxycarbonylmethyloxycarbonyl-tetracyclo[4.4.0.1$^{2,5}$.1$^{7,10}$]-3-dodecene), poly(8-cyclooctyloxycarbonylmethyloxycarbonyl-tetracyclo[4.4.0.1$^{2,5}$.1$^{7,10}$]-3-dodecene), poly(8-norbornyloxycarbonylmethyloxycarbonyl-tetracyclo[4.4.0.1$^{2,5}$.1$^{7,10}$]-3-dodecene), poly(8-(1-methylcyclopentyloxycarbonylmethyloxycarbonyl-tetracyclo[4.4.0.1$^{2,5}$.1$^{7,10}$]-3-dodecene), poly(8-(1-ethylcyclopentyloxycarbonylmethyloxycarbonyl)-tetracyclo[4.4.0.1$^{2,5}$.1$^{7,10}$]-3-dodecene), poly(8-(1-methylcyclohexyloxycarbonylmethyloxycarbonyl)-tetracyclo[4.4.0.1$^{2,5}$.1$^{7,10}$]-3-dodecene), poly(8-(1-ethylcyclohexyloxycarbonylmethyloxycarbonyl)-tetracyclo[4.4.0.1$^{2,5}$.1$^{7,10}$]-3-dodecene), poly(8-(1-methylnorbornyloxycarbonylmethyloxycarbonyl)-tetracyclo[4.4.0.1$^{2,5}$.1$^{7,10}$]-3-dodecene), poly(8-(1-ethylnorbornyloxycarbonylmethyloxycarbonyl)-tetracyclo[4.4.0.1$^{2,5}$.1$^{7,10}$]-3-dodecene), poly(8-(1-ethoxypropyloxycarbonylmethyloxycarbonyl)-tetracyclo[4.4.0.1$^{2,5}$.7,10]-3-dodecene), poly(8-(1-ethoxy-1-methylethyloxycarbonylmethyloxycarbonyl)-tetracyclo[4.4.0.1$^{2,5}$.1$^{7,10}$]-3-dodecene), poly(8-tetrahydrofuran-2-yloxycarbonylmethyloxycarbonyl-tetracyclo[4.4.0.1$^{2,5}$.1$^{7,10}$]-3-dodecene), poly(8-tetrahydropyran-2-yloxycarbonylmethyloxycarbonyl-tetracyclo[4.4.0.1$^{2,5}$.1$^{7,10}$]-3-dodecene), poly(8-(1-adamantyloxycarbonylmethyloxycarbonyl)-tetracyclo[4.4.0.1$^{2,5}$.1$^{7,10}$]-3-dodecene), poly(8-(2-adamantyloxycarbonylmethyloxycarbonyl)-tetracyclo[4.4.0.1$^{2,5}$.1$^{7,10}$]-3-dodecene), poly(8-(1-(2-(1-adamantyl)-2-propoxycarbonyl) ethoxycarbonyl)-tetracyclo[4.4.0.1$^{2,5}$.1$^{7,10}$]-3-dodecene), poly(8-(3-(2-(1-adamantyl)-2-propoxycarbonyl) propoxycarbonyl)-tetracyclo[4.4.0.1$^{2,5}$.1$^{7,10}$]-3-dodecene), poly(8-(2-(2-(1-adamantyl)-2-propoxycarbonyl)-2-propoxycarbonyl)-tetracyclo[4.4.0.1$^{2,5}$.1$^{7,10}$]-3-dodecene), poly(8-(2-methyl-2-adamantyloxycarbonylmethyloxycarbonyl)-tetracyclo[4.4.0.1$^{2,5}$.1$^{7,10}$]-3-dodecene), poly(8-(3-(2-methyl-2-adamantyloxycarbonyl) propoxycarbonyl)-tetracyclo[4.4.0.1$^{2,5}$.1$^{7,10}$]-3-dodecene), poly(8-(2-(2-methyl-2-adamantyloxycarbonyl)-2-propoxycarbonyl)-tetracyclo[4.4.0.1$^{2,5}$.1$^{7,10}$]-3-dodecene), poly(8-(1-(2-methyl-2-adamantyloxycarbonyl) ethoxycarbonyl)-tetracyclo[4.4.0.1$^{2,5}$.1$^{7,10}$]-3-dodecene), poly(8-(2-ethyl-2-adamantyloxycarbonylmethyloxycarbonyl)-tetracyclo[4.4.0.1$^{2,5}$.1$^{7,10}$]-3-dodecene), poly(8-(2-isopropyl-2-adamantyloxycarbonylmethyloxycarbonyl)-tetracyclo[4.4.0.1$^{2,5}$.1$^{7,10}$]-3-dodecene), poly(8-(2-(1-adamantyl)-2-propoxycarbonylmethyloxycarbonyl)-tetracyclo[4.4.0.1$^{2,5}$.1$^{7,10}$]-3-dodecene), poly(8-(2-(1-adamantyl)-2-butoxycarbonylmethyloxycarbonyl)-tetracyclo[4.4.0.1$^{2,5}$.1$^{7,10}$]-3-dodecene), poly(8-(3-(1-adamantyl)-3-pentyloxycarbonylmethyloxycarbonyl)-tetracyclo[4.4.0.1$^{2,5}$.1$^{7,10}$]-3-dodecene), poly(8-(3-tert-butoxycarbonyl-1-cyclopentyloxycarbonyl)-tetracyclo[4.4.0.1$^{2,5}$.1$^{7,10}$]-3-dodecene), poly(8-(3-(1-methylcyclohexyloxycarbonyl)-1-cyclopentyloxycarbonyl)-tetracyclo[4.4.0.1$^{2,5}$.1$^{7,10}$]-3-dodecene), poly(8-(5-tert-butoxycarbonyl-2-norbornyloxycarbonyl)-tetracyclo[4.4.0.1$^{2,5}$.1$^{7,10}$]-3-dodecene), poly(8-(5-(1-methylcyclohexyloxycarbonyl)-2-norbornyloxycarbonyl)-tetracyclo[4.4.0.1$^{2,5}$.1$^{7,10}$]-3-dodecene), poly(8-(5,5-di(tert-butoxycarbonyl)-2-norbornyloxycarbonyl)-tetracyclo[4.4.0.1$^{2,5}$.1$^{7,10}$]-3-dodecene), poly(8-(5,6-di(tert-butoxycarbonyl)-2-norbornyloxycarbonyl)-tetracyclo[4.4.0.1$^{2,5}$.1$^{7,10}$]-3-dodecene), poly(8-(1-(1-methylcyclohexyloxycarbonyl)-octahydro-4,7-methanoindene-5-yloxycarbonyl)-tetracyclo[4.4.0.1$^{2,5}$.1$^{7,10}$]-3-dodecene), poly(8-(6-tert-butoxycarbonyl-decahydronaphthalene-2-yloxycarbonyl)-tetracyclo[4.4.0.1$^{2,5}$.1$^{7,10}$]-3-dodecene), poly(8-(9-tert-butoxycarbonyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), poly(8-(9-(1-methylcyclohexyloxycarbonyl)-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene) in a case where at least one of R$^1$ to R$^4$ represents an alkoxycarbonylalkyloxycarbonyl group.

In a case where R$^1$ to R$^4$ are bonded to each other to form a ring structure, examples of the cyclic alkyl structure include poly(1,4,4a, 5,6,7,8,8a, 9,9a, 10,10a-dodecahydro-1,4:9,10-dimethano-anthracene). Examples of the cyclic ester structure which can form a lactone ring include poly (4-oxy-pentacyclo[9.2.1.1$^{1,7}$.0$^{2,6}$.0$^{8,13}$]-10-pentadecene-3-one) as a γ-butyrolactone structure; and poly(4-oxy-pentacyclo[10.2.1.1$^{1,8}$.0$^{2,7}$.0$^{9,14}$]-11-hexadecene-3-one) as a 5-valerolactone structure. Examples of the cyclic acid anhydride structure include poly(4-oxy-pentacyclo[9.2.1.1$^{1,7}$.0$^{2,6}$.0$^{8,13}$]-10-pentadecene-3,5-one). Examples of the cyclic amide structure which can form a lactam ring include poly(4-methyl-4-aza-pentacyclo[9.2.1.1$^{1,7}$.0$^{2,6}$.0$^{8,13}$]-10-pentadecene-3-one), poly(4-ethyl-4-aza-pentacyclo [9.2.1.1$^{1,7}$.0$^{2,6}$.0$^{8,13}$]-10-pentadecene-3-one), poly(4-(n-propyl)-4-aza-pentacyclo[9.2.1.1$^{1,7}$.0$^{2,6}$.0$^{8,13}$]-10-pentadecene-3-one), poly(4-(n-butyl)-4-aza-pentacyclo[9.2.1.1$^{1,7}$.0$^{2,6}$.0$^{8,13}$]-10-pentadecene-3-one), poly(4-(1-methylbutyl)-4-aza-pentacyclo[9.2.1.1$^{1,7}$.0$^{2,6}$.0$^{8,13}$]-10-pentadecene-3-one), poly(4-cyclopentyl-4-aza-pentacyclo[9.2.1.1$^{1,7}$.0$^{2,6}$.0$^{8,13}$]-10-pentadecene-3-one), poly(4-cyclohexyl-4-aza-pentacyclo[9.2.1.1$^{1,7}$.0$^{2,6}$.0$^{8,13}$]-10-pentadecene-3-one), poly(4-phenyl-4-aza-pentacyclo[9.2.1.1$^{1,7}$.0$^{2,6}$.0$^{8,13}$]-10-pentadecene-3-one), and poly(4-(4-hydrophenyl)-4-aza-pentacyclo[9.2.1.1$^{1,7}$.0$^{2,6}$.0$^{8,13}$]-10-pentadecene-3-one) as γ-lactam; and poly(4-methyl-4-aza-pentacyclo[10.2.1.1$^{1,8}$.0$^{2,7}$.0$^{9,14}$]-11-hexadecene-3-one), poly(4-ethyl-4-aza-pentacyclo[10.2.1.1$^{1,8}$.0$^{2,7}$.0$^{9,14}$]-11-hexadecene-3-one), poly(4-(n-propyl)-4-aza-pentacyclo[10.2.1.1$^{1,8}$.0$^{2,7}$.0$^{9,14}$]-11-hexadecene-3-one), poly(4-(n-butyl)-4-aza-pentacyclo[10.2.1.1$^{1,8}$.0$^{2,7}$.0$^{9,14}$]-11-hexadecene-3-one), poly(4-(1-methylbutyl)-4-aza-pentacyclo[10.2.1.1$^{1,8}$.0$^{2,7}$.0$^{9,14}$]-11-hexadecene-3-one), poly(4-cyclopentyl-4-aza-pentacyclo[10.2.1.1$^{1,8}$.0$^{2,7}$.0$^{9,14}$]-11-hexadecene-3-one), poly(4-cyclohexyl-4-aza-pentacyclo[10.2.1.1$^{1,8}$.0$^{2,7}$.0$^{9,14}$]-11-hexadecene-3-one), poly(4-phenyl-4-aza-pentacyclo[10.2.1.1$^{1,8}$.0$^{2,7}$.0$^{9,14}$]-11-hexadecene-3-one), and poly(4-(4-hydroxyphenyl)-4-aza-pentacyclo[10.2.1.1$^{1,8}$.0$^{2,7}$.0$^{9,14}$]-11-hexadecene-3-one) as 5-lactam. Examples of the cyclic imide structure which can form a maleimide ring include poly(4-methyl-4-aza-pentacyclo[9.2.1.1$^{1,7}$.0$^{2,6}$.0$^{8,13}$]-10-pentadecene-3,5-dione), poly(4-ethyl-4-aza-pentacyclo[9.2.1.1$^{1,7}$.0$^{2,6}$.0$^{8,13}$]-10-pentadecene-3,5-dione), poly(4-(n-propyl)-4-aza-pentacyclo[9.2.1.1$^{1,7}$.0$^{2,6}$.0$^{8,13}$]-10-pentadecene-3,5-dione), poly(4-(n-butyl)-4-aza-pentacyclo[9.2.1.1$^{1,7}$.0$^{2,6}$.0$^{8,13}$]-10-pentadecene-3,5-dione), poly(4-(1-methylbutyl)-4-aza-pentacyclo[9.2.1.1$^{1,7}$.0$^{2,6}$.0$^{8,13}$]-10-pentadecene-3,5-dione), poly(4-cyclopentyl-4-aza-pentacyclo[9.2.1.1$^{1,7}$.0$^{2,6}$.0$^{8,13}$]-10-pentadecene-3,5-dione), poly(4-cyclohexyl-4-aza-pentacyclo[9.2.1.1$^{1,7}$.0$^{2,6}$.0$^{8,13}$]-10-pentadecene-3,5-dione), poly(4-phenyl-4-aza-pentacyclo[9.2.1.1$^{1,7}$.0$^{2,6}$.0$^{8,13}$]-10-pentadecene-3,5-dione), and poly(4-(4-hydroxyphenyl)-4-aza-pentacyclo[9.2.1.1$^{1,7}$.0$^{2,6}$.0$^{8,13}$]-10-pentadecene-3,5-dione).

Among these, in the repeating structural unit [A] represented by Formula (1) according to the present embodiment, as the cyclic olefin polymer in which n represents 1, poly (8-methoxycarbonyl-tetracyclo[4.4.0.1$^{2,5}$.1$^{7,10}$]-3-dodecene), poly(8-ethoxycarbonyl-tetracyclo[4.4.0.1$^{2,5}$.1$^{7,10}$]-3-dodecene), poly(8-(n-propoxycarbonyl)-tetracyclo[4.4.0.1$^{2,5}$.1$^{7,10}$]-3-dodecene), poly(8-(n-butoxycarbonyl)-tetracyclo[4.4.0.1$^{2,5}$.1$^{7,10}$]-3-dodecene), poly(8-isobutoxycarbonyl-tetracyclo[4.4.0.1$^{2,5}$.1$^{7,10}$]-3-dodecene), poly(8-(tert-butoxycarbonyl)-tetracyclo[4.4.0.1$^{2,5}$.1$^{7,10}$]-3-dodecene), poly(8-(n-pentyloxycarbonyl)-tetracyclo[4.4.0.1$^{2,5}$.1$^{7,10}$]-3-dodecene), poly(8-(2-methyl-2-pentyloxycarbonyl)-tetracyclo[4.4.0.1$^{2,5}$.1$^{7,10}$]-3-dodecene), poly(8-(3-methyl-3-pentyloxycarbonyl)-tetracyclo[4.4.0.1$^{2,5}$.1$^{7,10}$]-3-dodecene), poly(8-(2-ethyl-3-methyl-3-pentyloxycarbonyl)-tetracyclo[4.4.0.1$^{2,5}$.1$^{7,10}$]-3-dodecene), poly(8-cyclopentyloxycarbonyl-tetracyclo[4.4.0.1$^{2,5}$.1$^{7,10}$]-3-dodecene), poly(8-(n-hexyloxycarbonyl)-tetracyclo[4.4.0.1$^{2,5}$.1$^{7,10}$]-3-dodecene), poly(8-cyclohexyloxycarbonyl-tetracyclo[4.4.0.1$^{2,5}$.1$^{7,10}$]-3-dodecene), poly(8-(2-methyl-2-butoxycarbonyl)-tetracyclo[4.4.0.1$^{2,5}$.1$^{7,10}$]-3-dodecene), poly(8-(2,3-dimethyl-2-butoxycarbonyl)-tetracyclo[4.4.0.1$^{2,5}$.1$^{7,10}$]-3-dodecene), poly(8-(2,3,3-trimethyl-2-butoxycarbonyl)-tetracyclo[4.4.0.1$^{2,5}$.1$^{7,10}$]-3-dodecene), poly(8-(2-methyl-2-hexyloxycarbonyl)-tetracyclo[4.4.0.1$^{2,5}$.1$^{7,10}$]-3-dodecene), poly(8-(3,4-dimethyl-3-hexyloxycarbonyl)-tetracyclo[4.4.0.1$^{2,5}$.1$^{7,10}$]-3-dodecene), poly(8-(3-methylbutoxycarbonyl)-tetracyclo[4.4.0.1$^{2,5}$.1$^{7,10}$]-3-dodecene), poly(8-(2-methylpentoxycarbonyl)-tetracyclo[4.4.0.1$^{2,5}$.1$^{7,10}$]-3-dodecene), poly(8-(3-methylpentoxycarbonyl)-tetracyclo[4.4.0.1$^{2,5}$.1$^{7,10}$]-3-dodecene), poly(8-(4-methylpentoxycarbonyl)-tetracyclo[4.4.0.1$^{2,5}$.1$^{7,10}$]-3-dodecene), poly(8-(3-methyl-3-heptyloxycarbonyl)-tetracyclo[4.4.0.1$^{2,5}$.1$^{7,10}$]-3-dodecene), poly(8-(2-cyclopentyl-2-propoxycarbonyl)-tetracyclo[4.4.0.1$^{2,5}$.1$^{7,10}$]-3-dodecene, poly(8-(2-cyclohexyl-2-propoxycarbonyl)-tetracyclo[4.4.0.1$^{2,5}$.1$^{7,10}$]-3-dodecene), poly(8-(2-norbornyl-2-propoxycarbonyl)-tetracyclo[4.4.0.1$^{2,5}$.1$^{7,10}$]-3-dodecene), poly(8-(1,1-dicyclopentylethoxycarbonyl)-tetracyclo[4.4.0.1$^{2,5}$.1$^{7,10}$]-3-dodecene), poly(8-(1,1-dicyclohexylethoxycarbonyl)-tetracyclo[4.4.0.1$^{2,5}$.1$^{7,10}$]-3-dodecene), poly(8-(1-methylcyclopentyloxycarbonyl)-tetracyclo[4.4.0.1$^{2,5}$.1$^{7,10}$]-3-dodecene), poly(8-(1-ethylcyclopentyloxycarbonyl)-tetracyclo[4.4.0.1$^{2,5}$.1$^{7,10}$]-3-dodecene), poly(8-(1-methylcyclohexyloxycarbonyl)-tetracyclo[4.4.0.1$^{2,5}$.1$^{7,10}$]-3-dodecene), poly(8-(1-ethylcyclohexyloxycarbonyl)-tetracyclo[4.4.0.1$^{2,5}$.1$^{7,10}$]-3-dodecene), poly(8-(1-methylcyclooctyloxycarbonyl)-tetracyclo[4.4.0.1$^{2,5}$.1$^{7,10}$]-3-dodecene), poly(8-(1-ethylcyclooctyloxycarbonyl)-tetracyclo[4.4.0.1$^{2,5}$.1$^{7,10}$]-3-dodecene), poly(8-(1-adamantyloxycarbonyl)-tetracyclo[4.4.0.1$^{2,5}$.1$^{7,10}$]-3-dodecene), poly(8-(2-methyl-2-adamantyloxycarbonyl)-tetracyclo[4.4.0.1$^{2,5}$.1$^{7,10}$]-3-dodecene), poly(8-(2-ethyl-2-adamantyloxycarbonyl)-tetracyclo[4.4.0.1$^{2,5}$.1$^{7,10}$]-3-dodecene), poly(8-(1-methyldecahydronaphthalene-1-yloxycarbonyl)-tetracyclo[4.4.0.1$^{2,5}$.1$^{7,10}$]-3-dodecene), poly(8-(1-ethyldecahydronaphthalene-1-yloxycarbonyl)-tetracyclo[4.4.0.1$^{2,5}$.1$^{7,10}$]-3-dodecene), poly(8-(2-methyldecahydronaphthalene-2-yloxycarbonyl)-tetracyclo[4.4.0.1$^{2,5}$.1$^{7,10}$]-3-dodecene), poly(8-(2-ethyldecahydronaphthalene-2-yloxycarbonyl)-tetracyclo[4.4.0.1$^{2,5}$.1$^{7,10}$]-3-dodecene), poly(8-(2-methyl-2-norbornyloxycarbonyl)-tetracyclo[4.4.0.1$^{2,5}$.1$^{7,10}$]-3-dodecene), poly(8-(2-ethyl-2-norbornyloxycarbonyl)-tetracyclo[4.4.0.1$^{2,5}$.1$^{7,10}$]-3-dodecene), poly(8-(2,7,7-trimethyl-2-norbornyloxycarbonyl)-tetracyclo[4.4.0.1$^{2,5}$.1$^{7,10}$]-3-dodecene), poly(8-(2-ethyl-7,7-dimethyl-2-norbornyloxycarbonyl)-tetracyclo[4.4.0.1$^{2,5}$.1$^{7,10}$]-3-dodecene), poly(8-(5-methyl-octahydro-4,7-methano-indene-5-yloxycarbonyl)-tetracyclo[4.4.0.1$^{2,5}$.1$^{7,10}$]-3-dodecene), poly(8-(5-ethyl-octahydro-4,7-methano-indene-5-yloxycarbonyl)-tetracyclo[4.4.0.1$^{2,5}$.1$^{7,10}$]-3-dodecene), poly(8-(4-methyl-tetracyclo[6.2.1.1$^{3,6}$.0$^{2,7}$]-dodecane-4-yloxycarbonyl)-tetracyclo[4.4.01$^{2,5}$.1$^{7,10}$]-3-dodecene), poly(8-(4-ethyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), poly(8-methoxycarbonylphenyl-tetracyclo[4.4.0.1$^{2,5}$.1$^{7,10}$]-3-dodecene), poly(8-ethoxycarbonylphenyl-tetracyclo[4.4.0.1$^{2,5}$.1$^{7,10}$]-3-dodecene), poly(8-(n-propoxycarbonylphenyl)-tetracyclo[4.4.0.1$^{2,5}$.1$^{7,10}$]-3-dodecene), poly(8-(i-propoxycarbonylphenyl)-tetracyclo[4.4.0.1$^{2,5}$.1$^{7,10}$]-3-dodecene), poly(8-(n-butoxycarbonylphenyl)-tetracyclo[4.4.0.1$^{2,5}$.1$^{7,10}$]-3-dodecene), poly(8-(tert-butoxycarbonylphenyl)-tetracyclo[4.4.0.1$^{2,5}$.1$^{7,10}$]-3-dodecene), poly(8-(n-pentyloxycarbonylphenyl)-tetracyclo[4.4.0.1$^{2,5}$.1$^{7,10}$]-3-dodecene), poly(8-(3-(2-methyl-2-butoxycarbonyl)phenyl)-tetracyclo[4.4.0.1$^{2,5}$.1$^{7,10}$]-3-dodecene), poly(8-(3-(2,3-dimethyl-2-butoxycarbonyl)phenyl)-tetracyclo[4.4.0.1$^{2,5}$.1$^{7,10}$]-3-dodecene), poly(8-(3-(2-cyclopentyl-2-propoxycarbonyl)phenyl)-tetracyclo[4.4.0.1$^{2,5}$.1$^{7,10}$]-3-dodecene), poly(8-(3-(2-cyclohexyl-2-propoxycarbonyl)phenyl)-tetracyclo[4.4.0.1$^{2,5}$.1$^{7,10}$]-3-dodecene), poly(8-(3-(1-methylcyclopentyloxycarbonyl)phenyl)-tetracyclo[4.4.0.1$^{2,5}$.1$^{7,10}$]-3-dodecene), poly(8-(3-(1-ethylcyclopentyloxycarbonyl)phenyl)-tetracyclo[4.4.0.1$^{2,5}$.7,10]-3-dodecene), poly(8-(3-(1-methylcyclohexyloxycarbonyl)phenyl)-tetracyclo[4.4.0.1$^{2,5}$.7,10]-3-dodecene), poly(8-(3-(1-ethylcyclohexyloxycarbonyl)phenyl)-tetracyclo[4.4.0.1$^{2,5}$.1$^{7,10}$]-3-dodecene), poly(8-(4-(2-methyl-2-butoxycarbonyl)phenyl)-tetracyclo[4.4.0.1$^{2,5}$.1$^{7,10}$]-3-dodecene), poly(8-(4-(2,3-dimethyl-2-butoxycarbonyl)phenyl)-tetracyclo[4.4.0.1$^{2,5}$.1$^{7,10}$]-3-dodecene), poly(8-(4-(2-cyclopentyl-2-propoxycarbonyl)phenyl)-tetracyclo[4.4.0.1$^{2,5}$.1$^{7,10}$]-3-dodecene), poly(8-(4-(2-cyclohexyl-2-propoxycarbonyl)phenyl)-tetracyclo[4.4.0.1$^{2,5}$.1$^{7,10}$]-3-dodecene), poly(8-(4-(1-methylcyclopentyloxycarbonyl)phenyl)-tetracyclo[4.4.0.1$^{2,5}$.1$^{7,10}$]-3-dodecene), poly(8-(4-(1-ethylcyclopentyloxycarbonyl)phenyl)-tetracyclo[4.4.0.1$^{2,5}$.1$^{7,10}$]-3-dodecene), poly(8-(4-(1-methylcyclohexyloxycarbonyl)phenyl)-tetracyclo[4.4.0.1$^{2,5}$.1$^{7,10}$]-3-dodecene), poly(8-(4-(1-ethylcyclohexyloxycarbonyl)phenyl)-tetracyclo[4.4.0.1$^{2,5}$.1$^{7,10}$]-3-dodecene), poly(8-methoxycarbonylnaphthyl-tetracyclo[4.4.0.1$^{2,5}$.1$^{7,10}$]-3-dodecene), poly(8-ethoxycarbonylnaphthyl-tetracyclo[4.4.0.1$^{2,5}$.1$^{7,10}$]-3-dodecene), poly(8-(n-propoxycarbonylnaphthyl)-tetracyclo[4.4.0.1$^{2,5}$.1$^{7,10}$]-3-dodecene), poly(8-(i-propoxycarbonylnaphthyl)-tetracyclo[4.4.0.1$^{2,5}$.1$^{7,10}$]-3-dodecene), poly(8-(n-butoxycarbonylnaphthyl)-tetracyclo[4.4.0.1$^{2,5}$.1$^{7,10}$]-3-dodecene), poly(8-(tert-butoxycarbonylphenyl)-tetracyclo[4.4.0.1$^{2,5}$.1$^{7,10}$]-3-dodecene), poly(8-(n-pentyloxycarbonylnaphthyl)-tetracyclo[4.4.0.1$^{2,5}$.1$^{7,10}$]-3-dodecene), poly(8-(5-(2-methyl-2-butoxycarbonyl) naphthyl)-tetracyclo[4.4.0.1$^{2,5}$.7,10]-3-dodecene), poly(8-(5-(2,3-dimethyl-2-butoxycarbonyl) naphthyl)-tetracyclo[4.4.0.1$^{2,5}$.1$^{7,10}$]-3-dodecene), poly(8-(5-(2-cyclopentyl-2-propoxycarbonyl) naphthyl)-tetracyclo[4.4.0.1$^{2,5}$.1$^{7,10}$]-3-dodecene), poly(8-(5-(2-cyclohexyl-2-propoxycarbonyl) naphthyl)-tetracyclo[4.4.0.1$^{2,5}$.1$^{7,10}$]-3-dodecene), poly(8-(5-(1-methylcyclopentyloxycarbonyl) naphthyl)-tetracyclo[4.4.0.1$^{2,5}$.1$^{7,10}$]-3-dodecene), poly(8-(5-(1-ethylcyclopentyloxycarbonyl) naphthyl)-tetracyclo[4.4.0.1$^{2,5}$.1$^{7,10}$]-3-dodecene), poly(8-(5-(1-methylcyclohexyloxycarbonyl) naphthyl)-tetracyclo[4.4.0.1$^{2,5}$.1$^{7,10}$]-3-dodecene), poly(8-(5-(1-ethylcyclohexyloxycarbonyl) naphthyl)-tetracyclo[4.4.0.1$^{2,5}$.7,10]-3-dodecene), poly(8-phenoxycarbonyl-tetracyclo[4.4.0.1$^{2,5}$.1$^{7,10}$]-3-dodecene), poly(8-benzyloxycarbonyl-tetracyclo[4.4.0.1$^{2,5}$.1$^{7,10}$]-3-dodecene), poly(8-(4-methylphenoxycarbonyl)-tetracyclo[4.4.0.1$^{2,5}$.1$^{7,10}$]-3-dodocene), poly(8-(3,4-dimethylphenoxycarbonyl)-tetracyclo[4.4.0.1$^{2,5}$.1$^{7,10}$]-3-dodecene), poly(8-(1-naphthoxycarbonyl)-tetracyclo[4.4.0.1$^{2,5}$.1$^{7,10}$]-3-dodecene), poly(8-(2-naphthoxycarbonyl)-tetracyclo[4.4.0.1$^{2,5}$.1$^{7,10}$]-3-dodecene), poly(8-(1-anthracenoxycarbonyl)-tetracyclo[4.4.0.1$^{2,5}$.1$^{7,10}$]-3-dodecene), poly(8-(methoxymethyloxycarbonyl-tetracyclo[4.4.0.1$^{2,5}$.1$^{7,10}$]-3-dodecene), poly(8-ethoxymethyloxycarbonyl-tetracyclo[4.4.0.1$^{2,5}$.1$^{7,10}$]-3-dodecene), poly(8-(n-propoxymethyloxycarbonyl)-tetracyclo[4.4.0.1$^{2,5}$.1$^{7,10}$]-3-dodecene), poly(8-isopropoxymethyloxycarbonyl-tetracyclo[4.4.0.1$^{2,5}$.1$^{7,10}$]-3-dodecene), poly(8-(n-butoxymethyloxycarbony)-tetracyclo[4.4.0.1$^{2,5}$.1$^{7,10}$]-3-dodecene), poly(8-(tert-butoxymethyloxycarbony)-tetracyclo[4.4.0.1$^{2,5}$.1$^{7,10}$]-3-dodecene), poly(8-cyclopentyloxymethyloxycarbonyl-tetracyclo[4.4.0.1$^{2,5}$.1$^{7,10}$]-3-dodecene), poly(8-cyclohexyloxymethyloxycarbonyl-tetracyclo[4.4.0.1$^{2,5}$.1$^{7,10}$]-3-dodecene), poly(8-cyclooctyloxymethyloxycarbonyl-tetracyclo[4.4.0.1$^{2,5}$.1$^{7,10}$]-3-dodecene), poly(8-norbornyloxymethyloxycarbonyl-tetracyclo[4.4.0.1$^{2,5}$.1$^{7,10}$]-3-dodecene), poly(8-(1-methylcyclopentyloxymethyloxycarbonyl)-tetracyclo[4.4.0.1$^{2,5}$.1$^{7,10}$]-3-dodecene), poly(8-(1-ethylcyclopentyloxymethyloxycarbonyl)-tetracyclo[4.4.0.1$^{2,5}$.1$^{7,10}$]-3-dodecene), poly(8-(1-methylcyclohexyloxymethyloxycarbonyl)-tetracyclo[4.4.0.1$^{2,5}$.1$^{7,10}$]-3-dodecene), poly(8-(1-ethylcyclohexyloxymethyloxycarbonyl)-tetracyclo[4.4.0.1$^{2,5}$.1$^{7,10}$]-3-dodecene), poly(8-(1-methylnorbornyloxymethyloxycarbonyl)-tetracyclo[4.4.0.1$^{2,5}$.1$^{7,10}$]-3-dodecene), poly(8-(1-ethylnorbornyloxymethyloxycarbonyl)-tetracyclo[4.4.0.1$^{2,5}$.1$^{7,10}$]-3-dodecene), poly(8-(1-ethoxypropyloxymethyloxycarbonyl)-tetracyclo[4.4.0.1$^{2,5}$.1$^{7,10}$]-3-dodecene), poly(8-(1-ethoxy-1-methylethyloxymethyloxycarbonyl)-tetracyclo[4.4.0.1$^{2,5}$.1$^{7,10}$]-3-dodecene), poly(8-tetrahydrofuran-2-yloxymethyloxycarbonyl-tetracyclo[4.4.0.1$^{2,5}$.1$^{7,10}$]-3-dodecene), poly(8-tetrahydropyran-2-yloxymethyloxycarbonyl-tetracyclo[4.4.0.1$^{2,5}$.1$^{7,10}$]-3-dodecene), poly(8-(1-adamantyloxymethyloxycarbonyl)-tetracyclo[4.4.0.1$^{2,5}$.1$^{7,10}$]-3-dodecene), poly(8-(2-adamantyloxymethyloxycarbonyl)-tetracyclo[4.4.0.1$^{2,5}$.1$^{7,10}$]-3-dodecene), poly(8-(1-(1-methoxy)ethoxycarbonyl)-tetracyclo[4.4.0.1$^{2,5}$.1$^{7,10}$]-3-dodecane), poly(8-(1-(1-ethoxy)ethoxycarbonyl)-tetracyclo[4.4.0.1$^{2,5}$.1$^{7,10}$]-3-dodecene), poly(8-(1-(1-n-propoxy)ethoxycarbonyl)-tetracyclo[4.4.0.1$^{2,5}$.1$^{7,10}$]-3-dodecene), poly(8-(1-(1-isopropoxy)ethoxycarbonyl)-tetracyclo[4.4.0.1$^{2,5}$.1$^{7,10}$]-3-dodecene), poly(8-(1-(1-n-butoxy)ethoxycarbonyl)-tetracyclo[4.4.0.1$^{2,5}$.1$^{7,10}$]-3-dodecene), poly(8-(1-(1-tert-butoxy)ethoxycarbonyl)-tetracyclo[4.4.0.1$^{2,5}$.1$^{7,10}$]-3-dodecene), poly(8-(1-(1-cyclopentyloxy)ethoxycarbonyl)-tetracyclo[4.4.0.1$^{2,5}$.1$^{7,10}$]-3-dodecene), poly(8-(1-(1-cyclohexyloxy)ethoxycarbonyl)-tetracyclo[4.4.0.1$^{2,5}$.1$^{7,10}$]-3-dodecene), poly(8-(1-(1-cyclooctyloxy)ethoxycarbonyl)-tetracyclo[4.4.0.1$^{2,5}$.1$^{7,10}$]-3-dodecene), poly(8-(1-(1-norbornyloxy)ethoxycarbonyl)-tetracyclo[4.4.0.1$^{2,5}$.1$^{7,10}$]-3-dodecene), poly(8-(1-(1-methylcyclopentyloxy)ethoxycarbonyl)-tetracyclo[4.4.0.1$^{2,5}$.1$^{7,10}$]-3-dodecene), poly(8-(1-(1-ethylcyclopentyloxy)ethoxycarbonyl)-tetracyclo[4.4.0.1$^{2,5}$.1$^{7,10}$]-3-dodecene), poly(8-(1-(1-methylcyclohexyloxy)ethoxycarbonyl)-tetracyclo[4.4.0.1$^{2,5}$.1$^{7,10}$]-3-dodecene), poly(8-(1-(1-ethylcyclohexyloxy)ethoxycarbonyl)-tetracyclo[4.4.0.1$^{2,5}$.1$^{7,10}$]-3-dodecene), poly(8-(1-(1-methylnorbornyloxy)ethoxycarbonyl)-tetracyclo[4.4.0.1$^{2,5}$.1$^{7,10}$]-3-dodecene), poly(8-(1-(1-ethylnorbornyloxy)ethoxycarbonyl)-tetracyclo[4.4.0.1$^{2,5}$.1$^{7,10}$]-3-dodecene), poly(8-(1-(1-ethoxypropyloxy)ethoxycarbonyl)-tetracyclo[4.4.0.1$^{2,5}$.1$^{7,10}$]-3-dodecene), poly(8-(1-(1-ethoxy-1-methylethyloxy)ethoxycarbonyl)-tetracyclo[4.4.0.1$^{2,5}$.1$^{7,10}$]-3-dodecene), poly(8-(1-(tetrahydrofuran-2-yloxy)ethoxycarbonyl)-tetracyclo[4.4.0.1$^{2,5}$.1$^{7,10}$]-3-dodecene), poly(8-(1-(tetrahydropyran-2-yloxy)ethoxycarbonyl)-tetracyclo[4.4.0.1$^{2,5}$.1$^{7,10}$]-3-dodecene), poly(8-(1-(1-adamantyloxy)ethoxycarbonyl)-tetracyclo[4.4.0.1$^{2,5}$.1$^{7,10}$]-3-dodecene), poly(8-(1-(2-adamantyloxy)ethoxycarbonyl)-tetracyclo[4.4.0.1$^{2,5}$.1$^{7,10}$]-3-dodecene), poly(8-(n-butoxycarbonylmethyloxycarbonyl)-tetracyclo[4.4.0.1$^{2,5}$.1$^{7,10}$]-3-dodecene), poly(8-(tert-butoxycarbonylmethyloxycarbonyl)-tetracyclo[4.4.0.1$^{2,5}$.1$^{7,10}$]-3-dodecene), poly(8-(2-cyclopentyl-2-propoxycarbonylmethyloxycarbonyl)-tetracyclo[4.4.0.1$^{2,5}$.1$^{7,10}$]-3-dodecene), poly(8-(2-cyclopentyl-2-butoxycarbonylmethyloxycarbonyl)-tetracyclo[4.4.0.1$^{2,5}$.1$^{7,10}$]-3-dodecene), poly(8-(2-cyclohexyl-2-propoxycarbonylmethyloxycarbonyl)-tetracyclo[4.4.0.1$^{2,5}$.1$^{7,10}$]-3-dodecene), poly(8-(3-(2-cyclohexyl-2-propoxycarbonyl)propoxycarbonyl)-tetracyclo[4.4.0.1$^{2,5}$.1$^{7,10}$]-3-dodecene), poly(8-(2-cyclohexyl-2-butoxycarbonylmethyloxycarbonyl)-tetracyclo[4.4.0.1$^{2,5}$.1$^{7,10}$]-3-dodecene), poly(8-(3-cyclohexyl-3-pentyloxycarbonylmethyloxycarbonyl)-tetracyclo[4.4.0.1$^{2,5}$.1$^{7,10}$]-3-dodecene), poly(8-(2-ethyl-2-norbornyloxycarbonylmethyloxycarbonyl)-tetracyclo[4.4.0.1$^{2,5}$.1$^{7,10}$]-3-dodecene), poly(8-(2-norbornyl-2-propoxycarbonylmethyloxycarbonyl)-tetracyclo[4.4.0.1$^{2,5}$.1$^{7,10}$]-3-dodecene), poly(8-(4-ethyl-tetracyclo[6.2.1.1$^{3,6}$.0$^{2,7}$]-dodecane-4-yloxycarbonylmethyloxycarbonyl)-tetracyclo[4.4.0.1$^{2,5}$.1$^{7,10}$]-3-dodecene), poly(8-(2-(tetracyclo[6.2.1.1$^{3,6}$.0$^{2,7}$]-dodecane-4-yl)-2-propoxycarbonylmethyloxycarbonyl)-tetracyclo[4.4.0.1$^{2,5}$.1$^{7,10}$]-3-dodecene), poly(8-(1,1-dicyclohexylethoxycarbonylmethyloxycarbonyl)-tetracyclo[4.4.0.1$^{2,5}$.1$^{7,10}$]-3-dodecene), poly(8-(1,1-dicyclohexylpropoxycarbonylmethyloxycarbonyl)-tetracyclo[4.4.0.1$^{2,5}$.1$^{7,10}$]-3-dodecene), poly(8-cyclopentyloxycarbonylmethyloxycarbonyl-tetracyclo[4.4.0.1$^{2,5}$.1$^{7,10}$]-3-dodecene), poly(8-cyclohexyloxycarbonylmethyloxycarbonyl-tetracyclo[4.4.0.1$^{2,5}$.1$^{7,10}$]-3-dodecene), poly(8-cyclooctyloxycarbonylmethyloxycarbonyl-tetracyclo[4.4.0.1$^{2,5}$.1$^{7,10}$]-3-dodecene), poly(8-norbornyloxycarbonylmethyloxycarbonyl-tetracyclo[4.4.0.1$^{2,5}$.1$^{7,10}$]-3-dodecene), poly(8-1-methylcyclopentyloxycarbonylmethyloxycarbonyl-tetracyclo[4.4.0.1$^{2,5}$.1$^{7,10}$]-3-dodecene), poly(8-(1-ethylcyclopentyloxycarbonylmethyloxycarbonyl)-tetracyclo[4.4.0.1$^{2,5}$.1$^{7,10}$]-3-dodecene), poly(8-(1-methylcyclohexyloxycarbonylmethyloxycarbonyl)-tetracyclo[4.4.0.1$^{2,5}$.1$^{7,10}$]-3-dodecene), poly(8-(1-ethylcyclohexyloxycarbonylmethyloxycarbonyl)-tetracyclo[4.4.0.1$^{2,5}$.1$^{7,10}$]-3-dodecene), poly(8-(1-methylnorbornyloxycarbonylmethyloxycarbonyl)-tetracyclo[4.4.0.1$^{2,5}$.1$^{7,10}$]-3-dodecene), poly(8-(1-ethylnorbornyloxycarbonylmethyloxycarbonyl)-tetracyclo[4.4.0.1$^{2,5}$.1$^{7,10}$]-3-dodecene), poly(8-(1-ethoxypropyloxycarbonylmethyloxycarbonyl)-tetracyclo[4.4.0.1$^{2,5}$.7,10]-3-dodecene), poly(8-(1-ethoxy-1- methylethyloxycarbonylmethyloxycarbonyl)-tetracyclo [4.4.0.1$^{2,5}$.1$^{7,10}$]-3-dodecene), poly(8-tetrahydrofuran-2-yloxycarbonylmethyloxycarbonyl-tetracyclo[4.4.0.1$^{2,5}$.1$^{7,10}$]-3-dodecene), poly(8-tetrahydropyran-2-yloxycarbonylmethyloxycarbonyl-tetracyclo[4.4.0.1$^{2,5}$.1$^{7,10}$]-3-dodecene), poly(8-(1-adamantyloxycarbonylmethyloxycarbonyl)-tetracyclo[4.4.0.1$^{2,5}$.1$^{7,10}$]-3-dodecene), poly(8-(2-adamantyloxycarbonylmethyloxycarbonyl)-tetracyclo[4.4.0.1$^{2,5}$.7,10]-3-dodecene), poly(8-(1-(2-(1-adamantyl)-2-propoxycarbonyl)-ethoxycarbonyl)-tetracyclo [4.4.0.1$^{2,5}$.1$^{7,10}$]-3-dodecene), poly(8-(3-(2-(1-adamantyl)-2-propoxycarbonyl)-propoxycarbonyl)-tetracyclo [4.4.0.1$^{2,5}$.1$^{7,10}$]-3-dodecene), poly(8-(2-(2-(1-adamantyl)-2-propoxycarbonyl)-2-propoxycarbonyl)-tetracyclo [4.4.0.1$^{2,5}$.1$^{7,10}$]-3-dodecene), poly(8-(2-methyl-2-adamantyloxycarbonylmethyloxycarbonyl)-tetracyclo[4.4.0.1$^{2,5}$.1$^{7,10}$]-3-dodecene), poly(8-(3-(2-methyl-2-adamantyloxycarbonyl) propoxycarbonyl)-tetracyclo[4.4.0.1$^{2,5}$.1$^{7,10}$]-3-dodecene), poly(8-(2-(2-methyl-2-adamantyloxycarbonyl)-2-propoxycarbonyl)-tetracyclo[4.4.0.1$^{2,5}$.1$^{7,10}$]-3-dodecene), poly(8-(1-(2-methyl-2-adamantyloxycarbonyl) ethoxycarbonyl)-tetracyclo[4.4.0.1$^{2,5}$.1$^{7,10}$]-3-dodecene), poly(8-(2-ethyl-2-adamantyloxycarbonylmethyloxycarbonyl)-tetracyclo[4.4.0.1$^{2,5}$.1$^{7,10}$]-3-dodecene), poly(8-(2-isopropyl-2-adamantyloxycarbonylmethyloxycarbonyl)-tetracyclo[4.4.0.1$^{2,5}$.1$^{7,10}$]-3-dodecene), poly(8-(2-(1-adamantyl)-2-propoxycarbonylmethyloxycarbonyl)-tetracyclo[4.4.0.1$^{2,5}$.1$^{7,10}$]-3-dodecene), poly(8-(2-(1-adamantyl)-2-butoxycarbonylmethyloxycarbonyl)-tetracyclo[4.4.0.1$^{2,5}$.1$^{7,10}$]-3-dodecene), poly(8-(3-(1-adamantyl)-3-pentyloxycarbonylmethyloxycarbonyl)-tetracyclo[4.4.0.1$^{2,5}$.1$^{7,10}$]-3-dodecene), poly(8-(3-tert-butoxycarbonyl-1-cyclopentyloxycarbonyl)-tetracyclo [4.4.0.1$^{2,5}$.1$^{7,10}$]-3-dodecene), poly(8-(3-(1-methylcyclohexyloxycarbonyl)-1-cyclopentyloxycarbonyl)-tetracyclo[4.4.0.1$^{2,5}$.1$^{7,10}$]-3-dodecene), poly(8-(5-tert-butoxycarbonyl-2-norbornyloxycarbonyl)-tetracyclo [4.4.0.1$^{2,5}$.1$^{7,10}$]-3-dodecene), poly(8-(5-(1-methylcyclohexyloxycarbonyl)-2-norbornyloxycarbonyl)-tetracyclo[4.4.0.1$^{2,5}$.1$^{7,10}$]-3-dodecene), poly(8-(5,5-(ditert-butoxycarbonyl)-2-norbornyloxycarbonyl)-tetracyclo [4.4.0.1$^{2,5}$.1$^{7,10}$]-3-dodecene), poly(8-(5,6-(ditert-butoxycarbonyl)-2-norbornyloxycarbonyl)-tetracyclo [4.4.0.1$^{2,5}$.1$^{7,10}$]-3-dodecene), poly(8-(1-(1-methylcyclohexyloxycarbonyl)-octahydro-4,7-methanoindene-5-yloxycarbonyl)-tetracyclo[4.4.0.1$^{2,5}$.1$^{7,10}$]-3-dodecene), poly(8-(6-tert-butoxycarbonyl-decahydronaphthalene-2-yloxycarbonyl)-tetracyclo[4.4.0.1$^{2,5}$.1$^{7,10}$]-3-dodecene), poly(8-(9-tert-butoxycarbonyl-tetracyclo[6.2.1.1$^{3,6}$.0$^{2,7}$]-dodecane-4-yloxycarbonyl)-tetracyclo [4.4.0.1$^{2,5}$.1$^{7,10}$]-3-dodecene), or poly(8-(9-(1-methylcyclohexyloxycarbonyl)-tetracyclo[6.2.1.1$^{3,6}$.0$^{2,7}$]-dodecane-4-yloxycarbonyl)-tetracyclo[4.4.0.1$^{2,5}$.1$^{7,1}$c)]-3-dodecene is preferable.

In the repeating structural unit [A] represented by Formula (1) according to the present embodiment, in a case where R$^1$ to R$^4$ are bonded to one another to form a ring structure, as the cyclic olefin polymer in which n represents 1, poly(4-oxy-pentacyclo[9.2.1.1$^{1,7}$.0$^{2,6}$.0$^{8,13}$]-10-pentadecene-3-one), poly(4-oxy-pentacyclo[9.2.1.1$^{1,7}$.0$^{2,6}$.0$^{8,13}$]-10-pentadecene-3,5-dione), poly(4-methyl-4-aza-pentacyclo[9.2.1.1$^{1,7}$.0$^{2,6}$.0$^{8,13}$]-10-pentadecene-3,5-dione), poly(4-ethyl-4-aza-pentacyclo[9.2.1.1$^{1,7}$.0$^{2,6}$.0$^{8,13}$]-10-pentadecene-3,5-dione), poly(4-(n-propyl)-4-aza-pentacyclo[9.2.1.1$^{1,7}$.0$^{2,6}$.0$^{8,13}$]-10-pentadecene-3,5-dione), poly(4-(n-butyl)-4-aza-pentacyclo[9.2.1.1$^{1,7}$.0$^{2,6}$.0$^{8,13}$]-10-pentadecene-3,5-dione), poly(4-(1-methylbutyl)-4-aza-pentacyclo[9.2.1.1$^{1,7}$.0$^{2,6}$.0$^{8,13}$]-10-pentadecene-3,5-dione), poly(4-cyclopentyl-4-aza-pentacyclo[9.2.1.1$^{1,7}$.0$^{2,6}$.0$^{8,13}$]-10-pentadecene-3,5-dione), poly(4-cyclohexyl-4-aza-pentacyclo[9.2.1.1$^{1,7}$.0$^{2,6}$.0$^{8,13}$]-10-pentadecene-3,5-dione), poly (4-phenyl-4-aza-pentacyclo[9.2.1.1$^{1,7}$.0$^{2,6}$.0$^{8,13}$]-10-pentadecene-3,5-dione), or poly(4-(4-hydroxyphenyl)-4-aza-pentacyclo[9.2.1.1$^{1,7}$.0$^{2,6}$.0$^{8,13}$]-10-pentadecene-3,5-dione) is preferable.

R$^5$ to R$^8$ in Formula (2) each have the same definition as those for R$^1$ to R$^4$ in Formula (1). Further, R$^5$ to R$^8$ may forma ring structure. Specifically, R$^5$ to R$^8$ are each independently bonded to one another or at least two of these are bonded to each other to form a ring structure optionally through a —C— bond, a —O— bond, or a —NR$^9$— bond. Examples thereof include a cyclic alkyl structure, a cyclic ester structure, a cyclic acid anhydride structure, a cyclic amide structure, and a cyclic imide structure.

The cyclic olefin polymer (I) according to the present embodiment may have two or more structural units in which at least one of R$^5$ to R$^8$ in the repeating structural unit [B] represented by Formula (2) is different from the rest.

In the repeating structural unit [B] represented by Formula (2) according to the present embodiment, examples of the cyclic olefin polymer in which n represents 0 include poly(5-methyl-7-oxy-bicyclo[2.2.1]hept-2-ene), poly(5-ethyl-7-oxy-bicyclo[2.2.1]hept-2-ene), poly(5-(n-propyl)-7-oxy-bicyclo[2.2.1]hept-2-ene), poly(5-(i-propyl)-7-oxy-bicyclo[2.2.1]hept-2-ene), poly(5-(n-butyl)-7-oxy-bicyclo [2.2.1]hept-2-ene), poly(5-(tert-butyl)-7-oxy-bicyclo[2.2.1] hept-2-ene), poly(5-(n-pentyl)-7-oxy-bicyclo[2.2.1]hept-2-ene), poly(5-cyclopentyl-7-oxy-bicyclo[2.2.1]hept-2-ene), poly(5-cyclohexyl-7-oxy-bicyclo[2.2.1]hept-2-ene), and poly(5-cyclooctyl-7-oxy-bicyclo[2.2.1]hept-2-ene) in a case where at least one of R$^5$ to R$^8$ represents an alkyl group; poly(5-phenyl-7-oxy-bicyclo[2.2.1]hept-2-ene), poly(5-naphthyl-7-oxy-bicyclo[2.2.1]hept-2-ene), poly(5-anthracenyl-7-oxy-bicyclo[2.2.1]hept-2-ene), poly(5-(o-tolyl)-7-oxy-bicyclo[2.2.1]hept-2-ene), poly(5-(m-tolyl)-7-oxy-bicyclo[2.2.1]hept-2-ene), poly(5-(p-tolyl)-7-oxy-bicyclo [2.2.1]hept-2-ene), poly(5-biphenyl-7-oxy-bicyclo[2.2.1] hept-2-ene), and poly(5-(4-hydroxyphenyl)-7-oxy-bicyclo [2.2.1]hept-2-ene) in a case where at least one of R$^5$ to R$^8$ represents an aryl group; poly(5-methoxy-7-oxy-bicyclo [2.2.1]hept-2-ene), poly(5-ethoxy-7-oxy-bicyclo[2.2.1] hept-2-ene), poly(5-(n-propoxy)-7-oxy-bicyclo[2.2.1]hept-2-ene), poly(5-(i-propoxy)-7-oxy-bicyclo[2.2.1]hept-2-ene), poly(5-(n-butoxy)-7-oxy-bicyclo[2.2.1]hept-2-ene), poly(5-(tert-butoxy)-7-oxy-bicyclo[2.2.1]hept-2-ene), poly (5-(n-pentoxy)-7-oxy-bicyclo[2.2.1]hept-2-ene), poly(5-cyclopentyloxy-7-oxy-bicyclo[2.2.1]hept-2-ene), poly(5-cyclohexyloxy-7-oxy-bicyclo[2.2.1]hept-2-ene), and poly(5-cyclooctyloxy-7-oxy-bicyclo[2.2.1]hept-2-ene) in a case where at least one of R$^5$ to R$^8$ represents an alkoxy group; poly(5-phenyloxy-7-oxy-bicyclo[2.2.1]hept-2-ene), poly(5-naphthyloxy-7-oxy-bicyclo[2.2.1]hept-2-ene), poly(5-anthracenyloxy-7-oxy-bicyclo[2.2.1]hept-2-ene), poly(5-(o-tolyloxy)-7-oxy-bicyclo[2.2.1]hept-2-ene), poly(5-(m-tolyloxy)-7-oxy-bicyclo[2.2.1]hept-2-ene), poly(5-(p-tolyloxy)-7-oxy-bicyclo[2.2.1]hept-2-ene), poly(5-(4-oxy-1,1'-biphenyl)-7-oxy-bicyclo[2.2.1]hept-2-ene), and (5-(4-hydroxyphenyloxy)-7-oxy-bicyclo[2.2.1]hept-2-ene) in a case where at least one of R$^5$ to R$^8$ represents an aryloxy group; poly(5-methoxymethyl-7-oxy-bicyclo[2.2.1]hept-2-ene), poly(5-methoxyethyl-7-oxy-bicyclo[2.2.1]hept-2-ene), poly(5-ethoxymethyl-7-oxy-bicyclo[2.2.1]hept-2-ene), poly(5-ethoxyethyl-7-oxy-bicyclo[2.2.1]hept-2-ene), poly(5-(n-propoxymethyl)-7-oxy-bicyclo[2.2.1]hept-2-ene), poly(5-isopropoxymethyl-7-oxy-bicyclo[2.2.1]hept-2-ene), poly(5-(n-butoxymethyl)-7-oxy-bicyclo[2.2.1]hept-2-ene), poly(5-isobutoxymethyl-7-oxy-bicyclo[2.2.1]hept-2-ene), poly(5-(tert-butoxymethyl)-7-oxy-bicyclo[2.2.1]hept-2-ene), poly(5-cyclopentyloxymethyl-7-oxy-bicyclo[2.2.1]hept-2-ene), poly(5-cyclohexyloxymethyl-7-oxy-bicyclo[2.2.1]hept-2-ene), and poly(5-cyclooctyloxymethyl-7-oxy-bicyclo[2.2.1]hept-2-ene) in a case where at least one of $R^5$ to $R^8$ represents an alkoxyalkyl group; poly(5-phenyloxymethyl-7-oxy-bicyclo[2.2.1]hept-2-ene), poly(5-naphthyloxymethyl-7-oxy-bicyclo[2.2.1]hept-2-ene), poly(5-anthracenyloxymethyl-7-oxy-bicyclo[2.2.1]hept-2-ene), poly(5-(o-tolyloxymethyl)-7-oxy-bicyclo[2.2.1]hept-2-ene), poly(5-(m-tolyloxymethyl)-7-oxy-bicyclo[2.2.1]hept-2-ene), poly(5-(p-tolyloxymethyl)-7-oxy-bicyclo[2.2.1]hept-2-ene), poly(5-(4-oxy-1,1'-biphenylmethyl)-7-oxy-bicyclo[2.2.1]hept-2-ene), poly(5-(4-hydroxyphenyloxymethyl)-7-oxy-bicyclo[2.2.1]hept-2-ene) in a case where at least one of $R^5$ to $R^8$ represents an aryloxyalkyl group; poly(5-methoxycarbonyl-7-oxy-bicyclo[2.2.1]hept-2-ene), poly(5-ethoxycarbonyl-7-oxy-bicyclo[2.2.1]hept-2-ene), poly(5-(n-propoxycarbonyl)-7-oxy-bicyclo[2.2.1]hept-2-ene), poly(5-(n-butoxycarbonyl)-7-oxy-bicyclo[2.2.1]hept-2-ene), poly(5-isobutoxycarbonyl-7-oxy-bicyclo[2.2.1]hept-2-ene), poly(5-(tert-butoxycarbonyl)-7-oxy-bicyclo[2.2.1]hept-2-ene), poly(5-(n-pentyloxycarbonyl)-7-oxy-bicyclo[2.2.1]hept-2-ene), poly(5-(2-methyl-2-pentyloxycarbonyl)-7-oxy-bicyclo[2.2.1]hept-2-ene), poly(5-(3-methyl-3-pentyloxycarbonyl)-7-oxy-bicyclo[2.2.1]hept-2-ene), poly(5-(2-ethyl-3-methyl-3-pentyloxycarbonyl)-7-oxy-bicyclo[2.2.1]hept-2-ene), poly(5-cyclopentyloxycarbonyl-7-oxy-bicyclo[2.2.1]hept-2-ene), poly(5-(n-hexyloxycarbonyl)-7-oxy-bicyclo[2.2.1]hept-2-ene), poly(5-cyclohexyloxycarbonyl-7-oxy-bicyclo[2.2.1]hept-2-ene), poly(5-(2-methyl-2-butoxycarbonyl)-7-oxy-bicyclo[2.2.1]hept-2-ene), poly(5-(2,3-dimethyl-2-butoxycarbonyl)-7-oxy-bicyclo[2.2.1]hept-2-ene), poly(5-(2,3,3-trimethyl-2-butoxycarbonyl)-7-oxy-bicyclo[2.2.1]hept-2-ene), poly(5-(2-methyl-2-hexyloxycarbonyl)-7-oxy-bicyclo[2.2.1]hept-2-ene), poly(5-(3,4-dimethyl-3-hexyloxycarbonyl)-7-oxy-bicyclo[2.2.1]hept-2-ene), poly(5-(3-methylbutoxycarbonyl)-7-oxy-bicyclo[2.2.1]hept-2-ene), poly(5-(2-methylpentoxycarbonyl)-7-oxy-bicyclo[2.2.1]hept-2-ene), poly(5-(3-methylpentoxycarbonyl)-7-oxy-bicyclo[2.2.1]hept-2-ene), poly(5-(4-methylpentoxycarbonyl)-7-oxy-bicyclo[2.2.1]hept-2-ene), poly(5-(3-methyl-3-heptyloxycarbonyl)-7-oxy-bicyclo[2.2.1]hept-2-ene), poly(5-(2-cyclopentyl-2-propoxycarbonyl)-7-oxy-bicyclo[2.2.1]hept-2-ene), poly(5-(2-cyclohexyl-2-propoxycarbonyl)-7-oxy-bicyclo[2.2.1]hept-2-ene), poly(5-(2-norbornyl-2-propoxycarbonyl)-7-oxy-bicyclo[2.2.1]hept-2-ene), poly(5-(1,1-dicyclopentylethoxycarbonyl)-7-oxy-bicyclo[2.2.1]hept-2-ene), poly(5-(1,1-dicyclohexylethoxycarbonyl)-7-oxy-bicyclo[2.2.1]hept-2-ene), poly(5-(1-methylcyclopentyloxycarbonyl)-7-oxy-bicyclo[2.2.1]-2-ene), (5-(1-ethylcyclopentyloxycarbonyl)-7-oxy-bicyclo[2.2.1]-2-ene), poly(5-(1-methylcyclohexyloxycarbonyl)-7-oxy-bicyclo[2.2.1]hept-2-ene), poly(5-(1-ethylcyclohexyloxycarbonyl)-7-oxy-bicyclo[2.2.1]hept-2-ene), poly(5-(1-methylcyclooctyloxycarbonyl)-7-oxy-bicyclo[2.2.1]hept-2-ene), poly(5-(1-ethylcyclooctyloxycarbonyl)-7-oxy-bicyclo[2.2.1]hept-2-ene), poly(5-(1-adamantyloxycarbonyl)-7-oxy-bicyclo[2.2.1]hept-2-ene), poly(5-(2-methyl-2-adamantyloxycarbonyl)-7-oxy-bicyclo[2.2.1]hept-2-ene), poly(5-(2-ethyl-2-adamantyloxycarbonyl)-7-oxy-bicyclo[2.2.1]hept-2-ene), poly(5-(1-methyldecahydronaphthalene-1-yloxycarbonyl)-7-oxy-bicyclo[2.2.1]hept-2-ene), poly(5-(1-ethyldecahydronaphthalene-1-yloxycarbonyl)-7-oxy-bicyclo[2.2.1]hept-2-ene), poly(5-(2-methyldecahydronaphthalene-2-yloxycarbonyl)-7-oxy-bicyclo[2.2.1]hept-2-ene), poly(5-(2-ethyldecahydronaphthalene-2-yloxycarbonyl)-7-oxy-bicyclo[2.2.1]hept-2-ene), poly(5-(2-methyl-2-norbornyloxycarbonyl)-7-oxy-bicyclo[2.2.1]hept-2-ene), poly(5-(2-ethyl-2-norbornyloxycarbonyl)-7-oxy-bicyclo[2.2.1]hept-2-ene), poly(5-(2,7,7-trimethyl-2-norbornyloxycarbonyl)-7-oxy-bicyclo[2.2.1]hept-2-ene), poly(5-(2-ethyl-7,7-dimethyl-2-norbornyloxycarbonyl)-7-oxy-bicyclo[2.2.1]hept-2-ene), poly(5-(5-methyl-octahydro-4,7-methano-indene-5-yloxycarbonyl)-7-oxy-bicyclo[2.2.1]hept-2-ene), poly(5-(5-ethyl-octahydro-4,7-methano-indene-5-yloxycarbonyl)-7-oxy-bicyclo[2.2.1]hept-2-ene), poly(5-(4-methyl-tetracyclo[6.2.1.1$^{3,6}$.0$^{2,7}$]-dodecane-4-yloxycarbonyl)-7-oxy-bicyclo[2.2.1]hept-2-ene), and poly(5-(4-ethyl-tetracyclo[6.2.1.1$^{3,6}$.0$^{2,7}$]-dodecane-4-yloxycarbonyl)-7-oxy-bicyclo[2.2.1]hept-2-ene) in a case where at least one of $R^5$ to $R^8$ represents an alkoxycarbonyl group; (5-dimethylaminocarbonyl-7-oxy-bicyclo[2.2.1]hept-2-ene), poly(5-diethylaminocarbonyl-7-oxy-bicyclo[2.2.1]hept-2-ene), poly(5-ethylmethylaminocarbonyl-7-oxy-bicyclo[2.2.1]hept-2-ene), poly(5-methylbutylaminocarbonyl-7-oxy-bicyclo[2.2.1]hept-2-ene), poly(5-butylethylaminocarbonyl-7-oxy-bicyclo[2.2.1]hept-2-ene), and poly(5-cyclohexylmethylaminocarbonyl-7-oxy-bicyclo[2.2.1]hept-2-ene) in a case where at least one of $R^5$ to $R^8$ represents a dialkylaminocarbonyl group; poly(5-phenoxycarbonyl-7-oxy-bicyclo[2.2.1]hept-2-ene), poly(5-benzyloxycarbonyl-7-oxy-bicyclo[2.2.1]hept-2-ene), poly(5-(4-methylphenoxycarbonyl)-7-oxy-bicyclo[2.2.1]hept-2-ene), poly(5-(3,4-dimethylphenoxycarbonyl)-7-oxy-bicyclo[2.2.1]hept-2-ene), poly(5-(1-naphthoxycarbonyl)-7-oxy-bicyclo[2.2.1]hept-2-ene), poly(5-(2-naphthoxycarbonyl)-7-oxy-bicyclo[2.2.1]hept-2-ene), and poly(5-(1-anthracenoxycarbonyl)-7-oxy-bicyclo[2.2.1]hept-2-ene) in a case where at least one of $R^5$ to $R^8$ represents an aryloxycarbonyl group; poly(5-methylphenylaminocarbonyl-7-oxy-bicyclo[2.2.1]hept-2-ene), poly(5-ethylphenylaminocarbonyl-7-oxy-bicyclo[2.2.1]hept-2-ene), poly(5-butylphenylaminocarbonyl-7-oxy-bicyclo[2.2.1]hept-2-ene), and poly(5-cyclohexylphenylaminocarbonyl-7-oxy-bicyclo[2.2.1]hept-2-ene) in a case where at least one of $R^5$ to $R^8$ represents an alkylarylaminocarbonyl group; poly(5-methoxycarbonylmethyl-7-oxy-bicyclo[2.2.1]hept-2-ene), poly(5-methoxycarbonylethyl-7-oxy-bicyclo[2.2.1]hept-2-ene), poly(5-ethoxycarbonylmethyl-7-oxy-bicyclo[2.2.1]hept-2-ene), poly(5-ethoxycarbonylethyl-7-oxy-bicyclo[2.2.1]hept-2-ene), poly(5-(n-propoxycarbonylmethyl)-7-oxy-bicyclo[2.2.1]hept-2-ene), poly(5-(i-propoxycarbonylmethyl)-7-oxy-bicyclo[2.2.1]hept-2-ene), poly(5-(n-butoxycarbonylmethyl)-7-oxy-bicyclo[2.2.1]hept-2-ene), poly(5-(tert-butoxycarbonylmethyl)-7-oxy-bicyclo[2.2.1]hept-2-ene), poly(5-(n-pentyloxycarbonylmethyl)-7-oxy-bicyclo[2.2.1]hept-2-ene), poly(5-(2-methyl-2-butoxycarbonyl)methyl)-7-oxy-bicyclo[2.2.1]hept-2-ene), poly(5-(2,3-dimethyl-2-butoxycarbonyl)methyl)-7-oxy-bicyclo[2.2.1]hept-2-ene), poly(5-cyclopentyloxycarbonylmethyl-7-oxy-bicyclo[2.2.1]-2-ene), poly(5-(n-hexyloxycarbonylmethyl)-7-oxy-bicyclo[2.2.1]hept-2-ene), poly(5-cyclohexyloxycarbonylmethyl-7-oxy-bicyclo[2.2.1]-2-ene), poly(5-(n-octyloxycarbonylmethyl)-7-oxy-bicyclo[2.2.1]hept-2-ene), poly(5-cyclooctyloxycarbonylmethyl-7-oxy-bicyclo[2.2.1]

hept-2-ene), poly(5-(2-cyclopentyl-2-propoxycarbonyl)methyl)-7-oxy-bicyclo[2.2.1]hept-2-ene), poly(5-(2-cyclohexyl-2-propoxycarbonyl)methyl)-7-oxy-bicyclo[2.2.1]hept-2-ene), poly(5-(1-methylcyclopentyloxycarbonyl)methyl)-7-oxy-bicyclo[2.2.1]hept-2-ene), poly(5-(1-ethylcyclopentyloxycarbonyl)methyl)-7-oxy-bicyclo[2.2.1]hept-2-ene), poly(5-(1-methylcyclohexyloxycarbonyl)methyl)-7-oxy-bicyclo[2.2.1]hept-2-ene), and poly(5-(1-ethylcyclohexyloxycarbonyl)methyl)-7-oxy-bicyclo[2.2.1]hept-2-ene) in a case where at least one of $R^5$ to $R^8$ represents an alkoxycarbonylalkyl group; poly(5-methoxycarbonylphenyl-7-oxy-bicyclo[2.2.1]hept-2-ene), poly(5-ethoxycarbonylphenyl-7-oxy-bicyclo[2.2.1]hept-2-ene), poly(5-(n-propoxycarbonylphenyl)-7-oxy-bicyclo[2.2.1]hept-2-ene), poly(5-(i-propoxycarbonylphenyl)-7-oxy-bicyclo[2.2.1]hept-2-ene), poly(5-(n-butoxycarbonylphenyl)-7-oxy-bicyclo[2.2.1]hept-2-ene), poly(5-(tert-butoxycarbonylphenyl)-7-oxy-bicyclo[2.2.1]hept-2-ene), poly(5-(n-pentyloxycarbonylphenyl)-7-oxy-bicyclo[2.2.1]hept-2-ene), poly(5-(3-(2-methyl-2-butoxycarbonyl)phenyl)-7-oxy-bicyclo[2.2.1]hept-2-ene), poly(5-(3-(2,3-dimethyl-2-butoxycarbonyl)phenyl)-7-oxy-bicyclo[2.2.1]hept-2-ene), poly(5-(3-(2-cyclopentyl-2-propoxycarbonyl)phenyl)-7-oxy-bicyclo[2.2.1]hept-2-ene), poly(5-(3-(2-cyclohexyl-2-propoxycarbonyl)phenyl)-7-oxy-bicyclo[2.2.1]hept-2-ene), poly(5-(3-(1-methylcyclopentyloxycarbonyl)phenyl)-7-oxy-bicyclo[2.2.1]hept-2-ene), poly(5-(3-(1-ethylcyclopentyloxycarbonyl)phenyl)-7-oxy-bicyclo[2.2.1]hept-2-ene), poly(5-(3-(1-methylcyclohexyloxycarbonyl)phenyl)-7-oxy-bicyclo[2.2.1]hept-2-ene), poly(5-(3-(1-ethylcyclohexyloxycarbonyl)phenyl)-7-oxy-bicyclo[2.2.1]hept-2-ene), poly(5-(4-(2-methyl-2-butoxycarbonyl)phenyl)-7-oxy-bicyclo[2.2.1]hept-2-ene), poly(5-(4-(2,3-dimethyl-2-butoxycarbonyl)phenyl)-7-oxy-bicyclo[2.2.1]hept-2-ene), poly(5-(4-(2-cyclopentyl-2-propoxycarbonyl)phenyl)-7-oxy-bicyclo[2.2.1]-2-ene), poly(5-(4-(2-cyclohexyl-2-propoxycarbonyl)phenyl)-7-oxy-bicyclo[2.2.1]hept-2-ene), poly(5-(4-(1-methylcyclopentyloxycarbonyl)phenyl)-7-oxy-bicyclo[2.2.1]hept-2-ene), poly(5-(4-(1-ethylcyclopentyloxycarbonyl)phenyl)-7-oxy-bicyclo[2.2.1]hept-2-ene), poly(5-(4-(1-methylcyclohexyloxycarbonyl)phenyl)-7-oxy-bicyclo[2.2.1]hept-2-ene), poly(5-(4-(1-ethylcyclohexyloxycarbonyl)phenyl)-7-oxy-bicyclo[2.2.1]hept-2-ene), poly(5-methoxycarbonylnaphthyl-7-oxy-bicyclo[2.2.1]hept-2-ene), poly(5-ethoxycarbonylnaphthyl-7-oxy-bicyclo[2.2.1]hept-2-ene), poly(5-(n-propoxycarbonylnaphthyl)-7-oxy-bicyclo[2.2.1]-2-ene), poly(5-(i-propoxycarbonylnaphthyl)-7-oxy-bicyclo[2.2.1]-2-ene), poly(5-(n-butoxycarbonylnaphthyl)-7-oxy-bicyclo[2.2.1]hept-2-ene), poly(5-(tert-butoxycarbonylphenyl)-7-oxy-bicyclo[2.2.1]hept-2-ene), poly(5-(n-pentyloxycarbonylnaphthyl)-7-oxy-bicyclo[2.2.1]hept-2-ene), poly(5-(5-(2-methyl-2-butoxycarbonyl)naphthyl)-7-oxy-bicyclo[2.2.1]hept-2-ene), poly(5-(5-(2,3-dimethyl-2-butoxycarbonyl)naphthyl)-7-oxy-bicyclo[2.2.1]hept-2-ene), poly(5-(5-(2-cyclopentyl-2-propoxycarbonyl)naphthyl)-7-oxy-bicyclo[2.2.1]hept-2-ene), poly(5-(5-(2-cyclohexyl-2-propoxycarbonyl)naphthyl)-7-oxy-bicyclo[2.2.1]hept-2-ene), poly(5-(5-(1-methylcyclopentyloxycarbonyl)naphthyl)-7-oxy-bicyclo[2.2.1]hept-2-ene), poly(5-(5-(1-ethylcyclopentyloxycarbonyl)naphthyl)-7-oxy-bicyclo[2.2.1]hept-2-ene), poly(5-(5-(1-methylcyclohexyloxycarbonyl)naphthyl)-7-oxy-bicyclo[2.2.1]hept-2-ene), and poly(5-(5-(1-ethylcyclohexyloxycarbonyl)naphthyl)-7-oxy-bicyclo[2.2.1]hept-2-ene) in a case where at least one of $R^5$ to $R^8$ represents an alkoxycarbonylaryl group; poly(5-phenoxycarbonylmethyl-7-oxy-bicyclo[2.2.1]hept-2-ene), poly(5-benzyloxycarbonylmethyl-7-oxy-bicyclo[2.2.1]hept-2-ene), poly(5-(4-methylphenoxycarbonylmethyl)-7-oxy-bicyclo[2.2.1]hept-2-ene), poly(5-(3,4-dimethylphenoxycarbonylmethyl)-7-oxy-bicyclo[2.2.1]hept-2-ene), poly(5-(1-naphthoxycarbonylmethyl)-7-oxy-bicyclo[2.2.1]hept-2-ene), poly(5-(2-naphthoxycarbonylmethyl)-7-oxy-bicyclo[2.2.1]hept-2-ene), and poly(5-(1-anthracenoxycarbonylmethyl)-7-oxy-bicyclo[2.2.1]hept-2-ene) in a case where at least one of $R^5$ to $R^8$ represents an aryloxycarbonylalkyl group; poly(5-methoxymethyloxycarbonyl-7-oxy-bicyclo[2.2.1]hept-2-ene), poly(5-ethoxymethyloxycarbonyl-7-oxy-bicyclo[2.2.1]hept-2-ene), poly(5-(n-propoxymethyloxycarbonyl)-7-oxy-bicyclo[2.2.1]-2-ene), poly(5-isopropoxymethyloxycarbonyl-7-oxy-bicyclo[2.2.1]hept-2-ene), poly(5-(n-butoxymethyloxycarbonyl)-7-oxy-bicyclo[2.2.1]hept-2-ene), poly(5-(tert-butoxymethyloxycarbonyl)-7-oxy-bicyclo[2.2.1]hept-2-ene), poly(5-cyclopentyloxymethyloxycarbonyl)-7-oxy-bicyclo[2.2.1]hept-2-ene), poly(5-cyclohexyloxymethyloxycarbonyl-7-oxy-bicyclo[2.2.1]hept-2-ene), poly(5-cyclooctyloxymethyloxycarbonyl-7-oxy-bicyclo[2.2.1]hept-2-ene), poly(5-norbornyloxymethyloxycarbonyl-7-oxy-bicyclo[2.2.1]hept-2-ene), poly(5-(1-methylcyclopentyloxymethyloxycarbonyl)-7-oxy-bicyclo[2.2.1]hept-2-ene), poly(5-(1-ethylcyclopentyloxymethyloxycarbonyl)-7-oxy-bicyclo[2.2.1]hept-2-ene), poly(5-(1-methylcyclohexyloxymethyloxycarbonyl)-7-oxy-bicyclo[2.2.1]hept-2-ene), poly(5-(1-ethylcyclohexyloxymethyloxycarbonyl)-7-oxy-bicyclo[2.2.1]hept-2-ene), poly(5-(1-methylnorbornyloxymethyloxycarbonyl)-7-oxy-bicyclo[2.2.1]hept-2-ene), poly(5-(1-ethylnorbornyloxymethyloxycarbonyl)-7-oxy-bicyclo[2.2.1]hept-2-ene), poly(5-(1-ethoxypropyloxymethyloxycarbonyl)-7-oxy-bicyclo[2.2.1]hept-2-ene), poly(5-(1-ethoxy-1-methylethyloxymethyloxycarbonyl)-7-oxy-bicyclo[2.2.1]-2-ene), poly(5-tetrahydrofuran-2-yloxymethyloxycarbonyl-7-oxy-bicyclo[2.2.1]hept-2-ene), poly(5-tetrahydropyran-2-yloxymethyloxycarbonyl-7-oxy-bicyclo[2.2.1]hept-2-ene), poly(5-(1-adamantyloxymethyloxycarbonyl)-7-oxy-bicyclo[2.2.1]hept-2-ene), poly(5-(2-adamantyloxymethyloxycarbonyl)-7-oxy-bicyclo[2.2.1]hept-2-ene), poly(5-(1-(1-methoxy)ethoxycarbonyl)-7-oxy-bicyclo[2.2.1]hept-2-ene), poly(5-(1-(1-ethoxy)ethoxycarbonyl)-7-oxy-bicyclo[2.2.1]-2-ene), poly(5-(1-(1-n-propoxy)ethoxycarbonyl)-7-oxy-bicyclo[2.2.1]hept-2-ene), poly(5-(1-(1-isopropoxy)ethoxycarbonyl)-7-oxy-bicyclo[2.2.1]hept-2-ene), poly(5-(1-(1-n-butoxy)ethoxycarbonyl)-7-oxy-bicyclo[2.2.1]hept-2-ene), poly(5-(1-(1-tert-butoxy)ethoxycarbonyl)-7-oxy-bicyclo[2.2.1]hept-2-ene), poly(5-(1-(1-cyclopentyloxy)ethoxycarbonyl)-7-oxy-bicyclo[2.2.1]hept-2-ene), poly(5-(1-(1-cyclohexyloxy)ethoxycarbonyl)-7-oxy-bicyclo[2.2.1]hept-2-ene), poly(5-(1-(1-cyclooctyloxy)ethoxycarbonyl)-7-oxy-bicyclo[2.2.1]hept-2-ene), poly(5-(1-(1-norbornyloxy)ethoxycarbonyl)-7-oxy-bicyclo[2.2.1]hept-2-ene), poly(5-(1-(1-methylcyclopentyloxy)ethoxycarbonyl)-7-oxy-bicyclo[2.2.1]hept-2-ene), poly(5-(1-(1-ethylcyclopentyloxy)ethoxycarbonyl)-7-oxy-bicyclo[2.2.1]hept-2-ene), poly(5-(1-(1-methylcyclohexyloxy)ethoxycarbonyl)-7-oxy-bicyclo[2.2.1]hept-2-ene), poly(5-(1-(1-ethylcyclohexyloxy)ethoxycarbonyl)-7-oxy-bicyclo[2.2.1]hept-2-ene), poly(5-(1-(1-methylnorbornyloxy)

ethoxycarbonyl)-7-oxy-bicyclo[2.2.1]hept-2-ene), poly(5-(1-(1-ethylnorbornyloxy)ethoxycarbonyl)-7-oxy-bicyclo[2.2.1]hept-2-ene), poly(5-(1-(1-ethoxypropyloxy)ethoxycarbonyl)-7-oxy-bicyclo[2.2.1]hept-2-ene), poly(5-(1-(1-ethoxy-1-methylethyloxy)ethoxycarbonyl)-7-oxy-bicyclo[2.2.1]hept-2-ene), poly(5-(1-(tetrahydrofuran-2-yloxy)ethoxycarbonyl)-7-oxy-bicyclo[2.2.1]hept-2-ene), poly(5-(1-tetrahydropyran-2-yloxy)ethoxycarbonyl)-7-oxy-bicyclo[2.2.1]hept-2-ene), poly(5-(1-(1-adamantyloxy)ethoxycarbonyl)-7-oxy-bicyclo[2.2.1]hept-2-ene), and poly(5-(1-(2-adamantyloxy)ethoxycarbonyl)-7-oxy-bicyclo[2.2.1]hept-2-ene) in a case where at least one of $R^5$ to $R^8$ represents an alkoxyalkyloxycarbonyl group; and poly(5-methoxycarbonylmethyloxycarbonyl-7-oxy-bicyclo[2.2.1]hept-2-ene), poly(5-ethoxycarbonylmethyloxycarbonyl-7-oxy-bicyclo[2.2.1]hept-2-ene), poly(5-(n-propoxycarbonylmethyloxycarbonyl)-7-oxy-bicyclo[2.2.1]hept-2-ene), poly(5-(isopropoxycarbonylmethyloxycarbonyl-7-oxy-bicyclo[2.2.1]hept-2-ene), poly(5-(n-butoxycarbonylmethyloxycarbonyl)-7-oxy-bicyclo[2.2.1]hept-2-ene), poly(5-(tert-butoxycarbonylmethyloxycarbonyl)-7-oxy-bicyclo[2.2.1]hept-2-ene), poly(5-(2-cyclopentyl-2-propoxycarbonylmethyloxycarbonyl)-7-oxy-bicyclo[2.2.1]hept-2-ene), poly(5-(2-cyclopentyl-2-butoxycarbonylmethyloxycarbonyl)-7-oxy-bicyclo[2.2.1]hept-2-ene), poly(5-(2-cyclohexyl-2-propoxycarbonylmethyloxycarbonyl)-7-oxy-bicyclo[2.2.1]hept-2-ene), poly(5-(3-(2-cyclohexyl-2-propoxycarbonyl)propoxycarbonyl)-7-oxy-bicyclo[2.2.1]hept-2-ene), poly(5-(2-cyclohexyl-2-butoxycarbonylmethyloxycarbonyl)-7-oxy-bicyclo[2.2.1]hept-2-ene), poly(5-(3-cyclohexyl-3-pentyloxycarbonylmethyloxycarbonyl)-7-oxy-bicyclo[2.2.1]hept-2-ene), poly(5-(2-ethyl-2-norbornyloxycarbonylmethyloxycarbonyl)-7-oxy-bicyclo[2.2.1]hept-2-ene), poly(5-(2-norbornyl-2-propoxycarbonylmethyloxycarbonyl)-7-oxy-bicyclo[2.2.1]hept-2-ene), poly(5-(4-ethyl-tetracyclo[6.2.1.1$^{3,6}$.0$^{2,7}$]-dodecane-4-yloxycarbonylmethyloxycarbonyl)-7-oxy-bicyclo[2.2.1]hept-2-ene), poly(5-(2-tetracyclo[6.2.1.1$^{3,6}$.0$^{2,7}$]-dodecane-4-yl)-2-propoxycarbonylmethyloxycarbonyl)-7-oxy-bicyclo[2.2.1]hept-2-ene), poly(5-(1,1-dicyclohexylethoxycarbonylmethyloxycarbonyl)-7-oxy-bicyclo[2.2.1]hept-2-ene), poly(5-(1,1-dicyclohexylpropoxycarbonylmethyloxycarbonyl)-7-oxy-bicyclo[2.2.1]hept-2-ene), poly(5-cyclopentyloxycarbonylmethyloxycarbonyl-7-oxy-bicyclo[2.2.1]hept-2-ene), poly(5-cyclohexyloxycarbonylmethyloxycarbonyl-7-oxy-bicyclo[2.2.1]hept-2-ene), poly(5-cyclooctyloxycarbonylmethyloxycarbonyl-7-oxy-bicyclo[2.2.1]hept-2-ene), poly(5-norbornyloxycarbonylmethyloxycarbonyl-7-oxy-bicyclo[2.2.1]hept-2-ene), poly(5-(1-methylcyclopentyloxycarbonylmethyloxycarbonyl)-7-oxy-bicyclo[2.2.1]hept-2-ene), poly(5-(1-ethylcyclopentyloxycarbonylmethyloxycarbonyl)-7-oxy-bicyclo[2.2.1]hept-2-ene), poly(5-(1-methylcyclohexyloxycarbonylmethyloxycarbonyl)-7-oxy-bicyclo[2.2.1]hept-2-ene), poly(5-(1-ethylcyclohexyloxycarbonylmethyloxycarbonyl)-7-oxy-bicyclo[2.2.1]hept-2-ene), poly(5-(1-methylnorbornyloxycarbonylmethyloxycarbonyl)-7-oxy-bicyclo[2.2.1]hept-2-ene), poly(5-(1-ethylnorbornyloxycarbonylmethyloxycarbonyl)-7-oxy-bicyclo[2.2.1]hept-2-ene), poly(5-(1-ethoxypropyloxycarbonylmethyloxycarbonyl)-7-oxy-bicyclo[2.2.1]-2-ene), poly(5-(1-ethoxy-1-methylethyloxycarbonylmethyloxycarbonyl)-7-oxy-bicyclo[2.2.1]hept-2-ene), poly(5-tetrahydrofuran-2-yloxycarbonylmethyloxycarbonyl-7-oxy-bicyclo[2.2.1]hept-2-ene), poly(5-tetrahydropyran-2-yloxycarbonylmethyloxycarbonyl-7-oxy-bicyclo[2.2.1]hept-2-ene), poly(5-(1-adamantyloxycarbonylmethyloxycarbonyl)-7-oxy-bicyclo[2.2.1]hept-2-ene), poly(5-(2-adamantyloxycarbonylmethyloxycarbonyl)-7-oxy-bicyclo[2.2.1]hept-2-ene), poly(5-(1-(2-(1-adamantyl)-2-propoxycarbonyl)ethoxycarbonyl)-7-oxy-bicyclo[2.2.1]hept-2-ene), poly(5-(3-(2-(1-adamantyl)-2-propoxycarbonyl)propoxycarbonyl)-7-oxy-bicyclo[2.2.1]hept-2-ene), poly(5-(2-(2-(1-adamantyl)-2-propoxycarbonyl)-2-propoxycarbonyl)-7-oxy-bicyclo[2.2.1]hept-2-ene), poly(5-(2-methyl-2-adamantyloxycarbonylmethyloxycarbonyl)-7-oxy-bicyclo[2.2.1]hept-2-ene), poly(5-(3-(2-methyl-2-adamantyloxycarbonyl)propoxycarbonyl)-7-oxy-bicyclo[2.2.1]hept-2-ene), poly(5-(2-(2-methyl-2-adamantyloxycarbonyl)-2-propoxycarbonyl)-7-oxy-bicyclo[2.2.1]hept-2-ene), poly(5-(1-(2-methyl-2-adamantyloxycarbonyl)ethoxycarbonyl)-7-oxy-bicyclo[2.2.1]hept-2-ene), poly(5-(2-ethyl-2-adamantyloxycarbonylmethyloxycarbonyl)-7-oxy-bicyclo[2.2.1]hept-2-ene), poly(5-(2-isopropyl-2-adamantyloxycarbonylmethyloxycarbonyl)-7-oxy-bicyclo[2.2.1]hept-2-ene), poly(5-(2-(1-adamantyl)-2-propoxycarbonylmethyloxycarbonyl)-7-oxy-bicyclo[2.2.1]hept-2-ene), poly(5-(2-(1-adamantyl)-2-butoxycarbonylmethyloxycarbonyl)-7-oxy-bicyclo[2.2.1]hept-2-ene), poly(5-(3-(1-adamantyl)-3-pentyloxycarbonylmethyloxycarbonyl)-7-oxy-bicyclo[2.2.1]hept-2-ene), poly(5-(3-tert-butoxycarbonyl-1-cyclopentyloxycarbonyl)-7-oxy-bicyclo[2.2.1]hept-2-ene), poly(5-(3-(1-methylcyclohexyloxycarbonyl)-1-cyclopentyloxycarbonyl)-7-oxy-bicyclo[2.2.1]hept-2-ene), poly(5-(5-tert-butoxycarbonyl-2-norbornyloxycarbonyl)-7-oxy-bicyclo[2.2.1]hept-2-ene), poly(5-(5-(1-methylcyclohexyloxycarbonyl)-2-norbornyloxycarbonyl)-7-oxy-bicyclo[2.2.1]hept-2-ene), poly(5-(5,5-di(tert-butoxycarbonyl)-2-norbornyloxycarbonyl)-7-oxy-bicyclo[2.2.1]hept-2-ene), poly(5-(5,6-di(tert-butoxycarbonyl)-2-norbornyloxycarbonyl)-7-oxy-bicyclo[2.2.1]hept-2-ene), poly(5-(1-(1-methylcyclohexyloxycarbonyl)-octahydro-4,7-methano-indene-5-yloxycarbonyl)-7-oxy-bicyclo[2.2.1]hept-2-ene), poly(5-(6-tert-butoxycarbonyl-decahydronaphthalene-2-yloxycarbonyl)-7-oxy-bicyclo[2.2.1]hept-2-ene), poly(5-(9-tert-butoxycarbonyl-tetracyclo[6.2.1.1$^{3,6}$.0$^{2,7}$]-dodecane-4-yloxycarbonyl)-7-oxy-bicyclo[2.2.1]hept-2-ene), and poly(5-(9-(1-methylcyclohexyloxycarbonyl)-tetracyclo[6.2.1.1$^{3,6}$.0$^{2,7}$]-dodecane-4-yloxycarbonyl)-7-oxy-bicyclo[2.2.1]hept-2-ene) in a case where at least one of $R^5$ to $R^8$ represents an alkoxycarbonylalkyloxycarbonyl group.

In a case where $R^5$ to $R^8$ are bonded to one another to form a ring structure, examples of the cyclic alkyl structure include poly(1,4,4a,5,6,7,8,8a-octahydro-1,4-ethano-naphthalene). Examples of the cyclic ester structure which can form a lactone ring include poly(4,10-dioxy-tricyclo[5.2.1.0$^{2,6}$]-8-decene-3-one) as a γ-butyrolactone structure; poly(4,10-dioxy-tricyclo[6.2.1.0$^{2,7}$]-9-undecene-3-one) as a δ-valerolactone structure; and poly(4,10-dioxy-tricyclo[5.2.1.0$^{2,6}$]-8-decene-3,5-dione) as a cyclic acid anhydride structure. Examples of the cyclic amide structure which can form a lactam ring include poly(4-methyl-4-aza-10-oxy-tricyclo[5.2.1.0$^{2,6}$]-8-decene-3-one), poly(4-ethyl-4-aza-10-oxy-tricyclo[5.2.1.0$^{2,6}$]-8-decene-3-one), poly(4-(n-propyl)-4-aza-10-oxy-tricyclo[5.2.1.0$^{2,6}$]-8-decene-3-one), poly(4-(n-butyl)-4-aza-10-oxy-tricyclo[5.2.1.0$^{2,6}$]-8-decene-3-one), poly(4-(1-methylbutyl)-4-aza-10-oxy-tricyclo[5.2.1.0$^{2,6}$]-8-decene-3-one), poly(4-cyclopentyl-4-aza-10-oxy-tricyclo[5.2.1.0$^{2,6}$]-8-decene-3-one), poly(4-cyclohexyl-4-aza-10-oxy-tricyclo[5.2.1.0$^{2,6}$]-8-decene-3-one), poly(4-phenyl-4-aza-10-oxy-tricyclo[5.2.1.0$^{2,6}$]-8-decene-3-one), and poly(4-(4-hydroxyphenyl)-4-aza-10-oxy-tricyclo[5.2.1.0$^{2,6}$]-8-decene-3-one) as γ-lactam; poly(4-methyl-4-aza-10-oxy-tricyclo[6.2.1.0$^{2,7}$]-9-undecene-3-one), poly(4-ethyl-4-aza-10-oxy-tricyclo[6.2.1.0$^{2,7}$]-9-undecene-3-one), poly(4-(n-propyl)-4-aza-10-oxy-tricyclo[6.2.1.0$^{2,7}$]-9-undecene-3-one), poly(4-(n-butyl)-4-aza-10-oxy-tricyclo[6.2.1.0$^{2,7}$]-9-undecene-3-one), poly(4-(1-methylbutyl)-4-aza-10-oxy-tricyclo[6.2.1.0$^{2,7}$]-9-undecene-3-one), poly(4-cyclopentyl-4-aza-10-oxy-tricyclo[6.2.1.0$^{2,7}$]-9-undecene-3-one), poly(4-cyclohexyl-4-aza-10-oxy-tricyclo[6.2.1.0$^{2,7}$]-9-undecene-3-one), poly(4-phenyl-4-aza-10-oxy-tricyclo[6.2.1.0$^{2,7}$]-9-undecene-3-one), and poly(4-(4-hydroxyphenyl)-4-aza-10-oxy-tricyclo[6.2.1.0$^{2,7}$]-9-undecene-3-one) as δ-lactam. Examples of the cyclic imide structure which can form a maleimide ring include poly(4-methyl-4-aza-10-oxy-tricyclo[5.2.1.0$^{2,6}$]-8-decene-3,5-dione), poly(4-ethyl-4-aza-10-oxy-tricyclo[5.2.1.0$^{2,6}$]-8-decene-3,5-dione), poly(4-(n-propyl)-4-aza-10-oxy-tricyclo[5.2.1.0$^{2,6}$]-8-decene-3,5-dione), poly(4-(n-butyl)-4-aza-10-oxy-tricyclo[5.2.1.0$^{2,6}$]-8-decene-3,5-dione), poly(4-(1-methylbutyl)-4-aza-10-oxy-tricyclo[5.2.1.0$^{2,6}$]-8-decene-3,5-dione), poly(4-cyclopentyl-4-aza-10-oxy-tricyclo[5.2.1.0$^{2,6}$]-8-decene-3,5-dione), poly(4-cyclohexyl-4-aza-10-oxy-tricyclo[5.2.1.0$^{2,6}$]-8-decene-3,5-dione), poly(4-phenyl-4-aza-10-oxy-tricyclo[5.2.1.0$^{2,6}$]-8-decene-3,5-dione), and poly(4-(4-hydroxyphenyl)-4-aza-10-oxy-tricyclo[5.2.1.0$^{2,6}$]-8-decene-3,5-dione).

Among these, in the repeating structural unit [B] represented by Formula (2) according to the present embodiment, as the cyclic olefin polymer in which n represents 0, poly(5-methoxycarbonyl-7-oxy-bicyclo[2.2.1]hept-2-ene), poly(5-ethoxycarbonyl-7-oxy-bicyclo[2.2.1]hept-2-ene), poly(5-(n-propoxycarbonyl)-7-oxy-bicyclo[2.2.1]hept-2-ene), poly(5-(n-butoxycarbonyl)-7-oxy-bicyclo[2.2.1]hept-2-ene), poly(5-isobutoxycarbonyl-7-oxy-bicyclo[2.2.1]hept-2-ene), poly(5-(tert-butoxycarbonyl)-7-oxy-bicyclo[2.2.1]hept-2-ene), poly(5-(n-pentyloxycarbonyl)-7-oxy-bicyclo[2.2.1]hept-2-ene), poly(5-(2-methyl-2-pentyloxycarbonyl)-7-oxy-bicyclo[2.2.1]hept-2-ene), poly(5-(3-methyl-3-pentyloxycarbonyl)-7-oxy-bicyclo[2.2.1]hept-2-ene), poly(5-(2-ethyl-3-methyl-3-pentyloxycarbonyl)-7-oxy-bicyclo[2.2.1]hept-2-ene), poly(5-cyclopentyloxycarbonyl-7-oxy-bicyclo[2.2.1]hept-2-ene), poly(5-(n-hexyloxycarbonyl)-7-oxy-bicyclo[2.2.1]hept-2-ene), poly(5-cyclohexyloxycarbonyl-7-oxy-bicyclo[2.2.1]hept-2-ene), poly(5-(2-methyl-2-butoxycarbonyl)-7-oxy-bicyclo[2.2.1]hept-2-ene), poly(5-(2,3-dimethyl-2-butoxycarbonyl)-7-oxy-bicyclo[2.2.1]hept-2-ene), poly(5-(2,3,3-trimethyl-2-butoxycarbonyl)-7-oxy-bicyclo[2.2.1]hept-2-ene), poly(5-(2-methyl-2-hexyloxycarbonyl)-7-oxy-bicyclo[2.2.1]hept-2-ene), poly(5-(3,4-dimethyl-3-hexyloxycarbonyl)-7-oxy-bicyclo[2.2.1]hept-2-ene), poly(5-(3-methylbutoxycarbonyl)-7-oxy-bicyclo[2.2.1]hept-2-ene), poly(5-(2-methylpentoxycarbonyl)-7-oxy-bicyclo[2.2.1]hept-2-ene), poly(5-(3-methylpentoxycarbonyl)-7-oxy-bicyclo[2.2.1]hept-2-ene), poly(5-(4-methylpentoxycarbonyl)-7-oxy-bicyclo[2.2.1]hept-2-ene), poly(5-(3-methyl-3-heptyloxycarbonyl)-7-oxy-bicyclo[2.2.1]hept-2-ene), poly(5-(2-cyclopentyl-2-propoxycarbonyl)-7-oxy-bicyclo[2.2.1]hept-2-ene), poly(5-(2-cyclohexyl-2-propoxycarbonyl)-7-oxy-bicyclo[2.2.1]hept-2-ene), poly(5-(2-norbornyl-2-propoxycarbonyl)-7-oxy-bicyclo[2.2.1]hept-2-ene), poly(5-(1,1-dicyclopentylethoxycarbonyl)-7-oxy-bicyclo[2.2.1]hept-2-ene), poly(5-(1,1-dicyclohexylethoxycarbonyl)-7-oxy-bicyclo[2.2.1]hept-2-ene), poly(5-(1-methylcyclopentyloxycarbonyl)-7-oxy-bicyclo[2.2.1]-2-ene), (5-(1-ethylcyclopentyloxycarbonyl)-7-oxy-bicyclo[2.2.1]hept-2-ene), poly(5-(1-methylcyclohexyloxycarbonyl)-7-oxy-bicyclo[2.2.1]hept-2-ene), poly(5-(1-ethylcyclohexyloxycarbonyl)-7-oxy-bicyclo[2.2.1]hept-2-ene), poly(5-(1-methylcyclooctyloxycarbonyl)-7-oxy-bicyclo[2.2.1]hept-2-ene), poly(5-(1-ethylcyclooctyloxycarbonyl)-7-oxy-bicyclo[2.2.1]hept-2-ene), poly(5-(1-adamantyloxycarbonyl)-7-oxy-bicyclo[2.2.1]hept-2-ene), poly(5-(2-methyl-2-adamantyloxycarbonyl)-7-oxy-bicyclo[2.2.1]hept-2-ene), poly(5-(2-ethyl-2-adamantyloxycarbonyl)-7-oxy-bicyclo[2.2.1]hept-2-ene), poly(5-(1-methyldecahydronaphthalene-1-yloxycarbonyl)-7-oxy-bicyclo[2.2.1]hept-2-ene), poly(5-(1-ethyldecahydronaphthalene-1-yloxycarbonyl)-7-oxy-bicyclo[2.2.1]hept-2-ene), poly(5-(2-methyldecahydronaphthalene-2-yloxycarbonyl)-7-oxy-bicyclo[2.2.1]hept-2-ene), poly(5-(2-ethyldecahydronaphthalene-2-yloxycarbonyl)-7-oxy-bicyclo[2.2.1]hept-2-ene), poly(5-(2-methyl-2-norbornyloxycarbonyl)-7-oxy-bicyclo[2.2.1]hept-2-ene), poly(5-(2-ethyl-2-norbornyloxycarbonyl)-7-oxy-bicyclo[2.2.1]hept-2-ene), poly(5-(2,7,7-trimethyl-2-norbornyloxycarbonyl)-7-oxy-bicyclo[2.2.1]hept-2-ene), poly(5-(2-ethyl-7,7-dimethyl-2-norbornyloxycarbonyl)-7-oxy-bicyclo[2.2.1]hept-2-ene), poly(5-(5-methyl-octahydro-4,7-methano-indene-5-yloxycarbonyl)-7-oxy-bicyclo[2.2.1]hept-2-ene), poly(5-(5-ethyl-octahydro-4,7-methano-indene-5-yloxycarbonyl)-7-oxy-bicyclo[2.2.1]hept-2-ene), poly(5-(4-methyl-tetracyclo[6.2.1.1$^{3,6}$.0$^{2,7}$]-dodecane-4-yloxycarbonyl)-7-oxy-bicyclo[2.2.1]hept-2-ene), poly(5-(4-ethyl-tetracyclo[6.2.1.1$^{3,6}$.0$^{2,7}$]-dodecane-4-yloxycarbonyl)-7-oxy-bicyclo[2.2.1]hept-2-ene), poly(5-methoxycarbonylphenyl-7-oxy-bicyclo[2.2.1]hept-2-ene), poly(5-ethoxycarbonylphenyl-7-oxy-bicyclo[2.2.1]hept-2-ene), poly(5-(n-propoxycarbonylphenyl)-7-oxy-bicyclo[2.2.1]hept-2-ene), poly(5-(i-propoxycarbonylphenyl)-7-oxy-bicyclo[2.2.1]hept-2-ene), poly(5-(n-butoxycarbonylphenyl)-7-oxy-bicyclo[2.2.1]hept-2-ene), poly(5-(tert-butoxycarbonylphenyl)-7-oxy-bicyclo[2.2.1]hept-2-ene), poly(5-(n-pentyloxycarbonylphenyl)-7-oxy-bicyclo[2.2.1]hept-2-ene), poly(5-(3-(2-methyl-2-butoxycarbonyl)phenyl)-7-oxy-bicyclo[2.2.1]hept-2-ene), poly(5-(3-(2,3-dimethyl-2-butoxycarbonyl)phenyl)-7-oxy-bicyclo[2.2.1]hept-2-ene), poly(5-(3-(2-cyclopentyl-2-propoxycarbonyl)phenyl)-7-oxy-bicyclo[2.2.1]hept-2-ene), poly(5-(3-(2-cyclohexyl-2-propoxycarbonyl)phenyl)-7-oxy-bicyclo[2.2.1]hept-2-ene), poly(5-(3-(1-methylcyclopentyloxycarbonyl)phenyl)-7-oxy-bicyclo[2.2.1]hept-2-ene), poly(5-(3-(1-ethylcyclopentyloxycarbonyl)phenyl)-7-oxy-bicyclo[2.2.1]hept-2-ene), poly(5-(3-(1-methylcyclohexyloxycarbonyl)phenyl)-7-oxy-bicyclo[2.2.1]hept-2-ene), poly(5-(3-(1-ethylcyclohexyloxycarbonyl)phenyl)-7-oxy-bicyclo[2.2.1]hept-2-ene), poly(5-(4-(2-methyl-2-butoxycarbonyl)phenyl)-7-oxy-bicyclo[2.2.1]hept-2-ene), poly(5-(4-(2,3-dimethyl-2-butoxycarbonyl)phenyl)-7-oxy-bicyclo[2.2.1]hept-2-ene), poly(5-(4-(2-cyclopentyl-2-propoxycarbonyl)phenyl)-7-oxy-bicyclo[2.2.1]hept-2-ene), poly(5-(4-(2- cyclohexyl-2-propoxycarbonyl)phenyl)-7-oxy-bicyclo[2.2.1]hept-2-ene), poly(5-(4-(1-methylcyclopentyloxycarbonyl)phenyl)-7-oxy-bicyclo[2.2.1]hept-2-ene), poly(5-(4-(1-ethylcyclopentyloxycarbonyl)phenyl)-7-oxy-bicyclo[2.2.1]hept-2-ene), poly(5-(4-(1-methylcyclohexyloxycarbonyl)phenyl)-7-oxy-bicyclo[2.2.1]hept-2-ene), poly(5-(4-(1-ethylcyclohexyloxycarbonyl)phenyl)-7-oxy-bicyclo[2.2.1]hept-2-ene), poly(5-methoxycarbonylnaphthyl-7-oxy-bicyclo[2.2.1]hept-2-ene), poly(5-ethoxycarbonylnaphthyl-7-oxy-bicyclo[2.2.1]hept-2-ene), poly(5-(n-propoxycarbonylnaphthyl)-7-oxy-bicyclo[2.2.1]hept-2-ene), poly(5-(i-propoxycarbonylnaphthyl)-7-oxy-bicyclo[2.2.1]hept-2-ene), poly(5-(n-butoxycarbonylnaphthyl)-7-oxy-bicyclo[2.2.1]hept-2-ene), poly(5-(tert-butoxycarbonylphenyl)-7-oxy-bicyclo[2.2.1]hept-2-ene), poly(5-(n-pentyloxycarbonylnaphthyl)-7-oxy-bicyclo[2.2.1]hept-2-ene), poly(5-(5-(2-methyl-2-butoxycarbonyl)naphthyl)-7-oxy-bicyclo[2.2.1]hept-2-ene), poly(5-(5-(2,3-dimethyl-2-butoxycarbonyl)naphthyl)-7-oxy-bicyclo[2.2.1]-2-ene), poly(5-(5-(2-cyclopentyl-2-propoxycarbonyl)naphthyl)-7-oxy-bicyclo[2.2.1]hept-2-ene), poly(5-(5-(2-cyclohexyl-2-propoxycarbonyl)naphthyl)-7-oxy-bicyclo[2.2.1]hept-2-ene), poly(5-(5-(1-methylcyclopentyloxycarbonyl) naphthyl)-7-oxy-bicyclo[2.2.1]-2-ene), poly(5-(5-(1-ethylcyclopentyloxycarbonyl)naphthyl)-7-oxy-bicyclo[2.2.1]-2-ene), poly(5-(5-(1-methylcyclohexyloxycarbonyl)naphthyl)-7-oxy-bicyclo[2.2.1]-2-ene), poly(5-(5-(1-ethylcyclohexyloxycarbonyl)naphthyl)-7-oxy-bicyclo[2.2.1]hept-2-ene), poly(5-phenoxycarbonyl-7-oxy-bicyclo[2.2.1]hept-2-ene), poly(5-benzyloxycarbonyl-7-oxy-bicyclo[2.2.1]hept-2-ene), poly(5-(4-methylphenoxycarbonyl)-7-oxy-bicyclo[2.2.1]hept-2-ene), poly(5-(3,4-dimethylphenoxycarbonyl)-7-oxy-bicyclo[2.2.1]hept-2-ene), poly(5-(1-naphthoxycarbonyl)-7-oxy-bicyclo[2.2.1]hept-2-ene), poly(5-(2-naphthoxycarbonyl)-7-oxy-bicyclo[2.2.1]hept-2-ene), poly(5-(1-anthracenoxycarbonyl)-7-oxy-bicyclo[2.2.1]hept-2-ene), poly(5-methoxymethyloxycarbonyl-7-oxy-bicyclo[2.2.1]hept-2-ene), poly(5-ethoxymethyloxycarbonyl-7-oxy-bicyclo[2.2.1]hept-2-ene), poly(5-(n-propoxymethyloxycarbonyl)-7-oxy-bicyclo[2.2.1]-2-ene), poly(5-isopropoxymethyloxycarbonyl-7-oxy-bicyclo[2.2.1]hept-2-ene), poly(5-(n-butoxymethyloxycarbonyl)-7-oxy-bicyclo[2.2.1]hept-2-ene), poly(5-(tert-butoxymethyloxycarbonyl)-7-oxy-bicyclo[2.2.1]hept-2-ene), poly(5-cyclopentyloxymethyloxycarbonyl)-7-oxy-bicyclo[2.2.1]hept-2-ene), poly(5-cyclohexyloxymethyloxycarbonyl-7-oxy-bicyclo[2.2.1]hept-2-ene), poly(5-cyclooctyloxymethyloxycarbonyl-7-oxy-bicyclo[2.2.1]hept-2-ene), poly(5-norbornyloxymethyloxycarbonyl-7-oxy-bicyclo[2.2.1]hept-2-ene), poly(5-(1-methylcyclopentyloxymethyloxycarbonyl)-7-oxy-bicyclo[2.2.1]hept-2-ene), poly(5-(1-ethylcyclopentyloxymethyloxycarbonyl)-7-oxy-bicyclo[2.2.1]hept-2-ene), poly(5-(1-methylcyclohexyloxymethyloxycarbonyl)-7-oxy-bicyclo[2.2.1]hept-2-ene), poly(5-(1-ethylcyclohexyloxymethyloxycarbonyl)-7-oxy-bicyclo[2.2.1]hept-2-ene), poly(5-(1-methylnorbornyloxymethyloxycarbonyl)-7-oxy-bicyclo[2.2.1]hept-2-ene), poly(5-(1-ethylnorbornyloxymethyloxycarbonyl)-7-oxy-bicyclo[2.2.1]hept-2-ene), poly(5-(1-ethoxypropyloxymethyloxycarbonyl)-7-oxy-bicyclo[2.2.1]hept-2-ene), poly(5-(1-ethoxy-1-methylethyloxymethyloxycarbonyl)-7-oxy-bicyclo[2.2.1]-2-ene), poly(5-tetrahydrofuran-2-yloxymethyloxycarbonyl-7-oxy-bicyclo[2.2.1]hept-2-ene), poly(5-tetrahydropyran-2-yloxymethyloxycarbonyl-7-oxy-bicyclo[2.2.1]hept-2-ene), poly(5-(1-adamantyloxymethyloxycarbonyl)-7-oxy-bicyclo[2.2.1]hept-2-ene), poly(5-(2-adamantyloxymethyloxycarbonyl)-7-oxy-bicyclo[2.2.1]hept-2-ene), poly(5-(1-(1-methoxy)ethoxycarbonyl)-7-oxy-bicyclo[2.2.1]hept-2-ene), poly(5-(1-(1-ethoxy)ethoxycarbonyl)-7-oxy-bicyclo[2.2.1]-2-ene), poly(5-(1-(1-n-propoxy)ethoxycarbonyl)-7-oxy-bicyclo[2.2.1]hept-2-ene), poly(5-(1-(1-isopropoxy)ethoxycarbonyl)-7-oxy-bicyclo[2.2.1]hept-2-ene), poly(5-(1-(1-n-butoxy)ethoxycarbonyl)-7-oxy-bicyclo[2.2.1]hept-2-ene), poly(5-(1-(1-tert-butoxy)ethoxycarbonyl)-7-oxy-bicyclo[2.2.1]hept-2-ene), poly(5-(1-(1-cyclopentyloxy)ethoxycarbonyl)-7-oxy-bicyclo[2.2.1]hept-2-ene), poly(5-(1-(1-cyclohexyloxy)ethoxycarbonyl)-7-oxy-bicyclo[2.2.1]hept-2-ene), poly(5-(1-(1-cyclooctyloxy)ethoxycarbonyl)-7-oxy-bicyclo[2.2.1]hept-2-ene), poly(5-(1-(1-norbornyloxy)ethoxycarbonyl)-7-oxy-bicyclo[2.2.1]hept-2-ene), poly(5-(1-(1-methylcyclopentyloxy)ethoxycarbonyl)-7-oxy-bicyclo[2.2.1]hept-2-ene), poly(5-(1-(1-ethylcyclopentyloxy)ethoxycarbonyl)-7-oxy-bicyclo[2.2.1]hept-2-ene), poly(5-(1-(1-methylcyclohexyloxy)ethoxycarbonyl)-7-oxy-bicyclo[2.2.1]hept-2-ene), poly(5-(1-(1-ethylcyclohexyloxy)ethoxycarbonyl)-7-oxy-bicyclo[2.2.1]hept-2-ene), poly(5-(1-(1-methylnorbornyloxy)ethoxycarbonyl)-7-oxy-bicyclo[2.2.1]hept-2-ene), poly(5-(1-(1-ethylnorbornyloxy)ethoxycarbonyl)-7-oxy-bicyclo[2.2.1]hept-2-ene), poly(5-(1-(1-ethoxypropyloxy)ethoxycarbonyl)-7-oxy-bicyclo[2.2.1]hept-2-ene), poly(5-(1-(1-ethoxy-1-methylethyloxy)ethoxycarbonyl)-7-oxy-bicyclo[2.2.1]hept-2-ene), poly(5-(1-(tetrahydrofuran-2-yloxy)ethoxycarbonyl)-7-oxy-bicyclo[2.2.1]hept-2-ene), poly(5-(1-tetrahydropyran-2-yloxy)ethoxycarbonyl)-7-oxy-bicyclo[2.2.1]hept-2-ene), poly(5-(1-(1-adamantyloxy)ethoxycarbonyl)-7-oxy-bicyclo[2.2.1]hept-2-ene), poly(5-(1-(2-adamantyloxy)ethoxycarbonyl)-7-oxy-bicyclo[2.2.1]hept-2-ene), poly(5-(n-butoxycarbonylmethyloxycarbonyl)-7-oxy-bicyclo[2.2.1]hept-2-ene), poly(5-(tert-butoxycarbonylmethyloxycarbonyl)-7-oxy-bicyclo[2.2.1]hept-2-ene), poly(5-(2-cyclopentyl-2-propoxycarbonylmethyloxycarbonyl)-7-oxy-bicyclo[2.2.1]hept-2-ene), poly(5-(2-cyclopentyl-2-butoxycarbonylmethyloxycarbonyl)-7-oxy-bicyclo[2.2.1]hept-2-ene), poly(5-(2-cyclohexyl-2-propoxycarbonylmethyloxycarbonyl)-7-oxy-bicyclo[2.2.1]hept-2-ene), poly(5-(3-(2-cyclohexyl-2-propoxycarbonyl)propoxycarbonyl)-7-oxy-bicyclo[2.2.1]hept-2-ene), poly(5-(2-cyclohexyl-2-butoxycarbonylmethyloxycarbonyl)-7-oxy-bicyclo[2.2.1]hept-2-ene), poly(5-(3-cyclohexyl-3-pentyloxycarbonylmethyloxycarbonyl)-7-oxy-bicyclo[2.2.1]hept-2-ene), poly(5-(2-ethyl-2-norbornyloxycarbonylmethyloxycarbonyl)-7-oxy-bicyclo[2.2.1]hept-2-ene), poly(5-(2-norbornyl-2-propoxycarbonylmethyloxycarbonyl)-7-oxy-bicyclo[2.2.1]hept-2-ene), poly(5-(4-ethyl-tetracyclo[6.2.1.1$^{3,6}$.0$^{2,7}$]-dodecane-4-yloxycarbonylmethyloxycarbonyl)-7-oxy-bicyclo[2.2.1]hept-2-ene), poly(5-(2-tetracyclo[6.2.1.1$^{3,6}$.0$^{2,7}$]-dodecane-4-yl)-2-propoxycarbonylmethyloxycarbonyl)-7-oxy-bicyclo[2.2.1]hept-2-ene), poly(5-(1,1-dicyclohexylethoxycarbonylmethyloxycarbonyl)-7-oxy-bicyclo[2.2.1]hept-2-ene), poly(5-(1,1-dicyclohexylpropoxycarbonylmethyloxycarbonyl)-7-oxy-bicyclo[2.2.1]hept-2-ene), poly(5-cyclopentyloxycarbonylmethyloxycarbonyl-7-oxy-bicyclo[2.2.1]hept-2-ene), poly(5- cyclohexyloxycarbonylmethyloxycarbonyl-7-oxy-bicyclo[2.2.1]hept-2-ene), poly(5-cyclooctyloxycarbonylmethyloxycarbonyl-7-oxy-bicyclo[2.2.1]hept-2-ene), poly(5-norbornyloxycarbonylmethyloxycarbonyl-7-oxy-bicyclo[2.2.1]hept-2-ene), poly(5-(1-methylcyclopentyloxycarbonylmethyloxycarbonyl-7-oxy-bicyclo[2.2.1]hept-2-ene), poly(5-(1-ethylcyclopentyloxycarbonylmethyloxycarbonyl)-7-oxy-bicyclo[2.2.1]hept-2-ene), poly(5-(1-methylcyclohexyloxycarbonylmethyloxycarbonyl)-7-oxy-bicyclo[2.2.1]hept-2-ene), poly(5-(1-ethylcyclohexyloxycarbonylmethyloxycarbonyl)-7-oxy-bicyclo[2.2.1]hept-2-ene), poly(5-(1-methylnorbornyloxycarbonylmethyloxycarbonyl)-7-oxy-bicyclo[2.2.1]hept-2-ene), poly(5-(1-ethylnorbornyloxycarbonylmethyloxycarbonyl)-7-oxy-bicyclo[2.2.1]hept-2-ene), poly(5-(1-ethoxypropyloxycarbonylmethyloxycarbonyl)-7-oxy-bicyclo[2.2.1]hept-2-ene), poly(5-(1-ethoxy-1-methylethyloxycarbonylmethyloxycarbonyl)-7-oxy-bicyclo[2.2.1]hept-2-ene), poly(5-tetrahydrofuran-2-yloxycarbonylmethyloxycarbonyl-7-oxy-bicyclo[2.2.1]hept-2-ene), poly(5-tetrahydropyran-2-yloxycarbonylmethyloxycarbonyl-7-oxy-bicyclo[2.2.1]hept-2-ene), poly(5-(1-adamantyloxycarbonylmethyloxycarbonyl)-7-oxy-bicyclo[2.2.1]hept-2-ene), poly(5-(2-adamantyloxycarbonylmethyloxycarbonyl)-7-oxy-bicyclo[2.2.1]hept-2-ene), poly(5-(1-(2-(1-adamantyl)-2-propoxycarbonyl)ethoxycarbonyl)-7-oxy-bicyclo[2.2.1]hept-2-ene), poly(5-(3-(2-(1-adamantyl)-2-propoxycarbonyl)propoxycarbonyl)-7-oxy-bicyclo[2.2.1]hept-2-ene), poly(5-(2-(2-(1-adamantyl)-2-propoxycarbonyl)-2-propoxycarbonyl)-7-oxy-bicyclo[2.2.1]hept-2-ene), poly(5-(2-methyl-2-adamantyloxycarbonylmethyloxycarbonyl)-7-oxy-bicyclo[2.2.1]hept-2-ene), poly(5-(3-(2-methyl-2-adamantyloxycarbonyl)propoxycarbonyl)-7-oxy-bicyclo[2.2.1]hept-2-ene), poly(5-(2-(2-methyl-2-adamantyloxycarbonyl)-2-propoxycarbonyl)-7-oxy-bicyclo[2.2.1]hept-2-ene), poly(5-(1-(2-methyl-2-adamantyloxycarbonyl)ethoxycarbonyl)-7-oxy-bicyclo[2.2.1]hept-2-ene), poly(5-(2-ethyl-2-adamantyloxycarbonylmethyloxycarbonyl)-7-oxy-bicyclo[2.2.1]hept-2-ene), poly(5-(2-isopropyl-2-adamantyloxycarbonylmethyloxycarbonyl)-7-oxy-bicyclo[2.2.1]hept-2-ene), poly(5-(2-(1-adamantyl)-2-propoxycarbonylmethyloxycarbonyl)-7-oxy-bicyclo[2.2.1]hept-2-ene), poly(5-(2-(1-adamantyl)-2-butoxycarbonylmethyloxycarbonyl)-7-oxy-bicyclo[2.2.1]hept-2-ene), poly(5-(3-(1-adamantyl)-3-pentyloxycarbonylmethyloxycarbonyl)-7-oxy-bicyclo[2.2.1]hept-2-ene), poly(5-(3-tert-butoxycarbonyl-1-cyclopentyloxycarbonyl)-7-oxy-bicyclo[2.2.1]hept-2-ene), poly(5-(3-(1-methylcyclohexyloxycarbonyl)-1-cyclopentyloxycarbonyl)-7-oxy-bicyclo[2.2.1]hept-2-ene), poly(5-(5-tert-butoxycarbonyl-2-norbornyloxycarbonyl)-7-oxy-bicyclo[2.2.1]hept-2-ene), poly(5-(5-(1-methylcyclohexyloxycarbonyl)-2-norbornyloxycarbonyl)-7-oxy-bicyclo[2.2.1]hept-2-ene), poly(5-(5,5-di(tert-butoxycarbonyl)-2-norbornyloxycarbonyl)-7-oxy-bicyclo[2.2.1]hept-2-ene), poly(5-(5,6-di(tert-butoxycarbonyl)-2-norbornyloxycarbonyl)-7-oxy-bicyclo[2.2.1]hept-2-ene), poly(5-(1-(1-methylcyclohexyloxycarbonyl)-octahydro-4,7-methano-indene-5-yloxycarbonyl)-7-oxy-bicyclo[2.2.1]hept-2-ene), poly(5-(6-tert-butoxycarbonyl-decahydronaphthalene-2-yloxycarbonyl)-7-oxy-bicyclo[2.2.1]hept-2-ene), poly(5-(9-tert-butoxycarbonyl-tetracyclo[6.2.1.1$^{3,6}$.0$^{2,7}$]-dodecane-4-yloxycarbonyl)-7-oxy-bicyclo[2.2.1]hept-2-ene), or poly(5-(9-(1-methylcyclohexyloxycarbonyl-tetracyclo[6.2.1.1$^{3,6}$.0$^{2,7}$]-dodecane-4-yloxycarbonyl)-7-oxy-bicyclo[2.2.1]hept-2-ene) is preferable.

Further, in the repeating structural unit [B] represented by Formula (2) according to the present embodiment, in a case where $R^5$ to $R^8$ are bonded to one another to form a ring structure, as the cyclic olefin polymer in which n represents 0, poly(4,10-dioxy-tricyclo[5.2.1.0$^{2,6}$]-8-decene-3-one), poly(4,10-dioxy-tricyclo[5.2.1.0$^{2,6}$]-8-decene-3,5-dione), poly(4-methyl-4-aza-10-oxy-tricyclo[5.2.1.0$^{2,6}$]-8-decene-3,5-dione), poly(4-ethyl-4-aza-10-oxy-tricyclo[5.2.1.0$^{2,6}$]-8-decene-3,5-dione), poly(4-(n-propyl)-4-aza-10-oxy-tricyclo[5.2.1.0$^{2,6}$]-8-decene-3,5-dione), poly(4-(n-butyl)-4-aza-10-oxy-tricyclo[5.2.1.0$^{2,6}$]-8-decene-3,5-dione), poly(4-(1-methylbutyl)-4-aza-10-oxy-tricyclo[5.2.1.0$^{2,6}$]-8-decene-3,5-dione), poly(4-cyclopentyl-4-aza-10-oxy-tricyclo[5.2.1.0$^{2,6}$]-8-decene-3,5-dione), poly(4-cyclohexyl-4-aza-10-oxy-tricyclo[5.2.1.0$^{2,6}$]-8-decene-3,5-dione), poly(4-phenyl-4-aza-10-oxy-tricyclo[5.2.1.0$^{2,6}$]-8-decene-3,5-dione), or poly(4-(4-hydroxyphenyl)-4-aza-10-oxy-tricyclo[5.2.1.0$^{2,6}$]-8-decene-3,5-dione) is preferable.

In the repeating structural unit [B] represented by Formula (2) according to the present embodiment, examples of the cyclic olefin polymer in which n represents 1 include poly(8-methyl-11,12-dioxy-tetracyclo[4.4.0.1$^{2,5}$.1$^{7,10}$]-3-dodecene), poly(8-ethyl-11,12-dioxy-tetracyclo[4.4.0.1$^{2,5}$.1$^{7,10}$]-3-dodecene), poly(8-(n-propyl)-11,12-dioxy-tetracyclo[4.4.0.1$^{2,5}$.1$^{7,10}$]-3-dodecene), poly(8-(i-propyl)-11,12-dioxy-tetracyclo[4.4.0.1$^{2,5}$.1$^{7,10}$]-3-dodecene), poly(8-(n-butyl)-11,12-dioxy-tetracyclo[4.4.0.1$^{2,5}$.1$^{7,10}$]-3-dodecene), poly(8-(tert-butyl)-11,12-dioxy-tetracyclo[4.4.0.1$^{2,5}$.1$^{7,10}$]-3-dodecene), poly(8-(n-pentyl)-11,12-dioxy-tetracyclo[4.4.0.1$^{2,5}$.1$^{7,10}$]-3-dodecene), poly(8-cyclopentyl-11,12-dioxy-tetracyclo[4.4.0.1$^{2,5}$.1$^{7,10}$]-3-dodecene), poly(8-cyclohexyl-11,12-dioxy-tetracyclo[4.4.0.1$^{2,5}$.1$^{7,10}$]-3-dodecene), and poly(8-cyclooctyl-11,12-dioxy-tetracyclo[4.4.0.1$^{2,5}$.1$^{7,10}$]-3-dodecene) in a case where at least one of $R^5$ to $R^8$ represents an alkyl group; poly(8-phenyl-II,12-dioxy-tetracyclo[4.4.0.1$^{2,5}$.1$^{7,10}$]-3-dodecene), poly(8-naphthyl-11,12-dioxy-tetracyclo[4.4.0.1$^{2,5}$.1$^{7,10}$]-3-dodecene), poly(8-anthracenyl-11,12-dioxy-tetracyclo[4.4.0.1$^{2,5}$.1$^{7,10}$]-3-dodecene), poly(8-(o-tolyl)-11,12-dioxy-tetracyclo[4.4.0.1$^{2,5}$.1$^{7,10}$]-3-dodecene), poly(8-(m-tolyl)-11,12-dioxy-tetracyclo[4.4.0.1$^{2,5}$.1$^{7,10}$]-3-dodecene), poly(8-(p-tolyl)-11,12-dioxy-tetracyclo[4.4.0.1$^{2,5}$.1$^{7,10}$]-3-dodecene), poly(8-biphenyl-11,12-dioxy-tetracyclo[4.4.0.1$^{2,5}$.17,10]-3-dodecene), and poly(8-(4-hydroxyphenyl)-11,12-dioxy-tetracyclo[4.4.0.1$^{2,5}$.1$^{7,10}$]-3-dodecene) in a case where at least one of $R^5$ to $R^8$ represents an aryl group; poly(8-methoxy-11,12-dioxy-tetracyclo[4.4.0.1$^{2,5}$.1$^{7,10}$]-3-dodecene), poly(8-ethoxy-11,12-dioxy-tetracyclo[4.4.0.1$^{2,5}$.1$^{7,10}$]-3-dodecene), poly(8-(n-propoxy)-11,12-dioxy-tetracyclo[4.4.0.1$^{2,5}$.1$^{7,10}$]-3-dodecene), poly(8-(i-propoxy)-11,12-dioxy-tetracyclo[4.4.0.1$^{2,5}$.1$^{7,10}$]-3-dodecene), poly(8-(n-butoxy)-11,12-dioxy-tetracyclo[4.4.0.1$^{2,5}$.1$^{7,10}$]-3-dodecene), poly(8-(tert-butoxy)-11,12-dioxy-tetracyclo[4.4.0.1$^{2,5}$.1$^{7,10}$]-3-dodecene), poly(8-(n-pentoxy)-11,12-dioxy-tetracyclo[4.4.0.1$^{2,5}$.1$^{7,10}$]-3-dodecene), poly(8-cyclopentyloxy-11,12-dioxy-tetracyclo[4.4.0.1$^{2,5}$.1$^{7,10}$]-3-dodecene), poly(8-cyclohexyloxy-11,12-dioxy-tetracyclo[4.4.0.1$^{2,5}$.1$^{7,10}$]-3-dodecene), and poly(8-cyclooctyloxy-11,12-dioxy-tetracyclo[4.4.0.1$^{2,5}$.1$^{7,10}$]-3-dodecene) in a case where at least one of $R^5$ to $R^8$ represents an alkoxy group; poly(8- phenyloxy-11,12-dioxy-tetracyclo[4.4.0.1$^{2,5}$.1$^{710}$]-3-dodecene), poly(8-naphthyloxy-11,12-dioxy-tetracyclo[4.4.0.1$^{2,5}$.1$^{7,10}$]-3-dodecene), poly(8-anthracenyloxy-11,12-dioxy-tetracyclo[4.4.0.1$^{2,5}$.1$^{7,10}$]-3-dodecene), poly(8-(o-tolyloxy)-11,12-dioxy-tetracyclo[4.4.0.1$^{2,5}$.1$^{7,10}$]-3-dodecene), poly(8-(m-tolyloxy)-11,12-dioxy-tetracyclo[4.4.0.1$^{2,5}$.1$^{7,10}$]-3-dodecene), poly(8-(p-tolyloxy)-11,12-dioxy-tetracyclo[4.4.0.1$^{2,5}$.1$^{7,10}$]-3-dodecene), poly(8-(4-oxy-11,12-biphenyl)-11,12-dioxy-tetracyclo[4.4.0.1$^{2,5}$.1$^{7,10}$]-3-dodecene), and (8-(4-hydroxyphenyloxy)-11,12-dioxy-tetracyclo[4.4.0.1$^{2,5}$.7,10]-3-dodecene) in a case where at least one of R$^5$ to R$^8$ represents an aryloxy group; poly(8-methoxymethyl-11,12-dioxy-tetracyclo[4.4.0.1$^{2,5}$.1$^{7,10}$]-3-dodecene), poly(8-methoxyethyl-11,12-dioxy-tetracyclo[4.4.0.1$^{2,5}$.1$^{7,10}$]-3-dodecene), poly(8-ethoxymethyl-11,12-dioxy-tetracyclo[4.4.0.1$^{2,5}$.1$^{7,10}$]-3-dodecene), poly(8-ethoxyethyl-11,12-dioxy-tetracyclo[4.4.0.1$^{2,5}$.1$^{7,10}$]-3-dodecene), poly(8-(n-propoxymethyl)-11,12-dioxy-tetracyclo[4.4.0.1$^{2,5}$.1$^{7,10}$]-3-dodecene), poly(8-isopropoxymethyl-11,12-dioxy-tetracyclo[4.4.0.1$^{2,5}$.1$^{7,10}$]-3-dodecene), poly(8-(n-butoxymethyl)-11,12-dioxy-tetracyclo[4.4.0.1$^{2,5}$.1$^{7,10}$]-3-dodecene), poly(8-isobutoxymethyl-11,12-dioxy-tetracyclo[4.4.0.1$^{2,5}$.1$^{7,10}$]-3-dodecene), poly(8-(tert-butoxymethyl)-11,12-dioxy-tetracyclo[4.4.0.1$^{2,5}$.1$^{7,10}$]-3-dodecene), poly(8-cyclopentyloxymethyl-11,12-dioxy-tetracyclo[4.4.0.1$^{2,5}$.1$^{7,10}$]-3-dodecene), poly(8-cyclohexyloxymethyl-11,12-dioxy-tetracyclo[4.4.0.1$^{2,5}$.1$^{7,10}$]-3-dodecene), and poly(8-cyclooctyloxymethyl-11,12-dioxy-tetracyclo[4.4.0.1$^{2,5}$.1$^{7,10}$]-3-dodecene) in a case where at least one of R$^5$ to R$^8$ represents an alkoxyalkyl group; poly(8-phenyloxymethyl-11,12-dioxy-tetracyclo[4.4.0.1$^{2,5}$.1$^{7,10}$]-3-dodecene), poly(8-naphthyloxymethyl-11,12-dioxy-tetracyclo[4.4.0.1$^{2,5}$.1$^{7,10}$]-3-dodecene), poly(8-anthracenyloxymethyl-11,12-dioxy-tetracyclo[4.4.0.1$^{2,5}$.1$^{7,10}$]-3-dodecene), poly(8-(o-tolyloxymethyl)-11,12-dioxy-tetracyclo[4.4.0.1$^{2,5}$.1$^{7,10}$]-3-dodecene), poly(8-(m-tolyloxymethyl)-11,12-dioxy-tetracyclo[4.4.0.1$^{2,5}$.1$^{7,10}$]-3-dodecene), poly(8-(p-tolyloxymethyl)-11,12-dioxy-tetracyclo[4.4.0.1$^{2,5}$.1$^{7,10}$]-3-dodecene), poly(8-(4-oxy-1,1'-biphenylmethyl)-11,12-dioxy-tetracyclo[4.4.0.1$^{2,5}$.1$^{7,10}$]-3-dodecene), and poly(8-(4-hydroxyphenyloxymethyl)-11,12-dioxy-tetracyclo[4.4.0.1$^{2,5}$.1$^{7,10}$]-3-dodecene) in a case where at least one of R$^5$ to R$^8$ represents an aryloxyalkyl group; poly(8-methoxycarbonyl-11,12-dioxy-tetracyclo[4.4.0.1$^{2,5}$.1$^{7,10}$]-3-dodecene), poly(8-ethoxycarbonyl-11,12-dioxy-tetracyclo[4.4.0.1$^{2,5}$.1$^{7,10}$]-3-dodecene), poly(8-(n-propoxycarbonyl)-11,12-dioxy-tetracyclo[4.4.0.1$^{2,5}$.1$^{7,10}$]-3-dodecene), poly(8-(n-butoxycarbonyl)-11,12-dioxy-tetracyclo[4.4.0.1$^{2,5}$.1$^{7,10}$]-3-dodecene), poly(8-isobutoxycarbonyl-11,12-dioxy-tetracyclo[4.4.0.1$^{2,5}$.1$^{7,10}$]-3-dodecene), poly(8-(tert-butoxycarbonyl)-11,12-dioxy-tetracyclo[4.4.0.1$^{2,5}$.1$^{7,10}$]-3-dodecene), poly(8-(n-pentyloxycarbonyl)-11,12-dioxy-tetracyclo[4.4.0.1$^{2,5}$.1$^{7,10}$]-3-dodecene), poly(8-(2-methyl-2-pentyloxycarbonyl)-11,12-dioxy-tetracyclo[4.4.0.1$^{2,5}$.1$^{7,10}$]-3-dodecene), poly(8-(3-methyl-3-pentyloxycarbonyl)-11,12-dioxy-tetracyclo[4.4.0.1$^{2,5}$.1$^{7,10}$]-3-dodecene), poly(8-(2-ethyl-3-methyl-3-pentyloxycarbonyl)-11,12-dioxy-tetracyclo[4.4.0.1$^{2,5}$.1$^{7,10}$]-3-dodecene), poly(8-cyclopentyloxycarbonyl-11,12-dioxy-tetracyclo[4.4.0.1$^{2,5}$.1$^{7,10}$]-3-dodecene), poly(8-(n-hexyloxycarbonyl)-11,12-dioxy-tetracyclo[4.4.0.1$^{2,5}$.1$^{7,10}$]-3-dodecene), poly(8-cyclohexyloxycarbonyl-11,12-dioxy-tetracyclo[4.4.0.1$^{2,5}$.1$^{7,10}$]-3-dodecene), poly(8-(2-methyl-2-butoxycarbonyl)-11,12-dioxy-tetracyclo[4.4.0.1$^{2,3}$.7,10]-3-dodecene), poly(8-(2,3-dimethyl-2-butoxycarbonyl)-11,12-dioxy-tetracyclo[4.4.0.1$^{2,5}$.1$^{7,10}$]-3-dodecene), poly(8-(2,3,3-trimethyl-2-butoxycarbonyl)-11,12-dioxy-tetracyclo[4.4.0.1$^{2,5}$.1$^{7,10}$]-3-dodecene), poly(8-(2-methyl-2-hexyloxycarbonyl)-11,12-dioxy-tetracyclo[4.4.0.1$^{2,3}$.1$^{7,10}$]-3-dodecene), poly(8-(3,4-dimethyl-3-hexyloxycarbonyl)-11,12-dioxy-tetracyclo[4.4.0.1$^{2,5}$.1$^{7,10}$]-3-dodecene), poly(8-(3-methylbutoxycarbonyl)-11,12-dioxy-tetracyclo[4.4.0.1$^{2,5}$.1$^{7,10}$]-3-dodecene), poly(8-(2-methylpentoxycarbonyl)-11,12-dioxy-tetracyclo[4.4.0.1$^{2,5}$.1$^{7,10}$]-3-dodecene), poly(8-(3-methylpentoxycarbonyl)-11,12-dioxy-tetracyclo[4.4.0.1$^{2,5}$.1$^{7,10}$]-3-dodecene), poly(8-(4-methylpentoxycarbonyl)-11,12-dioxy-tetracyclo[4.4.0.1$^{2,5}$.1$^{7,10}$]-3-dodecene), poly(8-(3-methyl-3-heptyloxycarbonyl)-11,12-dioxy-tetracyclo[4.4.0.1$^{2,3}$.1$^{7,10}$]-3-dodecene), poly(8-(2-cyclopentyl)-2-propoxycarbonyl)-11,12-dioxy-tetracyclo[4.4.0.1$^{2,5}$.1$^{7,10}$]-3-dodecene), poly(8-(2-cyclohexyl-2-propoxycarbonyl)-11,12-dioxy-tetracyclo[4.4.0.1$^{2,3}$.7,10]-3-dodecene), poly(8-(2-norbornyl-2-propoxycarbonyl)-11,12-dioxy-tetracyclo[4.4.0.1$^{2,5}$.1$^{7,10}$]-3-dodecene), poly(8-(1,1-dicyclopentylethoxycarbonyl)-11,12-dioxy-tetracyclo[4.4.0.1$^{2,5}$.1$^{7,10}$]-3-dodecene), poly(8-(1,1-dicyclohexylethoxycarbonyl)-11,12-dioxy-tetracyclo[4.4.0.1$^{2,5}$.1$^{7,10}$]-3-dodecene), poly(8-(1-methylcyclopentyloxycarbonyl)-11,12-dioxy-tetracyclo[4.4.0.1$^{2,5}$.1$^{7,10}$]-3-dodecene), poly(8-(1-ethylcyclopentyloxycarbonyl)-11,12-dioxy-tetracyclo[4.4.0.1$^{2,5}$.1$^{7,10}$]-3-dodecene), poly(8-(1-methylcyclohexyloxycarbonyl)-11,12-dioxy-tetracyclo[4.4.0.1$^{2,5}$.1$^{7,10}$]-3-dodecene), poly(8-(1-ethylcyclohexyloxycarbonyl)-11,12-dioxy-tetracyclo[4.4.0.1$^{2,5}$.1$^{7,10}$]-3-dodecene), poly(8-(1-methylcyclooctyloxycarbonyl)-11,12-dioxy-tetracyclo[4.4.0.1$^{2,5}$.1$^{7,10}$]-3-dodecene), poly(8-(1-ethylcyclooctyloxycarbonyl)-11,12-dioxy-tetracyclo[4.4.0.1$^{2,5}$.1$^{7,10}$]-3-dodecene), poly(8-(1-adamantyloxycarbonyl)-11,12-dioxy-tetracyclo[4.4.0.1$^{2,5}$.1$^{7,10}$]-3-dodecene), poly(8-(2-methyl-2-adamantyloxycarbonyl)-11,12-dioxy-tetracyclo[4.4.0.1$^{2,5}$.1$^{7,10}$]-3-dodecene), poly(8-(2-ethyl-2-adamantyloxycarbonyl)-11,12-dioxy-tetracyclo[4.4.0.1$^{2,5}$.1$^{7,10}$]-3-dodecene), poly(8-(1-methyldecahydronaphthalene-1-yloxycarbonyl)-11,12-dioxy-tetracyclo[4.4.0.1$^{2,5}$.1$^{7,10}$]-3-dodecene), poly(8-(1-ethyldecahydronaphthalene-1-yloxycarbonyl)-11,12-dioxy-tetracyclo[4.4.0.1$^{2,5}$.1$^{7,10}$]-3-dodecene), poly(8-(2-methyldecahydronaphthalene-2-yloxycarbonyl)-11,12-dioxy-tetracyclo[4.4.0.1$^{2,5}$.1$^{7,10}$]-3-dodecene), poly(8-(2-ethyldecahydronaphthalene-2-yloxycarbonyl)-11,12-dioxy-tetracyclo[4.4.0.1$^{2,5}$.1$^{7,10}$]-3-dodecene), poly(8-(2-methyl-2-norbornyloxycarbonyl)-11,12-dioxy-tetracyclo[4.4.0.1$^{2,5}$.1$^{7,10}$]-3-dodecene), poly(8-(2-ethyl-2-norbornyloxycarbonyl)-11,12-dioxy-tetracyclo[4.4.0.1$^{2,5}$.1$^{7,10}$]-3-dodecene), poly(8-(2,7,7-trimethyl-2-norbornyloxycarbonyl)-11,12-dioxy-tetracyclo[4.4.0.1$^{2,5}$.1$^{7,10}$]-3-dodecene), poly(8-(2-ethyl-7,7-dimethyl-2-norbornyloxycarbonyl)-11,12-dioxy-tetracyclo[4.4.0.1$^{2,5}$.1$^{7,10}$]-3-dodecene), poly(8-(5-methyl-octahydro-4,7-methano-indene-5-yloxycarbonyl)-1,1,12-dioxy-tetracyclo[4.4.0.1$^{2,5}$.1$^{7,10}$]-3-dodecene), poly(8-(5-ethyl-octahydro-4,7-methano-indene-5-yloxycarbonyl)-11,12-dioxy-tetracyclo[4.4.0.1$^{2,5}$.1$^{7,10}$]-3-dodecene), poly(8-(4-methyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), and poly(8-(4-ethyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) in a case where at least one of R$^5$ to R$^8$ represents an alkoxycarbonyl group; (5-dimethylaminocarbonyl-11,12-dioxy-tetracyclo[4.4.0.1$^{2,5}$.1$^{7,10}$]-3-dodecene), poly(5-diethylaminocarbonyl-11,12-dioxy-tetracyclo[4.4.0.1$^{2,5}$.1$^{7,10}$]-3-dodecene), poly(5-ethylmethylaminocarbonyl-11,12-dioxy-tetracyclo [4.4.0.1$^{2,5}$.1$^{7,10}$]-3-dodecene), poly(5-methylbutylaminocarbonyl-11,12-dioxy-tetracyclo[4.4.0.1$^{2,5}$.1$^{7,10}$]-3-dodecene), poly(5-butylethylaminocarbonyl-11,12-dioxy-tetracyclo[4.4.0.1$^{2,5}$. 1$^{7,10}$]-3-dodecene), and poly(5-cyclohexylmethylaminocarbonyl-11,12-dioxy-tetracyclo [4.4.0.1$^{2,5}$.1$^{7,10}$]-3-dodecene) in a case where at least one of R$^5$ to R$^8$ represents an alkylaminocarbonyl group;

poly(8-phenoxycarbonyl-11,12-dioxy-tetracyclo [4.4.0.1$^{2,5}$.1$^{7,10}$]-3-dodecene), poly(8-benzyloxycarbonyl-11,12-dioxy-tetracyclo[4.4.0.1$^{2,5}$.1$^{7,10}$]-3-dodecene), poly (8-(4-methylphenoxycarbonyl)-11,12-dioxy-tetracyclo [4.4.0.1$^{2,5}$.1$^{7,10}$]-3-dodecene), poly(8-(3,4-dimethylphenoxycarbonyl)-11,12-dioxy-tetracyclo [4.4.0.1$^{2,5}$.1$^{7,10}$]-3-dodecene), poly(8-(1-naphthoxycarbonyl)-11,12-dioxy-tetracyclo[4.4.0.1$^{2,5}$.1$^{7,10}$]-3-dodecene), poly(8-(2-naphthoxycarbonyl)-11,12-dioxy-tetracyclo [4.4.0.1$^{2,5}$.1$^{7,10}$]-3-dodecene), and poly(8-(1-anthracenoxycarbonyl)-11,12-dioxy-tetracyclo[4.4.0.1$^{2,5}$.1$^{7,10}$]-3-dodecene) in a case where at least one of R$^5$ to R$^8$ represents an aryloxycarbonyl group;

poly(5-methylphenylaminocarbonyl)-11,12-dioxy-tetracyclo[4.4.0.1$^{2,5}$.1$^{7,10}$]-3-dodecene), poly(5-ethylphenylaminocarbonyl-11,12-dioxy-tetracyclo[4.4.0.1$^{2,5}$.1$^{7,10}$]-3-dodecene), poly(5-butylphenylaminocarbonyl-11,12-dioxy-tetracyclo[4.4.0.1$^{2,5}$.1$^{7,10}$]-3-dodecene), and poly(5-cyclohexylphenylaminocarbonyl-11,12-dioxy-tetracyclo [4.4.0.1$^{2,5}$.1$^{7,10}$]-3-dodecene) in a case where at least one of R$^1$ to R$^4$ represents an alkylarylaminocarbonyl group; poly (8-methoxycarbonylmethyl-11,12-dioxy-tetracyclo [4.4.0.1$^{2,5}$.1$^{7,10}$]-3-dodecene), poly(8-methoxycarbonylethyl-11,12-dioxy-tetracyclo[4.4.0.1$^{2,5}$.1$^{7,10}$]-3-dodecene), poly(8-ethoxycarbonylmethyl-11,12-dioxy-tetracyclo [4.4.0.1$^{2,5}$.1$^{7,10}$]-3-dodecene), poly(8-ethoxycarbonylethyl-11,12-dioxy-tetracyclo[4.4.0.1$^{2,5}$.1$^{7,10}$]-3-dodecene), poly (8-(n-propoxycarbonylmethyl)-11,12-dioxy-tetracyclo [4.4.0.1$^{2,5}$.1$^{7,10}$]-3-dodecene), poly(8-(i-propoxycarbonylmethyl)-11,12-dioxy-tetracyclo [4.4.0.1$^{2,5}$.1$^{7,10}$]-3-dodecene), poly(8-(n-butoxycarbonylmethyl)-11,12-dioxy-tetracyclo[4.4.0.1$^{2,5}$.1$^{7,10}$]-3-dodecene), poly(8-(tert-butoxycarbonylmethyl)-11,12-dioxy-tetracyclo [4.4.0.1$^{2,5}$.1$^{7,10}$]-3-dodecene), poly(8-(n-pentyloxycarbonylmethyl)-11,12-dioxy-tetracyclo[4.4.0.1$^{2,5}$.1$^{7,10}$]-3-dodecene), poly(8-(2-methyl-2-butoxycarbonyl)methyl)-11,12-dioxy-tetracyclo[4.4.0.1$^{2,5}$.1$^{7,10}$]-3-dodecene), poly(8-(2,3-dimethyl-2-butoxycarbonyl)methyl)-11,12-dioxy-tetracyclo [4.4.0.1$^{2,5}$.1$^{7,10}$]-3-dodecene), poly(8-cyclopentyloxycarbonylmethyl)-11,12-dioxy-tetracyclo [4.4.0.1$^{2,5}$.1$^{7,10}$]-3-dodecene), poly(8-(n-hexyloxycarbonylmethyl)-11,12-dioxy-tetracyclo [4.4.0.1$^{2,5}$.1$^{7,10}$]-3-dodecene), poly(8-cyclohexyloxycarbonylmethyl-11,12-dioxy-tetracyclo[4.4.0.1$^{2,5}$.1$^{7,10}$]-3-dodecene), poly(8-(n-octyloxycarbonylmethyl)-11,12-dioxy-tetracyclo[4.4.0.1$^{2,5}$.1$^{7,10}$]-3-dodecene), poly(8-cyclooctyloxycarbonylmethyl-11,12-dioxy-tetracyclo [4.4.0.1$^{2,5}$.1$^{7,10}$]-3-dodecene), poly(8-(2-cyclopentyl-2-propoxycarbonyl)methyl)-11,12-dioxy-tetracyclo [4.4.0.1$^{2,5}$.1$^{7,10}$]-3-dodecene), poly(8-(2-cyclohexyl-2-propoxycarbonyl)methyl)-11,12-dioxy-tetracyclo [4.4.0.1$^{2,5}$.1$^{7,10}$]-3-dodecene), poly(8-(1-methylcyclopentyloxycarbonyl)methyl)-11,12-dioxy-tetracyclo [4.4.0.1$^{2,5}$.1$^{7,10}$]-3-dodecene), poly(8-(1-ethylcyclopentyloxycarbonyl)methyl)-11,12-dioxy-tetracyclo [4.4.0.1$^{2,5}$.1$^{7,10}$]-3-dodecene), poly(8-(1-methylcyclohexyloxycarbonyl)methyl)-11,12-dioxy-tetracyclo [4.4.0.1$^{2,5}$.1$^{7,10}$]-3-dodecene), and poly(8-(1-ethylcyclohexyloxycarbonyl)methyl)-11,12-dioxy-tetracyclo [4.4.0.1$^{2,5}$.1$^{7,10}$]-3-dodecene) in a case where at least one of R$^5$ to R$^8$ represents an alkoxycarbonylalkyl group; poly(8-methoxycarbonylphenyl)-11,12-dioxy-tetracyclo [4.4.0.1$^{2,5}$.1$^{7,10}$]-3-dodecene), poly(8-ethoxycarbonylphenyl)-11,12-dioxy-tetracyclo[4.4.0.1$^{2,5}$.1$^{7,10}$]-3-dodecene), poly(8-(n-propoxycarbonylphenyl)-11,12-dioxy-tetracyclo [4.4.0.1$^{2,5}$.1$^{7,10}$]-3-dodecene), poly(8-(i-propoxycarbonylphenyl)-11,12-dioxy-tetracyclo[4.4.0.1$^{2,6}$. 7,10]-3-dodecene), poly(8-(n-butoxycarbonylphenyl)-11,12-dioxy-tetracyclo[4.4.0.1$^{2,5}$.1$^{7,10}$]-3-dodecene), poly(8-(tert-butoxycarbonylphenyl)-11,12-dioxy-tetracyclo [4.4.0.1$^{2,5}$.1$^{7,10}$]-3-dodecene), poly(8-(n-pentyloxycarbonylphenyl)-11,12-dioxy-tetracyclo[4.4.0.1$^{2,5}$.1$^{7,10}$]-3-dodecene), poly(8-(3-(2-methyl-2-butoxycarbonyl)phenyl)-11,12-dioxy-tetracyclo[4.4.0.1$^{2,5}$.1$^{7,10}$]-3-dodecene), poly(8-(3-(2,3-dimethyl-2-butoxycarbonyl)phenyl)-11,12-dioxy-tetracyclo[4.4.0.1$^{2,5}$.1$^{7,10}$]-3-dodecene), poly(8-(3-(2-cyclopentyl-2-propoxycarbonyl)phenyl)-11,12-dioxy-tetracyclo[4.4.0.1$^{2,5}$.1$^{7,10}$]-3-dodecene), poly(8-(3-(2-cyclohexyl-2-propoxycarbonyl)phenyl)-11,12-dioxy-tetracyclo[4.4.0.1$^{2,5}$.1$^{7,10}$]-3-dodecene), poly(8-(3-(1-methylcyclopentyloxycarbonyl)phenyl)-11,12-dioxy-tetracyclo[4.4.0.1$^{2,5}$.1$^{7,10}$]-3-dodecene), poly(8-(3-(1-ethylcyclopentyloxycarbonyl)phenyl)-11,12-dioxy-tetracyclo[4.4.0.1$^{2,5}$.1$^{7,10}$]-3-dodecene), poly(8-(3-(1-methylcyclohexyloxycarbonyl)phenyl)-11,12-dioxy-tetracyclo[4.4.0.1$^{2,5}$.1$^{7,10}$]-3-dodecene), poly(8-(3-(1-ethylcyclohexyloxycarbonyl)phenyl)-11,12-dioxy-tetracyclo[4.4.0.1$^{2,5}$.1$^{7,10}$]-3-dodecene), poly(8-(4-(2-methyl-2-butoxycarbonyl)phenyl)-11,12-dioxy-tetracyclo [4.4.0.1$^{2,5}$.1$^{7,10}$]-3-dodecene), poly(8-(4-(2,3-dimethyl-2-butoxycarbonyl)phenyl)-11,12-dioxy-tetracyclo [4.4.0.1$^{2,5}$.1$^{7,10}$]-3-dodecene), poly(8-(4-(2-cyclopentyl-2-propoxycarbonyl)phenyl)-11,12-dioxy-tetracyclo [4.4.0.1$^{2,5}$.1$^{7,10}$]-3-dodecene), poly(8-(4-(2-cyclohexyl-2-propoxycarbonyl)phenyl)-11,12-dioxy-tetracyclo [4.4.0.1$^{2,5}$.1$^{7,10}$]-3-dodecene), poly(8-(4-(1-methylcyclopentyloxycarbonyl)phenyl)-11,12-dioxy-tetracyclo [4.4.0.1$^{2,5}$.1$^{7,10}$]-3-dodecene), poly(8-(4-(1-ethylcyclopentyloxycarbonyl)phenyl)-11,12-dioxy-tetracyclo [4.4.0.1$^{2,5}$.1$^{7,10}$]-3-dodecene), poly(8-(4-(1-methylcyclohexyloxycarbonyl)phenyl)-11,12-dioxy-tetracyclo [4.4.0.1$^{2,5}$.1$^{7,10}$]-3-dodecene), poly(8-(4-(1-ethylcyclohexyloxycarbonyl)phenyl)-11,12-dioxy-tetracyclo [4.4.0.1$^{2,5}$.1$^{7,10}$]-3-dodecene), poly(8-methoxycarbonylnaphthyl-11,12-dioxy-tetracyclo[4.4.0.1$^{2,5}$. 1$^{7,10}$]-3-dodecene), poly(8-ethoxycarbonylnaphthyl-11,12-dioxy-tetracyclo[4.4.0.1$^{2,5}$.1$^{7,10}$]-3-dodecene), poly(8-(n-propoxycarbonylnaphthyl)-11,12-dioxy-tetracyclo [4.4.0.1$^{2,5}$.1$^{7,10}$]-3-dodecene), poly(8-(i-propoxycarbonylnaphthyl)-11,12-dioxy-tetracyclo[4.4.0.1$^{2,5}$.1$^{7,10}$]-3-dodecene), poly(8-(n-butoxycarbonylnaphthyl)-11,12-dioxy-tetracyclo[4.4.0.1$^{2,5}$.1$^{7,10}$]-3-dodecene), poly(8-(tert-butoxycarbonylphenyl)-11,12-dioxy-tetracyclo [4.4.0.1$^{2,5}$.1$^{7,10}$]-3-dodecene), poly(8-(n-pentyloxycarbonylnaphthyl)-11,12-dioxy-tetracyclo[4.4.0.1$^{2,5}$.1$^{7,10}$]-3-dodecene), poly(8-(5-(2-methyl-2-butoxycarbonyl)naphthyl)-11,12-dioxy-tetracylo[4.4.0.1$^{2,5}$.1$^{7,10}$]-3-dodecene), poly(8-(5-(2,3-dimethyl-2-butoxycarbonyl) naphthyl)-11,12-dioxy-tetracyclo[4.4.0.1$^{2,5}$.1$^{7,10}$]-3-dodecene), poly(8-(5-(2-cyclopentyl-2-propoxycarbonyl) naphthyl)-11,12-dioxy-tetracyclo[4.4.0.1$^{2,5}$.1$^{7,10}$]-3-dodecene), poly(8-(5-(2-cyclohexyl-2-propoxycarbonyl) naphthyl)-11,12-dioxy-tetracyclo[4.4.0.1$^{2,5}$.1$^{7,10}$]-3-dodecene), poly(8-(5-(1-methylcyclopentyloxycarbonyl) naphthyl)-11,12-dioxytetracyclo[4.4.0.1$^{2,5}$.1$^{7,10}$]-3-dodecene), poly(8-(5-(1-ethylcyclopentyloxycarbonyl) naphthyl)-11,12-dioxy-tetracyclo[4.4.0.1$^{2,5}$.1$^{7,10}$]-3-dodecene), poly(8-(5-(1-methylcyclohexyloxycarbonyl) naphthyl)-11,12-dioxy-tetracyclo[4.4.0.1$^{2,5}$.1$^{7,10}$]-3-dodecene), and poly(8-(5-(1-ethylcyclohexyloxycarbonyl) naphthyl)-11,12-dioxy-tetracyclo[4.4.0.1$^{2,5}$.1$^{7,10}$]-3-dodecene) in a case where at least one of R$^5$ to R$^8$ represents an alkoxycarbonylaryl group; poly(8-phenoxycarbonylmethyl-11,12-dioxy-tetracyclo[4.4.0.1$^{2,5}$.1$^{7,10}$]-3-dodecene), poly(8-benzyloxycarbonylmethyl-11,12-dioxy-tetracyclo[4.4.0.1$^{2,5}$.1$^{7,10}$]-3-dodecene), poly(8-(4-methylphenoxycarbonylmethyl)-11,12-dioxy-tetracyclo[4.4.0.1$^{2,5}$.1$^{7,10}$]-3-dodecene), poly(8-(3,4-dimethylphenoxycarbonylmethyl)-11,12-dioxy-tetracyclo[4.4.0.1$^{2,5}$.1$^{7,10}$]-3-dodecene), poly(8-(1-naphthoxycarbonylmethyl)-11,12-dioxy-tetracyclo[4.4.0.1$^{2,5}$.1$^{7,10}$]-3-dodecene), poly(8-(2-naphthoxycarbonylmethyl)-11,12-dioxy-tetracyclo[4.4.0.1$^{2,5}$.1$^{7,10}$]-3-dodecene), and poly(8-(1-anthracenoxycarbonylmethyl)-11,12-dioxy-tetracyclo[4.4.0.1$^{2,5}$.1$^{7,10}$]-3-dodecene) in a case where at least one of R$^5$ to R$^8$ represents an aryloxycarbonylalkyl group; poly(8-methoxymethyloxycarbonyl-11,12-dioxy-tetracyclo[4.4.0.1$^{2,5}$.1$^{7,10}$]-3-dodecene), poly(8-ethoxymethyloxycarbonyl-11,12-dioxy-tetracyclo[4.4.0.1$^{2,5}$.$^{7,10}$]-3-dodecene), poly(8-(n-propoxymethyloxycarbonyl)-11,12-dioxy-tetracyclo[4.4.0.1$^{2,5}$.1$^{7,10}$]-3-dodecene), poly(8-isopropoxymethyloxycarbonyl-11,12-dioxy-tetracyclo[4.4.0.1$^{2,5}$.1$^{2,5}$.1$^{7,10}$]-3-dodecene), poly(8-(n-butoxymethyloxycarbony)-11,12-dioxy-tetracyclo[4.4.0.1$^{2,5}$.1$^{7,10}$]-3-dodecene), poly(8-(tert-butoxymethyloxycarbony)-11,12-dioxy-tetracyclo[4.4.0.1$^{2,5}$.1$^{7,10}$]-3-dodecene), poly(8-cyclopentyloxymethyloxycarbonyl-11,12-dioxy-tetracyclo[4.4.0.1$^{2,5}$.1$^{7,10}$]-3-dodecene), poly(8-cyclohexyloxymethyloxycarbonyl-11,12-dioxy-tetracyclo[4.4.0.1$^{2,5}$.1$^{7,10}$]-3-dodecene), poly(8-cyclooctyloxymethyloxycarbonyl-11,12-dioxy-tetracyclo[4.4.0.1$^{2,5}$.1$^{7,10}$]-3-dodecene), poly(8-norbornyloxymethyloxycarbonyl-11,12-dioxy-tetracyclo[4.4.0.1$^{2,5}$.1$^{7,10}$]-3-dodecene), poly(8-(1-methylcyclopentyloxymethyloxycarbonyl-11,12-dioxy-tetracyclo[4.4.0.1$^{2,5}$.1$^{7,10}$]-3-dodecene), poly(8-(1-ethylcyclopentyloxymethyloxycarbonyl-11,12-dioxy-tetracyclo[4.4.0.1$^{2,5}$.1$^{7,10}$]-3-dodecene), poly(8-(1-methylcyclohexyloxymethyloxycarbonyl-11,12-dioxy-tetracyclo[4.4.0.1$^{2,5}$.1$^{7,10}$]-3-dodecene), poly(8-(1-ethylcyclohexyloxymethyloxycarbonyl-11,12-dioxy-tetracyclo[4.4.0.1$^{2,5}$.1$^{7,10}$]-3-dodecene), poly(8-(1-methylnorbornyloxymethyloxycarbonyl-11,12-dioxy-tetracyclo[4.4.0.1$^{2,5}$.1$^{7,10}$]-3-dodecene), poly(8-(1-ethylnorbornyloxymethyloxycarbonyl-11,12-dioxy-tetracyclo[4.4.0.1$^{2,5}$.1$^{7,10}$]-3-dodecene), poly(8-(1-ethoxypropyloxymethyloxycarbonyl-11,12-dioxy-tetracyclo[4.4.0.1$^{2,5}$.1$^{7,10}$]-3-dodecene), poly(8-(1-ethoxy-1-methylethyloxymethyloxycarbonyl-11,12-dioxy-tetracyclo[4.4.0.1$^{2,5}$.1$^{7,10}$]-3-dodecene), poly(8-tetrahydrofuran-2-yloxymethyloxycarbonyl-11,12-dioxy-tetracyclo[4.4.0.1$^{2,5}$.1$^{7,10}$]-3-dodecene), poly(8-tetrahydropyran-2-yloxymethyloxycarbonyl-11,12-dioxy-tetracyclo[4.4.0.1$^{2,5}$.1$^{7,10}$]-3-dodecene), poly(8-(1-adamantyloxymethyloxycarbonyl)-11,12-dioxy-tetracyclo[4.4.0.1$^{2,5}$.1$^{7,10}$]-3-dodecene), poly(8-(2-adamantyloxymethyloxycarbonyl)-11,12-dioxy-tetracyclo[4.4.0.1$^{2,5}$.1$^{7,10}$]-3-dodecene), poly(8-(1-(1-methoxy) ethoxycarbonyl)-11,12-dioxy-tetracyclo[4.4.0.1$^{2,5}$.7,10]-3-dodecene), poly(8-(1-(ethoxy) ethoxycarbonyl)-11,12-dioxy-tetracyclo[4.4.0.1$^{2,5}$.1$^{7,10}$]-3-dodecene), poly(8-(1-(1-n-propoxy) ethoxycarbonyl)-11,12-dioxy-tetracyclo[4.4.0.1$^{2,5}$.1$^{7,10}$]-3-dodecene), poly(8-(1-(1-isopropoxy) ethoxycarbonyl)-11,12-dioxy-tetracyclo[4.4.0.1$^{2,5}$.7,10]-3-dodecene), poly(8-(1-(1-n-butoxy) ethoxycarbonyl)-11,12-dioxy-tetracyclo[4.4.0.1$^{2,5}$.1$^{7,10}$]-3-dodecene), poly(8-(1-(1-tert-butoxy) ethoxycarbonyl)-11,12-dioxy-tetracyclo[4.4.0.1$^{2,5}$.1$^{7,10}$]-3-dodecene), poly(8-(1-(1-cyclopentyloxy) ethoxycarbonyl)-11,12-dioxy-tetracyclo[4.4.0.1$^{2,5}$.1$^{7,10}$]-3-dodecene), poly(8-(1-(1-cyclohexyloxy) ethoxycarbonyl)-11,12-dioxy-tetracyclo[4.4.0.1$^{2,5}$.1$^{7,10}$]-3-dodecene), poly(8-(1-(1-cyclooctyloxy) ethoxycarbonyl)-11,12-dioxy-tetracyclo[4.4.0.1$^{2,5}$.1$^{7,10}$]-3-dodecene), poly(8-(1-(1-norbornyloxy) ethoxycarbonyl)-11,12-dioxy-tetracyclo[4.4.0.1$^{2,5}$.7,10]-3-dodecene), poly(8-(1-(1-methylcyclopentyloxy) ethoxycarbonyl)-11,12-dioxy-tetracyclo[4.4.0.1$^{2,5}$.1$^{7,10}$]-3-dodecene), poly(8-(1-(1-ethylcyclopentyloxy) ethoxycarbonyl)-11,12-dioxy-tetracyclo[4.4.0.1$^{2,5}$.1$^{7,10}$]-3-dodecene), poly(8-(1-(1-methylcyclohexyloxy) ethoxycarbonyl)-11,12-dioxy-tetracyclo[4.4.0.1$^{2,5}$.1$^{7,10}$]-3-dodecene), poly(8-(1-(1-ethylcyclohexyloxy) ethoxycarbonyl)-11,12-dioxy-tetracyclo[4.4.0.1$^{2,5}$.1$^{7,10}$]-3-dodecene), poly(8-(1-(1-methylnorbornyloxy) ethoxycarbonyl)-11,12-dioxy-tetracyclo[4.4.0.1$^{2,5}$.1$^{7,10}$]-3-dodecene), poly(8-(1-(1-ethylnorbornyloxy) ethoxycarbonyl)-11,12-dioxy-tetracyclo[4.4.0.1$^{2,5}$.1$^{7,10}$]-3-dodecene), poly(8-(1-(1-ethoxypropyloxy) ethoxycarbonyl)-11,12-dioxy-tetracyclo[4.4.0.1$^{2,5}$.1$^{7,10}$]-3-dodecene), poly(8-(1-(1-ethoxy-1-methylethyloxy)ethoxycarbonyl)-11,12-dioxy-tetracyclo[4.4.0.1$^{2,5}$.1$^{7,10}$]-3-dodecene), poly(8-(1-(tetrahydrofuran-2-yloxy)ethoxycarbonyl)-11,12-dioxy-tetracyclo[4.4.0.1$^{2,5}$.1$^{7,10}$]-3-dodecene), poly(8-(1-(tetrahydropyran-2-yloxy)ethoxycarbonyl)-11,12-dioxy-tetracyclo[4.4.0.1$^{2,5}$.1$^{7,10}$]-3-dodecene), poly(8-(1-(1-adamantyloxy) ethoxycarbonyl)-11,12-dioxy-tetracyclo[4.4.0.1$^{2,5}$.1$^{718}$]-3-dodecene), and poly(8-(1-(2-adamantyloxy)ethoxycarbonyl)-11,12-dioxy-tetracyclo[4.4.0.1$^{2,5}$.1$^{718}$]-3-dodecene) in a case where at least one of R$^5$ to R$^8$ represents an alkoxyalkyloxycarbonyl group; and poly(8-methoxycarbonylmethyloxycarbonyl-11,12-dioxy-tetracyclo[4.4.0.1$^{2,5}$.1$^{7,10}$]-3-dodecene), poly(8-ethoxycarbonylmethyloxycarbonyl-11,12-dioxy-tetracyclo[4.4.0.1$^{2,5}$.1$^{7,10}$]-3-dodecene), poly(8-(n-propoxycarbonylmethyloxycarbonyl-11,12-dioxy-tetracyclo[4.4.0.1$^{2,5}$.1$^{7,10}$]-3-dodecene), poly(8-isopropoxycarbonylmethyloxycarbonyl-11,12-dioxy-tetracyclo[4.4.0.1$^{2,5}$.1$^{7,10}$]-3-dodecene), poly(8-(n-butoxycarbonylmethyloxycarbonyl-11,12-dioxy-tetracyclo[4.4.0.1$^{2,5}$.1$^{718}$]-3-dodecene), poly(8-(tert-butoxycarbonylmethyloxycarbonyl-11,12-dioxy-tetracyclo[4.4.0.1$^{2,5}$.1$^{7,10}$]-3-dodecene), poly(8-(2-cyclopentyl-2-propoxycarbonylmethyloxycarbonyl-11,12-dioxy-tetracyclo[4.4.0.1$^{2,5}$.1$^{7,10}$]-3-dodecene), poly(8-(2-cyclopentyl-2-butoxycarbonylmethyloxycarbonyl-11,12-dioxy-tetracyclo[4.4.0.1$^{2,5}$.1$^{7,10}$]-3-dodecene), poly(8-(2-cyclohexyl-2-propoxycarbonylmethyloxycarbonyl-11,12-dioxy-tetracyclo[4.4.0.1$^{2,5}$.1$^{7,10}$]-3-dodecene), poly(8-(3-(2-cyclohexyl-2-propoxycarbonyl) propoxycarbonyl)-11,12-dioxy-tetracyclo[4.4.0.1$^{2,5}$.1$^{7,10}$]-3-dodecene), poly(8-(2-cyclohexyl-2-butoxycarbonylmethyloxycarbonyl-11,12-dioxy-tetracyclo[4.4.0.1$^{2,5}$.1$^{7,10}$]-3-dodecene), poly(8-(3-cyclohexyl-3-pentyloxycarbonylmethyloxycarbonyl-11,12-dioxy-tetracyclo[4.4.0.1$^{2,5}$.1$^{7,10}$]-3-dodecene), poly(8-(2-ethyl-2-norbornyloxycarbonylmethyloxycarbonyl-11,12-dioxy-tetracyclo[4.4.0.1$^{2,5}$.1$^{7,10}$]-3-dodecene), poly(8-(2-norbornyl-2-propoxycarbonylmethyloxycarbonyl-11,12-dioxy-tetracyclo[4.4.0.1$^{2,5}$.1$^{7,10}$]-3-dodecene), poly(8-(4-ethyl-tetracyclo[6.2.1.1$^{3,6}$.0$^{2,7}$]-dodecane-4-yloxycarbonylmethyloxycarbonyl)-11,12-dioxy-tetracyclo

[4.4.0.1$^{2,5}$.1$^{7,10}$]-3-dodecene), poly(8-(2-tetracyclo[6.2.1.1$^{3,6}$.0$^{2,7}$]-dodecane-4-yl)-2-propoxycarbonylmethyloxycarbonyl)-11,12-dioxy-tetracyclo[4.4.0.1$^{2,5}$.1$^{7,10}$]-3-dodecene), poly(8-(1,1-dicyclohexylethoxycarbonylmethyloxycarbonyl)-11,12-dioxy-tetracyclo[4.4.0.1$^{2,5}$.1$^{7,10}$]-3-dodecene), poly(8-(1,1-dicyclohexylpropoxycarbonylmethyloxycarbonyl)-11,12-dioxy-tetracyclo[4.4.0.1$^{2,5}$.1$^{7,10}$]-3-dodecene), poly(8-cyclopentyloxycarbonylmethyloxycarbonyl-11,12-dioxy-tetracyclo[4.4.0.1$^{2,5}$.1$^{7,10}$]-3-dodecene), poly(8-cyclohexyloxycarbonylmethyloxycarbonyl-11,12-dioxy-tetracyclo[4.4.0.1$^{2,5}$.1$^{7,10}$]-3-dodecene), poly(8-cyclooctyloxycarbonylmethyloxycarbonyl-11,12-dioxy-tetracyclo[4.4.0.1$^{2,5}$.1$^{7,10}$]-3-dodecene), poly(8-norbornyloxycarbonylmethyloxycarbonyl-11,12-dioxy-tetracyclo[4.4.0.1$^{2,5}$.1$^{7,10}$]-3-dodecene), poly(8-(1-methylcyclopentyloxycarbonylmethyloxycarbonyl)-11,12-dioxy-tetracyclo[4.4.0.1$^{2,5}$.1$^{7,10}$]-3-dodecene), poly(8-(1-ethylcyclopentyloxycarbonylmethyloxycarbonyl)-11,12-dioxy-tetracyclo[4.4.0.1$^{2,5}$.1$^{7,10}$]-3-dodecene), poly(8-(1-methylcyclohexyloxycarbonylmethyloxycarbonyl)-11,12-dioxy-tetracyclo[4.4.0.1$^{2,5}$.1$^{7,10}$]-3-dodecene), poly(8-(1-ethylcyclohexyloxycarbonylmethyloxycarbonyl)-11,12-dioxy-tetracyclo[4.4.0.1$^{2,5}$.1$^{7,10}$]-3-dodecene), poly(8-(1-methylnorbornyloxycarbonylmethyloxycarbonyl)-11,12-dioxy-tetracyclo[4.4.0.1$^{2,5}$.1$^{7,10}$]-3-dodecene), poly(8-(1-ethylnorbornyloxycarbonylmethyloxycarbonyl)-11,12-dioxy-tetracyclo[4.4.0.1$^{2,5}$.1$^{7,10}$]-3-dodecene), poly(8-(1-ethoxypropyloxycarbonylmethyloxycarbonyl)-11,12-dioxy-tetracyclo[4.4.0.1$^{2,5}$.1$^{7,10}$]-3-dodecene), poly(8-(1-ethoxy-1-methylethyloxycarbonylmethyloxycarbonyl)-11,12-dioxy-tetracyclo[4.4.0.1$^{2,5}$.1$^{7,10}$]-3-dodecene), poly(8-tetrahydrofuran-2-yloxycarbonylmethyloxycarbonyl-11,12-dioxy-tetracyclo[4.4.0.1$^{2,5}$.1$^{7,10}$]-3-dodecene), poly(8-tetrahydropyran-2-yloxycarbonylmethyloxycarbonyl-11,12-dioxy-tetracyclo[4.4.0.1$^{2,5}$.1$^{7,10}$]-3-dodecene), poly(8-(1-adamantyloxycarbonylmethyloxycarbonyl)-11,12-dioxy-tetracyclo[4.4.0.1$^{2,5}$.1$^{7,10}$]-3-dodecene), poly(8-(2-adamantyloxycarbonylmethyloxycarbonyl)-11,12-dioxy-tetracyclo[4.4.0.1$^{2,5}$.1$^{7,10}$]-3-dodecene), poly(8-(1-(2-(1-adamantyl)-2-propoxycarbonyl)-ethoxycarbonyl)-11,12-dioxy-tetracyclo[4.4.0.1$^{2,5}$.1$^{7,10}$]-3-dodecene), poly(8-(3-(2-(1-adamantyl)-2-propoxycarbonyl)-propoxycarbonyl)-11,12-dioxy-tetracyclo[4.4.0.1$^{2,5}$.1$^{7,10}$]-3-dodecene), poly(8-(2-(2-(1-adamantyl)-2-propoxycarbonyl)-2-propoxycarbonyl)-11,12-dioxy-tetracyclo[4.4.0.1$^{2,5}$.1$^{7,10}$]-3-dodecene), poly(8-(2-methyl-2-adamantyloxycarbonylmethyloxycarbonyl)-11,12-dioxy-tetracyclo[4.4.0.1$^{2,5}$.1$^{7,10}$]-3-dodecene), poly(8-(3-(2-methyl-2-adamantyloxycarbonyl) propoxycarbonyl)-11,12-dioxy-tetracyclo[4.4.0.1$^{2,5}$.1$^{7,10}$]-3-dodecene), poly(8-(2-(2-methyl-2-adamantyloxycarbonyl)-2-propoxycarbonyl)-11,12-dioxy-tetracyclo[4.4.0.1$^{2,5}$.1$^{7,10}$]-3-dodecene), poly(8-(1-(2-methyl-2-adamantyloxycarbonyl) ethoxycarbonyl)-11,12-dioxy-tetracyclo[4.4.0.1$^{2,5}$.1$^{7,10}$]-3-dodecene), poly(8-(2-ethyl-2-adamantyloxycarbonylmethyloxycarbonyl)-11,12-dioxy-tetracyclo[4.4.0.1$^{2,5}$.1$^{7,10}$]-3-dodecene), poly(8-(2-isopropyl-2-adamantyloxycarbonylmethyloxycarbonyl)-11,12-dioxy-tetracyclo[4.4.0.1$^{2,5}$.1$^{7,10}$]-3-dodecene), poly(8-(2-(1-adamantyl)-2-propoxycarbonylmethyloxycarbonyl)-11,12-dioxy-tetracyclo[4.4.0.1$^{2,5}$.1$^{7,10}$]-3-dodecene), poly(8-(2-(1-adamantyl)-2-butoxycarbonylmethyloxycarbonyl)-11,12-dioxy-tetracyclo[4.4.0.1$^{2,5}$.1$^{7,10}$]-3-dodecene), poly(8-(3-(1-adamantyl)-3-pentyloxycarbonylmethyloxycarbonyl)-11,12-dioxy-tetracyclo[4.4.0.1$^{2,5}$.1$^{7,10}$]-3-dodecene), poly(8-(3-tert-butoxycarbonyl-1-cyclopentyloxycarbonyl)-11,12-dioxy-tetracyclo[4.4.0.1$^{2,5}$.1$^{7,10}$]-3-dodecene), poly(8-(3-(1-methylcyclohexyloxycarbonyl)-1-cyclopentyloxycarbon yl)-11,12-dioxy-tetracyclo[4.4.0.1$^{2,5}$.1$^{7,10}$]-3-dodecene), poly(8-(5-tert-butoxycarbonyl-2-norbornyloxycarbonyl)-11,12-dioxy-tetracyclo[4.4.0.1$^{2,5}$.1$^{7,10}$]-3-dodecene), poly(8-(5-(1-methylcyclohexyloxycarbonyl)-2-norbornyloxycarbonyl)-11,12-dioxy-tetracyclo[4.4.0.1$^{2,5}$.1$^{7,10}$]-3-dodecene), poly(8-(5,5-di(tert-butoxycarbonyl)-2-norbornyloxycarbonyl)-11,12-dioxy-tetracyclo[4.4.0.1$^{2,5}$.1$^{7,10}$]-3-dodecene), poly(8-(5,6-di(tert-butoxycarbonyl)-2-norbornyloxycarbonyl)-11,12-dioxy-tetracyclo[4.4.0.1$^{2,5}$.1$^{7,10}$]-3-dodecene), poly(8-(1-(1-methylcyclohexyloxycarbonyl)-octahydro-4,7-methano-indene-5-yloxycarbonyl)-11,12-dioxy-tetracyclo[4.4.0.1$^{2,5}$.1$^{7,10}$]-3-dodecene), poly(8-(6-tert-butoxycarbonyl-decahydronaphthalene-2-yloxycarbon yl)-11,12-dioxy-tetracyclo[4.4.0.1$^{2,5}$.1$^{7,10}$]-3-dodecene), poly(8-(9-tert-butoxycarbonyl-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), and poly(8-(9-(1-methylcyclohexyloxycarbonyl)-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) in a case where at least one of R$^5$ to R$^8$ represents an alkoxycarbonylalkyloxycarbonyl group.

In a case where R$^5$ to R$^8$ are bonded to each other to form a ring structure, examples of the cyclic alkyl structure include poly(1,4,4a,5,6,7,8,8a,9,9a,10,10a-dodecahydro-1,4:9,10-diepoxy-naphthalene). Examples of the cyclic ester structure which can form a lactone ring include poly(4,14,15-trioxy-pentacyclo[9.2.1.1$^{1,7}$.0$^{2,6}$.0$^{8,13}$]-10-pentadecene-3-one) as a γ-butyrolactone structure; and poly(4,15,16-trioxy-pentacyclo[10.2.1.1$^{1,8}$.0$^{2,7}$.0$^{9,14}$]-11-hexadecene-3-one) as a δ-valerolactone structure. Examples of the cyclic acid anhydride structure include poly(4,14,15-trioxy-pentacyclo[9.2.1.1$^{1,7}$.0$^{2,6}$.0$^{8,13}$]-10-pentadecene-3,5-dione).

Examples of the cyclic amide structure which can form a lactam ring include poly(4-methyl-4-aza-14,15-dioxy-pentacyclo[9.2.1.1$^{1,7}$.0$^{2,6}$.0$^{8,13}$]-10-pentadecene-3-one), poly(4-ethyl-4-aza-14,15-dioxy-pentacyclo[9.2.1.1$^{1,7}$.0$^{2,6}$.0$^{8,13}$]-10-pentadecene-3-one), poly(4-(n-propyl)-4-aza-14,15-dioxy-pentacyclo[9.2.1.1$^{1,7}$.0$^{2,6}$.0$^{8,13}$]-10-pentadecene-3-one), poly(4-(n-butyl)-4-aza-14,15-dioxy-pentacyclo[9.2.1.1$^{1,7}$.0$^{2,6}$.0$^{8,13}$]-10-pentadecene-3-one), poly(4-(1-methylbutyl)-4-aza-14,15-dioxy-pentacyclo[9.2.1.1$^{1,7}$.0$^{2,6}$.0$^{8,13}$]-10-pentadecene-3-one), poly(4-cyclopentyl-4-aza-14,15-dioxy-pentacyclo[9.2.1.1$^{1,7}$.0$^{2,6}$.0$^{8,13}$]-10-pentadecene-3-one), poly(4-cyclohexyl-4-aza-14,15-dioxy-pentacyclo[9.2.1.1$^{1,7}$.0$^{2,6}$.0$^{8,13}$]-10-pentadecene-3-one), poly(4-phenyl-4-aza-14,15-dioxy-pentacyclo[9.2.1.1$^{1,7}$.0$^{2,6}$.0$^{8,13}$]-10-pentadecene-3-one), and poly(4-(4-hydrophenyl)-4-aza-14,15-dioxy-pentacyclo[9.2.1.1$^{1,7}$.0$^{2,6}$.0$^{8,13}$]-10-pentadecene-3-one) as γ-lactam; and poly(4-methyl-4-aza-15,16-dioxy-pentacyclo[10.2.1.1$^{1,8}$.0$^{2,7}$.0$^{9,14}$]-11-hexadecene-3-one), poly(4-ethyl-4-aza-15,16-dioxy-pentacyclo[10.2.1.1$^{1,8}$.0$^{2,7}$.0$^{9,14}$]-11-hexadecene-3-one), poly(4-(n-propyl)-4-aza-15,16-dioxy-pentacyclo[10.2.1.1$^{1,8}$.0$^{2,7}$.0$^{9,14}$]-11-hexadecene-3-one), poly(4-(n-butyl)-4-aza-15,16-dioxy-pentacyclo[10.2.1.1$^{1,8}$.0$^{2,7}$.0$^{9,14}$]-11-hexadecene-3-one), poly(4-(1-methylbutyl)-4-aza-15,16-dioxy-pentacyclo[10.2.1.1$^{1,8}$.0$^{2,7}$.0$^{9,14}$]-11-hexadecene-3-one), poly(4-cyclopentyl-4-aza-15,16-dioxy-pentacyclo[10.2.1.1$^{1,8}$.0$^{2,7}$.0$^{9,14}$]-11-hexadecene-3-one), poly(4-cyclohexyl-4-aza-15,16-dioxy-pentacyclo[10.2.1.1$^{1,8}$.0$^{2,7}$.0$^{9,14}$]-11-hexadecene-3-one), poly(4-phenyl-4-aza-15,16-dioxy-pentacyclo[10.2.1.1$^{1,8}$.0$^{2,7}$.0$^{9,14}$]-11-hexadecene-3-one), and poly(4-(4-hydroxyphenyl)-4-aza-15,16-dioxy-pentacyclo

[10.2.1.1$^{1,8}$.0$^{2,7}$.0$^{9,14}$]-11-hexadecene-3-one) as δ-lactam. Examples of the cyclic imide structure which can form a maleimide ring include poly(4-methyl-4-aza-14,15-dioxy-pentacyclo[9.2.1.1$^{1,7}$.0$^{2,6}$.0$^{8,13}$]-10-pentadecene-3,5-dione), poly(4-ethyl-4-aza-14,15-dioxy-pentacyclo[9.2.1.1$^{1,7}$.0$^{2,6}$.0$^{8,13}$]-10-pentadecene-3,5-dione), poly(4-(n-propyl)-4-aza-14,15-dioxy-pentacyclo[9.2.1.1$^{1,7}$.0$^{2,6}$.0$^{8,13}$]-10-pentadecene-3,5-dione), poly(4-(n-butyl)-4-aza-14,15-dioxy-pentacyclo[9.2.1.1$^{1,7}$.0$^{2,6}$.0$^{8,13}$]-10-pentadecene-3,5-dione), poly(4-(1-methylbutyl)-4-aza-14,15-dioxy-pentacyclo[9.2.1.1$^{1,7}$.0$^{2,6}$.0$^{8,13}$]-10-pentadecene-3,5-dione), poly(4-cyclopentyl)-4-aza-14,15-dioxy-pentacyclo[9.2.1.1$^{1,7}$.0$^{2,6}$.0$^{8,13}$]-10-pentadecene-3,5-dione), poly(4-cyclohexyl-4-aza-14,15-dioxy-pentacyclo[9.2.1.1$^{1,7}$.0$^{2,6}$.0$^{8,13}$]-10-pentadecene-3,5-dione), poly(4-phenyl-4-aza-14,15-dioxy-pentacyclo[9.2.1.1$^{1,7}$.0$^{2,6}$.0$^{8,13}$]-10-pentadecene-3,5-dione), and poly(4-(4-hydroxyphenyl)-4-aza-14,15-dioxy-pentacyclo[9.2.1.1$^{1,7}$. 0$^{2,6}$.0$^{8,13}$]-10-pentadecene-3,5-dione).

Among these, in the repeating structural unit [B] represented by Formula (2) according to the present embodiment, as the cyclic olefin polymer in which n represents 1, poly(8-methoxycarbonyl-11,12-dioxy-tetracyclo[4.4.0.1$^{2,5}$.1$^{7,10}$]-3-dodecene), poly(8-ethoxycarbonyl-11,12-dioxy-tetracyclo[4.4.0.1$^{2,5}$.1$^{7,10}$]-3-dodecene), poly(8-(n-propoxycarbonyl)-11,12-dioxy-tetracyclo[4.4.0.1$^{2,5}$]-3-dodecene), poly(8-(n-butoxycarbonyl)-11,12-dioxy-tetracyclo[4.4.0.1$^{2,5}$.1$^{7,10}$]-3-dodecene), poly(8-isobutoxycarbonyl-11,12-dioxy-tetracyclo[4.4.0.1$^{2,5}$.1$^{7,10}$]-3-dodecene), poly(8-(tert-butoxycarbonyl)-11,12-dioxy-tetracyclo[4.4.0.1$^{2,5}$.1$^{7,10}$]-3-dodecene), poly(8-(n-pentyloxycarbonyl)-11,12-dioxy-tetracyclo[4.4.0.1$^{2,5}$.1$^{7,10}$]-3-dodecene), poly(8-(2-methyl-2-pentyloxycarbonyl)-11,12-dioxy-tetracyclo[4.4.0.1$^{2,5}$.1$^{7,10}$]-3-dodecene), poly(8-(3-methyl-3-pentyloxycarbonyl)-11,12-dioxy-tetracyclo[4.4.0.1$^{2,5}$.1$^{7,10}$]-3-dodecene), poly(8-(2-ethyl-3-methyl-3-pentyloxycarbonyl)-11,12-dioxy-tetracyclo[4.4.0.1$^{2,5}$.1$^{7,10}$]-3-dodecene), poly(8-cyclopentyloxycarbonyl-11,12-dioxy-tetracyclo[4.4.0.1$^{2,5}$.1$^{7,10}$]-3-dodecene), poly(8-(n-hexyloxycarbonyl)-11,12-dioxy-tetracyclo[4.4.0.1$^{2,5}$.1$^{7,10}$]-3-dodecene), poly(8-cyclohexyloxycarbonyl-11,12-dioxy-tetracyclo[4.4.0.1$^{2,5}$.1$^{7,10}$]-3-dodecene), poly(8-(2-methyl-2-butoxycarbonyl)-11,12-dioxy-tetracyclo[4.4.0.1$^{2,5}$.1$^{7,10}$]-3-dodecene), poly(8-(2,3-dimethyl-2-butoxycarbonyl)-11,12-dioxy-tetracyclo[4.4.0.1$^{2,5}$.1$^{7,10}$]-3-dodecene), poly(8-(2,3,3-trimethyl-2-butoxycarbonyl)-11,12-dioxy-tetracyclo[4.4.0.1$^{2,5}$.1$^{7,10}$]-3-dodecene), poly(8-(2-methyl-2-hexyloxycarbonyl)-11,12-dioxy-tetracyclo[4.4.0.1$^{2,5}$.1$^{7,10}$]-3-dodecene), poly(8-(3,4-dimethyl-3-hexyloxycarbonyl)-11,12-dioxy-tetracyclo[4.4.0.1$^{2,5}$.1$^{7,10}$]-3-dodecene), poly(8-(3-methylbutoxycarbonyl)-11,12-dioxy-tetracyclo[4.4.0.1$^{2,5}$.1$^{7,10}$]-3-dodecene), poly(8-(2-methylpentoxycarbonyl)-11,12-dioxy-tetracyclo[4.4.0.1$^{2,5}$.1$^{7,10}$]-3-dodecene), poly(8-(3-methylpentoxycarbonyl)-11,12-dioxy-tetracyclo[4.4.0.1$^{2,5}$.1$^{7,10}$]-3-dodecene), poly(8-(4-methylpentoxycarbonyl)-11,12-dioxy-tetracyclo[4.4.0.1$^{2,5}$.1$^{7,10}$]-3-dodecene), poly(8-(3-methyl-3-heptyloxycarbonyl)-11,12-dioxy-tetracyclo[4.4.0.1$^{2,5}$.1$^{7,10}$]-3-dodecene), poly(8-(2-cyclopentyl)-2-propoxycarbonyl)-11,12-dioxy-tetracyclo [4.4.0.1$^{2,5}$.1$^{7,10}$]-3-dodecene), poly(8-(2-cyclohexyl-2-propoxycarbonyl)-11,12-dioxy-tetracyclo[4.4.0.1$^{2,5}$.1$^{7,10}$]-3-dodecene), poly(8-(2-norbornyl-2-propoxycarbonyl)-11,12-dioxy-tetracyclo[4.4.0.1$^{2,5}$.1$^{7,10}$]-3-dodecene), poly(8-(1,1-dicyclopentylethoxycarbonyl)-11,12-dioxy-tetracyclo[4.4.0.1$^{2,5}$.1$^{7,10}$]-3-dodecene), poly(8-(1,1-dicyclohexylethoxycarbonyl)-11,12-dioxy-tetracyclo[4.4.0.1$^{2,5}$.7,10]-3-dodecene), poly(8-(1-methylcyclopentyloxycarbonyl)-11,12-dioxy-tetracyclo[4.4.0.1$^{2,5}$.1$^{7,10}$]-3-dodecene), poly(8-(1-ethylcyclopentyloxycarbonyl)-11,12-dioxy-tetracyclo[4.4.0.1$^{2,5}$.1$^{7,10}$]-3-dodecene), poly(8-(1-methylcyclohexyloxycarbonyl)-11,12-dioxy-tetracyclo[4.4.0.1$^{2,5}$.1$^{7,10}$]-3-dodecene), poly(8-(1-ethylcyclohexyloxycarbonyl)-11,12-dioxy-tetracyclo[4.4.0.1$^{2,5}$.1$^{7,10}$]-3-dodecene), poly(8-(1-methylcyclooctyloxycarbonyl)-11,12-dioxy-tetracyclo[4.4.0.1$^{2,5}$.1$^{7,10}$]-3-dodecene), poly(8-(1-ethylcyclooctyloxycarbonyl)-11,12-dioxy-tetracyclo[4.4.0.1$^{2,5}$.17$^{10}$]-3-dodecene), poly(8-(1-adamantyloxycarbonyl)-11,12-dioxy-tetracyclo[4.4.0.1$^{2,5}$.1$^{7,10}$]-3-dodecene), poly(8-(2-methyl-2-adamantyloxycarbonyl)-11,12-dioxy-tetracyclo[4.4.0.1$^{2,5}$.1$^{7,10}$]-3-dodecene), poly(8-(2-ethyl-2-adamantyloxycarbonyl)-11,12-dioxy-tetracyclo[4.4.0.1$^{2,5}$.1$^{7,10}$]-3-dodecene), poly(8-(1-methyldecahydronaphthalene-1-yloxycarbonyl)-11,12-dioxy-tetracyclo[4.4.0.1$^{2,5}$.1$^{7,10}$]-3-dodecene), poly(8-(1-ethyldecahydronaphthalene-1-yloxycarbonyl)-11,12-dioxy-tetracyclo[4.4.0.1$^{2,5}$.1$^{7,10}$]-3-dodecene), poly(8-(2-methyldecahydronaphthalene-2-yloxycarbonyl)-11,12-dioxy-tetracyclo[4.4.0.1$^{2,5}$.1$^{7,10}$]-3-dodecene), poly(8-(2-ethyldecahydronaphthalene-2-yloxycarbonyl)-11,12-dioxy-tetracyclo[4.4.0.1$^{2,5}$.1$^{7,10}$]-3-dodecene), poly(8-(2-methyl-2-norbornyloxycarbonyl)-11,12-dioxy-tetracyclo[4.4.0.1$^{2,5}$.1$^{7,10}$]-3-dodecene), poly(8-(2-ethyl-2-norbornyloxycarbonyl)-11,12-dioxy-tetracyclo[4.4.0.1$^{2,5}$.1$^{7,10}$]-3-dodecene), poly(8-(2,7,7-trimethyl-2-norbornyloxycarbonyl)-11,12-dioxy-tetracyclo[4.4.0.1$^{2,5}$.1$^{7,10}$]-3-dodecene), poly(8-(2-ethyl-7,7-dimethyl-2-norbornyloxycarbonyl)-11,12-dioxy-tetracyclo[4.4.0.1$^{2,5}$.1$^{7,10}$]-3-dodecene), poly(8-(5-methyl-octahydro-4,7-methano-indene-5-yloxycarbonyl)-11,12-dioxy-tetracyclo[4.4.0.1$^{2,5}$.1$^{7,10}$]-3-dodecene), poly(8-(5-ethyl-octahydro-4,7-methano-indene-5-yloxycarbonyl)-11,12-dioxy-tetracyclo[4.4.0.1$^{2,5}$.1$^{7,10}$]-3-dodecene), poly(8-(4-methyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), poly(8-(4-ethyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), poly(8-methoxycarbonylphenyl)-11,12-dioxy-tetracyclo[4.4.0.1$^{2,5}$.1$^{7,10}$]-3-dodecene), poly(8-ethoxycarbonylphenyl)-11,12-dioxy-tetracyclo[4.4.0.1$^{2,5}$.1$^{7,10}$]-3-dodecene), poly(8-(n-propoxycarbonylphenyl)-11,12-dioxy-tetracyclo[4.4.0.1$^{2,5}$.1$^{7,10}$]-3-dodecene), poly(8-(i-propoxycarbonylphenyl)-11,12-dioxy-tetracyclo[4.4.0.1$^{2,5}$.1$^{7,10}$]-3-dodecene), poly(8-(n-butoxycarbonylphenyl)-11,12-dioxy-tetracyclo[4.4.0.1$^{2,5}$.1$^{7,10}$]-3-dodecene), poly(8-(tert-butoxycarbonylphenyl)-11,12-dioxy-tetracyclo[4.4.0.1$^{2,5}$.1$^{7,10}$]-3-dodecene), poly(8-(n-pentyloxycarbonylphenyl)-11,12-dioxy-tetracyclo[4.4.0.1$^{2,5}$.1$^{7,10}$]-3-dodecene), poly(8-(3-(2-methyl-2-butoxycarbonyl)phenyl)-11,12-dioxy-tetracyclo[4.4.0.1$^{2,5}$.1$^{7,10}$]-3-dodecene), poly(8-(3-(2,3-dimethyl-2-butoxycarbonyl)phenyl)-11,12-dioxy-tetracyclo[4.4.0.1$^{2,5}$.1$^{7,10}$]-3-dodecene), poly(8-(3-(2-cyclopentyl-2-propoxycarbonyl)phenyl)-11,12-dioxy-tetracyclo[4.4.0.1$^{2,5}$.1$^{7,10}$]-3-dodecene), poly(8-(3-(2-cyclohexyl-2-propoxycarbonyl)phenyl)-11,12-dioxy-tetracyclo[4.4.0.1$^{2,5}$.1$^{7,10}$]-3-dodecene), poly(8-(3-(1-methylcyclopentyloxycarbonyl)phenyl)-11,12-dioxy-tetracyclo[4.4.0.1$^{2,5}$.17,10]-3-dodecene), poly(8-(3-(1-ethylcyclopentyloxycarbonyl)phenyl)-11,12-dioxy-tetracyclo[4.4.0.1$^{2,5}$.1$^{7,10}$]-3-dodecene), poly(8-(3-(1-methylcyclohexyloxycarbonyl)phenyl)-11,12-dioxy-tetracyclo[4.4.0.1$^{2,5}$.1$^{7,10}$]-3-dodecene), poly(8-(3-(1- ethylcyclohexyloxycarbonyl)phenyl)-11,12-dioxy-tetracyclo[4.4.0.1$^{2,5}$.1$^{7,10}$]-3-dodecene), poly(8-(4-(2-methyl-2-butoxycarbonyl)phenyl)-11,12-dioxy-tetracyclo [4.4.0.1$^{2,5}$.1$^{7,10}$]-3-dodecene), poly(8-(4-(2,3-dimethyl-2-butoxycarbonyl)phenyl)-11,12-dioxy-tetracyclo [4.4.0.1$^{2,5}$.1$^{7,10}$]-3-dodecene), poly(8-(4-(2-cyclopentyl-2-propoxycarbonyl)phenyl)-11,12-dioxy-tetracyclo [4.4.0.1$^{2,5}$.1$^{7,10}$]-3-dodecene), poly(8-(4-(2-cyclohexyl-2-propoxycarbonyl)phenyl)-11,12-dioxy-tetracyclo [4.4.0.1$^{2,5}$.1$^{7,10}$]-3-dodecene), poly(8-(4-(1-methylcyclopentyloxycarbonyl)phenyl)-11,12-dioxy-tetracyclo [4.4.0.1$^{2,5}$.1$^{7,10}$]-3-dodecene), poly(8-(4-(1-ethylcyclopentyloxycarbonyl)phenyl)-11,12-dioxy-tetracyclo [4.4.0.1$^{2,5}$.1$^{7,10}$]-3-dodecene), poly(8-(4-(1-methylcyclohexyloxycarbonyl)phenyl)-11,12-dioxy-tetracyclo [4.4.0.1$^{2,5}$.1$^{7,10}$]-3-dodecene), poly(8-(4-(1-ethylcyclohexyloxycarbonyl)phenyl)-11,12-dioxy-tetracyclo [4.4.0.1$^{2,5}$.1$^{7,10}$]-3-dodecene), poly(8-methoxycarbonylnaphthyl-11,12-dioxy-tetracyclo[4.4.0.1$^{2,5}$. 1$^{7,10}$]-3-dodecene), poly(8-ethoxycarbonylnaphthyl-11,12-dioxy-tetracyclo[4.4.0.1$^{2,5}$.1$^{7,10}$]-3-dodecene), poly(8-(n-propoxycarbonylnaphthyl)-11,12-dioxy-tetracyclo [4.4.0.1$^{2,5}$.1$^{7,10}$]-3-dodecene), poly(8-(i-propoxycarbonylnaphthyl)-11,12-dioxy-tetracyclo[4.4.0.1$^{2,5}$.1$^{7,10}$]-3-dodecene), poly(8-(n-butoxycarbonylnaphthyl)-11,12-dioxy-tetracyclo[4.4.0.1$^{2,5}$.1$^{7,10}$]-3-dodecene), poly(8-(tert-butoxycarbonylphenyl)-11,12-dioxy-tetracyclo [4.4.0.1$^{2,5}$.1$^{7,10}$]-3-dodecene), poly(8-(n-pentyloxycarbonylnaphthyl)-11,12-dioxy-tetracyclo[4.4.0.1$^{2,5}$.1$^{7,10}$]-3-dodecene), poly(8-(5-(2-methyl-2-butoxycarbonyl) naphthyl)-11,12-dioxy-tetracyclo[4.4.0.1$^{2,5}$.1$^{7,10}$]-3-dodecene), poly (8-(5-(2,3-dimethyl-2-butoxycarbonyl) naphthyl)-11,12-dioxy-tetracyclo[4.4.0.1$^{2,5}$.1$^{7,10}$]-3-dodecene), poly(8-(5-(2-cyclopentyl-2-propoxycarbonyl) naphthyl)-11,12-dioxy-tetracyclo[4.4.0.1$^{2,5}$.1$^{7,10}$]-3-dodecene), poly(8-(5-(2-cyclohexyl-2-propoxycarbonyl) naphthyl)-11,12-dioxy-tetracyclo[4.4.0.1$^{2,5}$.1$^{7,10}$]-3-dodecene), poly(8-(5-(1-methylcyclopentyloxycarbonyl) naphthyl)-11,12-dioxy-tetracyclo[4.4.0.1$^{2,5}$.1$^{7,10}$]-3-dodecene), poly(8-(5-(1-ethylcyclopentyloxycarbonyl) naphthyl)-11,12-dioxy-tetracyclo[4.4.0.1$^{2,5}$.1$^{7,10}$]-3-dodecene), poly(8-(5-(1-methylcyclohexyloxycarbonyl) naphthyl)-11,12-dioxy-tetracyclo[4.4.0.1$^{2,5}$.1$^{7,10}$]-3-dodecene), poly(8-(5-(1-ethylcyclohexyloxycarbonyl) naphthyl)-11,12-dioxy-tetracyclo[4.4.0.1$^{2,5}$.1$^{7,10}$]-3-dodecene), poly(8-phenoxycarbonyl-11,12-dioxy-tetracyclo[4.4.0.1$^{2,5}$.1$^{7,10}$]-3-dodecene), poly(8-benzyloxycarbonyl-11,12-dioxy-tetracyclo[4.4.0.1$^{2,5}$.1$^{7,10}$]-3-dodecene), poly(8-(4-methylphenoxycarbonyl)-11,12-dioxy-tetracyclo [4.4.0.1$^{2,5}$.1$^{7,10}$]-3-dodecene), poly(8-(3,4-dimethylphenoxycarbonyl)-11,12-dioxy-tetracyclo[4.4.0.1$^{2,5}$.1$^{7,10}$]-3-dodecene), poly(8-(1-naphthoxycarbonyl)-11,12-dioxy-tetracyclo[4.4.0.1$^{2,5}$.1$^{7,10}$]-3-dodecene), poly(8-(2-naphthoxycarbonyl)-11,12-dioxy-tetracyclo[4.4.0.1$^{2,5}$. 1$^{7,10}$]-3-dodecene), poly(8-(1-anthracenoxycarbonyl)-11, 12-dioxy-tetracyclo[4.4.0.1$^{2,5}$.1$^{7,10}$]-3-dodecene), poly(8-(methoxymethyloxycarbonyl-11,12-dioxy-tetracyclo [4.4.0.1$^{2,5}$.1$^{7,10}$]-3-dodecene), poly(8-(ethoxymethyloxycarbonyl-11,12-dioxy-tetracyclo [4.4.0.1$^{2,5}$.1$^{7,10}$]-3-dodecene), poly(8-(n-propoxymethyloxycarbonyl)-11,12-dioxy-tetracyclo[4.4.0.1$^{2,5}$.1$^{7,10}$]-3-dodecene), poly(8-isopropoxymethyloxycarbonyl-11,12-dioxy-tetracyclo[4.4.0.1$^{2,5}$.1$^{7,10}$]-3-dodecene), poly(8-(n-butoxymethyloxycarbonyl)-11,12-dioxy-tetracyclo [4.4.0.1$^{2,5}$.1$^{7,10}$]-3-dodecene), poly(8-(tert-butoxymethyloxycarbonyl)-11,12-dioxy-tetracyclo[4.4.0.1$^{2,5}$.1$^{7,10}$]-3-dodecene), poly(8-cyclopentyloxymethyloxycarbonyl-11,12-dioxy-tetracyclo[4.4.0.1$^{2,5}$.1$^{7,10}$]-3-dodecene), poly(8-cyclohexyloxymethyloxycarbonyl-11,12-dioxy-tetracyclo [4.4.0.1$^{2,5}$.7,10]-3-dodecene), poly(8-cyclooctyloxymethyloxycarbonyl-11,12-dioxy-tetracyclo [4.4.0.1$^{2,5}$.7,10]-3-dodecene), poly(8-norbornyloxymethyloxycarbonyl-11,12-dioxy-tetracyclo [4.4.0.1$^{2,5}$.1$^{7,10}$]-3-dodecene), poly(8-(1-methylcyclopentyloxymethyloxycarbonyl-11,12-dioxy-tetracyclo[4.4.0.1$^{2,5}$.1$^{7,10}$]-3-dodecene), poly(8-(1-ethylcyclopentyloxymethyloxycarbonyl-11,12-dioxy-tetracyclo[4.4.0.1$^{2,5}$.1$^{7,10}$]-3-dodecene), poly(8-(1-methylcyclohexyloxymethyloxycarbonyl-11,12-dioxy-tetracyclo[4.4.0.1$^{2,5}$.1$^{7,10}$]-3-dodecene), poly(8-(1-ethylcyclohexyloxymethyloxycarbonyl-11,12-dioxy-tetracyclo[4.4.0.1$^{2,5}$.1$^{7,10}$]-3-dodecene), poly(8-(1-methylnorbornyloxymethyloxycarbonyl-11,12-dioxy-tetracyclo[4.4.0.1$^{2,5}$.1$^{7,10}$]-3-dodecene), poly(8-(1-ethylnorbornyloxymethyloxycarbonyl-11,12-dioxy-tetracyclo[4.4.0.1$^{2,5}$.1$^{7,10}$]-3-dodecene), poly(8-(1-ethoxypropyloxymethyloxycarbonyl-11,12-dioxy-tetracyclo[4.4.0.1$^{2,5}$.1$^{7,10}$]-3-dodecene), poly(8-(1-ethoxy-1-methylethyloxymethyloxycarbonyl-11,12-dioxy-tetracyclo[4.4.0.1$^{2,5}$.1$^{7,10}$]-3-dodecene), poly(8-tetrahydrofuran-2-yloxymethyloxycarbonyl-11,12-dioxy-tetracyclo[4.4.0.1$^{2,5}$.1$^{7,10}$]-3-dodecene), poly(8-tetrahydropyran-2-yloxymethyloxycarbonyl-11,12-dioxy-tetracyclo[4.4.0.1$^{2,5}$.1$^{7,10}$]-3-dodecene), poly(8-(1-adamantyloxymethyloxycarbonyl)-11,12-dioxy-tetracyclo [4.4.0.1$^{2,5}$.1$^{7,10}$]-3-dodecene), poly(8-(2-adamantyloxymethyloxycarbonyl)-11,12-dioxy-tetracyclo [4.4.0.1$^{2,5}$.1$^{7,10}$]-3-dodecene), poly(8-(1-(1-methoxy) ethoxycarbonyl)-11,12-dioxy-tetracyclo[4.4.0.1$^{2,5}$.1$^{7,10}$]-3-dodecene), poly(8-(1-(1-ethoxy) ethoxycarbonyl)-11,12-dioxy-tetracyclo[4.4.0.1$^{2,5}$.1$^{7,10}$]-3-dodecene), poly(8-(1-(1-n-propoxy) ethoxycarbonyl)-11,12-dioxy-tetracyclo [4.4.0.1$^{2,5}$.1$^{7,10}$]-3-dodecene), poly(8-(1-(1-isopropoxy) ethoxycarbonyl)-11,12-dioxy-tetracyclo[4.4.0.1$^{2,5}$.1$^{7,10}$]-3-dodecene), poly(8-(1-(1-n-butoxy) ethoxycarbonyl)-11,12-dioxy-tetracyclo[4.4.0.1$^{2,5}$.7,10]-3-dodecene), poly(8-(1-(1-tert-butoxy) ethoxycarbonyl)-11,12-dioxy-tetracyclo [4.4.0.1$^{2,5}$.1$^{7,10}$]-3-dodecene), poly(8-(1-(1-cyclopentyloxy) ethoxycarbonyl)-11,12-dioxy-tetracyclo[4.4.0.1$^{2,5}$.1$^{7,10}$]-3-dodecene), poly(8-(1-(1-cyclohexyloxy) ethoxycarbonyl)-11,12-dioxy-tetracyclo[4.4.0.1$^{2,5}$.1$^{7,10}$]-3-dodecene), poly (8-(1-(1-cyclooctyloxy) ethoxycarbonyl)-11,12-dioxy-tetracyclo[4.4.0.1$^{2,5}$.1$^{7,10}$]-3-dodecene), poly(8-(1-(1-norbornyloxy) ethoxycarbonyl)-11,12-dioxy-tetracyclo [4.4.0.1$^{2,5}$.7,10]-3-dodecene), poly(8-(1-(1-methylcyclopentyloxy) ethoxycarbonyl)-11,12-dioxy-tetracyclo[4.4.0.1$^{2,5}$.1$^{7,10}$]-3-dodecene), poly(8-(1-(1-ethylcyclopentyloxy) ethoxycarbonyl)-11,12-dioxy-tetracyclo[4.4.0.1$^{2,5}$.1$^{7,10}$]-3-dodecene), poly(8-(1-(1-methylcyclohexyloxy) ethoxycarbonyl)-11,12-dioxy-tetracyclo[4.4.0.1$^{2,5}$.1$^{7,10}$]-3-dodecene), poly(8-(1-(1-ethylcyclohexyloxy) ethoxycarbonyl)-11,12-dioxy-tetracyclo[4.4.0.1$^{2,5}$.1$^{7,10}$]-3-dodecene), poly(8-(1-(1-methylnorbornyloxy) ethoxycarbonyl)-11,12-dioxy-tetracyclo[4.4.0.1$^{2,5}$.1$^{7,10}$]-3-dodecene), poly(8-(1-(1-ethylnorbornyloxy) ethoxycarbonyl)-11,12-dioxy-tetracyclo [4.4.0.1$^{2,5}$.1$^{7,10}$]-3-dodecene), poly(8-(1-(1-ethoxypropyloxy) ethoxycarbonyl)-11,12-dioxy-tetracyclo [4.4.0.1$^{2,5}$.1$^{7,10}$]-3-dodecene), poly(8-(1-(1-ethoxy-1-methylethyloxy) ethoxycarbonyl)-11,12-dioxy-tetracyclo [4.4.0.1$^{2,5}$.1$^{7,10}$]-3-dodecene), poly(8-(1-(tetrahydrofuran- 2-yloxy) ethoxycarbonyl)-11,12-dioxy-tetracyclo[4.4.0.1$^{2,5}$.1$^{7,10}$]-3-dodecene), poly(8-(1-(tetrahydropyran-2-yloxy) ethoxycarbonyl)-11,12-dioxy-tetracyclo[4.4.0.1$^{2,5}$.1$^{7,10}$]-3-dodecene), poly(8-(1-(1-adamantyloxy) ethoxycarbonyl)-11,12-dioxy-tetracyclo[4.4.0.1$^{2,5}$.1$^{7,10}$]-3-dodecene), poly(8-(1-(2-adamantyloxy) ethoxycarbonyl)-11,12-dioxy-tetracyclo[4.4.0.1$^{2,5}$.1$^{7,10}$]-3-dodecene), poly(8-(n-butoxycarbonylmethyloxycarbonyl-11,12-dioxy-tetracyclo[4.4.0.1$^{2,5}$.1$^{7,10}$]-3-dodecene), poly(8-(tert-butoxycarbonylmethyloxycarbonyl-11,12-dioxy-tetracyclo[4.4.0.1$^{2,5}$.1$^{7,10}$]-3-dodecene), poly(8-(2-cyclopentyl-2-propoxycarbonylmethyloxycarbonyl-11,12-dioxy-tetracyclo[4.4.0.1$^{2,5}$.1$^{7,10}$]-3-dodecene), poly(8-(2-cyclopentyl-2-butoxycarbonylmethyloxycarbonyl-11,12-dioxy-tetracyclo[4.4.0.1$^{2,5}$.1$^{7,10}$]-3-dodecene), poly(8-(2-cyclohexyl-2-propoxycarbonylmethyloxycarbonyl-11,12-dioxy-tetracyclo[4.4.0.1$^{2,5}$.1$^{7,10}$]-3-dodecene), poly(8-(3-(2-cyclohexyl-2-propoxycarbonyl)propoxycarbonyl)-11,12-dioxy-tetracyclo[4.4.0.1$^{2,5}$.1$^{7,10}$]-3-dodecene), poly(8-(2-cyclohexyl-2-butoxycarbonylmethyloxycarbonyl-11,12-dioxy-tetracyclo[4.4.0.1$^{2,5}$.1$^{7,10}$]-3-dodecene), poly(8-(3-cyclohexyl-3-pentyloxycarbonylmethyloxycarbonyl-11,12-dioxy-tetracyclo[4.4.0.1$^{2,5}$.1$^{7,10}$]-3-dodecene), poly(8-(2-ethyl-2-norbornyloxycarbonylmethyloxycarbonyl-11,12-dioxy-tetracyclo[4.4.0.1$^{2,5}$.1$^{7,10}$]-3-dodecene), poly(8-(2-norbornyl-2-propoxycarbonylmethyloxycarbonyl-11,12-dioxy-tetracyclo[4.4.0.1$^{2,5}$.1$^{7,10}$]-3-dodecene), poly(8-(4-ethyl-tetracyclo[6.2.1.1$^{3,6}$.0$^{2,7}$]-dodecane-4-yloxycarbonylmethyloxycarbonyl)-11,12-dioxy-tetracyclo[4.4.0.1$^{2,5}$.1$^{7,10}$]-3-dodecene), poly(8-(2-tetracyclo[6.2.1.1$^{3,6}$.0$^{2,7}$]-dodecane-4-yl)-2-propoxycarbonylmethyloxycarbonyl)-11,12-dioxy-tetracyclo[4.4.0.1$^{2,5}$.1$^{7,10}$]-3-dodecene), poly(8-(1,1-dicyclohexylethoxycarbonylmethyloxycarbonyl)-11,12-dioxy-tetracyclo[4.4.0.1$^{2,5}$.1$^{7,10}$]-3-dodecene), poly(8-(1,1-dicyclohexylpropoxycarbonylmethyloxycarbonyl)-tetracyclo[4.4.0.1$^{2,5}$.1$^{7,10}$]-3-dodecene), poly(8-cyclopentyloxycarbonylmethyloxycarbonyl-11,12-dioxy-tetracyclo[4.4.0.1$^{2,5}$.1$^{7,10}$]-3-dodecene), poly(8-cyclohexyloxycarbonylmethyloxycarbonyl-11,12-dioxy-tetracyclo[4.4.0.1$^{2,5}$.1$^{7,10}$]-3-dodecene), poly(8-cyclooctyloxycarbonylmethyloxycarbonyl-11,12-dioxy-tetracyclo[4.4.0.1$^{2,5}$.1$^{7,10}$]-3-dodecene), poly(8-norbornyloxycarbonylmethyloxycarbonyl-11,12-dioxy-tetracyclo[4.4.0.1$^{2,5}$.1$^{7,10}$]-3-dodecene), poly(8-(1-methylcyclopentyloxycarbonylmethyloxycarbonyl-11,12-dioxy-tetracyclo[4.4.0.1$^{2,5}$.1$^{7,10}$]-3-dodecene), poly(8-(1-ethylcyclopentyloxycarbonylmethyloxycarbonyl)-11,12-dioxy-tetracyclo[4.4.0.1$^{2,5}$.1$^{7,10}$]-3-dodecene), poly(8-(1-methylcyclohexyloxycarbonylmethyloxycarbonyl)-11,12-dioxy-tetracyclo[4.4.0.1$^{2,5}$.1$^{7,10}$]-3-dodecene), poly(8-(1-ethylcyclohexyloxycarbonylmethyloxycarbonyl)-11,12-dioxy-tetracyclo[4.4.0.1$^{2,5}$.1$^{7,10}$]-3-dodecene), poly(8-(1-methylnorbornyloxycarbonylmethyloxycarbonyl)-11,12-dioxy-tetracyclo[4.4.0.1$^{2,5}$.1$^{7,10}$]-3-dodecene), poly(8-(1-ethylnorbornyloxycarbonylmethyloxycarbonyl)-11,12-dioxy-tetracyclo[4.4.0.1$^{2,5}$.1$^{7,10}$]-3-dodecene), poly(8-(1-ethoxypropyloxycarbonylmethyloxycarbonyl)-11,12-dioxy-tetracyclo[4.4.0.1$^{2,5}$.1$^{7,10}$]-3-dodecene), poly(8-(1-ethoxy-1-methylethyloxycarbonylmethyloxycarbonyl)-11,12-dioxy-tetracyclo[4.4.0.1$^{2,5}$.1$^{7,10}$]-3-dodecene), poly(8-tetrahydrofuran-2-yloxycarbonylmethyloxycarbonyl-11,12-dioxy-tetracyclo[4.4.0.1$^{2,5}$.1$^{7,10}$]-3-dodecene), poly(8-tetrahydropyran-2-yloxycarbonylmethyloxycarbonyl-11,12-dioxy-tetracyclo[4.4.0.1$^{2,5}$.1$^{7,10}$]-3-dodecene), poly(8-(1-adamantyloxycarbonylmethyloxycarbonyl)-11,12-dioxy-tetracyclo[4.4.0.1$^{2,5}$.1$^{7,10}$]-3-dodecene), poly(8-(2-adamantyloxycarbonylmethyloxycarbonyl)-11,12-dioxy-tetracyclo[4.4.0.1$^{2,5}$.1$^{7,10}$]-3-dodecene), poly(8-(1-(2-(1-adamantyl)-2-propoxycarbonyl) ethoxycarbonyl)-11,12-dioxy-tetracyclo[4.4.0.1$^{2,5}$.1$^{7,10}$]-3-dodecene), poly(8-(3-(2-(1-adamantyl)-2-propoxycarbonyl) propoxycarbonyl)-11,12-dioxy-tetracyclo[4.4.0.1$^{2,5}$.1$^{7,10}$]-3-dodecene), poly(8-(2-(2-(1-adamantyl)-2-propoxycarbonyl)-2-propoxycarbonyl)-11,12-dioxy-tetracyclo[4.4.0.1$^{2,5}$.1$^{7,10}$]-3-dodecene), poly(8-(2-methyl-2-adamantyloxycarbonylmethyloxycarbonyl)-11,12-dioxy-tetracyclo[4.4.0.1$^{2,5}$.1$^{7,10}$]-3-dodecene), poly(8-(3-(2-methyl-2-adamantyloxycarbonyl) propoxycarbonyl)-11,12-dioxy-tetracyclo[4.4.0.1$^{2,5}$.1$^{7,10}$]-3-dodecene), poly(8-(2-(2-methyl-2-adamantyloxycarbonyl)-2-propoxycarbonyl)-11,12-dioxy-tetracyclo[4.4.0.1$^{2,5}$.1$^{7,10}$]-3-dodecene), poly(8-(1-(2-methyl-2-adamantyloxycarbonyl) ethoxycarbonyl)-11,12-dioxy-tetracyclo[4.4.0.1$^{2,5}$.1$^{7,10}$]-3-dodecene), poly(8-(2-ethyl-2-adamantyloxycarbonylmethyloxycarbonyl)-11,12-dioxy-tetracyclo[4.4.0.1$^{2,5}$.1$^{7,10}$]-3-dodecene), poly(8-(2-isopropyl-2-adamantyloxycarbonylmethyloxycarbonyl)-11,12-dioxy-tetracyclo[4.4.0.1$^{2,5}$.1$^{7,10}$]-3-dodecene), poly(8-(2-(1-adamantyl)-2-propoxycarbonylmethyloxycarbonyl)-11,12-dioxy-tetracyclo[4.4.0.1$^{2,5}$.1$^{7,10}$]-3-dodecene), poly(8-(2-(1-adamantyl)-2-butoxycarbonylmethyloxycarbonyl)-11,12-dioxy-tetracyclo[4.4.0.1$^{2,5}$.1$^{7,10}$]-3-dodecene), poly(8-(3-(1-adamantyl)-3-pentyloxycarbonylmethyloxycarbonyl)-11,12-dioxy-tetracyclo[4.4.0.1$^{2,5}$.1$^{7,10}$]-3-dodecene), poly(8-(3-tert-butoxycarbonyl-1-cyclopentyloxycarbonyl)-11,12-dioxy-tetracyclo[4.4.0.1$^{2,5}$.1$^{7,10}$]-3-dodecene), poly(8-(3-(1-methylcyclohexyloxycarbonyl)-1-cyclopentyloxycarbonyl)-11,12-dioxy-tetracyclo[4.4.0.1$^{2,5}$.1$^{7,10}$]-3-dodecene), poly(8-(5-tert-butoxycarbonyl-2-norbornyloxycarbonyl)-11,12-dioxy-tetracyclo[4.4.0.1$^{2,5}$.1$^{7,10}$]-3-dodecene), poly(8-(5-(1-methylcyclohexyloxycarbonyl)-2-norbornyloxycarbonyl)-11,12-dioxy-tetracyclo[4.4.0.1$^{2,5}$.1$^{7,10}$]-3-dodecene), poly(8-(5,5-di(tert-butoxycarbonyl)-2-norbornyloxycarbonyl)-11,12-dioxy-tetracyclo[4.4.0.1$^{2,5}$.1$^{7,10}$]-3-dodecene), poly(8-(5,6-di(tert-butoxycarbonyl)-2-norbornyloxycarbonyl)-11,12-dioxy-tetracyclo[4.4.0.1$^{2,5}$.1$^{7,10}$]-3-dodecene), poly(8-(1-(1-methylcyclohexyloxycarbonyl)-octahydro-4,7-methano-indene-5-yloxycarbonyl)-11,12-dioxy-tetracyclo[4.4.0.1$^{2,5}$.1$^{7,10}$]-3-dodecene), poly(8-(6-tert-butoxycarbonyl-decahydronaphthalene-2-yloxycarbon yl)-11,12-dioxy-tetracyclo[4.4.0.1$^{2,5}$.1$^{7,10}$]-3-dodecene), poly(8-(9-tert-butoxycarbonyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), or poly(8-(9-(1-methylcyclohexyloxycarbonyl)-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) is preferable.

Further, in the repeating structural unit [B] represented by Formula (2) according to the present embodiment, in a case where $R^5$ to $R^8$ are bonded to one another to form a ring structure, as the cyclic olefin polymer in which n represents 1, poly(4,14,15-trioxy-pentacyclo[9.2.1.1$^{1,7}$.0$^{2,6}$.0$^{8,13}$]-10-pentadecene-3-one), poly(4,14,15-trioxy-pentacyclo[9.2.1.0$^{1,7}$.0$^{2,6}$.0$^{8,13}$]-10-pentadecene-3,5-dione), poly(4-methyl-4-aza-14,15-dioxy-pentacyclo[9.2.1.1$^{1,7}$.0$^{2,6}$.0$^{8,13}$]-10-pentadecene-3,5-dione), poly(4-ethyl-4-aza-14,15-dioxy-pentacyclo[9.2.1.1$^{1,7}$.0$^{2,6}$.0$^{8,13}$]-10-pentadecene-3,5-dione), poly(4-(n-propyl)-4-aza-14,15-dioxy-pentacyclo[9.2.1.1$^{1,7}$.0$^{2,6}$.0$^{8,13}$]-10-pentadecene-3,5-dione), poly(4-(n-butyl)-4-aza-14,15-dioxy-pentacyclo[9.2.1.1$^{1,7}$.0$^{2,6}$.0$^{8,13}$]-10-pentadecene-3,5-dione), poly(4-(1-methylbutyl)-4-aza-14,15-dioxy-pentacyclo[9.2.1.1$^{1,7}$.0$^{2,6}$.0$^{8,13}$]-10-pentadecene-3,5-dione), poly(4-cyclopentyl)-4-aza-14,15- dioxy-pentacyclo[9.2.1.1$^{1,7}$.0$^{2,6}$.0$^{8,13}$]-10-pentadecene-3,5-dione), poly(4-cyclohexyl-4-aza-14,15-dioxy-pentacyclo [9.2.1.1$^{1,7}$.0$^{2,6}$.0$^{8,13}$]-10-pentadecene-3,5-dione), poly(4-phenyl-4-aza-14,15-dioxy-pentacyclo[9.2.1.1$^{1,7}$.0$^{2,6}$.0$^{8,13}$]-10-pentadecene-3,5-dione), or poly(4-(4-hydroxyphenyl)-4-aza-14,15-dioxy-pentacyclo[9.2.1.1$^{1,7}$. 0$^{2,6}$.0$^{8,13}$]-10-pentadecene-3,5-dione) is preferable.

The cyclic olefin polymer (I) according to the present embodiment can be obtained by polymerizing, for example, a cyclic olefin monomer represented by Formula (3) shown below and a cyclic olefin monomer represented by formula (4) shown below through ring opening metathesis polymerization.

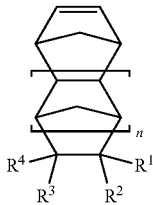
(3)

In Formula (3), $R^1$ to $R^4$ and n each have the same definition as that in Formula (1).

The cyclic olefin monomer according to the present embodiment may have two or more structural units in which at least one of $R^1$ to $R^4$ in the structural unit represented by Formula (3) is different from the rest.

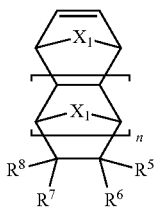
(4)

In Formula (4), $R^5$ to $R^8$, $X_1$, and n each have the same definition as that in Formula (2).

The cyclic olefin monomer according to the present embodiment may have two or more structural units in which at least one of $R^5$ to $R^8$ in the structural unit represented by Formula (4) is different from the rest.

The catalyst used at the time of polymerizing the cyclic olefin polymer (I) according to the present embodiment is not particularly limited as long as the catalyst is capable of performing ring opening metathesis polymerization on the cyclic olefin monomer, and examples thereof include an organic transition metal alkylidene complex catalyst such as molybdenum (Mo), tungsten (W), or ruthenium (Ru); and a ring opening metathesis catalyst obtained by combining an organic transition metal catalyst and a Lewis acid serving as a co-catalyst. Further, it is preferable to use an organic transition metal alkylidene complex catalyst such as molybdenum (Mo), tungsten (W), or ruthenium (Ru).

In the present embodiment, particularly, a highly polar cyclic olefin monomer containing a heteroatom can be copolymerized. For example, a highly polar cyclic olefin monomer can be efficiently copolymerized in a case where an organic transition metal alkylidene complex such as molybdenum (Mo), tungsten (W), or ruthenium (Ru) is used for a ring opening methathesis polymerization catalyst.

Examples of the ring opening metathesis polymerization catalyst of the organic transition metal alkylidene catalyst include a tungsten-based alkylidene catalyst such as W(N-2,6-Pr$^i_2$C$_6$H$_3$) (CHBu$^t$) (OBu$^t$)$_2$, W(N-2,6-Pr$^i_2$C$_6$H$_3$) (CHBu$^t$) (OCMe$_2$CF$_3$)$_2$, W(N-2,6-Pr$^i_2$C$_6$H$_3$) (CHBu$^t$) (OCMe (CF$_3$)$_2$)$_2$, W(N-2,6-Pr$^i_2$C$_6$H$_3$) (CHCMe$_2$Ph) (OBu$^t$)$_2$, W(N-2,6-Pr$^i_2$C$_6$H$_3$) (CHCMe$_2$Ph) (OCMe$_2$CF$_3$)$_2$, W(N-2,6-Pr$^i_2$C$_6$H$_3$) (CHCMe$_2$Ph) (OCMe (CF$_3$)$_2$)$_2$, W(N-2,6-Pr$^i_2$C$_6$H$_3$) (CHCMe$_2$Ph) (OC(CF$_3$)$_3$)$_2$, or W(N-2,6-Me$_2$C$_6$H$_3$) (CHCMe$_2$Ph) (OC(CF$_3$)$_3$)$_2$ (in the formulae, Pr$^i$ represents an iso-propyl group, Bu$^t$ represents a tert-butyl group, Me represents a methyl group, and Ph represents a phenyl group); a tungsten-based alkylidene catalyst such as W(N-2,6-Me$_2$C$_6$H$_3$) (CHCHCMePh) (OBu$^t$)$_2$ (PMe$_3$) W(N-2,6-Me$_2$C$_6$H$_3$) (CHCHCMe$_2$) (OBu$^t$)$_2$ (PMe$_3$), W(N-2,6-Me$_2$C$_6$H$_3$) (CHCHCPh$_2$) (OBu$^t$)$_2$ (PMe$_3$). W(N-2,6-Me$_2$C$_6$H$_3$) (CHCHCMePh) (OCMe$_2$(CF$_3$))$_2$ (PMe$_3$), W(N-2,6-Me$_2$C$_6$H$_3$) (CHCHCMe$_2$) (OCMe$_2$(CF$_3$))$_2$ (PMe$_3$), W(N-2,6-Me$_2$C$_6$H$_3$) (CHCHCPh$_2$) (OCMe$_2$(CF$_3$))$_2$ (PMe$_3$), W(N-2,6-Me$_2$C$_6$H$_3$) (CHCHCMe$_2$) (OCMe (CF$_3$)$_2$)$_2$ (PMe$_3$), W(N-2,6-Me$_2$C$_6$H$_3$) (CHCHCMe$_2$) (OCMe (CF$_3$)$_2$)$_2$ (PMe$_3$), W(N-2,6-Me$_2$C$_6$H$_3$) (CHCHCPh$_2$) (OCMe (CF$_3$)$_2$)$_2$ (PMe$_3$) W(N-2,6-Pr$^i_2$C$_6$H$_3$) (CHCHCMePh) (OCMe$_2$(CF$_3$))$_2$ (PMe$_3$), W(N-2,6-Pr$^i_2$C$_6$H$_3$) (CHCHCMePh) (OCMe (CF$_3$)$_2$)$_2$ (PMe$_3$), or W(N-2,6-Pr$^i_2$C$_6$H$_3$) (CHCHCMePh) (OPh)$_2$ (PMe$_3$) (in the formulae, Pr$^i$ represents an iso-propyl group, Bu$^t$ represents a tert-butyl group, Me represents a methyl group, and Ph represents a phenyl group); a molybdenum-based alkylidene catalyst such as Mo(N-2,6-Pr$^i_2$C$_6$H$_3$) (CHBu$^t$) (OBu$^t$)$_2$, Mo(N-2,6-Pr$^i_2$C$_6$H$_3$) (CHBu$^t$) (OCMe$_2$CF$_3$)$_2$, Mo(N-2,6-Pr$^i_2$C$_6$H$_3$) (CHBu$^t$) (OCMe (CF$_3$)$_2$)$_2$, Mo(N-2,6-Pr$^i_2$C$_6$H$_3$) (CHBu$^t$) (OC (CF$_3$)$_3$)$_2$, Mo(N-2,6-Pr$^i_2$C$_6$H$_3$) (CHCMe$_2$Ph) (OBu$^t$)$_2$, Mo(N-2,6-Pr$^i_2$C$_6$H$_3$) (CHCMe$_2$Ph) (OCMe$_2$CF$_3$)$_2$, Mo(N-2,6-Pr$^i_2$C$_6$H$_3$) (CHCMe$_2$Ph) (OCMe (CF$_3$)$_2$)$_2$, Mo(N-2,6-Pr$^i_2$C$_6$H$_3$) (CHCMe$_2$Ph) (OC (CF$_3$)$_3$)$_2$, Mo(N-2,6-Me$_2$C$_6$H$_3$) (CHCMe$_2$Ph) (OBu$^t$)$_2$, Mo(N-2,6-Me$_2$C$_6$H$_3$) (CHCMe$_2$Ph) (OCMe$_2$CF$_3$)$_2$, Mo(N-2,6-Me$_2$C$_6$H$_3$) (CHCMe$_2$Ph) (OCMe(CF$_3$)$_2$)$_2$, or Mo(N-2,6-Me$_2$C$_6$H$_3$) (CHCMe$_2$Ph) (OC(CF$_3$)$_3$)$_2$ (in the formulae, Pr$^i$ represents an iso-propyl group, But represents a tert-butyl group, Me represents a methyl group, and Ph represents a phenyl group); and a ruthenium-based alkylidene catalyst such as Ru(P(C$_6$H$_{11}$)$_3$)$_2$(CHPh)Cl$_2$ (in the formula, Ph represents a phenyl group). The ring opening metathesis polymerization catalyst may be used alone or in combination of two or more kinds thereof.

Examples of the polymerization catalyst metal component at the time of polymerizing the cyclic olefin polymer (I) according to the present embodiment include transition metals such as molybdenum, tungsten, rhenium, iridium, tantalum, ruthenium, vanadium, titanium, palladium, and rhodium. Among these, molybdenum, tungsten, ruthenium, or rhodium is preferable, and molybdenum or tungsten is more preferable.

The molar ratio of the cyclic olefin monomer to the ring opening metathesis polymerization catalyst of the organic transition metal alkylidene complex in the polymerization reaction is in a range of 10 equivalents to 50000 equivalents, preferably in a range of 50 equivalents to 30000 equivalents, and more preferably in a range of 100 equivalents to 20000 equivalents with respect to 1 mol of the ring opening metathesis polymerization catalyst.

The polymerization reaction may be carried out with or without a solvent. Examples of the solvent include ethers such as tetrahydrofuran, diethyl ether, dibutyl ether, dimethoxyethane, and dioxane; an aromatic hydrocarbon such as benzene, toluene, xylene, or ethylbenzene; an aliphatic hydrocarbon such as pentane, hexane, or heptane; an aliphatic cyclic hydrocarbon such as cyclopentane, cyclohexane, methyl cyclohexane, dimethyl cyclohexane, or decalin; a halogenated hydrocarbon such as methylene dichloride, dichloroethane, dichloroethylene, tetrachloroethane, chlorobenzene, or trichlorobenzene; and an ester such as methyl acetate or ethyl acetate. These solvents may be used alone or in combination of two or more kinds thereof.

Further, the polymerization reaction may be carried out in the coexistence of a chain transfer agent such as olefins or dienes. Examples of the olefins used as a chain transfer agent include α-olefin such as ethylene, propylene, butane, pentene, hexene, or octene; and silicon-containing olefin such as vinyl trimethylsilane, allyl trimethylsilane, allyl triethylsilane, or allyl triisopropylsilane. Further, examples of the dienes include non-conjugated diene such as 1,4-pentadiene, 1,5-hexadiene, or 1,6-heptadiene. The chain transfer agent may be used alone or in combination of two or more kinds thereof.

The amount of the chain transfer agent to be used which is allowed to coexist is preferably in a range of 0.001 equivalents to 1000 equivalents and more preferably in a range of 0.01 equivalents to 100 equivalents with respect to 1 mol of the cyclic olefin monomer. The amount of the chain transfer agent to be used is more preferably in a range of 0.1 equivalents to 2000 equivalents and more preferably in a range of 1 equivalent to 1000 equivalents with respect to 1 mol of the ring opening metathesis polymerization catalyst. The size of the molecular weight can be adjusted by optionally setting these ratios.

The monomer concentration in the polymerization reaction is not particularly limited since the monomer concentration varies depending on the reactivity of the cyclic olefin monomer or the solubility in a polymerization solvent, but the concentration of the cyclic olefin monomer is, for example, in a range of 0.001 kg/kg to 3 kg/kg, preferably in a range of 0.01 kg/kg to 2 kg/kg, and more preferably in a range of 0.02 kg/kg to 1 kg/kg with respect to 1 kg of the solvent. The reaction temperature is not particularly limited since the reaction temperature varies depending on the kind or the amount of the cyclic olefin monomer and the ring opening metathesis catalyst, but is preferably in a range of −30° C. to 150° C., preferably in a range of 0° C. to 120° C., and still more preferably in a range of 15° C. to 100° C. The reaction time is, for example, in a range of 1 minute to 10 hours, preferably in a range of 5 minutes to 8 hours, and more preferably in a range of 10 minutes to 6 hours.

After the polymerization reaction, a cyclic olefin polymer solution can be obtained by stopping the reaction using aldehydes such as butyl aldehyde; ketones such as acetone; or alcohols such as methanol. At this time, from the viewpoint of further suppressing generation of volatile components (outgas) by reducing the amount of unpolymerized monomers in the cyclic olefin polymer to be obtained, the polymerization rate of the cyclic olefin monomer is preferably 90% or greater, more preferably 95% or greater, and still more preferably 100%.

Further, the method of obtaining a polymer from the solution of the cyclic olefin polymer is not particularly limited, and examples thereof include a method of discharging the reaction solution to a poor solvent being stirred; a method of precipitating a polymer using a steam stripping method of blowing steam into the reaction solution; and a method of evaporating and removing a solvent from the reaction solution through heating.

Further, the cyclic olefin polymer (I) according to the present embodiment may be in the form in which a double bond in the main chain is hydrogenated (also referred to as hydrogenation). In this manner, further excellent heat melt fluidity can be exhibited by releasing restriction on the movement of a polymer chain using a double bond in the main chain, for example, lowering the glass transition temperature of the polymer and adjusting the temperature at the intersection between a storage modulus (G') curve and a loss modulus (G") curve to be in an appropriate range as measured using a rheometer. As the result, an underlayer film in which defects such as voids are further suppressed and which has excellent flatness and exhibits an excellent embedding property can be formed. The hydrogenation ratio during the hydrogenation reaction is preferably in a range of 0.1% to 100% by mole, more preferably in a range of 1.0% to 95% by mole, and still more preferably in a range of 5% to 90% by mole.

The catalyst for hydrogenating a double bond moiety in the main chain of the polymer obtained by the ring opening metathesis polymerization may be a homogeneous metal complex catalyst or a heterogeneous metal-supported catalyst as long as the catalyst is capable of carrying out hydrogenation. Among these, a heterogeneous metal-supported catalyst which can easily separate a catalyst is suitable, and preferred examples thereof include activated carbon-supported palladium, alumina-supported palladium, activated carbon-supported rhodium, alumina-supported rhodium, activated carbon-supported ruthenium, and alumina-supported ruthenium. These catalysts may be used alone or in combination of two or more kinds thereof.

The solvent used for hydrogenation is not particularly limited as long as the polymer is dissolved therein and the solvent itself is not hydrogenated, and examples thereof include ethers such as tetrahydrofuran, diethyl ether, dibutyl ether, dimethoxyethane, and dioxane; an aromatic hydrocarbon such as benzene, toluene, xylene, or ethylbenzene; an aliphatic hydrocarbon such as pentane, hexane, or heptane; an aliphatic cyclic hydrocarbon such as cyclopentane, cyclohexane, methyl cyclohexane, dimethyl cyclohexane, or decalin; a halogenated hydrocarbon such as methylene dichloride, dichloroethane, dichloroethylene, tetrachloroethane, chlorobenzene, or trichlorobenzene; and an ester such as methyl acetate or ethyl acetate. These solvents may be used alone or in combination of two or more kinds thereof. Further, it is preferable that a step which is suitable for productivity can be employed without carrying out a solvent substitution step by means of using the same kind of solvent as the solvent selected based on the polymerization reaction described above.

In the hydrogenation reaction of the olefin moiety in the main chain described above, the hydrogen pressure is preferably in a range of the normal pressure to 10 MPa, more preferably in a range of 0.5 to 8 MPa, and particularly preferably in a range of 2 to 5 MPa. Further, the reaction temperature is preferably in a range of 0° C. to 200° C., more preferably in a range of room temperature to 150° C., and particularly preferably in a range of 50° C. to 100° C. The mode in which the hydrogenation reaction is carried out is not particularly limited, and examples of the method of carrying out the hydrogenation reaction include a method of carrying out the reaction by dispersing or dissolving a catalyst in a solvent; and a method of carrying out the reaction by filling a column or the like with a catalyst and circulating a polymer solution as a stationary phase.

Further, the hydrogenation treatment of the olefin moiety in the main chain is not particularly limited and the hydrogenation treatment may be performed after the polymerization solution of the polymer before the hydrogenation treatment is precipitated in a poor solvent, the polymer is isolated, and the polymer is dissolved in a solvent again or the hydrogenation treatment may be performed using the above-described hydrogenation catalyst without isolating the polymer from the polymerization solution.

Particularly, the method of obtaining a polymer from a polymer solution in a case of preferably using a heterogeneous metal-supported catalyst such as activated carbon rhodium or activated carbon ruthenium after the hydrogenation is not particularly limited, and examples thereof include a method of obtaining a polymer solution which does not contain a catalyst using a method of filtration, centrifugation, or decantation and discharging the reaction solution to a poor solvent being stirred; a method of precipitating a polymer using a steam stripping method of blowing steam into the reaction solution; and a method of evaporating and removing a solvent from the reaction solution through heating.

Further, in a case where the hydrogenation reaction is carried out using a heterogeneous metal-supported catalyst, the polymer can be obtained according to the above-described method after a synthetic solution is filtered and the metal-supported catalyst is separated by filtration. In order to obtain a polymer solution particularly free of a metal which is used in a semiconductor device manufacturing step, the polymer may be obtained according to the above-described method after a solution obtained by roughly removing a catalyst component is filtered. Particularly, it is suitable to perform microfiltration on the catalyst component, and the opening diameter of a filtration filter is preferably in a range of 10 μm to 0.05 μm, particularly preferably in a range of 10 μm to 0.10 μm, and still more preferably in a range of 5 μm to 0.10 μm.

In the cyclic olefin polymer (I) according to the present embodiment, the weight-average molecular weight (Mw) thereof in terms of polystyrene which is measured by gel permeation chromatography (GPC) at a sample concentration of 3.0 to 9.0 mg/ml is preferably in a range of 1000 to 20000, more preferably in a range of 1500 to 19000, and still more preferably in a range of 2000 to 18000. In a case where the weight-average molecular weight (Mw) is set to be in the above-described range, further excellent heat melt fluidity can be exhibited at the time of heating the surface of the uneven structure of the substrate at a temperature of 200° C. to 250° C., which is applied in a typical semiconductor device manufacturing step, in a baking step after the surface thereof is coated with the resin material for forming an underlayer film according to the present embodiment. As the result, an underlayer film in which defects such as voids are further suppressed and which has excellent flatness and exhibits an excellent embedding property can be formed. Further, a resist underlayer film with a small difference in film thickness in the sparse and dense pattern and excellent uniformity of the film thickness on a projection pattern in a silicon wafer surface can be formed on a substrate having a complex shape.

The molecular weight distribution (Mw/Mn), which is a ratio between the weight-average molecular weight (Mw) and the number average molecular weight (Mn) in a case where the molecular weight (Mw) is in the above-described range, is preferably in a range of 1.3 to 5.0, more preferably in a range of 1.3 to 4.0, and still more preferably in a range of 1.3 to 3.0. In a case where the molecular weight distribution (Mw/Mn) is set to be in the above-described range, the melt unevenness with respect to the heating during the baking step can be further suppressed, and the resin is further uniformly melted. As the result, an underlayer film in which defects such as voids are further suppressed and which has excellent flatness and exhibits an excellent embedding property can be formed.

(Thermoplastic Resin (II))

It is preferable that the resin material for forming an underlayer film according to the present embodiment further contains a thermoplastic resin (II) which is different from the cyclic olefin polymer (I). In this manner, for example, the embedding property for an uneven structure in which the intervals 6 between projections, the heights 5 of projections, and the widths 8 of projections are not uniform as shown in FIG. 3 can be further improved. In addition, the difference in film thickness in the sparse and dense pattern is decreased, and the uniformity of the film thickness on the projection pattern in the silicon wafer surface can be further improved.

From the viewpoints of lowering the glass transition temperature of the resin material for forming an underlayer film and easily adjusting the temperature at the intersection between the storage modulus (G') curve and the loss modulus (G") curve during the measurement using a rheometer to be in an appropriate range, the mass ratio (I/II) of the cyclic olefin polymer (I) to the thermoplastic resin (II) in the resin material for forming an underlayer film according to the present embodiment is preferably 5/95 or greater, more preferably 10/90 or greater, and still more preferably 15/85 or greater. The mass ratio thereof is preferably 95/5 or less, more preferably 90/10 or less, still more preferably 85/15 or less, even still more preferably 80/20 or less, even still more preferably 70/30 or less, even still more preferably 63/37 or less, and particularly preferably 60/40 or less.

The thermoplastic resin (II) is not particularly limited as long as the resin is thermoplastic, and various organic polymers can be used. For example, polymers obtained by addition polymerization or polycondensation can be used as such organic polymers. Preferred examples thereof include a polycondensation polymer and an addition polymerization polymer such as polyester, polystyrene, polyimide, an acrylic polymer, a methacrylic polymer (an acrylic polymer and a methacrylic polymer are also collectively referred to as a (meth)acrylic polymer), polyvinyl ether, phenol novolak, naphthol novolak, polyether, polyamide, and polycarbonate. As a light absorbing site for adjusting a refractive index (n), an extinction coefficient (k), and the like, an organic polymer having an aromatic ring structure such as a benzene ring, a naphthalene ring, an anthracene ring, a triazine ring, a quinoline ring, or a quinoxaline ring is preferably used.

Examples of the organic polymer having an aromatic ring structure include an addition polymerization polymer containing an addition polymerizable monomer such as benzyl acrylate, benzyl methacrylate, phenyl acrylate, naphthyl acrylate, anthryl methacrylate, anthryl methyl methacrylate, styrene, hydroxystyrene, benzylvinyl ether, or N-phenylmaleimide as a structural unit thereof, and a polycondensation polymer such as phenol novolak or naphthol novolak.

Further, in a case where an addition polymerization polymer is used as the thermoplastic resin (II), the polymer may be a homopolymer or a copolymer. An addition polymerizable monomer is used for production of an addition polymerization polymer. Examples of such an addition polymerizable monomer include acrylic acid, methacrylic acid, an acrylic acid ester compound, a methacrylic acid ester compound, an acrylamide compound, a methacrylamide compound, a vinyl compound, a styrene compound, a maleimide compound, a maleic anhydride, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthryl methyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthryl methyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxybornornene-2-carboxylic-6-lactone, 3-methacryloxypropyltriethoxylsilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinyl acetic acid, vinyl trimethoxysilane, 2-chloroethyl vinyl ether, 2-methoxyethyl vinyl ether, vinyl naphthalene, and vinyl anthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

In a case where a polycondensation polymer is used as the thermoplastic resin (II), examples of such a polymer include a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalaic acid, and maleic anhydride.

Further, examples of the polycondensation polymer include polyester, polyamide, and polyimide of polypyromellitimide, poly(p-phenyleneterephthalamide), polybutylene terephthalate, and polyethylene terephthalate.

Among these, from the viewpoints of more easily adjusting the temperature at the intersection between the storage modulus (G') curve and the loss modulus (G") curve during measurement using a rheometer to be in an appropriate range while satisfactorily maintaining the etching resistance, the refractive index (n), and the extinction coefficient (k) of the resin material for forming an underlayer film according to the present embodiment, and easily introducing the semiconductor manufacturing process, at least one selected from an organic polymer having an aromatic ring structure and a (meth)acrylic polymer is preferable, and at least one selected from a (meth)acrylic polymer and a polyhydroxystyrene-based resin is more preferable as the thermoplastic resin (II) according to the present embodiment.

The (meth)acrylic polymer according to the present embodiment is a polymer having at least a constitutional unit derived from an acrylic acid ester compound or a methacrylic acid ester compound.

As the acrylic acid ester compound or the methacrylic acid ester compound, for example, the above-described compounds can be used.

The polyhydroxystyrene-based resin according to the present embodiment is a polymer having at least a constitutional unit derived from hydroxystyrene. In the present embodiment, the concept of hydroxystyrene includes hydroxystyrene, those obtained by substituting a hydrogen atom bonded to the a-position of hydroxystyrene with other substituents such as a halogen atom, an alkyl group, and a halogenated alkyl group, and hydroxystyrene derivatives of the substituents thereof.

In the hydroxystyrene derivative, at least a benzene ring and a hydroxyl group bonded thereto are maintained, and examples thereof include those obtained by substituting a hydrogen atom bonded to the a-position of hydroxystyrene with other substituents such as a halogen atom, an alkyl group having 1 to 5 carbon atoms, and a halogenated alkyl group, those obtained by further bonding an alkyl group having 1 to 5 carbon atoms to a benzene ring to which a hydroxyl group of hydroxystyrene has been bonded, and those obtained by further bonding one or two hydroxyl groups (at this time, the total number of hydroxyl groups is 2 or 3) to a benzene ring to which a hydroxyl group of hydroxystyrene has been bonded. Here, the a-position of the hydroxystyrene indicates the carbon atom to which a benzene ring has been bonded unless otherwise specified.

Examples of the halogen atom include a chlorine atom, a fluorine atom, and a bromine atom.

The proportion of the constitutional units derived from the polyhydroxystyrene-based resin and the hydroxystyrene according to the present embodiment is preferably greater than or equal to 60% by mole and less than or equal to 100% by mole, more preferably greater than or equal to 70% by mole and less than or equal to 100% by mole, and still more preferably greater than or equal to 80% by mole and less than or equal to 100% by mole with respect to the total amount of all constitutional units constituting the polyhydroxystyrene-based resin.

Here, typically, an organic polymer having an aromatic ring structure such as a polyhydroxystyrene-based resin exhibits extremely large absorption at a wavelength of 193 nm, and thus is not suitable for an ArF photolithography step carried out using an ArF excimer laser having a wavelength of 193 nm as a light source. Therefore, those skilled in the art do not usually consider of combining the organic polymer having an aromatic ring structure such as a polyhydroxystyrene-based resin with the cyclic olefin polymer (I) suitable for the ArF photolithography step.

Typically, phase separation occurs in a case where two kinds of different polymers are mixed with each other. Due to the phase separation, it is expected that the glass transition temperature of the composition becomes two peaks derived from the glass transition temperatures of the two kinds of polymers so that the baking conditions in the underlayer film forming step become complicated, the etching rate is not constant due to the non-uniformity in the underlayer film (particularly in the oxygen plasma), or the effects as a planarizing material also become disadvantageous. Therefore, the material becomes a material which is not suitable for the lithography step. Accordingly, those skilled in the art do not usually consider of combining the organic polymer having an aromatic ring structure such as a polyhydroxystyrene-based resin with the cyclic olefin polymer (I) suitable for the ArF photolithography step.

However, according to the examination of the present inventors, it was found that the temperature at the intersection between the storage modulus (G') curve and the loss modulus (G") curve during measurement using a rheometer is easily adjusted to be in an appropriate range while the etching resistance, the etching rate, the refractive index (n), and the extinction coefficient (k) of the resin material for forming an underlayer film are satisfactorily maintained by combining the polyhydroxystyrene-based resin with the cyclic olefin polymer (I), and thus the embedding property of the resin material for forming an underlayer film with respect to the uneven structure in which the widths between projections and the heights of projections on the surface are not uniform as illustrated in FIG. 3, can be more effectively improved.

The weight-average molecular weight (Mw) of the thermoplastic resin (II) according to the present embodiment in terms of polystyrene is preferably in a range of 1000 to 100000, more preferably in a range of 1000 to 50000, and still more preferably in a range of 1000 to 30000.

The thermoplastic resin (II) according to the present embodiment can be used alone or in combination of two or more kinds thereof within a range where the effects of the present invention are not impaired.

In addition, the amount of the volatile component generated in the resin material for forming an underlayer film according to the present embodiment which is measured using the following method 1 is preferably greater than or equal to 0.0% by mass and less than or equal to 1.0% by mass, more preferably greater than or equal to 0.0% by mass and less than or equal to 0.7% by mass, still more preferably greater than or equal to 0.0% by mass and less than or equal to 0.5% by mass, and particularly preferably greater than or equal to 0.0% by mass and less than or equal to 0.1% by mass in a case where the total amount of the resin material for forming an underlayer film is set to 100% by mass.

In this manner, since generation of the volatile component (outgas) accompanied by decomposition of the polymer at the time of heating and melting can be suppressed, a resist underlayer film with further excellent flatness can be formed.

In other words, a resist underlayer film which is capable of suppressing intermixing of an intermediate layer provided as an upper layer with the material used as a resist layer and suppressing generation of voids or the like, and has an embedding property in a further excellent state and further excellent flatness can be formed.

The method 1: The resin material for forming an underlayer film according to the present embodiment is dissolved in tetrahydrofuran to prepare a solution in which the concentration of the resin material for forming an underlayer film is 20% by mass, the obtained solution is weighed using an aluminum plate, heated at 200° C. for 3 minutes in a nitrogen flow so that the tetrahydrofuran is removed, and cooled to room temperature so that the resin material for forming an underlayer film is solidified, the resin material for forming an underlayer film is heated in a temperature range of 30° C. to 300° C. at a heating rate of 10° C./min in a nitrogen atmosphere, and the amount of the volatile component generated in the resin material for forming an underlayer film is calculated based on a weight reduction amount in a temperature range of 100° C. to 250° C.

The glass transition temperature of the resin material for forming an underlayer film according to the present embodiment based on the differential scanning calorimetry is preferably in a range of 40° C. to 220° C., more preferably in a range of 50° C. to 220° C., still more preferably in a range of 60° C. to 200° C., and even still more preferably in a range of 70° C. to 180° C. In a case where the glass transition temperature thereof is in the above-described range, the temperature at the intersection between the storage modulus (G') curve and the loss modulus (G") curve is easily adjusted to be in the above-described range.

Further, for example, a method of performing SEM observation on a sample obtained by embedding the uneven surface of the substrate through formation of a coating film according to a spin coating method and cutting out the cross section of the sample after being baked is used for evaluation of the flatness of the resist underlayer film. In this case, it is preferable that the following flatness (ΔFT) can be used as a measure of showing the degree of fluctuation of the atmospheric surface. First, ten heights from the bottoms of recesses to the atmospheric surface (a surface (a) described below) in the uneven structure of the substrate are measured, and the average value ($H_{av}$) is set as the film thickness. Next, based on the result obtained by measuring the maximum value ($H_{max}$) and the minimum value ($H_{min}$) among the film thicknesses in fluctuation, a value ($[(H_{max}-H_{min})/H_{av}]\times100$ (%)) obtained by dividing a difference ($H_{max}-H_{min}$) between the maximum value and the minimum value by the average value of the film thicknesses is set as the measure of the flatness (ΔFT). Here, in a case where the substrate does not have an uneven structure, the "heights from the bottoms of recesses to the atmospheric surface" may be replaced by the "height from the surface of the substrate to the atmospheric surface".

Figure 4:
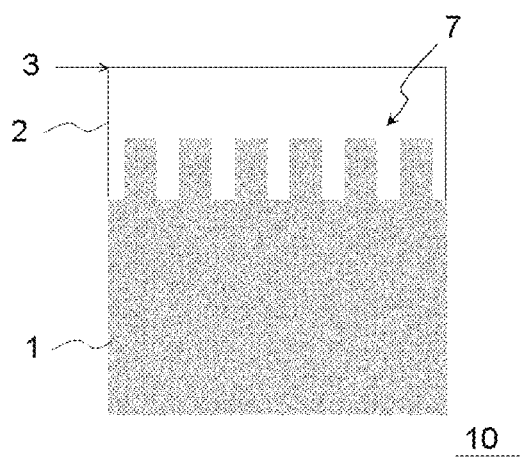
FIG. 4 shows schematic views for describing the thickness of a resist underlayer film, the height of an uneven structure, and the interval between projections of the even structure in a laminate according to an embodiment of the present invention.
Figure 4:
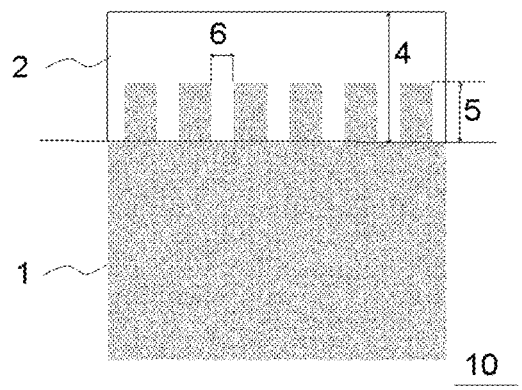
Figure 4:
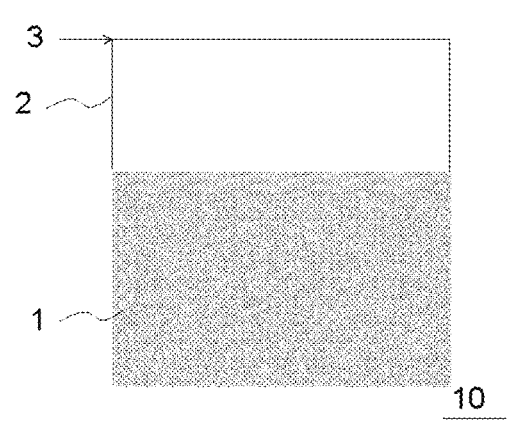
Figure 4:
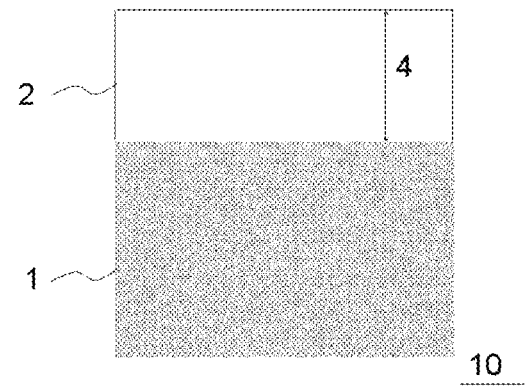

FIG. 4 are schematic views for describing a film thickness 4 of a resist underlayer film 2, a height 5 of an uneven structure 7, and an interval 6 between projections of the uneven structure 7 in a laminate 10 according to the embodiment of the present invention. As shown in FIG. 4, in a case where a substrate 1 has the uneven structure 7, the height from the bottom of a recess to a surface (a) 3 is set as a film thickness 4 of the resist underlayer film 2. Further, in a case where the substrate 1 does not have the uneven structure 7, the height from the surface of the substrate 1 to the surface (a) 3 is set as the film thickness 4 of the resist underlayer film 2.

The flatness (ΔFT) is preferably in a range of 0% to 5%, more preferably in a range of 0% to 3%, and still more preferably in a range of 0% to 1%. In this manner, the thickness of the resist layer can be made more uniform regardless of the presence of the intermediate layer, and a desired pattern in lithography can be obtained with excellent reproducibility.

Figure 2:
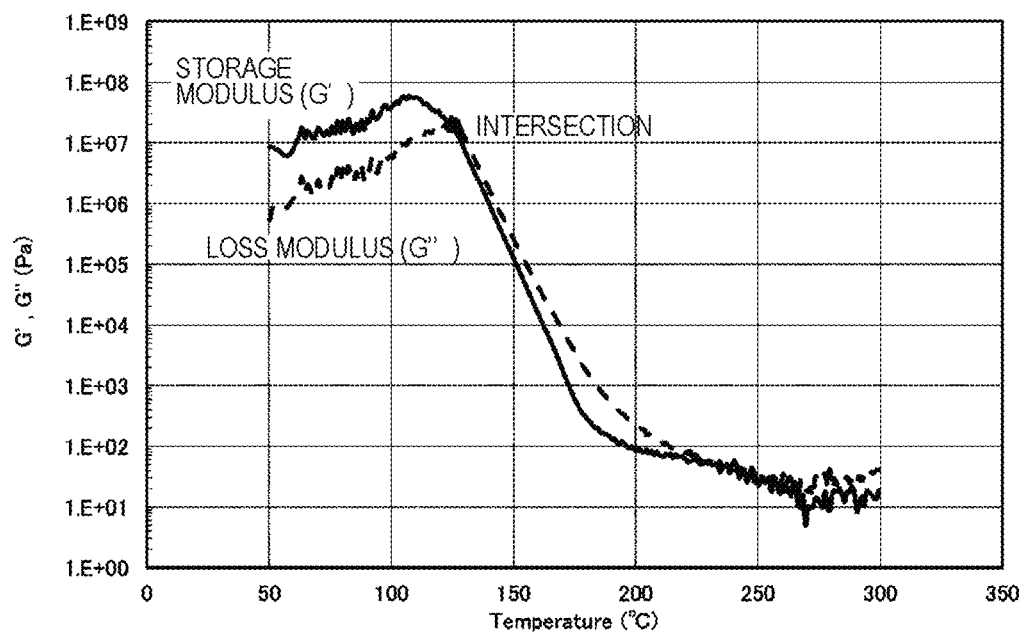
FIG. 2 shows a storage modulus (G') curve, a loss modulus (G") curve, and an intersection between these curves in measurement of the solid viscoelasticity of a resin composition 1 described in Example 5.

Further, for example, a method of performing SEM observation on a sample obtained by embedding the uneven surface of the substrate through formation of a coating film according to a spin coating method and cutting out the cross section of the sample after being baked is used for evaluation of the difference in film thickness in a sparse and dense pattern of the resist underlayer film. In this case, in a switching portion of the sparse and dense pattern, as shown in FIG. 3-2, in a case where the width between projections (recess width) in the uneven structure of the substrate is set as a and the projection width is set as b, the ratio [a/(a+b)] of the width between projections to the pattern pitch width represented by a+b is set as α, and the a value, $α_1$, and $α_2$ for each of the pattern areas with different widths between projections and different projection widths on the same substrate are acquired. The switching portion of the sparse and dense pattern is obtained in a case where the absolute value of the difference between $α_1$ and $α_2$ is in a range of $0<|α_1-α_2|<1$. In the difference in film thickness in the switching portion of the sparse and dense pattern, ten film thicknesses from the surfaces of the projections to the atmospheric surface in each of the pattern regions on the same substrate with different α values are measured, an average value $H_1$ and an average value $H_2$ are respectively acquired, and $|H_1-H_2|$ which is an absolute value of a difference in average film thickness on projections in two pattern regions is set as a difference ΔFT (sparse and dense) in film thickness in a switching portion of the sparse and dense pattern.

In FIG. 3-2, "$a_1/(a_1+b_1)=α_1$" and "$a_2/(a_2+b_2)=α_2$" are satisfied. $H_1$ and $H_2$ each indicate the average film thickness on projections in the regions of $α_1$ and $α_2$, and "$|H_1-H_2|=ΔFT$ (sparse and dense)" is satisfied.

The uniformity of the film thickness on the projection pattern of the substrate becomes excellent as the difference in film thickness in the switching portion of the sparse and dense pattern is decreased, and the difference in film thickness is preferably greater than or equal to 0 nm and less than or equal to 20 nm, more preferably greater than or equal to 0 nm and less than or equal to 15 nm, and still more preferably greater than or equal to 0 nm and less than or equal to 10 nm. In this manner, the thickness of the resist layer can be made more uniform regardless of the presence of the intermediate layer, and a desired pattern in lithography can be obtained with excellent reproducibility.

In an ArF photolithography step of transferring a pattern of a photomask using an ArF excimer laser having a wavelength of 193 nm to a layer formed of a resist material formed over the underlayer film, light having passed through the underlayer film from the resist layer is reflected on the surface of the semiconductor substrate and is incident on the resist layer on the upper side from the underlayer film again. In other words, the roughness of the pattern may deteriorate because optical interference occurs due to the influence of a standing wave and this results in non-uniform concentration of an acid generated inside the resist. Further, in a case where a substrate having a plurality of trenches particularly with aspect ratios different from one another, reflection of light causes irregular reflection on a stepped portion, and the irregular reflected light is incident on the resist layer from the underlayer film again. Therefore, a phenomenon in which the transfer accuracy deteriorates due to the acid generated by the light which has been incident inside the resist layer that should be an unexposed portion occurs.

In order to prevent deterioration of pattern roughness or deterioration of transfer accuracy due to a standing wave or irregular reflection on the resist layer from the underlayer film, the underlayer film is required to have a function as an anti-reflective film. Practically, it is considered that the reflectivity into the resist film from the underlayer film needs to be suppressed to less than or equal to 1%.

As a specific method of allowing the underlayer film to exhibit the function as an anti-reflective film, a method of controlling an optical constant of the resin material for forming an underlayer film has been known.

The reflectivity to the resist layer from the underlayer film can be set to less than or equal to 1% by controlling a refractive index (n value) of the resin material for forming an underlayer film according to the present embodiment at a wavelength of 193 nm which is measured using the following method 2 and an extinction coefficient (k value) of the resin material for forming an underlayer film according to the present embodiment which is measured using the following method 3 such that the n value and the k value are preferably set to be in a range of 1.5 to 2.0 and 0.0001 to 0.5 respectively, more preferably set to be in a range of 1.55 to 1.95 and 0.0001 to 0.4 respectively, and still more preferably set to be in a range of 1.6 to 1.9 and 0.0001 to 0.3 respectively. Further, from the viewpoint of exhibiting the anti-reflection performance, it is preferable that the anti-reflective film has a flat shape. From the viewpoint of forming an anti-reflective film it is preferable that the present embodiment is employed since the surface of the underlayer film can be made to be a flat structure.

Method 2: A coating film which is formed of the resin material for forming an underlayer film and has a thickness of 250 nm is formed on a silicon wafer, and the refractive index (n value) of the obtained coating film at a wavelength of 193 nm is set as the refractive index (n value) of the resin material for forming an underlayer film.

Method 3: A coating film which is formed of the resin material for forming an underlayer film and has a thickness of 250 nm is formed on a silicon wafer, and the extinction coefficient (k value) of the obtained coating film is set as the extinction coefficient (k value) of the resin material for forming an underlayer film.

Further, the average value $H_{av}$ (the film thicknesses of the resist underlayer film at ten optional sites of the surface (α) of the resist underlayer film on a side opposite to the substrate are measured, and the average value of these is set as $H_{av}$) of the film thicknesses (the distances from the upper portion of the substrate to the surface of the underlayer film at several optional sites are measured in a case where the substrate that does not have an uneven structure is used, and the distances from the bottoms of recesses of the uneven surface of the substrate to the surface of the underlayer film are measured in a case where a substrate having an uneven structure is used) of the underlayer film used here is preferably in a range of 5 to 500 nm, more preferably in a range of 7 to 450 nm, and still more preferably in a range of 10 to 400 nm. In a case where the n value and the k value are respectively in the above-described range and the thickness of the underlayer film is in the above-described range, a processed substrate which is free of roughness in the pattern of the photomask and is transferred with high accuracy in the ArF photolithography step can be obtained. <Preparation of Varnish-Like Resin Material for Forming Underlayer Film>

The resin material for forming an underlayer film according to the present embodiment can be made into a varnish-like resin material for forming an underlayer film which is suitable for being applied to the substrate by dissolving or dispersing the cyclic olefin polymer (I) according to the present embodiment and the thermoplastic resin (II) as necessary in an organic solvent and removing foreign matter through a filter having pores according to the size of a desired pattern as necessary.

The organic solvent used here is not particularly limited as long as the cyclic olefin polymer (I) according to the present embodiment and the thermoplastic resin (II) as necessary can be dissolved or dispersed in the solvent.

Examples of the organic solvent include an alcohol-based solvent, an ether-based solvent, a ketone-based solvent, an amide-based solvent, an ester-based solvent, and a hydrocarbon-based solvent.

Examples of the alcohol-based solvent include an aliphatic monoalcohol-based solvent having 1 to 18 carbon atoms such as methanol, ethanol, isopropyl alcohol, 4-methyl-2-pentanol, or n-hexanol; an alicyclic monoalcohol-based solvent having 3 to 18 carbon atoms such as cyclohexanol; a polyhydric alcohol-based solvent having 2 to 18 carbon atoms such as 1,2-propylene glycol or 1,3-butylene glycol; and a polyhydric alcohol partial ether-based solvent having 3 to 19 carbon atoms such as 2-methoxyethanol, 3-methoxypropanol, propylene glycol monomethyl ether, 3-methoxybutanol, propylene glycol-n-propyl ether, diethylene glycol monoethyl ether, propylene glycol-n-butyl ether, dipropylene glycol methyl ether, dipropylene glycol-n-propyl ether, dipropylene glycol-n-butyl ether, tripropylene glycol methyl ether, or tripropylene glycol-n-butyl ether.

Examples of the ether-based solvent include a dialkyl ether-based solvent such as diethyl ether, dipropyl ether, or dibutyl ether; a cyclic ether-based solvent such as tetrahydrofuran or tetrahydropyran; and an aromatic ring-containing ether-based solvent such as diphenyl ether or anisole.

Examples of the ketone-based solvent include a chain-like ketone-based solvent such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-iso-butyl ketone, or trimethyl nonanone;

acyclic ketone-based solvent such as cyclopentanone, cyclohexanone, cycloheptanone, cyclooctanone, or methyl cyclohexanone; and 2,4-pentanedione, acetonyl acetone, or acetophenone.

Examples of the amide-based solvent include a cyclic amide-based solvent such as N,N'-dimethylimidazolidinone or N-methylpyrrolidone; and a chain-like amide-based solvent such as N-methylformamide, N,N-dimethylformamide, N,N-diethylformamide, acetamide, N-methylacetamide, N,N-dimethylacetamide, or N-methylpropionamide.

Examples of the ester-based solvent include a monocarboxylic acid ester-based solvent such as n-butyl acetate, ethyl lactate, or cyclohexanol acetate; a polyhydric alcohol monocarboxylate-based solvent such as propylene glycol acetate, propylene glycol diacetate, 1,4-butanediol diacetate, 1,3-butylene glycol diacetate, 1,6-hexanediol diacetate, or triacetin; a polyhydric alcohol partial ether carboxylate-based solvent such as ethylene glycol monomethyl ether acetate, propylene glycol monomethyl ether acetate, 3-methoxybutyl acetate, ethylene glycol monobutyl ether acetate, diethylene glycol monoethyl ether acetate, dipropylene glycol methyl ether acetate, or diethylene glycol monobutyl ether acetate; a polycarboxylic acid diester-based solvent such as diethyl oxalate; a lactone-based solvent such as y-butyrolactone or 5-valerolactone; and a carbonate-based solvent such as diethyl carbonate, ethylene carbonate, or propylene carbonate.

Examples of the hydrocarbon-based solvent include a linear or branched hydrocarbon having 5 to 10 carbon atoms, an alicyclic hydrocarbon having 5 to 12 carbon atoms, and an aromatic hydrocarbon having 6 to 18 carbon atoms. Some or all hydrogen atoms on a ring of the alicyclic hydrocarbon and the aromatic hydrocarbon may be substituted with a linear or branched alkyl group having 1 to 5 carbon atoms.

Among these, the solvent is selected in consideration of the volatilization rate of the solvent at the time of application, the adaptability to the process, and the productivity, and it is preferable that an oxygen-containing solvent such as a chain-like ketone-based solvent, a cyclic ketone-based solvent, a chain-like ether, or a cyclic ether is selected. The resin material for forming an underlayer film according to the present embodiment may contain one or two or more kinds of solvents.

Further, the concentration of the resin component in the varnish-like resin material for forming an underlayer film according to the present embodiment is preferably in a range of 0.01% to 50.0% by mass, more preferably in a range of 0.1% to 45.0% by mass, and still more preferably in a range of 1.0% to 40.0% by mass. The concentration of the resin component can be selected in consideration of the solubility of the polymer, the adaptability to the filtration process, the film forming property, the thickness of the underlayer film, and the like.

Further, for the purpose of adjusting the physical properties of the material as the underlayer film such as the etching resistance and optical characteristics, a thermosetting resin such as an epoxy resin; a thermosetting monomer; and an oxide of a metal such as zirconium, hafnium, ruthenium, or titanium may be mixed into the resin material for forming an underlayer film according to the present embodiment within the range where the effects of the present invention are not impaired.

Further, in a case of providing the resist layer and the resist underlayer film or an intermediate layer between the resist layer and the resist underlayer film, the resin material for forming an underlayer film according to the present embodiment may contain a crosslinking agent within the range where the effects of the present invention are not impaired, for the purpose of suppressing intermixing of the intermediate layer with the resist underlayer film. Meanwhile, in a case where a crosslinking agent is used, the influence of reaction shrinkage at the time of curing may become significant. For example, in a case where the pattern of unevenness is irregular, the amount of the crosslinking agent is extremely large, and the distance between projects is long, the influence of the shrinkage cannot be ignored in some cases. Accordingly, the flatness may be degraded. Therefore, it is preferable that the content of the crosslinking agent in the material for forming an underlayer film according to the present embodiment is small. From this viewpoint, in a case where the total content of the polymer component contained in the resin material for forming an underlayer film is set to 100 parts by mass, the content of the crosslinking agent in the resin material for forming an underlayer film according to the present embodiment is preferably less than 5 parts by mass, more preferably less than 3 parts by mass, and still more preferably less than 2 parts by mass.

A polyfunctional epoxy compound, an oxetane compound, or the like is suitably used as the crosslinking agent, but the crosslinking agent is not particularly limited to these compounds.

Examples of the polyfunctional epoxy compound include epoxy compounds, for example, alicyclic epoxy resins or glycidyl ether of hydrogenated bisphenol A, such as 1,7-octadiene diepoxide, limonene dioxide, 4-vinyl cyclohexene dioxide, 3,4-epoxycyclohexylmethyl-3',4'-epoxycyclohexane carboxylate, di(3,4-epoxycyclohexyl)adipate, (3,4-epoxy-6-methylcyclohexyl)methyl-3,4-epoxy-6-methylcyclohexa ne carboxylate, ethylene 1,2-di(3,4-epoxycyclohexanecarboxylic acid) ester, 3',4'-epoxycyclohexylmethyl-3,4-epoxycyclohexane carboxylate, bis(3,4-epoxycyclohexylmethyl) adipate, a bisphenol A type epoxy resin, a halogenated bisphenol A type epoxy resin, a bisphenol F type epoxy resin, an o-, m-, or p-cresol novolak type epoxy resin, a phenol novolak type epoxy resin, polyglycidyl ether of polyhydric alcohol, and 3,4-epoxycyclohexenylmethyl-3',4'-epoxycyclohexene carboxylate.

Examples of the polyfunctional oxetane compound include bis(3-ethyl-3-oxetanylmethyl)ether, 1,2-bis[(3-ethyl-3-oxetanylmethoxy)]ethane, 1,3-bis[(3-ethyl-3-oxetanylmethoxy)]propane, 1,3-bis[(3-ethyl-3-oxetanylmethoxy)]-2,2-dimethyl-propane, 1,4-bis(3-ethyl-3-oxetanylmethoxy)butane, 1,6-bis(3-ethyl-3-oxetanylmethoxy)hexane, 1,4-bis[(3-methyl-3-oxetanyl)methoxy]benzene, 1,3-bis[(3-methyl-3-oxetanyl)methoxy]benzene, 1,4-bis{[(3-methyl-3-oxetanyl)methoxy]methyl}cyclohexane, 4,4'-bis{[3-methyl-3-oxetanyl]methoxylmethyl}biphenyl, 4,4'-bis{[(3-methyl-3-oxetanyl)methoxy]methyl}bicyclohexane, 2,3-bis[(3-methyl-3-oxetanyl)methoxy]bicycle[2.2.1]heptane, $^{2,5}$-bis[(3-methyl-3-oxetanyl)methoxy]bicycle[2.2.1]heptane, 2,6-bis[(3-methyl-3-oxetanyl)methoxy]bicycle[2.2.1]heptane, 1,4-bis[(3-ethyl-3-oxetanyl)methoxy]benzene, 1,3-bis[(3-ethyl-3-oxetanyl)methoxy]benzene, 1,4-bis{[3-ethyl-3-oxetanyl]methoxylmethyl}benzene, 1,4-bis-{[(3-ethyl-3-oxetanyl)methoxy]methyl}cyclohexane, 4,4'-bis{[(3-ethyl-3-oxetanyl)methoxy]methyl}biphenyl, 4,4'-bis{[(3-ethyl-3-oxetanyl)methoxy]methyl}bicyclohexane, 2,3-bis[(3-ethyl-3-oxetanyl)methoxy]bicycle[2.2.1]heptane, $^{2,5}$-bis[(3-ethyl-3-oxetanyl)methoxy]bicycle[2.2.1]heptane, and 2,6-bis[(3-ethyl-3-oxetanyl)methoxy]bicycle[2.2.1]heptane. Further, these crosslinking agents may be used alone or in combination of two or more kinds thereof.

Further, the total content of the cyclic olefin polymer (I) and the thermoplastic resin (II) in the resin material for forming an underlayer film according to the present embodiment and particularly in the varnish-like resin material for forming an underlayer film is preferably in a range of 50.0% to 100.0% by mass, more preferably in a range of 60.0% to 100.0% by mass, and still more preferably in a range of 70.0% to 100.0% by mass in the case where the total content of the resin material for forming an underlayer film is set to 100% by mass. The total content of the cyclic olefin polymer (I) and the thermoplastic resin (II) can be selected in consideration of the physical properties of the material as the underlayer film such as the etching resistance and the optical characteristics.

Further, it goes without saying that the total content ratio between the cyclic olefin polymer (I) and the thermoplastic resin (II) is a ratio preferable in a case of forming the resin material for forming an underlayer film according to the present embodiment without being limited to the varnish state.

Next, the varnish-like resin material for forming an underlayer film which has been prepared using the above-described method is filtered by being allowed to pass through a filter. In this manner, polymer insoluble, gels, or foreign matter can be removed from the varnish-like resin material for forming an underlayer film, and a uniform layer as an underlayer film can be formed between the resist film layer and the surface of the substrate.

The opening diameter of the filtration filter is preferably in a range of 1 μm to 0.001 μm, more preferably in a range of 0.5 μm to 0.001 μm, and still more preferably in a range of 0.1 μm to 0.001 μm. The filtration process may be carried out by performing a multi-stage process of sending the varnish from a filter having a large pore diameter to a filter having a small pore diameter or a single process of directly sending the varnish to a filter having a small pore diameter. Examples of the material of the filter include organic materials such as polytetrafluoroethylene (PTFE), polypropylene (PP), polyether sulfone (PES), and cellulose; and inorganic materials such as glass fibers and metals, and the material can be selected in consideration of the varnish characteristics and the process adaptability as long as the material does not affect the function as the underlayer film.

Further, examples of the method of sending the varnish to the filter include a method of using a pressure difference and a method of sending the varnish to the filter using mechanical drive through a screw or the like. In addition, the temperature for the filtration can be selected in consideration of the filter performance, the solution viscosity, and the solubility of the polymer, and the temperature thereof is preferably in a range of −10° C. to 200° C., more preferably in a range of 0° C. to 150° C., and still more preferably in a range of room temperature to 100° C. The temperature thereof can be selected in consideration of the varnish characteristics or the process adaptability unless precipitation or gelation of dissolved components and the like, or modification of the composition such as thermal decomposition or the like due to heating is found.

<Resist Underlayer Film and Method of Producing Resist Underlayer Film>

The resist underlayer film according to the present embodiment can be formed using the resin material for forming an underlayer film according to the present embodiment.

The method of producing the resist underlayer film according to the present embodiment includes a step of forming a coating film containing the resin material for forming an underlayer film according to the present embodiment on the substrate (hereinafter, also referred to as a "coating film forming step"). Further, the method may further include a step of heating the coating film (hereinafter, also referred to as a "baking step") as necessary.

According to the method of producing the resist underlayer film according to the present embodiment, since the resin material for forming an underlayer film according to the present embodiment is used, a resist underlayer film having sufficient optical characteristics, etching resistance, excellent flatness, and a suppressed amount of volatile components generated can be obtained.

Further, the resin material for forming an underlayer film according to the present embodiment has an excellent embedding property with respect to the substrate having a complicated shape. Therefore, according to the method of producing the resist underlayer film according to the present embodiment, a resist underlayer film having sufficient optical characteristics, etching resistance, excellent flatness, and a suppressed amount of volatile components generated can be prepared on a substrate having a complicated shape, such as a substrate having a stepped portion or a substrate having a plurality of trenches.

Hereinafter, each step will be described, but the present invention is not limited thereto.

[Coating Film Forming Step]

In the present step, a coating film containing the resin material for forming an underlayer film according to the present embodiment is formed on the substrate using the resin material for forming an underlayer film according to the present embodiment.

Examples of the substrate include a silicon wafer, an aluminum wafer, and a nickel wafer. An uneven structure may be imparted to a surface of the substrate. The uneven structure may be in a state in which a coating film is formed of a low dielectric material such as a silica ($SiO_2$) film, a SiCN film, a SiOC film obtained by doping silica ($SiO_2$) with carbon (C), a methylsiloxane-based organic film (SOG), or a silica insulating film in which minute holes having a diameter of several nanometers or less are uniformly distributed. As described above, according to the method of producing the resist underlayer film according to the present embodiment, a substrate having a stepped portion or a substrate having a plurality of trenches can be suitably used as the substrate. Therefore, a resist underlayer film having excellent flatness can be formed even in a case where a substrate having such a complicated shape is used.

As the substrate having a plurality of trenches, for example, a substrate having different aspect ratios can also be suitably used.

A substrate having various aspect ratios can be used. For example, in the trenches of the substrate, the ratio between the maximum value and the minimum value among the aspect ratios is preferably in a range of 1 to 30, more preferably in a range of 1 to 25, and still more preferably in a range of 1 to 20.

The method of coating the substrate with the resin material for forming an underlayer film according to the present embodiment is not particularly limited, and examples thereof include a method of coating the substrate with the above-described varnish-like resin material for forming an underlayer film using a method such as spin coating, solution cast coating, roll coating, slit coating, or ink jet coating. The film thicknesses of the coating film formed at this time is preferably in a range of 1 to 2000 nm, more preferably in a range of 1 to 1000 nm, and still more preferably in a range of 1 to 500 nm.

[Baking Step]

In the present step, the coating film formed in the coating film forming step is heated (baked). As a method of baking this coating film, a method of heating the coating film is exemplified. The temperature of heating the coating film is preferably in a range of 100° C. to 400° C., more preferably in a range of 150° C. to 300° C., and still more preferably in a range of 180° C. to 250° C. The heating time is preferably in a range of 5 seconds to 60 minutes, more preferably in a range of 10 seconds to 10 minutes, and still more preferably in a range of 30 seconds to 3 minutes. The coating film may be heated in an air atmosphere or an inert gas atmosphere such as nitrogen gas or argon gas.

Further, examples of the heating mode in the present step include a mode in which the coating film is heated for the purpose of removing a solvent in the coating film and allowed to flow by being heated thereafter to be embedded in the uneven structure of the substrate; a mode in which a foreign substance such as a thermosetting material mixed for the purpose of compensating for the function within the range where the effects of the present invention are not impaired is cured and allowed to flow by being heated thereafter to be embedded in the uneven structure of the substrate; and a mode in which the coating film is heated for the purpose of separating a leaving group in the resin material for forming an underlayer film and allowed to flow by being heated thereafter to be embedded in the uneven structure of the substrate.

The coating film may be heated in the baking step by performing a multi-stage process of increasing the temperature in a stepwise manner.

The average value $H_{av}$ of the film thicknesses of the resist underlayer film to be formed is preferably in a range of 5 to 500 nm, more preferably in a range of 7 to 450 nm, still more preferably in a range of 10 to 400 nm.

The resist underlayer film according to the present embodiment can be used as a step member for forming a pattern using photolithography.

<Laminate>

The laminate according to the present embodiment includes a substrate (a) and a resist underlayer film (b) containing the resin material for forming an underlayer film according to the present embodiment which has been formed on one surface of the substrate (a). It is preferable that the laminate has a structure in which the substrate (a) is in contact with the resist underlayer film (b). Here, the resist underlayer film (b) and the method of producing the resist underlayer film are the same as the resist underlayer film and the method of producing the resist underlayer film according to the present embodiment, and thus the description thereof will not be repeated.

FIG. 4 shows schematic views for describing the film thickness 4 of the resist underlayer film 2, the height 5 of the uneven structure 7, and the interval 6 between projections of the uneven structure 7 in the laminate 10 according to the embodiment of the present invention.

The substrate (a) may be a structure having a flat surface, but it is preferable that one or both surfaces thereof have an uneven structure with a height of preferably 5 to 500 nm, more preferably 7 to 450 nm, and still more preferably 10 to 400 nm.

Here, the above-described height indicates the height 5 of the uneven structure 7 shown in FIG. 4. For example, optional ten heights 5 of the uneven structure 7 are measured, and the average value of these heights can be employed as the height.

Further, the interval between projections in the uneven structure is preferably greater than or equal to 1 nm and less than or equal to 10 mm. The lower limit of the interval between projections in the uneven structure is more preferably 3 nm or greater, more preferably 5 nm or greater, and particularly preferably 10 nm or greater.

Here, the interval between projections in the uneven structure indicates the interval 6 between projections in the uneven structure 7 shown in FIG. 4. For example, optional ten intervals 6 between projections in the uneven structure 7 are measured, and the average value of these intervals can be employed as the interval.

Further, the upper limit of the interval between projections in the uneven structure is more preferably 5 mm or less, more preferably 1 mm or less, and particularly preferably 0.5 mm or less.

From the viewpoint that the effects of the resist underlayer film (b) tend to be significantly exhibited, it is preferable that the substrate (a) has the above-described uneven structure.

The thickness of the substrate (a) is preferably in a range of 0.01 to 10000 μm. The lower limit of the thickness of the substrate (a) is more preferably 0.03 μm or greater, still more preferably 0.05 μm or greater, and particularly preferably 0.10 μm or greater.

The upper limit of the thickness of the substrate (a) is more preferably 5000 μm or less, still more preferably 3000 μm or less, and particularly preferably 1000 μm or less.

In the laminate according to the present embodiment, the flatness (ΔFT) of the surface (a) of the resist underlayer film (b) on a side opposite to the substrate (a) which is calculated by the following equation is preferably in a range of 0% to 5%, more preferably in a range of 0% to 3%, and still more preferably 0% to 1%.

$$\text{nFlatness}(\Delta FT) = [(H_{max} - H_{min})/H_{av}] \times 100 (\%)$$

Here, the film thicknesses of the resist underlayer film (b) are measured in ten optional sites of the surface (a), the average value of these measured values is set as $H_{av}$, the maximum value in the film thicknesses of the resist underlayer film (b) is set as $H_{max}$, and the minimum value in the film thicknesses of the resist underlayer film (b) is set as $H_{min}$.

In this manner, the thickness of the resist layer can be made more uniform regardless of the presence of the intermediate layer, and a desired pattern in lithography can be obtained with excellent reproducibility.

<Pattern Formation Method>

A pattern formation method according to the present embodiment includes a step of forming a resist pattern on an upper surface side of the resist underlayer film according to the present embodiment (hereinafter, also referred to as a "resist pattern forming step"); and a step of sequentially etching the resist underlayer film and the substrate using the resist pattern as a mask (hereinafter, also referred to as an "etching step").

Further, the pattern formation method according to the present embodiment may be performed by forming an intermediate layer on an upper surface side of the resist underlayer film to form a resist pattern on an upper surface side of the intermediate layer in the resist pattern forming step and etching the intermediate layer in the etching step.

According to the pattern formation method according to the present embodiment, an excellent pattern can be formed because the resist underlayer film according to the present embodiment which has sufficient optical characteristics, etching resistance, excellent flatness, and a suppressed amount of volatile components generated is used.

Hereinafter, each step will be described, but the present invention is not limited thereto.

[Resist Pattern Forming Step]

In the present step, a resist pattern is formed on the upper surface side of the resist underlayer film. An intermediate layer is formed on the upper surface side of the resist underlayer film, and the resist pattern is formed on the upper surface side of this intermediate layer.

The intermediate layer indicates a layer that compensates for the functions of the resist underlayer film and/or the resist film or has these functions for imparting the functions that the resist underlayer film and/or the resist film does not have in the formation of the resist pattern or the like. For example, in a case where an anti-reflective film (also referred to as an anti-reflection layer) is formed as an intermediate layer, the intermediate layer can compensate for the anti-reflection function of the resist underlayer film.

Further, in a case where a hard mask layer is formed as an intermediate layer, the influence on the resist underlayer film at the time of using an alkali developer during a developing step is suppressed and/or the insufficient etching resistance of the resist pattern formation layer at the time of etching the substrate formed of silicon, aluminum, nickel, and the like of the lower layer after the underlayer film according to the present embodiment is etched can be compensated.

Further, the intermediate layer formed on the underlayer film according to the present embodiment may include one or both of the anti-reflection layer and the hard mask layer, and the layers may be configured such that the anti-reflection layer or the hard mask layer is formed directly on the underlayer film according to the present embodiment. The layer configuration is suitably selected in consideration of the characteristics of the resist material and the processed substrate material and the productivity.

The intermediate layer can be formed of an organic compound or an inorganic oxide. Examples of the organic compound include DW-42, DW-44, ARC-28, and ARC-29 (all manufactured by Brewer Science, Inc.); and AR-3 and AR-19 (both manufactured by Rohm and Haas Company).

Further, as the inorganic oxide, NFC SOG Series (manufactured by JSR Corporation), and polysiloxane, titanium oxide, alumina oxide, and tungsten formed using a CVD method oxide can be used.

The method of forming the intermediate layer is not particularly limited, and examples thereof include a coating method and a CVD method. Among these, a coating method is preferable. In a case of using the coating method, the intermediate layer can be continuously formed after formation of the resist underlayer film.

Further, the film thickness of the intermediate layer is not particularly limited and can be appropriately selected depending on the function required for the intermediate layer, and the film thickness thereof is preferably in a range of 1 nm to 5 μm, more preferably in a range of 5 nm to 3 μm, and still more preferably in a range of 10 nm to 0.3 μm.

Examples of the method of forming the resist pattern on the upper surface side of the resist underlayer film or the intermediate layer include a method of using photolithography. This method will be described in detail layer, and the present invention is not limited thereto.

The method of using photolithography includes a step of forming a resist film on the upper surface side of the resist underlayer film using a resist composition or the like (hereinafter, also referred to as a "resist film forming step"); a step of exposing the resist film (hereinafter, also referred to as an "exposing step"), and a step of developing the exposed resist film (hereinafter, also referred to as a "developing step").

(Resist Film Forming Step)

In the present step, the resist film is formed on the upper surface side of the resist underlayer film using the resist composition.

Specifically, the resist film is formed by coating the surface with the resist composition such that the resist film to be obtained has a predetermined film thickness and allowing the solvent in the coating film to volatilize by performing pre-baking.

Examples of the resist composition include a positive type or negative type chemically amplified resist composition containing a photoacid generator; a positive type resist composition formed of an alkali-soluble resin and a quinone diazide-based photosensitive agent; and a negative type resist composition formed of an alkali-soluble resin and a crosslinking agent.

The solid content concentration of the resist composition is preferably in a range of 0.1% by mass to 50% by mass, more preferably in a range of 0.5% by mass to 50% by mass, and still more preferably in a range of 1.0% by mass to 50% by mass, and the solid content concentration thereof can be selected to be in an appropriate range in consideration of the target film thickness and the productivity.

Further, it is preferable that the resist composition is prepared by being filtered through a filter having a pore diameter of approximately 0.1 μm. Further, in this step, a commercially available resist composition can be used as it is. The method of coating the surface with the resist composition is not particularly limited and can be performed using a spin coating method, a cast coating method, or a roll coating method.

Further, the pre-baking temperature is appropriately selected depending on the kind of the resist composition to be used, but is preferably in a range of 30° C. to 200° C. and more preferably in a range of 50° C. to 150° C.

(Exposing Step)

In the present step, the resist film formed in the resist film forming step is exposed. The resist film is exposed through, for example, a predetermined mask pattern and liquid immersion as necessary.

The exposure light is appropriately selected from electromagnetic waves such as visible light, ultraviolet rays, fat ultraviolet rays, X rays, and γ rays; and particle beams such as electron beams, molecular beams, ion beams, and a rays depending on the kind of the photoacid generator used in the resist composition. In addition, far ultraviolet rays are preferable; KrF excimer laser light (248 nm), ArF excimer laser light (193 nm), F2 excimer laser light (wavelength of 157 nm), Kr2 excimer laser light (wavelength of 147 nm), ArKr excimer laser light (wavelength of 134 nm), or extreme ultraviolet rays (wavelength of 13 nm and the like) are more preferable, and ArF excimer laser light is still more preferable.

After the exposure, post-baking can be performed in order to improve the resolution, the pattern profile, and the developability of the resist pattern to be formed.

The post-baking temperature is appropriately adjusted depending on the kind of the resist composition to be used, but is preferably in a range of 50° C. to 200° C. and more preferably in a range of 70° C. to 150° C.

(Developing Step)

In the present step, the resist film exposed in the exposing step is developed.

The developer used in the development is appropriately selected depending on the kind of the resist composition to be used. In a case of alkali development, examples of the developer include an alkaline aqueous solution such as sodium hydroxide, potassium hydroxide, sodium carbonate, sodium silicate, sodium metasilicate, ammonia, ethylamine, n-propylamine, diethylamine, di-n-propylamine, trimethylamine, methyl diethylamine, dimethyl ethanolamine, triethanolamine, tetramethyl ammonium hydroxide, tetraethyl ammonium hydroxide, pyrrole, piperidine, choline, 1,8-diazabicyclo[5.4.0]-7-undecene, or 1,5-diazabicyclo[4.3.0]-5-nonene. Further, in a case where the intermediate layer is formed by performing the intermediate layer forming step, the influence on the resist underlayer film of any of these alkaline aqueous solutions can be suppressed.

An appropriate amount of a surfactant or a water-soluble organic solvent of alcohols such as methanol or ethanol can be added to these alkaline aqueous solutions.

Further, a developer containing an organic solvent can be used as the developer. Examples of the organic solvent include esters, ketones, ethers, alcohols, amides, and hydrocarbons. The solvent used in the organic solvent development is appropriately selected depending on the characteristics of the resist underlayer film. After the development using the developer, a predetermined resist pattern is formed by performing washing and drying on the resist film.

Further, as the method of performing the resist pattern forming step, a method of using a nanoimprint method or a method of using a self-assembled composition can be used in addition to the method of using photolithography described above.

[Etching Step]

In the present step, the resist underlayer film and the substrate are sequentially etched using the resist pattern as a mask. In this manner, the pattern is formed on the substrate. Further, in a case of forming an intermediate layer, the intermediate layer is also etched.

The above-described etching may be dry etching or wet etching. The dry etching can be performed using a known dry etching device. In addition, the source gas at the time of dry etching is not particularly limited because the source gas depends on the elemental composition of the material to be etched, and examples of the source gas which can be used include gas containing an oxygen atom such as $O_2$, CO, or $CO_2$; inert gas such as $H_e$, $N_2$, or Ar; chlorine-based gas such as $Cl_2$ or $BCl_3$; fluorine-based gas such as $CHF_3$ or $CF_4$; and gas such as $H_2$ or $NH_3$. Further, these gases can be used by being mixed.

[Step of Removing Underlayer Film Material after Formation of Substrate Pattern]

In the present step, the resist underlayer film which becomes unnecessary is removed after the resist pattern is transferred to the substrate and formed thereon in the etching step.

The removal method may be a dry method or a wet method using a solvent or the like and is suitably selected in consideration of the physical properties of the material and the process adaptability. Further, a combination of the dry method and the wet method may be used as the removal method.

In a case of the dry method, a dry etching device used in the etching step can be used. Accordingly, the dry method is preferable used from the viewpoint of the productivity since there is no need to change the production line at the time of transition from the etching step to the step of removing the underlayer film material.

In the step of removing the underlayer film material, the source gas at the time of using a dry etching device is suitably selected depending on the elemental composition of the material to be etched, and examples of the source gas include gas containing an oxygen atom such as $O_2$, CO, or $CO_2$; inert gas such as $H_e$, $N_2$, or Ar; chlorine-based gas such as $Cl_2$ or $BCl_3$; fluorine-based gas such as $CHF_3$ or $CF_4$; and gas such as $H_2$ or $NH_3$. The gas source is suitably selected depending on the substrate material or the low dielectric material applied to the surface of the substrate. Further, these gases can be used in the form of a mixture of two or more kinds thereof.

EXAMPLES

Hereinafter, the present embodiment will be described in detail with reference to examples and comparative examples. The present embodiment is not limited to the description of these examples.

method of analyzing each resin material for forming an underlayer film (a cyclic olefin polymer (I) or a resin composition obtained by mixing the cyclic olefin polymer (I) and a thermoplastic resin (II) at a predetermined mass ratio) in examples and comparative examples and evaluation of the embedding property and the flatness were performed according to the following methods.

[Weight-Average Molecular Weight (Mw) and Molecular Weight Distribution (Mw/Mn)]

The weight-average molecular weight (Mw) and the number average molecular weight (Mn) of the polymer dissolved in tetrahydrofuran (THF) or trifluorotoluene (TFT) were measured using gel permeation chromatography (GPC) under the following conditions and calculated by calibrating the molecular weight based on polystyrene standards.

Detector: RI-2031 and 875-UV (manufactured by JASCO Corporation) or Model 270 (manufactured by Viscotec GmbH.), Serially connected column: Shodex K-806M, 804, 803, 802.5, Column temperature: 40° C., flow rate: 1.0 ml/min, sample concentration: 3.0 to 9.0 mg/ml.

[Measurement of Hydrogenation Ratio]

A polymer sample was dissolved in deuterated chloroform, and the hydrogenation ratio was measured using the integral value of a peak belonging to hydrogen of double bond carbon in a range of a chemical shift δ of 5.0 to 7.0 ppm under conditions of 270 MHz $^1$H-NMR spectrum.

[Glass Transition Temperature]

The glass transition temperature was measured by heating a measurement sample at a heating rate of 10° C./min in a nitrogen atmosphere using DSC-50 (manufactured by Shimadzu Corporation).

[Method of Evaluating Volatile Component]

A THF solution of the resin material for forming an underlayer film (the cyclic olefin polymer (I) or a resin composition obtained by mixing the cyclic olefin polymer (I) and the thermoplastic resin (II) at a predetermined mass ratio) with a concentration of 20% by mass was weighed using an aluminum plate having a diameter of 5 mm such that the weight thereof was adjusted to 30 mg to 50 mg, and baked at 200° C. for 3 minutes in a nitrogen flow to remove THF. Next, the resultant was cooled to room temperature, and the weight thereof ($W_0$) was measured. Using a sample in a state in which a resin was solidified, the sample was heated from 30° C. to 300° C. at a heating rate of 10° C./min using TGA-60 (manufactured by Shimadzu Corporation) in a nitrogen atmosphere, and the weight thereof was continuously measured along with an increase in temperature to obtain the temperature vs. weight chart. Here, a weight reduction amount ($W_1$) in a temperature range of 100° C. to 250° C. was red from the chart, and the amount of volatile components generated was calculated based on the following equation.

Amount of volatile components generated(% by mass)=$W_1/W_0 \times 100$

[Measurement of Solid Viscoelasticity]

The solid viscoelasticity was measured under conditions of a measurement temperature range of 30° C. to 300° C., a heating rate of 3° C./min, and a frequency of 1 Hz in a nitrogen atmosphere in a shear mode using MCR302 (rheometer) (manufactured by Anton Paar GmbH). More specifically, the measurement was carried out according to the following method.

First, white powder (10 mg) of the resin material for forming an underlayer film (the cyclic olefin polymer (I) or a resin composition obtained by mixing the cyclic olefin polymer (I) and the thermoplastic resin (II) at a predetermined mass ratio) according to the present embodiment was placed in the center of a parallel disk having a diameter of 8 mm which had been heated to 230° C. Next, the powder was interposed using the disk, melted in a nitrogen atmosphere, and cooled to 30° C.

Thereafter, the sample was heated to 300° C. at the above-described heating rate and a frequency of 1 Hz in a shear mode. A graph was obtained by plotting the relationship between the obtained heating temperature, the storage modulus (G'), and the loss modulus (G''), and the temperature at the intersection between the storage modulus (G') curve and the loss modulus (G'') curve was confirmed (see FIGS. 1 and 2).

[Substrate having Surface with Uneven Structure for Evaluating Embedding Property, Flatness, and Difference in Film Thickness in Sparse and Dense Pattern]

Substrate A: A silicon substrate having a size of 3 cm×3 cm, in which a line and space pattern with a height of 200 nm, a projection width of 40 to 800 nm, and a width between projections of 40 to 1500 nm was formed on the surface of the substrate was used.

Substrate B: A silicon substrate having a size of 3 cm×3 cm, in which a line and space pattern with a height of 200 nm, a projection width of 40 nm to 1000 μm, and a width between projections of 40 nm to 1000 μm was formed on the surface of the substrate was used.

[Evaluation of Embedding Property]

The steps up to the baking step were performed, and the sample obtained by forming the resist underlayer film on the uneven surface of the silicon substrate A was divided to expose the surface for observing the cross section. Thereafter, the embedding property was evaluated based on the following evaluation criteria by observing the cross section of the substrate having a height of 200 nm, a projection width of 120 nm, and a width between projections of 40 nm using a scanning electron microscope JSM-6701F (manufactured by JASCO Corporation) (hereinafter, also noted as a SEM).

Uniform: a state without defects such as voids as a result of observation of the cross section using a SEM Non-uniform: a state with defects such as voids as a result of observation of the cross section using a SEM

[Evaluation of Flatness]

Ten film thicknesses of the resist underlayer film from the cross section of the substrate A on which evaluation of the embedding property had been performed were measured, and the average value thereof was set as $H_{av}$. Next, the flatness showing the index of the flatness was calculated using the following equation based on each of the maximum height ($H_{max}$) and the minimum height ($H_{min}$) from the ten measured heights.

Flatness(ΔFT)=$[(H_{max}-H_{min})/H_{av}]\times100$(%)

[Evaluation of Difference in Film Thickness in Sparse and Dense Pattern]

The sample obtained by forming the resist underlayer film on the uneven surface of the silicon substrate B was divided to expose the surface for observing the cross section using a SEM, and the difference in film thickness of a portion where the line and space with unevenness in a sparse and dense pattern was formed as in FIG. 3-2 was measured and evaluated. In FIG. 3-2, $a_1$ was 900 μm, $b_1$ was 800 nm, $a_2$ was 40 nm, and $b_2$ was 800 nm. Ten film thicknesses from the surfaces of projections to the atmospheric surface in each of the pattern regions were measured, an average value $H_1$ and an average value $H_2$ were respectively acquired, and an equation of "an absolute value ΔFT (sparse and dense)=|$H_1$-$H_2$|" of a difference in average film thickness on projections in two pattern regions was calculated and evaluated based on the following evaluation criteria.

Excellent: The value of ΔFT (sparse and dense) was greater than or equal to 0 nm and less than or equal to 10 nm Good: The value of ΔFT (sparse and dense) was greater than or equal to 11 nm and less than or equal to 20 nm Bad: The value of ΔFT (sparse and dense) was 21 nm or greater

[Measurement of n Value and k Value]

The n value and the k value were measured at optional three points of a measurement sample having a size of 20 mm×20 mm, obtained by being applied to a silicon wafer such that the thickness thereof was set to 250 nm, in an environment of a temperature of 23° C. to 25° C. and a humidity of 50% to 55% using a spectroscopic ellipsometer GES5E (manufactured by Semilab Inc.). Based on the measurement results, the refractive indices (n value) and the extinction coefficients (k value) at a wavelength of 193 nm were calculated, and the n value and the k value were respectively acquired from the three average values.

Here, the measurement sample was prepared according to the following method.

In a case where the cyclic olefin polymer (I) was used as the resin material for forming an underlayer film according to the present embodiment, a propylene glycol-1-monomethyl ether-2-acetate (hereinafter, noted as PGMEA) solution in which the cyclic olefin polymer (I) was dissolved at a concentration of 10% by mass was prepared, and a 4-inch silicon wafer was spin-coated with the obtained solution. Next, the resulting wafer was baked at 200° C. for 3 minutes in a nitrogen atmosphere. The sample was cooled to room temperature, cut out into a size of 20 mm×20 mm, and used as a sample for measurement.

Further, in a case where a resin composition obtained by mixing the cyclic olefin polymer (I) and the thermoplastic resin (II) at a predetermined mass ratio was used as the resin material for forming an underlayer film according to the present embodiment, a solution obtained by dissolving the resin material for forming an underlayer film according to the present embodiment at a concentration of 10% by mass in a mixed solvent containing PGMEA and cyclohexanone (hereinafter, noted as CH) at a mass ratio of PGMEA/CH of 50/50 was prepared, and a 4-inch silicon wafer was spin-coated with the obtained solution. Next, the resulting wafer was baked at 200° C. for 3 minutes in a nitrogen atmosphere. The sample was cooled to room temperature, cut out into a size of 20 mm×20 mm, and used as a sample for measurement.

[Evaluation of Plasma Etching Characteristics]

A parallel plate type plasma treatment device RIH1515Z (manufactured by ULVAC, Inc.) was used. First, the plasma etching treatment was performed by placing a sample in a chamber, reducing the pressure inside the chamber to 1 Pa or less, introducing 30 sccm of $CHF_3$ gas to the chamber, maintaining the pressure inside the chamber at 7 Pa, and applying a high frequency powder of 13.56 MHz for plasma discharge. The plasma etching treatment was performed for 30 seconds, 60 seconds, and 90 seconds.

[Method of Measuring Etching Rate]

The film thickness of the surface of the etched substrate was measured at three points using a spectroscopic ellipsometer GESSE (manufactured by Semilab Inc.), and the film thickness was calculated from the average value. Next, the amount of decrease in film thickness due to the etching was calculated from the film thicknesses before and after the etching, and the time (sec) was plotted on the horizontal axis and the amount (nm) of the reduced film thickness was plotted on the vertical axis. The etching rate (nm/sec) was calculated from the inclination of the obtained graph.

[Evaluation of Removal of Underlayer Film Material Using $O_2$ Etching]

The resist underlayer film according to the present embodiment was formed on a silicon substrate having a size of 3 cm×3 cm, in which a line and space pattern with a height of 200 nm, a projection width of 100 nm, and a width between projections of 100 nm was formed on the surface of the substrate.

The sample obtained by forming the resist underlayer film on the uneven surface of the silicon substrate was divided to perform observation using a SEM on the cross section of one of the sample pieces before removal of the underlayer film material.

The removal characteristics of the underlayer film material resulting from $O_2$ etching were evaluated using the other sample piece according to the following method.

The removal characteristics of the underlayer film material were evaluated using the same plasma treatment device as the device used for evaluation of the plasma etching characteristics. First, the sample was placed in a chamber, the pressure inside the chamber was reduced to 1 Pa or less, 30 sccm of $O_2$ gas was introduced to the chamber, and the pressure inside the chamber was maintained at 7 Pa. Next, a high frequency powder of 13.56 MHz was applied thereto for plasma discharge. The plasma etching treatment was carried out in this manner. The plasma etching treatment was performed for 60 seconds.

After the plasma etching treatment, the removal characteristics of the underlayer film material were evaluated by performing observation on the cross section of the sample after removal of the underlayer film material using a SEM and comparing SEM observation images before and after the plasma etching.

Example 1

In a 5 L autoclave provided with a magnetic stirrer in a nitrogen atmosphere, 320 g (2 mol) of tetracyclo[$4.4.0.1^{2,5}.1^{7,10}$]-3-dodecene having the structural unit [A], 304 g (2 mol) of 4,10-dioxy-tricyclo[$5.2.1.0^{2,6}$]-8-decene-3-one having the structural unit [B], and 21 g (0.25 mol) of 1,5-hexadiene were dissolved in 3.4 kg of tetrahydrofuran (hereinafter, referred to as THF), and the solution was stirred.

As a ring opening metathesis polymerization catalyst, 612 mg (0.8 mmol) of Mo(N-2,6-$Pr^i_2C_6H_3$) ($CHCMe_2Ph$) ($OCMe(CF_3)_2$)$_2$ was added thereto to cause a reaction at 60° C. for 3 hours. Thereafter, 173 mg (2.4 mmol) of n-butyl-aldehyde was added thereto, and the solution was cooled, thereby obtaining 4.0 kg of a ring opening metathesis polymer solution. In the obtained polymer, the polymerization rate thereof was 100%, the Mw was 5700, the ratio of Mw/Mn was 1.61, and the molar ratio ([A]/[B]) of the structural unit [A] to the structural unit [B] which was analyzed by $^1$HNMR was 50/50.

Next, the cyclic olefin polymer was precipitated from the obtained ring opening metathesis polymer solution using methanol and dried at 80° C. under reduced pressure, thereby obtaining a white power solid (polymer 1).

The glass transition temperature of the polymer 1 was 151° C.

Further, the amount of the volatile components generated in the polymer 1 was 0.0% by mass.

In addition, the temperature at the intersection between the storage modulus (G') curve and the loss modulus (G") curve calculated from the results obtained by measuring the solid viscoelasticity of the polymer 1 was 173° C. (see FIG. 1).

Next, a solution containing propylene glycol-1-monomethyl ether-2-acetate (hereinafter, noted as PGMEA) and cyclohexanone (hereinafter, also referred to as CH) at a mass ratio (PGMEA/cyclohexanone) of 5/5, in which the obtained polymer 1 was dissolved at a concentration of 10% by mass, was prepared, and the surface of the silicon substrate A and the surface of the silicon substrate B were coated with the solution under conditions of 1000 rpm for 10 sec. Thereafter, the surfaces were heated at 200° C. for 3 minutes in a nitrogen atmosphere.

The refractive index (n value) of the polymer 1 measured using an ellipsometer was 1.66 and the extinction coefficient (k value) thereof was 0.08.

As the result of observation performed on the cross section of the substrate A using a SEM, the polymer 1 was uniformly embedded without defects such as voids with respect to grooves with a narrow line width of 40 nm (height of 200 nm) between projections. Further, the thickness ($H_{av}$) of the layer of the polymer 1 obtained by measuring ten distances between the bottoms of recesses to the atmospheric surface and averaging the obtained values was 300 nm, the maximum height ($H_{max}$) was 301 nm, the minimum height ($H_{min}$) was 300 nm, and the flatness (ΔFT) was 0.3%.

Further, as the result of observation performed on the cross section of the silicon substrate B using a SEM, the thickness of an $H_1$ layer in a region where $a_1$ was 900 μm and $b_1$ was 800 nm was 213 nm, the thickness of an $H_2$ layer in a region where $a_2$ was 40 nm and $b_2$ was 800 nm was 230 nm, and the difference in film thickness in the sparse and dense pattern of the polymer 1 was 17 nm.

In addition, each evaluation was performed using the polymer 1. The obtained results are listed in Table 1.

Example 2

2.5 kg of a ring opening metathesis polymer solution was obtained according to the same method as that in Example 1 except that the monomer having the structural unit [A] was changed to 8-methoxycarbonyl-tetracyclo[$4.4.0.1^{2,5}.1^{7,10}$]-3-dodecene. In the obtained polymer, the polymerization rate thereof was 100%, the Mw was 6300, the ratio of Mw/Mn was 1.50, and the molar ratio ([A]/[B]) of the structural unit [A] to the structural unit [B] which was analyzed by $^1$HNMR was 50/50.

Next, the polymer was precipitated and dried according to the same method as that in Example 1 to obtain a white power solid (polymer 2).

The glass transition temperature of the polymer 2 was 150° C. Further, the amount of the volatile components generated in the polymer 2 was 0.0% by mass.

In addition, the temperature at the intersection between the storage modulus (G') curve and the loss modulus (G") curve to be calculated from the results obtained by measuring the solid viscoelasticity of the polymer 2 was 167° C.

Next, samples obtained by coating the uneven surface of the silicon substrate A and the uneven surface of the silicon substrate B with the polymer 2 were prepared according to the same method as that in Example 1.

The refractive index (n value) of the polymer 2 measured using an ellipsometer was 1.66 and the extinction coefficient (k value) thereof was 0.04.

As the result of observation performed on the cross section of the substrate A using a SEM, the polymer 2 was uniformly embedded without defects such as voids with respect to grooves with a narrow line width of 40 nm (height of 200 nm) between projections. Further, all measured values obtained by measuring ten distances between the bottoms of recesses to the atmospheric surface were 299 nm, and the flatness (ΔFT) was 0.0%.

Further, as the result of observation performed on the cross section of the substrate B using a SEM, the thickness of the $H_1$ layer in a region where $a_1$ was 900 μm and $b_1$ was 800 nm was 216 nm, the thickness of the $H_2$ layer in a region where $a_2$ was 40 nm and $b_2$ was 800 nm was 232 nm, and the difference in film thickness in the sparse and dense pattern of the polymer 2 was 16 nm.

In addition, each evaluation was performed using the polymer 2. The obtained results are listed in Table 1.

Example 3

4.1 kg of a ring opening metathesis polymer solution was obtained according to the same method as that in Example 1 except that the monomer having the structural unit [A] was changed to 8-(1-ethylcyclopentyloxycarbonyl)-tetracyclo[$4.4.0.1^{2,5}.1^{7,10}$]-3-dodecene. In the obtained polymer, the polymerization rate thereof was 100%, the Mw was 7200, the ratio of Mw/Mn was 1.50, and the molar ratio ([A]/[B]) of the structural unit [A] to the structural unit [B] which was analyzed by $^1$HNMR was 50/50.

Next, the polymer was precipitated and dried according to the same method as that in Example 1 to obtain a white power solid (polymer 3).

The glass transition temperature of the polymer 3 was 130° C.

Further, the amount of the volatile components generated in the polymer 3 was 0.0% by mass.

In addition, the temperature at the intersection between the storage modulus (G') curve and the loss modulus (G") curve to be calculated from the results obtained by measuring the solid viscoelasticity of the polymer 3 was 151° C.

Next, samples obtained by coating the uneven surface of the silicon substrate A and the uneven surface of the silicon substrate B with the polymer 3 were prepared according to the same method as that in Example 1.

The refractive index (n value) of the polymer 3 measured using an ellipsometer was 1.68 and the extinction coefficient (k value) thereof was 0.02.

As the result of observation performed on the cross section of the substrate A using a SEM, the polymer 3 was uniformly embedded without defects such as voids with respect to grooves with a narrow line width of 40 nm (height of 200 nm) between projections. Further, the thickness ($H_{av}$) of the layer of the polymer 3 obtained by measuring ten distances between the bottoms of recesses to the atmospheric surface and averaging the obtained values was 302 nm, the maximum height ($H_{max}$) was 303 nm, the minimum height ($H_{min}$) was 301 nm, and the flatness (ΔFT) was 0.7%.

Further, as the result of observation performed on the cross section of the substrate B using a SEM, the thickness of the $H_1$ layer in a region where $a_1$ was 900 and $b_1$ was 800 nm was 211 nm, the thickness of the $H_2$ layer in a region where $a_2$ was 40 nm and $b_2$ was 800 nm was 224 nm, and the difference in film thickness in the sparse and dense pattern of the polymer 3 was 13 nm.

In addition, each evaluation was performed using the polymer 3. The obtained results are listed in Table 1.

Example 4

4.2 kg of a ring opening metathesis polymer solution was obtained by dissolving 437 g (2 mol) of 8-methoxycarbonyl-tetracyclo[$4.4.0.1^{2,5}.1^{7,10}$]-3-dodecene having the structural unit [A], 121 g (0.5 mol) of 4-phenyl-4-aza-10-oxy-tricyclo[$5.2.1.0^{2,6}$]-8-decene-3,5-dione having the structural unit [B], and 21 g (0.25 mol) of 1,5-hexadiene in 3.7 kg of THF and carrying out the rest of the process according to the same method as that in Example 1.

Next, 11.4 g (dry mass of 5.6 g) of 5% Rh carbon having a moisture content of 50.7% was added to the obtained ring opening metathesis polymer solution as a hydrogenation catalyst to cause a hydrogenation reaction at 100° C. and a hydrogen pressure of 5 MPa for 12 hours. In the obtained polymer, the hydrogenation ratio thereof was 100% by mole, the Mw was 7800, the ratio of Mw/Mn was 1.57, and the molar ratio ([A]/[B]) of the structural unit [A] to the structural unit [B] which was analyzed by $^1$HNMR was 80/20.

Next, the polymer was precipitated and dried according to the same method as that in Example 1 to obtain a white power solid (polymer 4).

The glass transition temperature of the polymer 4 was 172° C.

Further, the amount of the volatile components generated in the polymer 4 was 0.0% by mass.

In addition, the temperature at the intersection between the storage modulus (G') curve and the loss modulus (G") curve to be calculated from the results obtained by measuring the solid viscoelasticity of the polymer 4 was 190° C.

Next, samples obtained by coating the uneven surface of the silicon substrate A and the uneven surface of the silicon substrate B with the polymer 4 were prepared according to the same method as that in Example 1.

The refractive index (n value) of the polymer 4 measured using an ellipsometer was 1.71 and the extinction coefficient (k value) thereof was 0.09.

As the result of observation performed on the cross section of the substrate A using a SEM, the polymer 4 was uniformly embedded without defects such as voids with respect to grooves with a narrow line width of 40 nm (height of 200 nm) between projections. Further, the thickness ($H_{av}$) of the layer of the polymer 4 obtained by measuring ten distances between the bottoms of recesses to the atmospheric surface and averaging the obtained values was 310 nm, the maximum height ($H_{max}$) was 311 nm, the minimum height ($H_{min}$) was 309 nm, and the flatness (ΔFT) was 0.6%.

Further, as the result of observation performed on the cross section of the substrate B using a SEM, the thickness of the $H_1$ layer in a region where $a_1$ was 900 μm and $b_1$ was 800 nm was 219 nm, the thickness of the $H_2$ layer in a region where $a_2$ was 40 nm and $b_2$ was 800 nm was 237 nm, and the difference in film thickness in the sparse and dense pattern of the polymer 4 was 18 nm.

In addition, each evaluation was performed using the polymer 4. The obtained results are listed in Table 1.

Example 5

The polymer 1 obtained in Example 1 as the cyclic olefin polymer (I) and polyhydroxystyrene (manufactured by Polysciences, Inc., product name: Poly(4-vinylphenol), weight-average molecular weight in terms of styrene: 5300) as the thermoplastic resin (II) were mixed at a mass ratio of 50/50, thereby obtaining a resin composition 1.

Using the resin composition 1, the glass transition temperature of the sample for measurement which had been prepared according to the same method as the method of evaluating the volatile components was 105° C., and the amount of the volatile components generated was 0.0% by mass.

In addition, the temperature at the intersection between the storage modulus (G') curve and the loss modulus (G") curve calculated from the results obtained by measuring the solid viscoelasticity of the resin composition 1 was 124° C. (see FIG. 2).

Here, the polymer 1 obtained in Example 1 and polyhydroxystyrene were dissolved in an organic solvent containing PGMEA and CH at a mass ratio of 50/50 such that the concentration of the polymer 1 and the concentration of the hydroxystyrene were respectively set to 5% by mass (total resin concentration: 10% by mass) to prepare a mixed solution. The obtained mixed solution was filtered using a membrane filter having a pore diameter of 0.1 μm to obtain a resin composition 1 for forming an underlayer film. The surface of the silicon substrate A and the surface of the silicon substrate B were coated using the resin composition 1 for forming an underlayer film under conditions of 1000 rpm for 10 sec. Thereafter, the surfaces were heated at 200° C. for 3 minutes in a nitrogen atmosphere.

The refractive index (n value) of the resin composition 1 for forming an underlayer film measured using an ellipsometer was 1.97 and the extinction coefficient (k value) thereof was 0.02.

As the result of observation performed on the cross section of the substrate A using a SEM, the resin composition 1 was uniformly embedded without defects such as voids with respect to grooves with a narrow line width of 40 nm (height of 200 nm) between projections. Further, the thickness ($H_{av}$) of the layer of the resin composition 1 obtained by measuring ten distances between the bottoms of recesses to the atmospheric surface and averaging the obtained values was 301 nm, the maximum height ($H_{max}$) was 303 nm, the minimum height ($H_{min}$) was 301 nm, and the flatness (ΔFT) was 0.7%.

Further, as the result of observation performed on the cross section of the substrate B using a SEM, the thickness of the $H_1$ layer in a region where $a_1$ was 900 μm and $b_1$ was 800 nm was 225 nm, the thickness of the $H_2$ layer in a region where $a_2$ was 40 nm and $b_2$ was 800 nm was 230 nm, and the difference in film thickness in the sparse and dense pattern of the resin composition 1 was 5 nm.

In addition, each evaluation was performed using the resin composition 1. The obtained results are listed in Table 3.

Example 6

A resin composition 2 was prepared according to the same method as that in Example 5 except that the polymer 2 obtained in Example 2 was used in place of the polymer 1. The glass transition temperature of the resin composition 2 was 107° C. and the amount of the volatile components generated was 0.0% by mass.

The temperature at the intersection between the storage modulus (G') curve and the loss modulus (G") curve to be calculated from the results obtained by measuring the solid viscoelasticity of the resin composition 2 was 122° C.

Next, a resin composition 2 for forming an underlayer film was prepared according to the same method as that in Example 5. Next, samples obtained by coating the uneven surface of the silicon substrate A and the uneven surface of the silicon substrate B with the resin composition 2 were prepared according to the same method as that in Example 5.

The refractive index (n value) of the resin composition 2 for forming an underlayer film measured using an ellipsometer was 1.94 and the extinction coefficient (k value) thereof was 0.05.

As the result of observation performed on the cross section of the substrate A using a SEM, the resin composition 2 was uniformly embedded without defects such as voids with respect to grooves with a narrow line width of 40 nm (height of 200 nm) between projections. Further, the thickness ($H_{av}$) of the layer of the resin composition 2 obtained by measuring ten distances between the bottoms of recesses to the atmospheric surface and averaging the obtained values was 299 nm, the maximum height ($H_{max}$) was 300 nm, the minimum height ($H_{min}$) was 299 nm, and the flatness (ΔFT) was 0.3%.

Further, as the result of observation performed on the cross section of the substrate B using a SEM, the thickness of the $H_1$ layer in a region where $a_1$ was 900 μm and $b_1$ was 800 nm was 225 nm, the thickness of the $H_2$ layer in a region where $a_2$ was 40 nm and $b_2$ was 800 nm was 232 nm, and the difference in film thickness in the sparse and dense pattern of the resin composition 2 was 7 nm.

In addition, each evaluation was performed using the resin composition 2. The obtained results are listed in Table 3.

Example 7

A resin composition 3 was prepared according to the same method as that in Example 5 except that the polymer 3 obtained in Example 3 was used in place of the polymer 1. The glass transition temperature of the resin composition 3 was 102° C. and the amount of the volatile components generated was 0.0% by mass.

The temperature at the intersection between the storage modulus (G') curve and the loss modulus (G") curve to be calculated from the results obtained by measuring the solid viscoelasticity of the resin composition 3 was 118° C.

Next, a resin composition 3 for forming an underlayer film was prepared according to the same method as that in Example 5. Next, samples obtained by coating the uneven surface of the silicon substrate A and the uneven surface of the silicon substrate B with the resin composition 3 were prepared according to the same method as that in Example 5.

The refractive index (n value) of the resin composition 3 for forming an underlayer film measured using an ellipsometer was 1.85 and the extinction coefficient (k value) thereof was 0.04.

As the result of observation performed on the cross section of the substrate A using a SEM, the resin composition 3 was uniformly embedded without defects such as voids with respect to grooves with a narrow line width of 40 nm (height of 200 nm) between projections. Further, the thickness ($H_{av}$) of the layer of the resin composition 3 obtained by measuring ten distances between the bottoms of recesses to the atmospheric surface and averaging the obtained values was 302 nm, the maximum height ($H_{max}$) was 303 nm, the minimum height ($H_{min}$) was 301 nm, and the flatness (ΔFT) was 0.7%.

Further, as the result of observation performed on the cross section of the substrate B using a SEM, the thickness of the $H_1$ layer in a region where $a_1$ was 900 μm and $b_1$ was 800 nm was 219 nm, the thickness of the $H_2$ layer in a region where $a_2$ was 40 nm and $b_2$ was 800 nm was 225 nm, and the difference in film thickness in the sparse and dense pattern of the resin composition 3 was 6 nm.

In addition, each evaluation was performed using the resin composition 3. The obtained results are listed in Table 3.

Example 8

A resin composition 4 was prepared according to the same method as that in Example 5 except that the polymer 4 obtained in Example 4 was used in place of the polymer 1. The glass transition temperature of the resin composition 4 was 132° C. and the amount of the volatile components generated was 0.0% by mass.

The temperature at the intersection between the storage modulus (G') curve and the loss modulus (G") curve to be calculated from the results obtained by measuring the solid viscoelasticity of the resin composition 4 was 150° C.

Next, a resin composition 4 for forming an underlayer film was prepared according to the same method as that in Example 5. Next, samples obtained by coating the uneven surface of the silicon substrate A and the uneven surface of the silicon substrate B with the resin composition 4 were prepared according to the same method as that in Example 5.

The refractive index (n value) of the resin composition 4 for forming an underlayer film measured using an ellipsometer was 1.81 and the extinction coefficient (k value) thereof was 0.08.

As the result of observation performed on the cross section of the substrate A using a SEM, the resin composition 4 was uniformly embedded without defects such as voids with respect to grooves with a narrow line width of 40 nm (height of 200 nm) between projections. Further, the thickness ($H_{av}$) of the layer of the resin composition 4 obtained by measuring ten distances between the bottoms of recesses to the atmospheric surface and averaging the obtained values was 300 nm, the maximum height ($H_{max}$) was 302 nm, the minimum height ($H_{min}$) was 300 nm, and the flatness (ΔFT) was 0.6%.

Further, as the result of observation performed on the cross section of the substrate B using a SEM, the thickness of the $H_1$ layer in a region where $a_1$ was 900 μm and $b_1$ was 800 nm was 220 nm, the thickness of the $H_2$ layer in a region where $a_2$ was 40 nm and $b_2$ was 800 nm was 228 nm, and the difference in film thickness in the sparse and dense pattern of the resin composition 4 was 8 nm.

In addition, each evaluation was performed using the resin composition 4. The obtained results are listed in Table 3.

Example 9

188 g (2 mol) of bicycle [2.2.1]hept-2-ene having the structural unit [A], 304 g (2 mol) of 4,10-dioxy-tricyclo[5.2.1.0$^{2,6}$]-8-decene-3-one having the structural unit [B], and 36 g (0.44 mol) of 1,5-hexadiene were dissolved in 2.8 kg of THF to obtain 3.3 kg of a ring opening metathesis polymer solution according to the same method as that in Example 1. In the obtained polymer, the polymerization rate thereof was 100%, the Mw was 6800, the ratio of Mw/Mn was 2.84, and the molar ratio ([A]/[B]) of the structural unit [A] to the structural unit [B] which was analyzed by $^1$HNMR was 50/50.

Next, the polymer was precipitated and dried at 60° C. under reduced pressure according to the same method as that in Example 1 to obtain a white power solid (polymer 5). The glass transition temperature of the polymer 5 was 72° C. Further, the amount of the volatile components generated in the polymer 5 was 0.0% by mass.

In addition, the temperature at the intersection between the storage modulus (G') curve and the loss modulus (G") curve to be calculated from the results obtained by measuring the solid viscoelasticity of the polymer 5 was 84° C.

Next, samples obtained by coating the uneven surface of the silicon substrate A and the uneven surface of the silicon substrate B with the polymer 5 were prepared according to the same method as that in Example 1.

The refractive index (n value) of the polymer 5 measured using an ellipsometer was 1.68 and the extinction coefficient (k value) thereof was 0.01.

As the result of observation performed on the cross section of the substrate A using a SEM, the polymer 5 was uniformly embedded without defects such as voids with respect to grooves with a narrow line width of 40 nm (height of 200 nm) between projections. Further, all measured values obtained by measuring ten distances between the bottoms of recesses to the atmospheric surface were 315 nm, and the flatness (ΔFT) was 0.0%.

Further, as the result of observation performed on the cross section of the substrate B using a SEM, the thickness of the $H_1$ layer in a region where $a_1$ was 900 μm and $b_1$ was 800 nm was 220 nm, the thickness of the $H_2$ layer in a region where $a_2$ was 40 nm and $b_2$ was 800 nm was 226 nm, and the difference in film thickness in the sparse and dense pattern of the polymer 5 was 6 nm.

In addition, each evaluation was performed using the polymer 5. The obtained results are listed in Table 1.

Example 10

Samples obtained by coating the uneven surface of the silicon substrate A and the uneven surface of the silicon substrate B with the polymer 5 were prepared according to the same method as that in Example 9 except that a solution containing the polymer 5 obtained in Example 9 at a concentration of 7% by mass, and PGMEA and cyclohexanone at a mass ratio of 5/5, was prepared.

As the result of observation performed on the cross section of the substrate A using a SEM, the polymer 5 was uniformly embedded without defects such as voids with respect to grooves with a narrow line width of 40 nm (height of 200 nm) between projections. Further, all measured values obtained by measuring ten distances between the bottoms of recesses to the atmospheric surface were 208 nm, and the flatness (ΔFT) was 0.0%.

Further, as the result of observation performed on the cross section of the substrate B using a SEM, the thickness of the $H_1$ layer in a region where $a_1$ was 900 μm and $b_1$ was 800 nm was 208 nm, the thickness of the $H_2$ layer in a region where $a_2$ was 40 nm and $b_2$ was 800 nm was 208 nm, and the difference in film thickness in the sparse and dense pattern of the polymer 5 was 0 nm.

In addition, each evaluation was performed using the polymer 5. The obtained results are listed in Table 1.

Example 11

Samples obtained by coating the uneven surface of the silicon substrate A and the uneven surface of the silicon substrate B with the polymer 5 were prepared according to the same method as that in Example 9 except that a solution containing the polymer 5 obtained in Example 9 at a concentration of 20% by mass and PGMEA and cyclohexanone at a mass ratio of 5/5 was prepared and the surfaces were coated under conditions of 600 rpm for 10 sec.

As the result of observation performed on the cross section of the substrate A using a SEM, the polymer 5 was uniformly embedded without defects such as voids with respect to grooves with a narrow line width of 40 nm (height of 200 nm) between projections. Further, all measured values obtained by measuring ten distances between the bottoms of recesses to the atmospheric surface were 1622 nm, and the flatness (ΔFT) was 0.0%.

Further, as the result of observation performed on the cross section of the substrate B using a SEM, the thickness of the $H_1$ layer in a region where $a_1$ was 900 μm and $b_1$ was 800 nm was 1622 nm, the thickness of the $H_2$ layer in a region where $a_2$ was 40 nm and $b_2$ was 800 nm was 1622 nm, and the difference in film thickness in the sparse and dense pattern of the polymer 5 was 0 nm.

In addition, each evaluation was performed using the polymer 5. The obtained results are listed in Table 1.

Example 12

469 g (2 mol) of 5-(1-ethylcyclopentyloxycarbonyl)-bicyclo[2.2.1]hept-2-ene having the structural unit [A], 304 g (2 mol) of 4,10-dioxy-tricyclo[$5.2.1.0^{2,6}$]-8-decene-3-one having the structural unit [B], and 42 g (0.51 mol) of 1,5-hexadiene were dissolved in 3.8 kg of THF to obtain 4.5 kg of a ring opening metathesis polymer solution according to the same method as that in Example 1. In the obtained polymer, the polymerization rate thereof was 100%, the Mw was 5600, the ratio of Mw/Mn was 1.92, and the molar ratio ([A]/[B]) of the structural unit [A] to the structural unit [B] which was analyzed by $^1$HNMR was 50/50.

Next, the polymer was precipitated and dried at 50° C. under reduced pressure according to the same method as that in Example 1 to obtain a white power solid (polymer 6).

The glass transition temperature of the polymer 6 was 56° C.

Further, the amount of the volatile components generated in the polymer 6 was 0.0% by mass.

In addition, the temperature at the intersection between the storage modulus (G') curve and the loss modulus (G") curve to be calculated from the results obtained by measuring the solid viscoelasticity of the polymer 6 was 76° C.

Next, samples obtained by coating the uneven surface of the silicon substrate A and the uneven surface of the silicon substrate B with the polymer 6 were prepared according to the same method as that in Example 1.

The refractive index (n value) of the polymer 6 measured using an ellipsometer was 1.78 and the extinction coefficient (k value) thereof was 0.02.

As the result of observation performed on the cross section of the substrate A using a SEM, the polymer 6 was uniformly embedded without defects such as voids with respect to grooves with a narrow line width of 40 nm (height of 200 nm) between projections. Further, all measured values obtained by measuring ten distances between the bottoms of recesses to the atmospheric surface were 311 nm, and the flatness (ΔFT) was 0.0%.

Further, as the result of observation performed on the cross section of the substrate B using a SEM, the thickness of the $H_1$ layer in a region where $a_1$ was 900 μm and $b_1$ was 800 nm was 213 nm, the thickness of the $H_2$ layer in a region where $a_2$ was 40 nm and $b_2$ was 800 nm was 218 nm, and the difference in film thickness in the sparse and dense pattern of the polymer 6 was 5 nm.

In addition, each evaluation was performed using the polymer 6. The obtained results are listed in Table 2.

Example 13

469 g (2 mol) of 5-(1-ethylcyclopentyloxycarbonyl)-bicyclo[2.2.1]hept-2-ene having the structural unit [A], 304 g (2 mol) of 4,10-dioxy-tricyclo[$5.2.1.0^{2,6}$]-8-decene-3-one having the structural unit [B], and 42 g (0.51 mol) of 1,5-hexadiene were dissolved in 3.8 kg of THF to obtain 4.5 kg of a ring opening metathesis polymer solution according to the same method as that in Example 1. In the obtained polymer, the polymerization rate thereof was 100%, the Mw was 7300, the ratio of Mw/Mn was 2.17, and the molar ratio ([A]/[B]) of the structural unit [A] to the structural unit [B] which was analyzed by $^1$HNMR was 50/50.

Next, the polymer was precipitated and dried at 50° C. under reduced pressure according to the same method as that in Example 1 to obtain a white power solid (polymer 7).

The glass transition temperature of the polymer 7 was 58° C.

Further, the amount of the volatile components generated in the polymer 7 was 0.0% by mass.

In addition, the temperature at the intersection between the storage modulus (G') curve and the loss modulus (G") curve to be calculated from the results obtained by measuring the solid viscoelasticity of the polymer 7 was 81° C.

Next, samples obtained by coating the uneven surface of the silicon substrate A and the uneven surface of the silicon substrate B with the polymer 7 were prepared according to the same method as that in Example 1.

The refractive index (n value) of the polymer 7 measured using an ellipsometer was 1.78 and the extinction coefficient (k value) thereof was 0.01.

As the result of observation performed on the cross section of the substrate A using a SEM, the polymer 7 was uniformly embedded without defects such as voids with respect to grooves with a narrow line width of 40 nm (height of 200 nm) between projections. Further, all measured values obtained by measuring ten distances between the bottoms of recesses to the atmospheric surface were 305 nm, and the flatness (ΔFT) was 0.0%.

Further, as the result of observation performed on the cross section of the substrate B using a SEM, the thickness of the H$_1$ layer in a region where a$_1$ was 900 μm and b$_1$ was 800 nm was 216 nm, the thickness of the H$_2$ layer in a region where a$_2$ was 40 nm and b$_2$ was 800 nm was 223 nm, and the difference in film thickness in the sparse and dense pattern of the polymer 7 was 7 nm.

In addition, each evaluation was performed using the polymer 7. The obtained results are listed in Table 2.

Example 14

34 g (dry weight of 16.9 g) of 5% Ru carbon having a moisture content of 50.3% and 1.8 g (dry mass of 0.89 g) of 5% Rh carbon having a moisture content of 50.7% were added to 4.0 kg of the ring opening metathesis polymer solution obtained in Example 3 as a hydrogenation catalyst to cause a hydrogenation reaction at 100° C. and a hydrogen pressure of 5 MPa for 12 hours. In the obtained polymer, the hydrogenation ratio thereof was 100%, the Mw was 9600, the ratio of Mw/Mn was 2.07, and the molar ratio HAJ/[B]) of the structural unit [A] to the structural unit [B] which was analyzed by $^1$1-INMR was 50/50.

Next, the polymer was precipitated and dried at 80° C. under reduced pressure according to the same method as that in Example 1 to obtain a white power solid (polymer 8).

The glass transition temperature of the polymer 8 was 91° C.

Further, the amount of the volatile components generated in the polymer 8 was 0.0% by mass.

In addition, the temperature at the intersection between the storage modulus (G') curve and the loss modulus (G") curve to be calculated from the results obtained by measuring the solid viscoelasticity of the polymer 8 was 112° C.

Next, samples obtained by coating the uneven surface of the silicon substrate A and the uneven surface of the silicon substrate B with the polymer 8 were prepared according to the same method as that in Example 1.

The refractive index (n value) of the polymer 8 measured using an ellipsometer was 1.66 and the extinction coefficient (k value) thereof was 0.02.

As the result of observation performed on the cross section of the substrate A using a SEM, the polymer 8 was uniformly embedded without defects such as voids with respect to grooves with a narrow line width of 40 nm (height of 200 nm) between projections. Further, the thickness (H$_{av}$) of the layer of the polymer 8 obtained by measuring ten distances between the bottoms of recesses to the atmospheric surface and averaging the obtained values was 310 nm, the maximum height (H$_{max}$) was 311 nm, the minimum height (H$_{min}$) was 309 nm, and the flatness (ΔFT) was 0.6%.

Further, as the result of observation performed on the cross section of the substrate B using a SEM, the thickness of the H$_1$ layer in a region where a$_1$ was 900 μm and b$_1$ was 800 nm was 221 nm, the thickness of the H$_2$ layer in a region where a$_2$ was 40 nm and b$_2$ was 800 nm was 228 nm, and the difference in film thickness in the sparse and dense pattern of the polymer 8 was 8 nm.

In addition, each evaluation was performed using the polymer 8. The obtained results are listed in Table 2.

Example 15

Next, 64 g (dry weight of 31.8 g) of 5% Ru carbon having a moisture content of 50.3% and 3.5 g (dry mass of 1.7 g) of 5% Rh carbon having a moisture content of 50.7% were added to 3.0 kg of the ring opening metathesis polymer solution obtained in Example 9 as a hydrogenation catalyst to cause a hydrogenation reaction at 100° C. and a hydrogen pressure of 5 MPa for 12 hours. In the obtained polymer, the hydrogenation ratio thereof was 100%, the Mw was 10400, the ratio of Mw/Mn was 3.18, and the molar ratio ([A]/[B]) of the structural unit [A] to the structural unit [B] which was analyzed by $^1$HNMR was 50/50.

Next, the polymer was precipitated and dried at 50° C. under reduced pressure according to the same method as that in Example 1 to obtain a white power solid (polymer 9). The glass transition temperature of the polymer 9 was 45° C.

Further, the amount of the volatile components generated in the polymer 9 was 0.0% by mass.

In addition, the temperature at the intersection between the storage modulus (G') curve and the loss modulus (G") curve to be calculated from the results obtained by measuring the solid viscoelasticity of the polymer 9 was 50° C.

Next, samples obtained by coating the uneven surface of the silicon substrate A and the uneven surface of the silicon substrate B with the polymer 8 were prepared according to the same method as that in Example 1.

The refractive index (n value) of the polymer 9 measured using an ellipsometer was 1.64 and the extinction coefficient (k value) thereof was 0.01.

As the result of observation performed on the cross section of the substrate A using a SEM, the polymer 9 was uniformly embedded without defects such as voids with respect to grooves with a narrow line width of 40 nm (height of 200 nm) between projections. Further, all measured values obtained by measuring ten distances between the bottoms of recesses to the atmospheric surface were 316 nm, and the flatness (ΔFT) was 0.0%.

Further, as the result of observation performed on the cross section of the substrate B using a SEM, the thickness of the H$_1$ layer in a region where a$_1$ was 900 μm and b$_1$ was 800 nm was 211 nm, the thickness of the H$_2$ layer in a region where $a_2$ was 40 nm and $b_2$ was 800 nm was 216 nm, and the difference in film thickness in the sparse and dense pattern of the polymer 9 was 5 nm.

In addition, each evaluation was performed using the polymer 9. The obtained results are listed in Table 2.

Example 16

3.3 kg of a ring opening metathesis polymer solution was obtained according to the same method as that in Example 5 except that 75 g (0.8 mol) of bicycle [2.2.]hept-2-ene having the structural unit [A] and 487 g (3.2 mol) of 4,10-dioxy-tricyclo[5.2.1.0$^{2,6}$]-8-decene-3-one having the structural unit [B] were used. In the obtained polymer, the polymerization rate thereof was 100%, the Mw was 5900, the ratio of Mw/Mn was 2.32, and the molar ratio ([A]/[B]) of the structural unit [A] to the structural unit [B] which was analyzed by IIE\TMR was 20/80.

Next, the polymer was precipitated and dried at 60° C. according to the same method as that in Example 5 to obtain a white power solid (polymer 10).

The glass transition temperature of the polymer 10 was 68° C.

Further, the amount of the volatile components generated in the polymer 10 was 0.0% by mass.

In addition, the temperature at the intersection between the storage modulus (G') curve and the loss modulus (G") curve to be calculated from the results obtained by measuring the solid viscoelasticity of the polymer 10 was 82° C.

Next, samples obtained by coating the uneven surface of the silicon substrate A and the uneven surface of the silicon substrate B with the polymer 10 were prepared according to the same method as that in Example 1.

The refractive index (n value) of the polymer 10 measured using an ellipsometer was 1.67 and the extinction coefficient (k value) was 0.02.

As the result of observation performed on the cross section of the substrate A using a SEM, the polymer 10 was uniformly embedded without defects such as voids with respect to grooves with a narrow line width of 40 nm (height of 200 nm) between projections. Further, all measured values obtained by measuring ten distances between the bottoms of recesses to the atmospheric surface were 320 nm, and the flatness (ΔFT) was 0.0%.

Further, as the result of observation performed on the cross section of the substrate B using a SEM, the thickness of the $H_1$ layer in a region where $a_1$ was 900 μm and $b_1$ was 800 nm was 217 nm, the thickness of the $H_2$ layer in a region where $a_2$ was 40 nm and $b_2$ was 800 nm was 216 nm, and the difference in film thickness in the sparse and dense pattern of the polymer 10 was 4 nm.

In addition, each evaluation was performed using the polymer 10. The obtained results are listed in Table 2.

Example 17

A resin composition 5 was prepared according to the same method as that in Example 5 except that the mixing mass ratio of the polymer 1 obtained in Example 5 to polyhydroxystyrene was changed to 60/40. The glass transition temperature of the resin composition 5 was 127° C., and the amount of the volatile components generated was 0.0% by mass.

In addition, the temperature at the intersection between the storage modulus (G') curve and the loss modulus (G") curve to be calculated from the results obtained by measuring the solid viscoelasticity of the resin composition 5 was 145° C.

Next, samples obtained by coating the uneven surface of the silicon substrate A and the uneven surface of the silicon substrate B with the polymer 8 were prepared according to the same method as that in Example 1.

The refractive index (n value) of the resin composition 5 for forming an underlayer film measured using an ellipsometer was 1.78 and the extinction coefficient (k value) was 0.06.

As the result of observation performed on the cross section of the substrate A using a SEM, the resin composition 5 was uniformly embedded without defects such as voids with respect to grooves with a narrow line width of 40 nm (height of 200 nm) between projections. Further, the thickness ($H_{av}$) of the layer of the resin composition 5 obtained by measuring ten distances between the bottoms of recesses to the atmospheric surface and averaging the obtained values was 336 nm, the maximum height ($H_{max}$) was 337 nm, the minimum height ($H_{min}$) was 335 nm, and the flatness (ΔFT) was 0.6%.

Further, as the result of observation performed on the cross section of the substrate B using a SEM, the thickness of the $H_1$ layer in a region where $a_1$ was 900 μm and $b_1$ was 800 nm was 232 nm, the thickness of the $H_2$ layer in a region where $a_2$ was 40 nm and $b_2$ was 800 nm was 240 nm, and the difference in film thickness in the sparse and dense pattern of the resin composition 5 was 8 nm.

In addition, each evaluation was performed using the resin composition 5. The obtained results are listed in Table 3.

Example 18

A resin composition 6 was prepared according to the same method as that in Example 5 except that polymethyl methacrylate was used as the thermoplastic resin (II) in place of the polyhydroxystyrene. The glass transition temperature of the resin composition 6 was 110° C., and the amount of the volatile components generated was 0.0% by mass.

In addition, the temperature at the intersection between the storage modulus (G') curve and the loss modulus (G") curve to be calculated from the results obtained by measuring the solid viscoelasticity of the resin composition 6 was 135° C.

Next, samples obtained by coating the uneven surface of the silicon substrate A and the uneven surface of the silicon substrate B with the polymer 8 were prepared according to the same method as that in Example 1.

The refractive index (n value) of the resin composition 6 for forming an underlayer film measured using an ellipsometer was 1.80 and the extinction coefficient (k value) was 0.02.

As the result of observation performed on the cross section of the substrate A using a SEM, the resin composition 6 was uniformly embedded without defects such as voids with respect to grooves with a narrow line width of 40 nm (height of 200 nm) between projections. Further, the thickness ($H_{av}$) of the layer of the resin composition 6 obtained by measuring ten distances between the bottoms of recesses to the atmospheric surface and averaging the obtained values was 300 nm, the maximum height ($H_{max}$) was 301 nm, the minimum height ($H_{min}$) was 300 nm, and the flatness (ΔFT) was 0.3%.

Further, as the result of observation performed on the cross section of the substrate B using a SEM, the thickness of the H₁ layer in a region where a₁ was 900 μm and b₁ was 800 nm was 227 nm, the thickness of the H₂ layer in a region where a₂ was 40 nm and b₂ was 800 nm was 233 nm, and the difference in film thickness in the sparse and dense pattern of the resin composition 6 was 6 nm.

In addition, each evaluation was performed using the resin composition 6. The obtained results are listed in Table 3.

Example 19

A solution containing PGMEA and cyclohexanone at a mass ratio (PGMEA/cyclohexanone) of 5/5 in which 10% by mass of the polymer 8 obtained in Example 14 and 0.3% by mass of 3',4'-epoxycyclohexylmethyl-3,4-epoxycyclohexanecarboxylate (EEC) were dissolved as a crosslinking agent, was prepared, thereby preparing a resin composition 7.

Since it was understood that the temperature at which the polarity of the cyclic olefin polymer changes is sufficiently higher than the temperature at the intersection between G' and G", the temperature at the intersection between G' and G" of the resin composition 7 formed of the cyclic olefin polymer 8 and the crosslinking agent can be regarded as the same value as described above.

Next, samples obtained by coating the uneven surface of the silicon substrate A and the uneven surface of the silicon substrate B with the resin composition 7 were prepared according to the same method as that in Example 1.

The refractive index (n value) measured using an ellipsometer was 1.67 and the extinction coefficient (k value) thereof was 0.02.

As the result of observation performed on the cross section of the substrate A using a SEM, the resin composition 7 was uniformly embedded without defects such as voids with respect to grooves with a narrow line width of 40 nm (height of 200 nm) between projections. Further, the thickness ($H_{av}$) of the layer of the resin composition 7 obtained by measuring ten distances between the bottoms of recesses to the atmospheric surface and averaging the obtained values was 313 nm, the maximum height ($H_{max}$) was 313 nm, the minimum height ($H_{min}$) was 312 nm, and the flatness (ΔFT) was 0.3%.

Further, as the result of observation performed on the cross section of the substrate B using a SEM, the thickness of the H₁ layer in a region where a₁ was 900 μm and b₁ was 800 nm was 239 nm, the thickness of the H₂ layer in a region where a₂ was 40 nm and b₂ was 800 nm was 244 nm, and the difference in film thickness in the sparse and dense pattern of the resin composition 7 was 5 nm.

In addition, each evaluation was performed using the resin composition 7. The obtained results are listed in Table 3.

Comparative Example 1

A cyclohexanone solution, in which 10% by mass of a novolak resin KA1165 (manufactured by DIC Corporation) whose temperature at the intersection between the storage modulus (G') curve and the loss modulus (G") curve calculated from the result of the solid viscoelasticity measurement was 255° C. was dissolved, was prepared, and the uneven surface of the silicon substrate A and the uneven surface of the silicon substrate B were spin-coated with the solution according to the same method as that in Example 1 and baked at 200° C. for 3 minutes.

Next, the embedding property and the flatness were respectively evaluated according to the same methods as those in Example 1. As the result of observation performed on the cross section of the substrate A using a SEM, the novolak resin caused voids to be generated in recess edge portions with respect to grooves with a narrow line width of 40 nm (height of 200 nm) between projections. Further, the thickness of the layer obtained by measuring ten distances between the bottoms of recesses to the atmospheric surface and averaging the obtained values was 300 nm, the maximum height ($H_{max}$) was 317 nm, the minimum height ($H_{min}$) was 285 nm, and the flatness (ΔFT) was 10.7%. In addition, the atmospheric surface was distorted.

Further, as the result of observation performed on the cross section of the substrate B using a SEM, the thickness of the H₁ layer in a region where a₁ was 900 μm and b₁ was 800 nm was 213 nm, the thickness of the H₂ layer in a region where a₂ was 40 nm and b₂ was 800 nm was 275 nm, and the difference in film thickness in the sparse and dense pattern of the novolak resin was 62 nm. The obtained results are listed in Table 2.

Comparative Example 2

A solution in which 2% by mass of 2-benzyl-2-dimethylamino-1-(4-morpholinophenyl)-butane-1-one with respect to methyl methacrylate was dissolved, as a photopolymerization initiator, in a cyclohexanone solution containing 10% by mass of methacrylate dissolved therein was prepared.

Next, samples obtained by spin-coating the uneven surface of the silicon substrate A and the uneven surface of the silicon substrate B with the solution were prepared according to the same method as that in Example 1.

Next, the coating film was cured by being irradiated with UV rays at an irradiation dose of 1000 mJ/cm².

Next, the embedding property and the flatness were respectively evaluated according to the same methods as those in Example 1. As the result of observation performed on the cross section of the substrate A using a SEM, voids were generated in recess edge portions with respect to grooves with a narrow line width of 40 nm (height of 200 nm) between projections. Further, the thickness of the layer obtained by measuring ten distances between the bottoms of recesses to the atmospheric surface and averaging the obtained values was 250 nm, the maximum height ($H_{max}$) was 275 nm, the minimum height ($H_{min}$) was 244 nm, and the flatness (ΔFT) was 12.4%. In addition, the atmospheric surface was distorted.

Further, as the result of observation performed on the cross section of the substrate B using a SEM, the thickness of the H₁ layer in a region where a₁ was 900 μm and b₁ was 800 nm was 242 nm, the thickness of the H₂ layer in a region where a₂ was 40 nm and b₂ was 800 nm was 315 nm, and the difference in film thickness in the sparse and dense pattern of the novolak resin was 73 nm. The obtained results are listed in Table 2.

[Evaluation of Plasma Etching Resistance]

Each silicon wafer was coated with each solution containing PGMEA and cyclohexanone at a mass ratio of 50/50 obtained by dissolving 10% by mass of each of the polymer 1, the polymer 2, the polymer 3, the polymer 4, the polymer 5, the polymer 6, the polymer 7, the polymer 8, the polymer 9, and the polymer 10 synthesized in Example 1, Example 2, Example 3, Example 4, Example 9, Example 12, Example 13, Example 14, Example 15, and Example 16, and the resulting wafer was baked at 200° C. for 3 minutes in a nitrogen atmosphere. Next, each sample was dry-etched for 30 seconds, 60 seconds, and 90 seconds in a $CHF_3$ gas atmosphere. Next, the amount of decrease in film thickness due to the etching was calculated from the film thicknesses before and after the etching, and the time (sec) was plotted on the horizontal axis and the amount (nm) of the reduced film thickness was plotted on the vertical axis. The etching rate (nm/sec) of each sample was calculated from the inclination of the obtained graph.

Each silicon wafer was coated with each solution containing PGMEA and cyclohexanone at amass ratio of 50/50 obtained by dissolving 10% by mass of each of the resin composition 1, the resin composition 2, the resin composition 3, the resin composition 4, the resin composition 5, the resin composition 6, and the resin composition 7 prepared in Example 5, Example 6, Example 7, Example 8, Example 17, Example 18, and Example 19, and the resulting wafer was baked at 200° C. for 3 minutes in a nitrogen atmosphere. Next, each sample was dry-etched for 30 seconds, 60 seconds, and 90 seconds in a $CHF_3$ gas atmosphere. Next, the amount of decrease in film thickness due to the etching was calculated from the film thicknesses before and after the etching, and the time (sec) was plotted on the horizontal axis and the amount (nm) of the reduced film thickness was plotted on the vertical axis. The etching rate (nm/sec) of each sample was calculated from the inclination of the obtained graph.

The etching rate was measured using $SiO_2$ [formed using tetraethoxysilane (TEOS) as a raw material and baking the material on the surface of the silicon wafer] formed on the surface of the silicon wafer as a target substance, and the etching resistance was evaluated based on the value [$SiO_2$ (nm/sec)/each sample (nm/sec)]. As the value of [$SiO_2$ (nm/sec)/each sample (nm/sec)] increases, this indicates that the etching resistance is excellent.

The value of the polymer 1 was 4.5, the value of the polymer 2 was 5.0, the value of the polymer 3 was 5.0, the value of the polymer 4 was 5.5, the value of the polymer 5 was 4.3, the value of the polymer 6 was 4.5, the value of the polymer 7 was 5.1, the value of the polymer 8 was 5.2, the value of the polymer 9 was 5.1, and the value of the polymer 10 was 4.3. As the result, all polymers showed high etching resistance to $SiO_2$.

The value of the resin composition 1 was 3.0, the value of the resin composition 2 was 2.5, the value of the resin composition 3 was 2.7, the value of the resin composition 4 was 3.5, the value of the resin composition 5 was 3.2, the value of the resin composition 6 was 2.7, and the value of the resin composition 7 was 5.2. As the result, all resin compositions showed high etching resistance to $SiO_2$.

[Evaluation of Removal Characteristics of Underlayer Film Material Using $O_2$ Etching]

Each surface of a silicon substrate, in which a line and space pattern with a height of 200 nm, a projection width of 100 nm, and a width between projections of 100 nm was formed on the surface of the substrate, was coated with each solution containing PGMEA and cyclohexanone at a mass ratio of 50/50, obtained by dissolving 10% by mass of each of the polymer 1 to the polymer 10 synthesized in Example 1, Example 4, Example 9, and Example 12 to Example 16 and the resin composition 1 to the resin composition 7 prepared in Example 5 to Example 8 and Example 17 to Example 19, and the substrate was baked at 200° C. for 3 minutes in a nitrogen atmosphere. Each sample was divided to perform SEM observation before removal of the underlayer film material using a piece therein, and dry etching was performed using the other piece for 60 seconds in an $O_2$ gas atmosphere so that the underlayer film material was removed. Next, SEM observation was performed after the removal.

Figure 5:
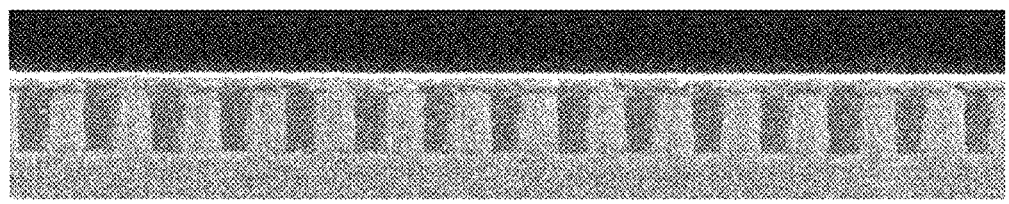
FIG. 5 shows images observed with a SEM before and after removal of the polymer 1 on which removal characteristic evaluation of an underlayer film material is performed using $O_2$ etching.
Figure 5:
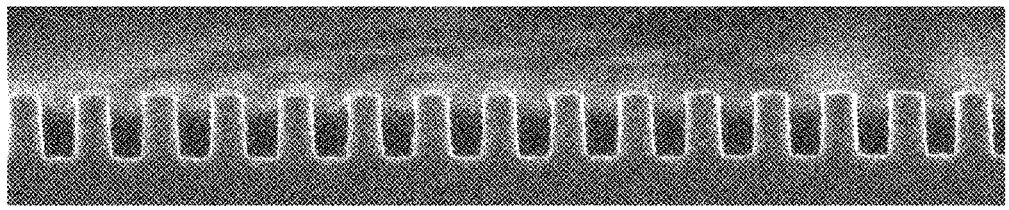

Based on the comparison between SEM observation images before and after the removal of the underlayer film material, all of the polymer 1 to the polymer 10 and all of the resin composition 1 to the resin composition 7 were removed without polymer residues on the substrate. FIG. 5 shows images observed with a SEM before and after removal of the polymer 1 using $O_2$ etching.

For comparison, the removal characteristic of the underlayer film material was evaluated according to the same method as described above using a siloxane resin in which a substituent on Si was propoxymethacrylate. As the result, polymer residues were found on the substrate by SEM observation, and the polymer was not able to be removed without polymer residues even in a case where the etching time was extended to 180 seconds.

TABLE 1

|  |  | Example 1 | Example 2 | Example 3 | Example 4 | Example 9 | Example 10 | Example 11 |
|---|---|---|---|---|---|---|---|---|
| Resin material for forming underlayer film | | Polymer 1 | Polymer 2 | Polymer 3 | Polymer 4 | Polymer 5 | Polymer 5 | Polymer 5 |
| Mw | | 5700 | 6300 | 7200 | 7800 | 6800 | 6800 | 6800 |
| Mw/Mn | | 1.61 | 1.50 | 1.50 | 1.57 | 2.84 | 2.84 | 2.84 |
| Structure A/Structure B | | 50/50 | 50/50 | 50/50 | 80/20 | 50/50 | 50/50 | 50/50 |
| Tg | | 151° C. | 150° C. | 130° C. | 172° C. | 72° C. | 72° C. | 72° C. |
| Amount of volatile components generated | | 0.0% | 0.0% | 0.0% | 0.0% | 0.0% | 0.0% | 0.0% |
| Intersection between G' and G'' | | 173° C. | 167° C. | 151° C. | 190° C. | 84° C. | 84° C. | 84° C. |
| Solution for measurement | | PGMEA/CH = 50/50 with 10% by mass of polymer | PGMEA/CH = 50/50 with 10% by mass of polymer | PGMEA/CH = 50/50 with 10% by mass of polymer | PGMEA/CH = 50/50 with 10% by mass of polymer | PGMEA/CH = 50/50 with 10% by mass of polymer | PGMEA/CH = 50/50 with 7% by mass of polymer | PGMEA/CH = 50/50 with 20% by mass of polymer |
| Refractive index (n value) | | 1.66 | 1.66 | 1.68 | 1.71 | 1.68 | 1.68 | 1.68 |
| Extinction coefficient (k value) | | 0.08 | 0.04 | 0.02 | 0.09 | 0.01 | 0.01 | 0.01 |
| Evaluation of embedding property | Substrate Evaluation result | A Uniform | A Uniform | A Uniform | A Uniform | A Uniform | A Uniform | A Uniform |

TABLE 1-continued

|  |  | Example 1 | Example 2 | Example 3 | Example 4 | Example 9 | Example 10 | Example 11 |
|---|---|---|---|---|---|---|---|---|
| Evaluation of flatness | Substrate | A | A | A | A | A | A | A |
|  | Average value (Hav) of thicknesses of resist underlayer film [nm] | 300 | 299 | 302 | 310 | 315 | 208 | 1622 |
|  | Flatness [%] | 0.3% | 0.0% | 0.7% | 0.6% | 0.0% | 0.0% | 0.0% |
| Evaluation of difference in film thickness of sparse and dense pattern | Substrate | B | B | B | B | B | B | B |
|  | Evaluation result | Good | Good | Good | Good | Excellent | Excellent | Excellent |

TABLE 2

|  |  | Example 12 | Example 13 | Example 14 | Example 15 | Example 16 | Comparative Example 1 | Comparative Example 2 |
|---|---|---|---|---|---|---|---|---|
| Resin material for forming underlayer film | | Polymer 6 | Polymer 7 | Polymer 8 | Polymer 9 | PoLymer 10 | Novolak resin | PMMA (photocuring) |
| Mw | | 5600 | 7300 | 9600 | 10400 | 5900 | — | — |
| Mw/Mn | | 1.92 | 2.17 | 2.07 | 3.18 | 2.32 | — | — |
| Structure A/Structure B | | 50/50 | 50/50 | 50/50 | 50/50 | 20/80 | — | — |
| Tg | | 56° C. | 58° C. | 91° C. | 45° C. | 68° C. | 120° C. | — |
| Amount of volatile components generated | | 0.0% | 0.0% | 0.0% | 0.0% | 0.0% | — | — |
| Intersection between G' and G" | | 76° C. | 81° C. | 112° C. | 50° C. | 82° C. | 255° C. | — |
| Solution for measurement | | PGMEA/CH = 50/50 with 10% by mass of polymer | PGMEA/CH = 50/50 with 10% by mass of polymer | PGMEA/CH = 50/50 with 10% by mass of polymer | PGMEA/CH = 50/50 with 10% by mass of polymer | PGMEA/CH = 50/50 with 10% by mass of polymer | Novolak resin/CH = 10/90 | Methyl methacrylate/CH = 10/90 |
| Refractive index (n value) | | 1.78 | 1.78 | 1.66 | 1.64 | 1.67 | — | — |
| Extinction coefficient (k value) | | 0.02 | 0.01 | 0.02 | 0.01 | 0.02 | — | — |
| Evaluation of embedding property | Substrate | A | A | A | A | A | A | A |
|  | Evaluation result | Uniform | Uniform | Uniform | Uniform | Uniform | Non-uniform | Non-uniform |
| Evaluation of flatness | Substrate | A | A | A | A | A | A | A |
|  | Average value (Hav) of thicknesses of resist underlayer film [nm] | 311 | 305 | 310 | 316 | 320 | 300 | 250 |
|  | Flatness [%] | 0.0% | 0.0% | 0.6% | 0.0% | 0.0% | 10.7% | 12.4% |
| Evaluation of difference in film thickness of sparse and dense pattern | Substrate | B | B | B | B | B | B | B |
|  | Evaluation result | Excellent | Excellent | Excellent | Excellent | Excellent | Bad | Bad |

TABLE 3

| | EXAMPLE 5 | EXAMPLE 6 | EXAMPLE 7 | EXAMPLE E | EXAMPLE 17 | EXAMPLE 18 | EXAMPLE 19 |
|---|---|---|---|---|---|---|---|
| RESIN MATERIAL FOR FORMING UNDERLAYER FILM | RESIN COMPOSITION 1 | RESIN COMPOSITION 2 | RESIN COMPOSITION 3 | RESIN COMPOSITION 4 | RESIN COMPOSITION 5 | RESIN COMPOSITION 6 | RESIN COMPOSITION 7 |
| CYCLIC OLEFIN POLYMER (I) KIND OF POLYMER | POLYMER 1 | POLYMER 2 | POLYMER 3 | POLYMER 4 | POLYMER 1 | POLYMER 1 | POLYMER 8 |
| MW | 5700 | 6300 | 7200 | 7800 | 5700 | 5700 | 9600 |
| MW/MN | 1.61 | 1.50 | 1.50 | 1.57 | 1.61 | 1.61 | 2.07 |
| STRUCTURE A/STRUCTURE B | 50/50 | 50/50 | 50/50 | 80/20 | 50/50 | 50/50 | 50/50 |
| TG | 151° C. | 150° C. | 130° C. | 172° C. | 151° C. | 151° C. | 91° C. |
| THERMOPLASTIC RESIN (II) | POLYHYDROXY-STYRENE | POLYHYDROXY-STYRENE | POLYHYDROXY-STYRENE | POLYHYDROXY-STYRENE | POLYHYDROXY-STYRENE | POLYMETHYL METHACRYLATE | — |
| CYCLIC OLEFIN POLYMER (I)/THERMOPLASTIC RESIN (II) (MASS RATIO) [—] | 50/50 | 50/50 | 50/50 | 50/50 | 60/40 | 50/50 | POLYMER B/EEC = 97/3 |
| TG OF RESIN COMPOSITION | 105° C. | 107° C. | 102° C. | 132° C. | 127° C. | 110° C. | — |
| AMOUNT OF VOLATILE COMPONENTS GENERATED | 0.0% | 0.0% | 0.0% | 0.0% | 0.0% | 0.0% | — |
| INTERSECTION BETWEEN G' AND G'' | 124° C. | 122° C. | 118° C. | 150° C. | 145° C. | 135° C. | — |
| SOLUTION FOR MEASUREMENT | PGMEA/CH = 50/50 WITH 10% BY MASS OF RESIN COMPOSITION | PGMEA/CH = 50/50 WITH 10% BY MASS OF POLYMER | PGMEA/CH = 50/50 WITH 10% BY MASS OF POLYMER | PGMEA/CH = 50/50 WITH 10% BY MASS OF POLYMER | PGMEA/CH = 50/50 WITH 10% BY MASS OF POLYMER | PGMEA/CH = 50/50 WITH 10% BY MASS OF POLYMER | PGMEA/CH = 50/50 WITH 10.3% BY MASS OF POLYMER |
| REFRACTIVE INDEX (N VALUE) | 1.97 | 1.94 | 1.85 | 1.81 | 1.78 | 1.80 | 1.67 |
| EXTINCTION COEFFICIENT (K VALUE) | 0.02 | 0.05 | 0.04 | 0.08 | 0.06 | 0.02 | 0.02 |
| EVALUATION OF EMBEDDING PROPERTY SUBSTRATE EVALUATION RESULT | A UNIFORM | A UNIFORM | A UNIFORM | A UNIFORM | A UNIFORM | A UNIFORM | A UNIFORM |
| EVALUATION OF FLATNESS SUBSTRATE AVERAGE VALUE (HAV) OF THICKNESSES OF RESIST UNDERLAYER FILM [NM] | A 301 | A 299 | A 302 | A 300 | A 336 | A 300 | A 313 |
| EVALUATION OF DIFFERENCE IN FILM THICKNESS OF SPARSE AND DENSE PATTERN FLATNESS [%] SUBSTRATE EVALUATION RESULT | 0.7% B EXCELLENT | 0.3% B EXCELLENT | 0.7% B EXCELLENT | 0.6% B EXCELLENT | 0.6% B EXCELLENT | 0.3% B EXCELLENT | 0.3% B EXCELLENT |

INDUSTRIAL APPLICABILITY

The resin material for forming an underlayer film according to the present invention enables provision of a resist underlayer film having sufficient optical characteristics, etching resistance, excellent flatness, and a suppressed amount of volatile components generated. Accordingly, in a semiconductor device manufacturing step, it is possible to obtain a semiconductor circuit with high degree of integration.

This application claims priority based on Japanese Patent Application No. 2017-196452 filed on Oct. 6, 2017, the entire disclosure of which is incorporated herein.

The present invention includes the following aspects.

1.

A resin material for forming an underlayer film which is used to form a resist underlayer film used in a multi-layer resist process, the resin material including: a cyclic olefin polymer (I), in which a temperature at an intersection between a storage modulus (G') curve and a loss modulus (G") curve in a solid viscoelasticity of the resin material for forming an underlayer film as measured under conditions of a measurement temperature range of 50° C. to 250° C., a heating rate of 3° C./min, and a frequency of 1 Hz in a nitrogen atmosphere in a shear mode using a rheometer is higher than or equal to 60° C. and lower than or equal to 200° C.

2.

The resin material for forming an underlayer film according to 1., in which the cyclic olefin polymer (I) has a repeating structural unit [A] represented by Formula (1).

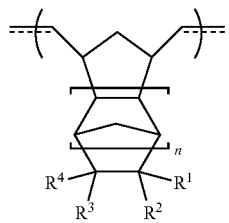

(1)

In Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2.

3.

The resin material for forming an underlayer film according to 2., in which the cyclic olefin polymer (I) further has a repeating structural unit [B] represented by Formula (2).

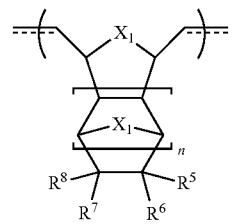

(2)

In Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—.

4.

The resin material for forming an underlayer film according to 3., in which a molar ratio [A]/[B] of the structural unit [A] to the structural unit [B] in the cyclic olefin polymer (I) is greater than or equal to 5/95 and less than or equal to 95/5.

5.

The resin material for forming an underlayer film according to any one of 1. to 4., further including: a thermoplastic resin (II) which is different from the cyclic olefin polymer (I).

6.

The resin material for forming an underlayer film according to 5., in which the thermoplastic resin (II) contains at least one selected from an organic polymer having an aromatic ring structure and a (meth)acrylic polymer.

7.

The resin material for forming an underlayer film according to 5. or 6., in which a mass ratio (I/II) of the cyclic olefin polymer (I) to the thermoplastic resin (II) in the resin material for forming an underlayer film is greater than or equal to 5/95 and less than or equal to 95/5.

8.

The resin material for forming an underlayer film according to any one of 1. to 7., in which an amount of a volatile component generated in the resin material for forming an underlayer film as measured using the following method 1 is greater than or equal to 0.0% by mass and less than or equal to 1.0% by mass in a case where the total amount of the resin material for forming an underlayer film is set to 100% by mass.

(method 1: the resin material for forming an underlayer film is dissolved in tetrahydrofuran to prepare a solution in which a concentration of the resin material for forming an underlayer film is 20% by mass, the obtained solution is weighed using an aluminum plate, heated at 200° C. for 3 minutes in a nitrogen flow such that the tetrahydrofuran is removed, and cooled to room temperature such that the resin material for forming an underlayer film is solidified, the resin material for forming an underlayer film is heated in a temperature range of 30° C. to 300° C. at a heating rate of 10° C./min in a nitrogen atmosphere, and the amount of the volatile component generated in the resin material for forming an underlayer film is calculated based on a weight reduction amount in a temperature range of 100° C. to 250° C.)

9.

The resin material for forming an underlayer film according to any one of 1. to 8., in which a weight-average molecular weight (Mw) of the cyclic olefin polymer in terms of polystyrene as measured using gel permeation chromatography is greater than or equal to 1000 and less than or equal to 20000.

10.

The resin material for forming an underlayer film according to any one of 1. to 9., in which a refractive index (n value) of the resin material for forming an underlayer film at a wavelength of 193 nm as measured using the following method 2 is greater than or equal to 1.5 and less than or equal to 2.0.

(method 2: a coating film which is formed of the resin material for forming an underlayer film and has a thickness of 250 nm is formed on a silicon wafer, and the refractive index (n value) of the obtained coating film at a wavelength of 193 nm is set as the refractive index (n value) of the resin material for forming an underlayer film)

11.

The resin material for forming an underlayer film according to any one of 1. to 10., in which an extinction coefficient (k value) of the resin material for forming an underlayer film as measured using the following method 3 is greater than or equal to 0.0001 and less than or equal to 0.5.

(method 3: a coating film which is formed of the resin material for forming an underlayer film and has a thickness of 250 nm is formed on a silicon wafer, and the extinction coefficient (k value) of the obtained coating film is set as the extinction coefficient (k value) of the cyclic olefin polymer)

12.

The resin material for forming an underlayer film according to any one of 1. to 11., which is formed on an uneven structure of a substrate having the uneven structure and is used for an underlayer film for embedding a recess in the uneven structure.

13.

A resist underlayer film including: the resin material for forming an underlayer film according to any one of 1. to 12.

14.

A method of producing a resist underlayer film, including: a step of forming a coating film which contains the resin material for forming an underlayer film according to any one of 1. to 12. on a substrate.

15.

The method of producing a resist underlayer film according to 14., further including: a step of heating the coating film.

16.

A laminate including: a substrate; and a resist underlayer film containing the resin material for forming an underlayer film according to any one of 1. to 12., which is formed on one surface of the substrate.

17.

The laminate according to 16., in which a flatness ΔFT of a surface (a) of the resist underlayer film on a side opposite to the substrate which is calculated using the following equation is greater than or equal to 0% and less than or equal to 5%.

$$\text{flatness}(\Delta FT)=[(H_{max}-H_{min})/H_{av}]\times 100(\%)$$

(where film thicknesses of the resist underlayer film are measured in ten optional sites of the surface (a), an average value of these measured values is set as $H_{av}$, a maximum value in the film thicknesses of the resist underlayer film is set as $H_{max}$ and a minimum value in the film thicknesses of the resist underlayer film is set as $H_{min}$)

18.

The laminate according to 16. or 17., in which an average value $H_{av}$ of the film thickness of the resist underlayer film is greater than or equal to 5 nm and less than or equal to 500 nm.

(where film thicknesses of the resist underlayer film are measured in ten optional sites of the surface (a) of the resist underlayer film on the side opposite to the substrate, and the average value of these measured values is set as $H_{av}$)

19.

The laminate according to any one of 16. to 18., in which the substrate has an uneven structure on at least one surface thereof, the resist underlayer film is formed on the uneven structure, the uneven structure has a height of greater than or equal to 5 nm and less than or equal to 500 nm, and an interval between projections is greater than or equal to 1 nm and less than or equal to 10 mm.

The invention claimed is:

1. A resin material for forming an underlayer film which is used to form a resist underlayer film used in a multi-layer resist process, the resin material comprising:
    a cyclic olefin polymer (I),
    wherein a temperature at an intersection between a storage modulus (G') curve and a loss modulus (G") curve in a solid viscoelasticity of the resin material for forming an underlayer film as measured under conditions of a measurement temperature range of 30° C. to 300° C., a heating rate of 3° C./min, and a frequency of 1 Hz in a nitrogen atmosphere in a shear mode using a rheometer is higher than or equal to 40° C. and lower than or equal to 200° C.

2. The resin material for forming an underlayer film according to claim 1,
    wherein the temperature at the intersection between the storage modulus (G') curve and the loss modulus (G") curve in the solid viscoelasticity of the resin material for forming an underlayer film as measured under the conditions of a measurement temperature range of 30° C. to 300° C., a heating rate of 3° C./min, and a frequency of 1 Hz in a nitrogen atmosphere in a shear mode using a rheometer is higher than or equal to 60° C. and lower than or equal to 200° C.

3. The resin material for forming an underlayer film according to claim 1,
    wherein the cyclic olefin polymer (I) has a repeating structural unit [A] represented by Formula (1),

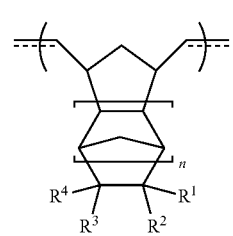

(1)

in Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2.

4. The resin material for forming an underlayer film according to claim 3,
wherein the cyclic olefin polymer (I) further has a repeating structural unit [B] represented by Formula (2),

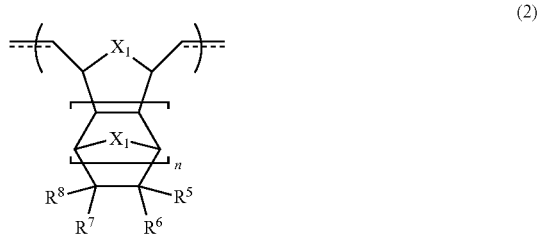

(2)

in Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and Xi represents —O— or —S—.

5. The resin material for forming an underlayer film according to claim 4,
wherein a molar ratio [A]/[B] of the structural unit [A] to the structural unit [B] in the cyclic olefin polymer (I) is greater than or equal to 5/95 and less than or equal to 95/5.

6. The resin material for forming an underlayer film according to claim 1, further comprising:
a thermoplastic resin (II) which is different from the cyclic olefin polymer (I).

7. The resin material for forming an underlayer film according to claim 6,
wherein the thermoplastic resin (II) contains at least one selected from an organic polymer having an aromatic ring structure and a (meth)acrylic polymer.

8. The resin material for forming an underlayer film according to claim 6,
wherein a mass ratio (I/II) of the cyclic olefin polymer (I) to the thermoplastic resin (II) in the resin material for forming an underlayer film is greater than or equal to 5/95 and less than or equal to 85/15.

9. The resin material for forming an underlayer film according to claim 6,
wherein a total content of the cyclic olefin polymer (I) and the thermoplastic resin (II) in the resin material for forming an underlayer film is greater than or equal to 50% by mass and less than or equal to 100% by mass in a case where a total amount of the resin material for forming an underlayer film is set to 100% by mass.

10. The resin material for forming an underlayer film according to claim 1,
wherein an amount of a volatile component in the resin material for forming an underlayer film as measured using the following method 1 is greater than or equal to 0.0% by mass and less than or equal to 1.0% by mass in a case where a total amount of the resin material for forming an underlayer film is set to 100% by mass,
(method 1: the resin material for forming an underlayer film is dissolved in tetrahydrofuran to prepare a solution in which a concentration of the resin material for forming an underlayer film is 20% by mass, the obtained solution is weighed using an aluminum plate, heated at 200° C. for 3 minutes in a nitrogen flow such that the tetrahydrofuran is removed, and cooled to room temperature such that the resin material for forming an underlayer film is solidified, the resin material for forming an underlayer film is heated in a temperature range of 30° C. to 300° C. at a heating rate of 10° C./min in a nitrogen atmosphere, and the amount of the volatile component generated in the resin material for forming an underlayer film is calculated based on a weight reduction amount in a temperature range of 100° C. to 250° C.).

11. The resin material for forming an underlayer film according to claim 1,
wherein a weight-average molecular weight (Mw) of the cyclic olefin polymer (I) in terms of polystyrene as measured using gel permeation chromatography is greater than or equal to 1000 and less than or equal to 20000.

12. The resin material for forming an underlayer film according to claim 1,
wherein a refractive index (n value) of the resin material for forming an underlayer film at a wavelength of 193 nm as measured using the following method 2 is greater than or equal to 1.5 and less than or equal to 2.0,
(method 2: a coating film which is formed of the resin material for forming an underlayer film and has a thickness of 250 nm is formed on a silicon wafer, and the refractive index (n value) of the obtained coating film at a wavelength of 193 nm is set as the refractive index (n value) of the resin material for forming an underlayer film).

13. The resin material for forming an underlayer film according to claim 1,
wherein an extinction coefficient (k value) of the resin material for forming an underlayer film as measured using the following method 3 is greater than or equal to 0.0001 and less than or equal to 0.5, (method 3: a coating film which is formed of the resin material for forming an underlayer film and has a thickness of 250 nm is formed on a silicon wafer, and the extinction coefficient (k value) of the obtained coating film is set as the extinction coefficient (k value) of the resin material for forming an underlayer film).

14. The resin material for forming an underlayer film according to claim 1, which is formed on an uneven structure of a substrate having the uneven structure and is used for an underlayer film for embedding a recess in the uneven structure.

15. The resin material for forming an underlayer film according to claim 1,
wherein a content of a crosslinking agent in the resin material for forming an underlayer film is less than 5 parts by mass in a case where a total content of polymer components contained in the resin material for forming an underlayer film is set to 100 parts by mass.

16. A resist underlayer film comprising:
the resin material for forming an underlayer film according to claim 1.

17. A method of producing a resist underlayer film, comprising:
a step of forming a coating film which contains the resin material for forming an underlayer film according to claim 1 on a substrate.

18. The method of producing a resist underlayer film according to claim 17, further comprising:
a step of heating the coating film.

19. A laminate comprising:
a substrate; and
a resist underlayer film containing the resin material for forming an underlayer film according to claim 1, which is formed on one surface of the substrate.

20. The laminate according to claim 19,
wherein a flatness ($\Delta FT$) of a surface ($\alpha$) of the resist underlayer film on a side opposite to the substrate which is calculated using the following equation is greater than or equal to 0% and less than or equal to 5%, $$\text{flatness}(\Delta FT)=[(H_{max}-H_{min})/H_{av}]\times 100(\%)$$

(where film thicknesses of the resist underlayer film are measured in ten optional sites of the surface ($\alpha$), an average value of these measured values is set as $H_{av}$, a maximum value in the film thicknesses of the resist underlayer film is set as $H_{max}$, and a minimum value in the film thicknesses of the resist underlayer film is set as $H_{min}$).

21. The laminate according to claim 19,
wherein an average value $H_{av}$ of the film thickness of the resist underlayer film is greater than or equal to 5 nm and less than or equal to 500 nm,
(where film thicknesses of the resist underlayer film are measured in ten optional sites of the surface ($\alpha$) of the resist underlayer film on the side opposite to the substrate, and the average value of these measured values is set as $H_{av}$).

22. The laminate according to claim 19,
wherein the substrate has an uneven structure on at least one surface thereof,
the resist underlayer film is formed on the uneven structure,
the uneven structure has a height of greater than or equal to 5 nm and less than or equal to 500 nm, and
an interval between projections is greater than or equal to 1 nm and less than or equal to 10 mm.

* * * * *